(12) United States Patent
Livesay et al.

(10) Patent No.: US 9,062,854 B2
(45) Date of Patent: Jun. 23, 2015

(54) LIGHTING SYSTEMS WITH HEAT EXTRACTING LIGHT EMITTING ELEMENTS

(71) Applicants: William R. Livesay, San Diego, CA (US); Scott M. Zimmerman, Basking Ridge, NJ (US); Richard L. Ross, Del Mar, CA (US); Eduardo DeAnda, San Diego, CA (US)

(72) Inventors: William R. Livesay, San Diego, CA (US); Scott M. Zimmerman, Basking Ridge, NJ (US); Richard L. Ross, Del Mar, CA (US); Eduardo DeAnda, San Diego, CA (US)

(73) Assignee: Goldeneye, Inc, San Diego, CA (US)

( * ) Notice: Subject to any disclaimer, the term of this patent is extended or adjusted under 35 U.S.C. 154(b) by 0 days.

(21) Appl. No.: 14/258,000

(22) Filed: Apr. 21, 2014

(65) Prior Publication Data
US 2015/0023023 A1 Jan. 22, 2015

Related U.S. Application Data

(63) Continuation of application No. 14/042,569, filed on Sep. 30, 2013, now Pat. No. 8,704,262, which is a continuation-in-part of application No. 13/572,608, filed on Aug. 10, 2012, now Pat. No. 8,575,641.

(60) Provisional application No. 61/574,925, filed on Aug. 11, 2011, provisional application No. 61/957,768, filed on Jul. 10, 2013.

(51) Int. Cl.
*H01L 31/0232* (2014.01)
*F21V 7/20* (2006.01)
*H01L 33/64* (2010.01)
(Continued)

(52) U.S. Cl.
CPC ............... *F21V 7/20* (2013.01); *H01L 33/642* (2013.01); *H01L 33/501* (2013.01); *H01L 33/502* (2013.01); *H01L 33/641* (2013.01); *H01L 24/73* (2013.01); *H01L 2224/48091* (2013.01); *H01L 2224/48227* (2013.01); *H01L 2224/48464* (2013.01); *H01L 2224/49107* (2013.01); *H01L 2224/8592* (2013.01); *H01L 2924/0002* (2013.01); *H01L 2224/45144* (2013.01); *H01L 2924/12041* (2013.01); *F21K 9/50* (2013.01); *F21S 8/046* (2013.01); *F21K 9/30* (2013.01); *F21S 8/04* (2013.01); *F21V 29/004* (2013.01); *F21Y 2101/02* (2013.01); *H01L 33/50* (2013.01); *F21V 23/02* (2013.01)

(58) Field of Classification Search
CPC ...................................... H01L 33/501
USPC ..................................... 257/90, 436
See application file for complete search history.

(56) References Cited

U.S. PATENT DOCUMENTS 6,552,368 B2 * 4/2003 Tamai et al. .............. 257/98
6,707,150 B1 * 3/2004 Lee ........................ 257/730
(Continued)

*Primary Examiner* — Chandra Chaudhari
(74) *Attorney, Agent, or Firm* — William Propp, Esq.

(57) ABSTRACT

Lighting systems with heat extracting light emitting elements are disclosed based on the light emitting surface also functioning as the heat cooling surface. Lighting systems which have only their light emitting surfaces exposed to ambient are disclosed. A thermally conductive mostly reflective light transmitting element provides light diffusion, interconnect, and forms a light recycling cavity providing very low profile and lightweight solid state light sources. These properties make these light sources very useful in applications such as aircraft, rescue, temporary illumination, and automotive where weight directly impacts cost and utility. The integration of drivers and other electrical functions onto the heat extracting light emitting elements is also disclosed.

10 Claims, 100 Drawing Sheets

(51) Int. Cl.
*H01L 23/00* (2006.01)
*F21K 99/00* (2010.01)
*F21S 8/04* (2006.01)
*F21V 29/00* (2015.01)
*F21V 23/02* (2006.01)
*H01L 33/50* (2010.01)
*F21Y 101/02* (2006.01)

(56) References Cited

U.S. PATENT DOCUMENTS

| | | |
|---|---|---|
| 7,361,938 B2 | 4/2008 | Mueller et al. |
| 7,422,801 B2 | 9/2008 | Yamashita |
| 7,855,449 B2 | 12/2010 | De Graff et al. |
| 8,481,977 B2 | 7/2013 | Beeson et al. |
| 2009/0217970 A1 | 9/2009 | Zimmerman et al. |

* cited by examiner

Emitting/Cooling Area

LIGHTING SYSTEMS WITH HEAT EXTRACTING LIGHT EMITTING ELEMENTS

CROSS-REFERENCE TO RELATED APPLICATIONS

This application is a continuation in part of U.S. application Ser. No. 14/042,569 filed on Sep. 30, 2013, which is a continuation in part of U.S. application Ser. No. 13/572,608 filed on Aug. 10, 2012, which claims benefit of U.S. Provisional Application Ser. No. 61/574,925, filed on Aug. 11, 2011, which is herein incorporated by reference. This application also claims the benefit of U.S. Provisional Patent Application No. 61/957,768, filed Jul. 10, 2013, which is also herein incorporated by reference.

BACKGROUND OF THE INVENTION

Solid State light sources based on light emitting diode (LED) technology offer the promise of energy savings over incandescent and fluorescent lighting without the toxic materials utilized in fluorescent or organic light emitting diode (OLED) light sources.

However to achieve widespread adoption and acceptance of solid state lighting (based on inorganic LEDs) requires that it be competitively priced to compete with incandescent and mercury filled fluorescent light sources. Even with its greener attributes and favorable impact on the environment the average consumer will still make purchase decisions based on the initial cost of the light source. It matters not that a solid state light source will last longer than an incandescent or fluorescent light source and that it offers the promise of being more economical when factoring in the energy saved over its useful life. Most consumers are not willing to pay more (initially) for eventual savings later. However, reducing the cost of solid state light sources has been a big challenge for lighting companies. According to The U.S. Department of Energy, 70% of the cost of solid state light sources is due to the LED package (40%) and the appended heat sink (30%). In U.S. Published Patent Application No. 20130099264 (Livesay), which is commonly assigned and incorporated by reference into this invention, and previous filings by the authors of this invention, it was shown how both of these can be eliminated by combining the heat sink and package into the light emitting and heat dissipating element. Also shown were several ways in which this can be accomplished including making the thermally conductive luminescent material the wavelength conversion material or alternatively placing the wavelength material between the thermally conductive translucent material and LED. Livesay lists several materials that can be used for the thermally conductive translucent material or element, which become light emitting (i.e. luminescent) by directing the light from the LED into and through the translucent elements. Prior to this invention it was believed that to achieve high efficiencies (light output versus energy input) required translucent materials with high optical transparency. However, to achieve high transparency in ceramic materials usually requires more expensive processing. For example to achieve higher transparency in Cerium doped Yttrium Aluminum Garnet requires high sintering temperatures and subsequent hot isostatic pressing. Similarly, $Al_2O_3$ (alumina) becomes more transparent with more costly sintering and hot isostatic pressing. These processes increase the cost of the material used for the light sources as practiced in Livesay and this invention. To effectively cool via natural convection and radiation requires large surface areas of the light transmissive thermally conductive materials (as taught by Livesay) to dissipate the heat generated by the LEDs attached to them. However if the cost of processing the light transmissive thermally conductive materials is high, this becomes a significant factor in the cost of the light source. It would be beneficial if there was a way in which less expensive light transmissive thermally conductive or translucent materials could be used. This would lower the cost of the light sources and speed up adoption of these environmentally friendly sources.

Heat generated within the LEDs and phosphor material in typical solid state light sources is transferred via conduction means to large appended heat sinks usually made out of aluminum or copper. The temperature difference between the LED junction and heat sink can be 40° C. to 50° C. The temperature difference between ambient and the surfaces of an appended heat sink's surfaces is typically very small given that there is typically a significant temperature drop (thermal resistance) between the LED junction and the heat sink surfaces. With small temperature differences between the heat sink and ambient very little radiative cooling takes place. This small temperature difference not only eliminates most of the radiative cooling but also requires that the heat sink be fairly large (and heavy) to provide enough surface area to effectively cool the LEDs. The larger the heat sink, the larger the temperature drop between the LED junction and the surface of the heat sink fins. For this reason, heat pipes and active cooling is used to reduce either the temperature drop or increase the convective cooling such that a smaller heat sink volume can be used. In general, the added weight of the heat sink and/or active cooling increases costs for shipping, installation, and in some cases poses a safety risk for overhead applications. It would be advantageous if the heat sink temperature was close to the LED junction temperature to enable more radiative cooling of the light source.

BRIEF SUMMARY OF THE INVENTION

This invention relates to solid state light sources based on LEDs mounted to and in thermal contact to light transmitting thermally conductive elements, which have sufficient surface area to provide convective and radiative cooling to dissipate the majority of the heat generated by the LEDs. Briefly, and in general terms, the present invention resides in a self cooling light source comprising at least one light-emitting diode (LED) and at least one light transmitting thermally conductive element to which the LED is mounted, the element having a heat emitting surface through which most of the heat from the LED is dissipated. Ideally, the light source is structured to redirect light emitted by the LED to pass through and exit from the light transmitting thermally conductive element through its heat emitting surface. In most cases the light transmitting thermally conductive material is also partially reflective and is sometimes referred herein as a reflective/transmissive (or reflective and transmissive light transmitting) thermally conducting element. Also the term "translucent" is used herein to describe elements that are both partially reflective and partially transmitting of light incident on them but also capable of waveguiding and scattering the light incident within the element. More economical, self-cooling solid state light sources can be realized by utilizing lower light transmitting (i.e. mostly reflective) thermally conductive translucent elements. Mostly reflective is used herein to describe light transmitting elements, which have higher light reflectivity than light transmissivity. Remarkably, it has been found when mostly reflective and, therefore, low (less than 16% to 20%) light transmitting thermally conductive elements are arranged to form a closed cavity or enclosure (which causes the light that is emitted by the LEDs, mounted to the inside surfaces of the elements, to reflect and recycle inside the thus formed light recycling cavity) that a high percentage (e.g. >80%) of the light emitted by the LEDs eventually is transmitted and extracted through one or more of the mostly reflective partially light transmitting thermally conductive elements and thereby is emitted from the outside surfaces of the cavity. All of the outside surfaces of the cavity are thereby luminescent (light emitting) and they also simultaneously dissipate the heat generated by the LEDs via convection and radiation. This creates a visually pleasing, very uniform and omnidirectional light source without requiring an appended heat sink. Because there is no need for an appended heat sink, there is no blocking of the light from any of the emitting sides of the source, creating a truly omnidirectional light source. Optionally, a reflector may be used with at least one LED and at least one thermally conductive translucent element to form the light recycling cavity to create a directional light source emitting from one or more of the sides (e.g. emitting into a hemisphere vs. a solid angle).

The electrical interconnect to the LEDs as well as other semiconductor devices can be integrated onto the thermally conductive translucent elements. The electrical interconnects can be highly reflective or optionally transparent electrical conductive traces on the thermally conductive translucent elements. In one embodiment of the invention, multiple, partially optically reflective and partially optically transmissive, thermally conductive elements are used to form a light recycling cavity, reflecting and light recycling emitted by the LEDs mounted to the interconnects on the thermally conductive translucent elements that form the cavity. Due to the multiple light reflections therein, a portion of the light emitted from each LED will be transmitted through one or more of the thermally conductive reflective and transmissive elements making up the cavity. The term 'mostly reflective' as used herein refers to thermally conductive elements that reflect over 50% of the light initially incident on them. Optionally, more costly higher in line light transmission (greater than 70%) materials may be utilized (e.g. transparent alumina oxide, TPA). These are typically less than 30% reflective. Wavelength conversion can be accomplished by: phosphor coatings or caps on the LEDs, wavelength conversion elements that are ceramic or organic and coated or bonded onto the thermally conductive translucent elements or optionally incorporated into the thermally conductive translucent elements. Light sources constructed, as described, with light transmitting (optionally translucent) thermally conductive elements or more reflective thermally conductive elements can completely or partially eliminate the need for any additional heat sinks by efficiently transferring and spreading out the heat generated in the LED over an area sufficiently large enough such that convective and radiative means can be used to cool the device.

Moreover, the use of lower light transmitting materials permits the use of higher thermal conductivity materials, which reduce the thermal resistance between the LED p-n junction (where the heat is generated) and the light emitting surfaces of the light source where the heat is dissipated. This in effect places the emitting surface to be cooled at a higher temperature (closer to the LED junction temperature), which enables more efficient radiative and convective cooling to ambient.

This invention relates to lighting systems and light sources where the light emitting surface transfers not only light to the surrounding ambient but also the heat generated in the device, light source, or lighting system to the surrounding ambient. Unlike other lighting systems, particularly solid state lighting systems, this enables the light emitting surface of the lighting system to be substantially the only exterior surface of said lighting system to be exposed to ambient. This is advantageous because this approach reduces weight, reduces the amount of material required, and allows the light sources to be embedded in or mounted to low thermal conductivity building materials like sheetrock, ceiling tiles, window glass, wood, wallpaper, fabrics, tile, linoleum, cork, lathe, plaster, painted surfaces, and sheet metal. This can be accomplished using solid state emitter e.g. (LEDs and/or LED packages) thermally connected or mounted to heat extracting light emitting elements. These heat extracting light emitting elements also referred herein as mostly reflective light transmitting low absorption translucent elements are most preferably made from alumina or other materials having high reflectivity, low optical absorption, high thermal conductivity, high emissivity, and high light diffusing properties. Further these heat extracting light emitting or mostly reflective light transmitting, thermally conductive low absorption, translucent and diffusing elements form at least one surface of a light recycling cavity which enables the light source to have very high uniformity while being very low profile and light weight. In facilitate these requirements the mostly reflective light transmitting thermally conductive element must be comprised of a material which exhibits low optical absorption between 400 nm and 750 nm for visible light sources and sufficient thermal conductivity to distribute the heat generated within the formed light recycling cavity over a large enough area to maintain reasonable surface temperatures of the light emitting surface and maintain low device (e.g. LED) temperatures. Materials like alumina with high emissivity greater than 0.3 are preferred, more preferably greater than 0.5 emissivity and most preferably greater than 0.7 emissivity to further enhance the transfer of heat to the surrounding ambient. Further the mostly reflective light transmitting thermally conductive element will preferably have a thermal conductivity of greater than 1 watts per meter kelvin (W/(m–K)) more preferably greater than 10 W/(m–K) and most preferably greater than 20 W/(m–K). Fortuitously, alumina is more reflective than light transmitting, has low optical absorption, has a thermal conductivity of 25 W/(m–K) and an emissivity of 0.8. and is a natural light diffuser as its diffusing properties are not based on air bubbles in the material but by its anisotropic refractive index. This allows it to be highly light diffusing with low optical absorption but simultaneously highly thermally conductive. The other unique property of alumina is a relatively high band gap in the visible region of the spectrum. Therefore it has low optical absorption in the visible range. By combining the two functions of heat-sinking and light emission into a single element very lightweight sources can be formed emitting greater than 20 lumens per gram. Alumina also has very good dielectric properties. This enables the mostly reflective light transmitting thermally conductive element to provide the function of electrical interconnect to the LEDs and other devices. This is facilitated by printing conductive traces on the inside surface of the mostly reflective light transmitting thermally conductive element. For example a power conversion elements may also be attached directly or thermally connected to the mostly reflective light transmitting thermally conductive low absorption translucent element so that the heat generated by these additional elements may also transfer the majority of their heat to the surrounding ambient through the mostly reflective light transmitting thermally conductive element to which it is thermally connected. Further power conversion or other electrical components can be attached or thermally connected to either the light emitting mostly reflective light transmitting thermally conductive elements or dummy (non light emitting) mostly reflective light transmitting thermally conductive elements whereby the mostly reflective light transmitting thermally conductive element conceals the power conversion or electrical component from view but provides an aesthetically pleasing and uniform look to the lighting system as seen by observers or occupants using the lighting system. The power conversion elements may alternately be separate thermally isolated power conversion elements via an interconnect means between the light system and the separate thermally isolated power conversion elements. Most preferably the light emitting surface is the outer surface of at least one mostly reflective light transmitting thermally conductive (translucent) element and upon whose inner surface (the surface facing into the light recycling cavity), at least one solid state emitter is mounted such that the heat generated by the at least one solid state emitter is transferred from the inner surface and into the at least one mostly reflective light transmitting thermally conductive translucent element and spread out via the thermal conductivity of the at least one mostly reflective light transmitting thermally conductive translucent element to its outer light emitting surface and then transferred (via convection and radiation) to the surrounding ambient. Preferred is that the solid state emitters are interconnected via interconnect means on the inner surface of the at least one mostly reflective light transmitting thermally conductive translucent element. The electrical interconnect is most preferably printed on the inner surface of the mostly reflective light transmitting thermally conductive element. Alternately, a low optical absorption flex circuit can be used to interconnect the solid state emitters electrically. However, the solid state emitters (e.g. LEDs) and other electrical components need to be thermally connected to the mostly reflective light transmitting thermally conductive translucent element so that the heat generated by the solid state emitters and other electrical components can be transferred to the surrounding ambient as described above. The light recycling cavity of the light source or lighting system is formed by a combination of at least one mostly reflective light transmitting thermally conductive element and at least one of the following: a mostly reflective light transmitting thermally conductive element, a reflector, a ceiling tile, or a high reflectivity decorative surface element. The light recycling cavity elements can be glued, welded, laser welded, snapped together, or otherwise held together. All the sides of the light recycling cavity inner surfaces need to be low optical absorption materials which can be light transmitting and/or highly reflective. The property of low optical absorption preferably extends to the elements within the light recycling cavity. These elements may include occupancy sensors, IR sensors, magnetic elements, batteries, wavelength conversion elements, laser diodes, WiFi transmitters or receivers, power conversion elements, wireless power transmitters, heat spreading elements, gaseous envelopes, liquid envelopes, interconnect elements, antennas, and other passive and active devices.

The lightweight nature and self cooling nature of the lighting system disclosed allows for attachment to a wide range of materials which may be non-rigid or rigid. Non-rigid and rigid materials may include electrical interconnect means. Most preferably non-rigid materials may be a woven material or building material. The non-rigid or rigid element may also be attached to a suspended ceiling grid for office, retail, low bay, or high bay applications. Due to the lightweight nature of the lighting sources disclosed, supports for the lighting system (e.g. suspended ceiling grids, light fixtures, chandeliers, etc.) can be constructed of lighter weight materials. For example, a suspended ceiling grid consisting of snap together grid elements comprising tubular elements, clips, support wires, ceiling anchors and wall anchors, may be constructed of at least one of the following lightweight materials, carbon fiber, aluminum, or polymers. The lighting systems preferably emit greater than 20 lumens per gram and most preferably greater than 50 lumens so that general illumination is possible. This also enables a number of other applications which benefit from a lightweight lighting system including light sources or lighting systems for use in or on an aircraft, tether-able balloon based lighting system, hand held light sources, an emergency light source, a camping lantern, a floating light system, lighting system used in medical applications (e.g. adjustable lights in surgical rooms) or a lighting system on an RPV. More preferably, a solid state lighting system emitting more than 20 lumens per gram and greater than 500 lumens attached to at least one support post is disclosed. This enables a wide range of indoor and outdoor lighting systems like streetlights, high bay, low bay and other suspended light sources. In many cases, weight plays a critical role in pole design. Lighter weight light sources can greatly reduce material usage and costs of not only the light fixture but all the supporting members as well.

In general, disclosed is a lighting system containing at least one recycling cavity; wherein said at least one recycling cavity comprises; at least one solid state emitter within said at least one recycling cavity, at least one interconnect means for providing power to said at least one solid state emitter and is at least partially within said at least one recycling cavity, and at least one mostly reflective light transmitting thermally conductive translucent element forming part of said at least one recycling cavity, wherein the light and heat generated within said lighting system is transferred to the surrounding ambient through said at least one thermally conductive translucent element. The lighting system may consist of at least two thermally conductive translucent elements which form part of at least one recycling cavity. The at least two thermally conductive translucent element may exhibit the same or different in-line transmission. In this manner more light can be transmitted through one element than another. The lighting systems disclosed may further be part of a fixture containing and additional optic which may be transmitting or reflective in nature. Multiple lighting systems may be used within a fixture and at least a portion of the light emitted from one lighting system may impinge on another at least one thermally conductive translucent element from another such lighting system. The portion of the light maybe redirected or used to increase the surface radiance of adjacent lighting systems. The multiple lighting systems may be parallel or not parallel to each other. Within a fixture multiple lighting systems may have different spectral outputs or the portion of the light emitted may be used to average the output from multiple lighting systems. Using this approach fixtures are disclosed which emit greater than at least 20 lumens per lumens per square inch and more preferably more than 50 lumens per square inch and greater than 50 lumens per cubic inch. Also disclosed are lighting systems that exhibit emitting surfaces that emits greater than 30 lumens per square inch and transfers greater than 0.1 watts per square inch of heat to the surrounding ambient from the light emitting surface. In general the lighting system may contain self cooling light sources embedded in a ceiling tile where the only exposed surface to ambient is the light emitting surface. The light diffusing properties of the light recycling cavity and the mostly reflective light transmitting thermally conductive translucent element allow the light sources to be very thin or of low profile while eliminating glare from the LEDs contained in the light recycling cavity. This low profile and the elimination of an appended heat sink allow the light sources and lighting system made thereof to be attached to ceilings, walls, fixtures without materially affecting the weight of the ceiling, wall, fixture, etc.

DETAILED DESCRIPTION OF THE INVENTION

Figure 1A:
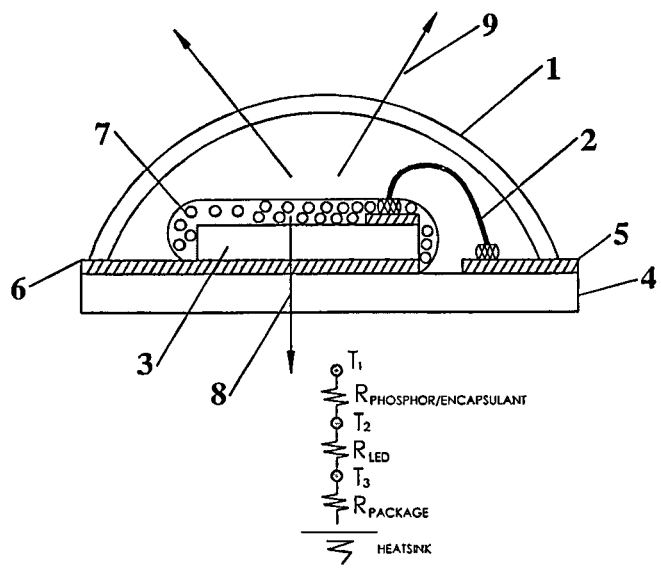
FIG. 1A depicts a side view of a prior art vertical light emitting diode mounted on a substrate where the optical emission is substantially in the opposite direction of the heat removal.

According to the present invention as practiced herein, a conductive interconnect (transparent or reflective) is deposited on translucent thermally conductive elements (e.g. alumina ($Al_2O_3$), transparent alumina (TPA), Spinel, Sapphire, etc.) This can be done lithographically, or more preferred, via screen printing. LEDs or LEDs on surface mountable ceramic substrates (also referred herein as LED packages) are mounted (e.g. via soldering or conductive adhesives) to the interconnect on the translucent thermally conductive elements. It is preferred that the mounting method establish a low thermal resistant contact from the LED to the light transmitting thermally conductive element. Light emitted by the LEDs is directed to the thermally conductive translucent elements where it passes through and is emitted by the thermally conductive light transmitting (and thereby light emitting luminescent) element. The light transmitting thermally conductive elements have surface areas sufficiently larger than the LEDs (or LEDs mounted to ceramic surface mount substrates) to dissipate the heat generated by the LEDs. As practiced in this invention, the heat generated by the LEDs is dissipated via convection and radiation from the luminescent (light emitting) surface (or surfaces) of the thermally conductive light transmitting and optionally translucent elements thereby eliminating any need for an appended bulky and heavy heat sink.

Large surface areas of the light transmissive or translucent thermally conductive materials or elements are required to practice the invention; therefore, it is desirable to minimize the cost of those materials. Disclosed herein is a means to fabricate self cooling solid state light sources using lower cost materials for the thermally conductive translucent elements which both emit the light and dissipate the heat from the LEDs. It is shown that by forming light recycling cavities with more reflective than transmitting thermally conductive light transmissive or translucent elements lower cost materials may be utilized. For example conventionally processed alumina ($AL_2O_3$) is relatively inexpensive (<10 cents per square inch). However, it is highly reflective (white in color) with a transmittance of less than 20% of incident light even in relatively thin thicknesses (from 500 microns to 1 millimeter) and, therefore, would appear to be a poor candidate for use as a luminescent element in the light sources where the LED(s) is enclosed in or by these materials. Highly transparent alumina (TPA) is by comparison more expensive (>50 cents per square inch) but can have a transmittance of greater than 80% of incident light with the majority of that being Fresnel reflections at the surfaces. However, one of the embodiments of this invention is to arrange the thermally conductive translucent elements into a closed envelope where they become light recycling cavities similar to those disclosed in U.S. Pat. No. 7,040,774 and U.S. Pat. No. 6,960,872, both of which are commonly assigned and incorporated by reference into this invention. Whereas, the higher cost materials that are more transparent translucent thermally conductive elements can be utilized to form these light recycling cavities, it has been found that the lower cost more reflective (less transparent) thermally conductive translucent material (e.g. conventionally processed alumina ($AL_2O_3$)) can perform almost as well as the more expensive transparent materials. For example a light recycling cavity can be formed using six thin sheets of 96% alumina with a reflectivity greater than 83%. As practiced herein LEDs or LED surface mountable packages (LEDs mounted on small ceramic substrates) are mounted on the inside surfaces of larger mostly reflective translucent thermally conductive elements that form a fully enclosed cavity.

A preferred material for these mostly reflective thermally conductive translucent materials is 96% alumina ($Al_2O_3$) as it is relatively inexpensive. If making a white light source, wavelength conversion materials (phosphors) are covered over the emitting surfaces of the LEDs. This can be a phosphor cap, a ceramic phosphor chip or a phosphor coated on the LED with a clear adhesive coating like silicone or epoxy. Light emitted from the LEDs (mounted on the inside of the cavity) and optionally wavelength converted, impinges on the opposite sides of the enclosed light recycling cavity and because the translucent thermally conductive elements in this case are mostly reflective only a small amount of light is transmitted (for example as little as 16% with an 84% reflective alumina element) and emitted from the outside surface. However, the light not transmitted is reflected back to the opposite and other sides of the such formed cavity and 16% of the 84% reflected light (~13.4%) is transmitted through and emitted by the other surfaces of the cavity. This process continues until a very high percentage of the light emitted by the LED(s) passes through the (white in body color and appearance) mostly reflective thermally conductive translucent (e.g. alumina) and is emitted by the light source. Remarkably over 80% of the light emitted by the LEDs will eventually be emitted through the sides of what in appearance looks like a white opaque envelope (or enclosure) even though the high reflectivity (e.g. alumina) elements have less than 17% optical transmittance. The critical parameter to make this approach efficient is that the mostly reflective thermally conductive translucent elements (e.g. alumina) have low absorption but scatter light efficiently. As such careful selection of sintering aids and other materials typically used in alumina ceramic production is necessary. This typically manifests itself as body color to the human eye. While scatter is wavelength dependent it does not necessarily translate into increased absorption in recycling cavity applications.

In the previously cited patents on light recycling cavities, it was disclosed that absorption losses must be minimized to create efficient recycling optical systems. In this disclosure, the recycling cavities are formed using partially reflective (<50%) and in one embodiment more reflective (>50%) thermally conductive elements. The elements may be translucent with scattering and may have reflectivities of >80% and still achieve high light extraction efficiencies from the LEDs in the closed light recycling cavities. As an example, a cube made up of thin alumina ($Al_2O_3$) sides onto which LEDs or LED packages are mounted forms a recycling cavity on the inside of the cube. A reflective (e.g. silver) or transparent (e.g. indium tin oxide) interconnect on the inside surfaces of the sides (e.g. alumina elements) of the cube enable electrical connections and power to be applied to the LEDs and/or LED packages mounted to the inside surfaces of the cube. Optionally, pins, wires, conductive vias, flex circuits, etc. can be used to bring power into the cavity via an external electrical power source. The inherent light weight of this approach allows for 50 lumens per gram output levels or higher which exceeds the lumens per gram of incandescent and fluorescent lights. Like incandescent and fluorescent lighting, these light recycling cavity sources do not require additional heat sinks as the light emitting surfaces of the cavity also are the heat emitting surfaces thereby substantially eliminating the need for any additional heat sinking elements. However, unlike the light recycling cavity as described in U.S. Pat. No. 6,960,872, which discloses physical exit apertures, the light generated by the LEDs and/or LED packages can only escape from the light recycling cavity (as disclosed herein) by passing through the thermally conductive translucent elements, which make up the sides of the cavity. This results in a very uniform light output from all exterior surfaces of the closed cavity, which creates a totally omnidirectional light source. Because the more reflective thermally conductive translucent elements (e.g. alumina ($Al_2O_3$)) only transmits between 10% and 20% of the incident light that impinges on them, the majority of the light emitted by the LEDs and/or LED packages are reflected multiple times thus forming a recycling cavity where the sides of the cavity are partially transmitting. As such a recycling cavity comprising partially transmitting thermally conductive elements is disclosed.

Also disclosed is the same recycling cavity further containing solid state LEDs and/or LED packages. Even further disclosed is a light recycling source comprising partially transmitting thermally conductive elements with LEDs and/or LED packages powered via a reflective interconnect and power input means. The reflected light rays bounce around within the recycling closed cavity and eventually are transmitted out of the light recycling cavity if the absorption losses of the alumina, interconnect, and LEDs and/or LED packages are low enough. This can be modeled as an infinite power series mathematically. If the absorption losses are low, tens if not hundreds of reflections can occur within the recycling closed cavity. This not only allows for high efficiency it also creates a very uniform output distribution on the emitting surfaces of the light emitting closed cavity or envelope. As such the formation of a recycling cavity to create a uniform intensity light source based on partially transmitting thermally conductive elements is an embodiment of this invention. The efficiency of such recycling cavities is measured by measuring the raw lumen output of the LED(s) by themselves outside a cavity driven at fixed voltage and current and then measuring the output from the light recycling cavity with the LED(s) driven at the same voltage and current.

The efficiency of the light recycling cavity is a function of the reflectivity of the interior surfaces of the cavity and the other elements within the cavity. Theoretically, if all interior surfaces are 100% reflective, then the only loss is that light that escapes or is absorbed by the LEDs or interconnect. The LEDs and or wavelength conversion material preferably have as high a reflectivity as possible however some absorption does occur. This will impact the efficiency, as light incident back on the LEDs or wavelength conversion elements will tend to get absorbed or further converted in the case of the wavelength conversions elements. This is readily seen when LED packages are placed within a thus formed recycling cavity as the color temperature of the LED packages drop by several 100° Kelvin. As such the use of recycling cavities to create lower color temperature light sources from higher color temperature LED packages is an embodiment of this invention. This occurs with recycling cavities as formed above with blue emitting LEDs and phosphor caps that convert the blue to longer wavelengths. Because of the recycling of blue light back to the wavelength conversion elements within the cavity more blue light is converted to longer wavelengths because of the light recycling. Light incident on the mostly reflective partially transmitting thermally conductive elements (e.g. alumina ($Al_2O_3$)) will either be reflected or emitted. It should be noted that even the more reflective partially transmitting thermally conductive elements (e.g. alumina ($Al_2O_3$)) can provide some wavelength conversion. It was discovered that inadvertent chromium dopants in standard alumina ($Al_2O_3$) will emit narrow band red light due to the blue wavelength photons exciting the chromium ions in the alumina matrix in a manner very similar to chromium doped sapphire (ruby laser). As such the addition of dopants or luminescent elements to the partially transmitting thermally conductive elements is also an embodiment of this invention.

Because the partially transmitting thermally conductive elements provide the heat dissipation means for the light source, relatively large areas of the partially transmitting thermally conductive elements (e.g. alumina ($Al_2O_3$)) are required compared to the areas of the LEDs or phosphor caps comprising the inside surfaces of the cavity. This is needed to provide a large enough exterior surface for radiative and convective cooling to dissipate the heat generated by the LEDs. This means that the reflectivity of the cavity is largely determined by the partially transmitting thermally conductive translucent elements. While alumina ($Al_2O_3$) is a preferred material for the partially transmitting thermally conductive elements used to form the recycling cavity light source disclosed herein, composites, other ceramics, polycrystalline, and single crystal materials which exhibit low absorption losses, reasonable thermal conductivity, and thermal stability are embodiment of this invention. As an example, Boron Nitride (BN) flakes within a low absorption optical polymer like polysilazane can be used to create partially transmitting thermally conductive elements. It is also noted that as the LED and/or LED packages become more efficient there will be a larger range of materials that can satisfy the requirements of the partially transmitting thermally conductive elements. In the future, in the advent of more efficient LEDs, the use of glass (1 W/mK) may be possible while still providing reasonable output levels. With current state of the art LEDs and using alumina ($Al_2O_3$) for the mostly reflective partially transmitting thermally conductive elements a uniform self cooling light source with surface brightnesses exceeding 20,000 ftL has been attained. It is also possible to utilize high thermal conductivity metals for the mostly reflective partially transmitting thermally conductive elements. By using thin strips or sheets of silver coated or plated copper and/or aluminum with many small holes or perforations any desired ratio of reflectivity to transmissivity for the light recycling cavity may be attained by adjusting the density of the tiny apertures (holes or perforations) through the elements. The perforations may be made by punching, drilling, laser ablation, etc.

The thermally conductive luminescent element can be used to completely or partially eliminate the need for any additional heat sinking means by efficiently transferring and spreading out the heat generated in the LED and luminescent element itself over an area sufficiently large enough such that convective and radiative means can be used to cool the device. In other words, the surface emitting the light also convectively and radiatively cools the device. Optionally, the thermally conductive luminescent element can also provide for the efficient wavelength conversion of a portion (zero to 100%) of the radiation emitted by the LEDs. Electrical interconnect of the LEDs and other semiconductor devices can be accomplished by opaque and/or transparent conductors that are fabricated onto the thermally conductive and optically partially transmitting elements. The low cost self-cooling solid state light sources can have printed on, thick film printed silver conductors with a reflectivity greater than 30% or optionally transparent conductors (e.g. indium tin oxide or zinc oxide).

The present invention may also be defined as a self cooling solid state light source comprising at least one light-emitting diode (LED) die and at least one thermally conductive luminescent element bonded to the at least one LED die; wherein heat is transmitted from the light source in basically the same direction as emitted light. More specifically, light is emitted from the LED die principally in a direction through the at least one luminescent element, and heat generated in the light source is transmitted principally in the same direction as the direction of light emission. Heat is dissipated from the light source by a combination of radiation, conduction and convection from the at least one luminescent element, without the need for a device heat sink.

Optionally, the luminescent thermally conductive element can provide light spreading of at least a portion of the radiation from the LEDs and/or radiation converted by the thermally conductive luminescent elements via waveguiding. A thermally conductive luminescent element acts as a waveguide with alpha less than 10 $cm^{-1}$ for wavelengths longer than 550 nm. In this case, the LEDs with emission wavelengths longer than 550 nm can be mounted and cooled by the thermally conductive luminescent elements and also have at least a portion of their emission efficiently spread out via waveguiding within the thermally conductive luminescent element as well.

Thermally conductive luminescent elements with InGaN and AlInGaP LEDs can convert at least a portion of the InGaN spectrum into wavelengths between 480 and 700 nm. Single crystal, polycrystalline, ceramic, and/or flame sprayed Ce:YAG, Strontium Thiogallate, or other luminescent materials emitting light between 480 and 700 nm and exhibiting an alpha below 10 $cm^{-1}$ for wavelengths between 500 nm and 700 nm can be a thermally conductive solid luminescent light spreading element.

The mounting of InGaN and AlInGaP LEDs can form solid state extended area light sources with correlated color temperatures less than 4500° K and efficiencies greater than 50 L/W and optionally color rendering indices greater than 80 based on these thermally conductive light spreading luminescent elements.

One embodiment of this invention is a luminescent thermally conductive translucent element having a thermal conductivity greater than 1 W/mK consisting of one or more of the following materials, alumina, ALN, Spinel, zirconium oxide, BN, YAG, TAG, and YAGG. Optionally, electrical interconnects maybe formed on at least one surface of the luminescent thermally conductive translucent element to provide electrical connection to the LED.

The luminescent thermally conductive element can have a thermal conductivity greater than 1 W/mK and have an emissivity greater than 0.2. A self cooling solid state light source can have at least one luminescent thermally conductive element with a thermal conductivity greater than 1 W/mK and an emissivity greater than 0.2. A self cooling solid state light source can have an average surface temperature greater than 50° C. and a luminous efficiency greater than 50 L/W. Optionally, a self-cooling solid state light source can have an average surface temperature greater than 50° C. and a luminous efficiency greater than 50 L/W containing at least one luminescent thermally conductive element with a thermal conductivity greater than 1 W/mK and an emissivity greater than 0.2. A self-cooling solid state light source can dissipate greater than 0.3 $W/cm^2$ via natural convection cooling and radiation cooling.

Translucent thermally conductive elements can be formed via the following methods: crystal growth, sintering, coating, fusible coating, injection molding, flame spraying, sputtering, CVD, plasma spraying, melt bonding, and pressing. Pressing and sintering of oxides with substantially one phase will improve translucency based on a luminescent powder. Alternately, a translucent element with a thermal conductivity greater than 1 W/mK and an alpha less than 10 $cm^{-1}$ can be coated with a wavelength conversion layer formed during the sintering process or after the sintering process. Single crystal or polycrystalline materials, both wavelength converting and non-wavelength converting, can be used as the thermally conductive luminescent element. Specifically, TPA (transparent polycrystalline alumina), Spinel, cubic zirconia, quartz, and other low absorption thermally conductive materials with a wavelength conversion layer can be formed during or after fabrication of these materials. Techniques such as pressing, extruding, and spatial flame spraying can form near net shape or finished parts. Additional wavelength conversion layers can be added to any of these materials via dip coating, flame spraying, fusing, evaporation, sputtering, CVD, laser ablation, or melt bonding. Controlled particle size and phase can improve translucency.

Coatings can improve the environmental and/or emissivity characteristics of the self-cooling light source, particularly if the coating is a high emissivity coating with and without luminescent properties. Single crystal, polycrystalline, ceramic, coating layers, or flame sprayed can be used both as a coating and as the bulk material Ce:YAG, with a high emissivity or environmental protective coating. In particular, polysiloxanes, polysilazanes and other transparent environmental overcoats can be applied via dip coating, evaporative, spray, or other coating methods, applied either before or after the attachment of the LEDs. Additional wavelength conversion materials can be added to these overcoats such as but not limited to quantum dots, wavelength shifter dyes (such as made by Eljen), and other wavelength conversion materials.

Wireless power transfer elements, power conditioning elements, drive electronics, power factor conditioning electronics, infrared/wireless emitters, and sensors can be integrated into the self cooling solid state light source.

A self cooling solid state light source can have a luminous efficiency greater than 50 L/W at a color temperature less than 4500° K and a color rendering index greater than 70. The self cooling solid state light source can have a surface temperature greater than 40° C., convectively and radiatively cooling more than 0.3 $W/cm^2$ of light source surface area, and have a luminous efficiency greater than 50 L/W.

A self cooling solid state light source can have a luminous efficiency greater than 50 L/W at a color temperature less than 4500° K and a color rendering index greater than 85 containing both blue and red LEDs. At least one luminescent thermally conductive element with an alpha less than 10 $cm^{-1}$ for wavelengths longer than 500 nm is used in the self cooling solid state light source containing at least one blue and at least one LED with emission wavelengths longer than 500 nm. Additional wavelength conversion materials in the form of coatings and/or elements including, but not limited, to phosphor powders, fluorescent dies, wavelength shifters, quantum dots, and other wavelength converting materials, can further improve efficiency and color rendering index.

Aspect ratios and shapes for the solid state light source can be, including but not limited to, plates, rods, cylindrical rods, spherical, hemispherical, oval, and other non-flat shapes. Die placement can mitigate edge effects and form more uniform emitters.

Additional scattering, redirecting, recycling, and imaging elements can be attached to and/or in proximity to the solid state light source designed to modify the far field distribution. Additional elements can be attached to the solid state light source with a thermally conductivity greater than 0.1 W/mK such that additional cooling is provided to the solid state light source via conduction of the heat generated within the solid state light source to the additional element and then to the surrounding ambient. An external frame can provide mechanical support, can be attached to the solid state light source, and/or can provide an external electrical interconnect. Multiple solid state sources arranged with and without additional optical elements can generate a specific far field distribution. In particular, multiple solid state sources can be arranged non-parallel to each other such that surface and edge variations are mitigated in the far field. A separation distance between solid state light sources surfaces of greater than 2 mm is preferred to facilitate convective cooling. Mounting and additional optical elements can enhance convective cooling via induced draft effects.

The thermally conductive luminescent element can also provide for the efficient wavelength conversion of a portion of the radiation emitted by the LEDs. Optionally, the luminescent thermally conductive element can provide light spreading of at least a portion of the radiation from the LEDs and/or radiation converted by the thermally conductive luminescent elements.

Disclosed is a self cooling solid state light source containing an optically transmitting thermally conductive element with a surface temperature greater than 50° C. and a surface area greater than the semiconductor devices mounted on the optically transmitting thermally conductive element. Even more preferably, a self cooling solid state light source containing at least one optically transmitting thermally conductive element with a surface temperature greater than 100° C. and a surface area greater than the surface area of the mounted semiconductor devices. Most preferred is a self cooling solid state light source containing at least one optically transmitting thermally conductive luminescent element with an average thermal conductivity greater than 1 W/mK. As an example, YAG doped with 2% Cerium at 4 wt % is dispersed into an alumina matrix using spray drying. The powders are pressed into a compact and then vacuum sintered at 1500° C. for 8 hours, followed by hot isostatic pressing at 1600° C. for 4 hours under argon. The material is diamond saw diced into 1 mm thick pieces which are ½ inch×1 inch in area. The parts are laser machined to form interconnect trenches into which silver paste is screen printed and fired. The fired silver traces are then lapped to form smooth a surface to which direct die attach LED die are soldered. Pockets are cut using the laser such that two pieces can be sandwiched together thereby embedding the direct die attach LED die inside two pieces of the ceramic Ce:YAG/alumina material. In this manner, a self cooling light source is formed. The direct die attached LED is electrically interconnected via the silver traces and thermally connected to the ceramic Ce:YAG/alumina material. The heat generated within the direct die attach LEDs and the ceramic Ce:YAG/alumina material is spread out over an area greater than the area of the LEDs. In this example, power densities greater than 1 W/cm$^2$ can be dissipated while maintaining a junction temperature less than 120° C. and surface temperature on the ceramic Ce:YAG/alumina material of 80° C. to 90° C. based on natural convection and radiative cooling. As such a ¼ inch×½ inch solid state light source can emit over 100 lumens without any additional heat sinking or cooling means.

Materials with emissivities greater than 0.3 are preferred to enhance the amount of heat radiated from the light emitting surfaces of the solid state light source. Even more preferable are materials with an emissivity greater than 0.7 for surface temperatures less than 200° C. A naturally convectively cooled surface with a natural convection coefficient of 20 W/m2/k with a surface temperature of 50° C. in a 25° C. ambient will transfer about 25% of its energy to the surrounding ambient radiatively if the surface emissivity is greater than 0.8 and can dissipate approximately 0.08 W/cm$^2$ of light source surface area. A similar naturally convectively cooled surface with a surface temperature of 100° C. can transfer 30% of its energy to the surrounding ambient radiatively and dissipate greater than 0.25 watts/cm$^2$ of surface area. A similar naturally convectively cooled surface with a surface temperature of 150° C. can transfer 35% of the heat radiatively and dissipate greater than 0.4 watts/cm$^2$. Given that solid state light sources can approach 50% electrical to optical conversion efficiency and that the typical spectral conversion is 300 lumens/optical watt, using this approach a self cooling solid state light source can emit 75 lumens for every 1.0 cm$^2$ of light source surface area. As an example, a ¼ inch×½ inch×2 mm thick self cooling light stick can generate more than 150 lumens while maintaining a surface temperature less than 100° C. The typical LED junction temperature for high powered devices can be over 120° C. and still maintain excellent life and efficiency. For surfaces with temperatures less than 120° C. the majority of the radiated energy is in the infrared with a wavelength greater than 8 microns. As such high emissivity coatings, materials, and surfaces, which are substantially transparent in the visible spectrum but with high thermal emissivity in the infrared, are preferred embodiments of self cooling light sources.

The emissivity of the materials in the infrared varies greatly. Glass has an emissivity of approximately 0.95 while aluminum oxide can be between 0.5 and 0.8. Organics such as polyimides can have fairly high emissivity in thick layers. This however will negatively affect the transfer of heat due to the low thermal conductivity of organics. As such high thermal conductivity high emissivity materials and coating are preferred. High emissivity/low visible absorption coatings are described in J. R. Grammer, "*Emissivity Coatings for Low-Temperature Space Radiators*", NASA Contract NAS 3-7630 (30 Sep. 1966). Various silicates are disclosed with emissivity greater than 0.85 and absorptions less than 0.2.

In order to maximize heat transfer to the ambient atmosphere, the need exists for luminescent thermally conductive materials which can effectively spread the heat generated by localized semiconductor and passive devices (e.g. LEDs, drivers, controller, resistors, coils, inductors, caps etc.) to a larger surface area than the semiconductor die via thermal conduction and then efficiently transfer the heat generated to the ambient atmosphere via convection and radiation. At the same time, these luminescent thermally conductive materials may optionally also efficiently convert at least a portion of the LED light emission to another portion of the visible spectrum to create a self cooling solid state light source with high lumen per watt efficiency and good color rendering. Conventional wavelength converters in both solid and powder form are substantially the same size as the LED die or semiconductor devices. This minimizes the volume of the luminescent material but localizes the heat generated within the luminescent element due to Stokes' losses and other conversion losses. In present day solid state light sources approximately 50% of the heat generated is within the luminescent material. By using a thermally conductive luminescent element with low dopant concentration, which also acts as a waveguide to the excitation light emitted by the LEDs, the heat generated by the luminescent conversion losses can be spread out over a larger volume. In addition, a more distributed light source can be generated rather than localized point sources as seen in conventional LED packages. In this manner the need for additional diffusing and optical elements can be eliminated or minimized. As such the use of translucent or partially transmitting luminescent thermally conductive elements with surface area greater than the semiconductor devices mounted on the luminescent elements is a preferred embodiment.

These and other embodiments of this invention are detailed in the description of figures below.

FIG. 1A depicts a prior art vertical LED die 3 mounted on a substrate 4. The vertical LED die 3 is typically coated with an inorganic/organic matrix 7 consisting of phosphor powder such as, but not limited to, Ce:YAG in a silicone resin material. The wire bond 2 is used to electrically connect vertical LED die 3 to interconnect 5, which is then coated with the inorganic/organic matrix 7. The other side of vertical LED die 3 is contacting interconnect 6 usually via eutectic solder or conductive adhesives. A lens 1 is further attached to substrate 4 to environmentally seal the assembly, enhance light extraction from vertical LED die 3, and modify the far field optical pattern of the light emitted by the device. In this case, emitted rays 9 are substantially traveling in the opposite direction of the heat ray 8.

As shown in the thermal schematic in FIG. 1A, cooling of the inorganic/organic matrix 7 occurs almost exclusively via thermal conduction through the vertical LED die 3 and into the substrate 4 via interconnect 6. The heat generated within inorganic/organic matrix 7 due to Stokes' losses and scattering absorption is thermally conducted to the vertical LED die 3 at a rate determined by the thermal resistance determined, by the bulk thermal conductivity of the inorganic/organic matrix 7. As shown in the simplified thermal schematic, the average temperature of the inorganic/organic matrix 7 is determined by the thermal resistance R (phosphor/encapsulant) and T2 the average temperature of the vertical LED die 3. In order for heat generated within the inorganic/organic matrix 7 to be dissipated to the ambient, it must move the thermal resistance of LED die 3 (RLED) and substrate 4 (R Package) before it can be dissipated to the ambient. This is a simplified thermal schematic, which lumps bulk and interface thermal resistances and spatial variations within the device. But in general, heat generated within the inorganic/organic matrix 7 must be dissipated mainly through the vertical LED die 3 due to low thermal conductivity of the other materials (e.g. Lens) which surround inorganic/organic matrix 7. Additional heat sinking means can further increase the surface area using metal, composite, or ceramic elements to enhance the dissipation of heat to ambient but the flow of heat is still basically the same. The lens 1 acts as an extraction element for the emitted light rays 9 but also acts as a barrier to thermal rays 8. Typically constructed of silicone or epoxy resins with thermal conductivity less than 0.1 W/mK, Lens 1 acts as a thermal insulator. Lens 1 also can limit thermal radiation from vertical LED 3 and inorganic/organic matrix 7 due to low emissivity. In general this design requires that approximate 50% of the isotropic emission from the active region within vertical LED 1 must be reflected off some surface within the device and that the far field output of the device be substantially directional or lambertian in nature. Even with the use of highly reflective layers, this represents a loss mechanism for this approach. These extra losses are associated with the added pathlength that the optical rays must go through and multiple reflections off the back electrodes. This added pathlength and reflections, which are required to extract the light generated in the active region of vertical LED 1, fundamentally reduces the efficiency of the LED based on the absorption losses of the LED itself. A significant portion of the light generated within the inorganic/organic matrix 7 must also pass through and be reflected by vertical LED 1. Since vertical LED 1 is not a lossless reflector, the added pathlength of these optical rays also reduce overall efficiency.

Figure 1B:
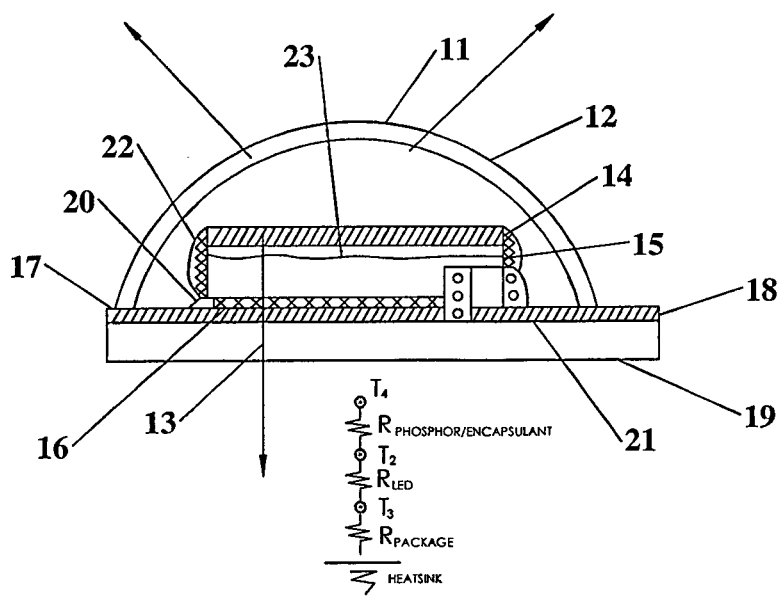
FIG. 1B depicts a side view of a prior art flip chip LED mounted on a substrate where the optical emission is substantially in the opposite direction of the heat removal.

FIG. 1B depicts a prior art flip chip mounted LED 15. Solder or thermo compression bonding attaches flip chip mounted LED 15 via contacts 16 and 21 to interconnects 17 and 18 respectively on substrate 19. Luminescent converter 14 may be an inorganic/organic matrix as discussed in FIG. 1A or solid luminescent element, such as a Ce:YAG ceramic, single crystalline Ce:YAG, polycrystalline Ce:YAG or other solid luminescent materials as known in the art. In either case, the same cooling deficiency applies with this design. Virtually all the cooling of the luminescent converter 14 must be through the flip chip mounted LED 15. Again, emission rays 12 travel in a direction substantially opposite to thermal rays 13 and once again approximately 50% the isotropic emission of the active region of the flip chip mounted LED 15 must to redirected within the device requiring the use of expensive metals like Ag, specialized coating methods and even nanolithography as in the case of photonic crystals.

The formation of contacts which are both highly reflective over a large portion of the LED die area and still forms a low resistivity contact has been a major challenge for the industry due to reflectivity degradation of Ag at the temperature typically required to form a good ohmic contact. This high light reflectivity and low electrical resistivity leads to added expense and efficiency losses. Because both the contacts must be done from one side typically an underfill 20 is used to fill in the voids created by the use of flip chip contacts. Lens 11 also forms a barrier to heat flow out of the device from both convectively and radiatively. The luminescent converter 14 is typically attached after the flip chip mounted die 15 is mounted and interconnected to substrate 19. A bonding layer 23 between the flip chip mounted die 15 and luminescent element 14 further thermally isolates the luminescent element 14. Typically, InGaN power LED UV/Blue chips exhibit efficiencies approaching 60% while White InGaN power LED packages are typically 40%. The loss within the luminescent converter 14 therefore represents a substantial portion of the total losses within the device. In the case of an inorganic/organic matrix luminescent converter of FIG. 1A, the conversion losses are further localized within the individual phosphor powders due to the low thermal conductivity of the silicone or epoxy matrix. The solid luminescent converter 14 has more lateral spreading due to the higher thermal conductivity of the solid material. Both cases are typically Cerium doped YAG with an intrinsic thermal conductivity of 14 W/mK. However since the silicone matrix has a thermal conductivity less than 0.1 W/mK and surrounds substantially all the phosphor powders, the inorganic/organic matrix has a macro thermal conductivity roughly equivalent to the silicone or epoxy by itself. Very high loading levels of phosphor powder can be used but lead to efficiency losses due to higher scatter.

There is simply nowhere for the heat generated in luminescent converter 14 to go except be thermally conducted into the flip chip mounted LED 15 via the bonding layer 23. In most cases, solid luminescent converters 14 must have an additional leakage coating 22 that deals with blue light that leaks out of the edge of the flip chip mounted LED 15. An inorganic/organic matrix suffers from the same issues in FIG. 1A. In both FIGS. 1A and 1B, the emission surface is substantially different from the cooling surfaces. The thermal schematic for FIG. 1B is similar to FIG. 1A in that heat generated within the luminescent converter 14 is substantially dissipated through the flip chip mounted LED 15. With the advent of high powered LEDs, a substantially portion of the heat generated within the device can be localized within luminescent converter 14. This localization has led to a variety of solutions including the use of remote phosphors. In general, luminescent converter 14 efficiency reduces as its average temperature T4 increases. In the prior art the luminescent converter 14 dissipates the majority of its heat through the flip chip mounted LED 15 with an average temperature of T5. This is an inherently higher temperature than the ambient. The need exists for techniques whereby the heat generated within luminescent converter 14 can be reduced for higher efficiency devices.

Figure 2A:
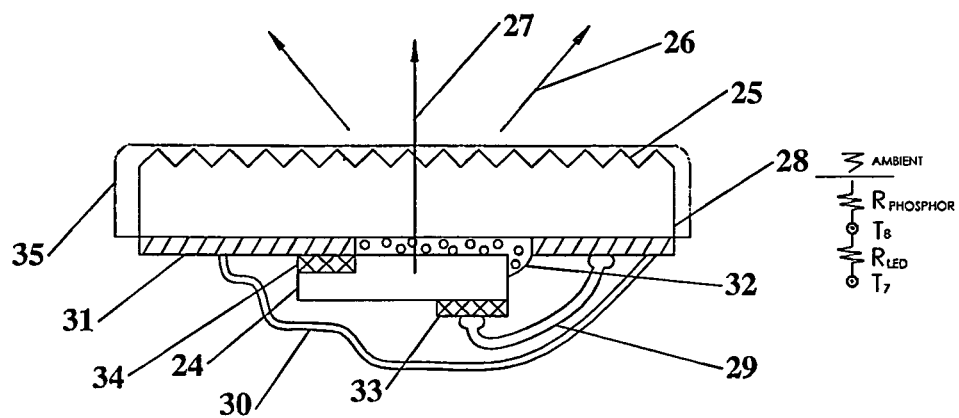
FIG. 2A depicts a side view of a vertical LED self cooling solid state light source of the present invention using luminescent thermally conductive luminescent elements and interconnects with thermal schematics of the present invention.

FIG. 2A depicts a vertical LED 24 of the present invention in which the optical emission rays 26 travel substantially in the same direction as the thermal rays 27. A thermally conductive luminescent element 25 provides wavelength conversion for at least a portion of the light emitted by vertical LED 24 and acts as an optical and thermal spreading element, extraction means, and a substrate for the electrical interconnect. In FIG. 2A, overcoat 30 may be reflective, transparent, partially reflective and exhibit reflectivity, which is wavelength and/or polarization dependent.

Wire bond 29 connects interconnect 28 to contact pad 33 with contact 34 attached via conductive ink or eutectic solder to interconnect 31. A transparent/translucent bonding layer 32 maximizes optical and thermal coupling into thermally conductive luminescent element 25 and eventually out of the device. The transparent/translucent bonding layer 32 may consist of, but is not limited to, glass fit, polysiloxane, polysilazane, silicone, and other transparent/translucent adhesive materials. Transparent/translucent bonding layer 32 has a thermal conductivity greater than 0.1 W/mK and even more preferably greater than 1 W/mK. Thermally conductive luminescent element 25 may consist of, but is not limited to, single crystal luminescent materials, polycrystalline luminescent materials, amorphous luminescent materials, thermally conductive transparent/translucent materials such as Sapphire, TPA, Nitrides, Spinel, cubic zirconia, quartz, and glass coated with a thermally conductive luminescent coating, and composites of thermally conductive transparent/translucent material and thermally conductive luminescent materials.

In FIG. 2A a high emissivity layer 35 may be applied to the thermally conductive luminescent element 25 to enhance radiative cooling. In addition, high emissivity layer 35 may also provide enhanced extraction efficiency by acting as an index matching layer between the surrounding air and the thermally conductive luminescent element 25, especially in the case where extraction elements are used to increase extraction from the thermally conductive luminescent element 25. Unlike the previous prior art thermal schematic, the flow of heat generated in the thermally conductive luminescent element 25 is directly coupled to the ambient via convective and radiative cooling off the surface of the thermally conductive luminescent element 25 itself. This direct coupling approach can only be effectively accomplished if the bulk thermal conductivity of the thermally conductive luminescent element 25 is high enough to effectively spread the heat out over an area sufficiently large enough to effective transfer the heat to the surrounding ambient. As such, a thermally conductive luminescent element has a surface area greater than the attached LED with an average bulk thermal conductivity greater than 1 W/mK wherein the heat generated within the Vertical LED 24 and thermally conductive luminescent element 25 are substantially transferred to the surrounding ambient via convection and radiation off the surface of thermally conductive luminescent element 25. High emissivity layer 35 most preferably has an emissivity greater than 0.8 at 100° C. and an absorption less than 0.2 throughout the visible spectrum. Alternately, the emissivity of the thermally conductive luminescent element 25 may be greater than 0.8 at 100° C. and have an absorption less than 0.2 throughout the visible spectrum.

Figure 2B:
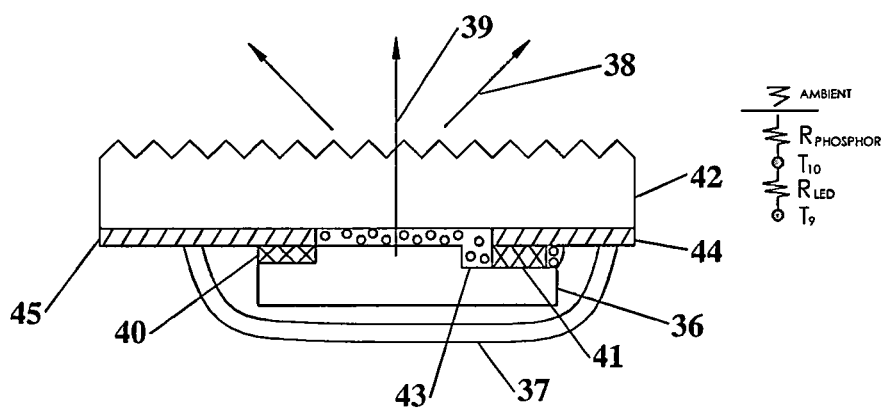
FIG. 2B depicts a side view of a flip chip LED self cooling solid state light source of the present invention using luminescent thermally conductive luminescent elements and interconnects with thermal schematics of the present invention.

FIG. 2B depicts a flip chip mounted LED 36 mounted on thermally conductive luminescent element 42 via a transparent/translucent bonding layer 43 and electrically connected via contacts 41 and 40 to interconnects 44 and 45 on thermally conductive luminescent element 25. Interconnects 44 and 45 are thick film silver conductors formed via screen printing, inkjet printing, lithographic means, or combinations of these other methods. As an example, thermally conductive luminescent element 42 may contain a laser cut trench approximately 5 micron deep into which silver paste is screen printed and fired. The surface of conductive luminescent element 42 is then optionally lapped to create a smooth surface for interconnect 44 and 45. The resulting surface is now smooth enough for thermo compression bonded die, direct die attach die with integral eutectic solders, and other direct attach bonding methods. The interconnects 44 and 45 are typically fired at a temperature greater than 400° C. The interconnects 44 and 45 are thick film or inkjet silver traces with line widths less than or greater than the width of the flip chip mounted LED 36. Optical losses within the device can be minimized by minimizing the amount of silver used, minimizing the width of the interconnect traces and maximizing the reflectivity of the silver traces. Alternately, the thermal resistance between flip chip mounted LED 36 and the thermally conductive luminescent element 42 may be minimized by increasing the amount of silver thickness or area. Overcoat 37 may consist of, but is not limited to, glass frit, polysiloxane, polysilazanes, flame sprayed ceramics, and evaporative/CVD coatings. A highly reflective layer in overcoat 37 is optional. In this manner, a compact directional light source can be formed. Transparent/translucent bonding layer acts as an environmental and shorting barrier for the device. The reflector in overcoat 37 can be applied after all the high temperature processing thereby maximizing reflectivity of the layer. The thermal schematic shown in FIG. 2B again shows that there is a much different thermal conduction path than FIG. 1 devices. Thermally conductive luminescent element 42 provides the cooling surfaces for the device as well as conversion of light from LED 36. The emitting surface of the device is also the cooling surface of the device.

Figure 2C:
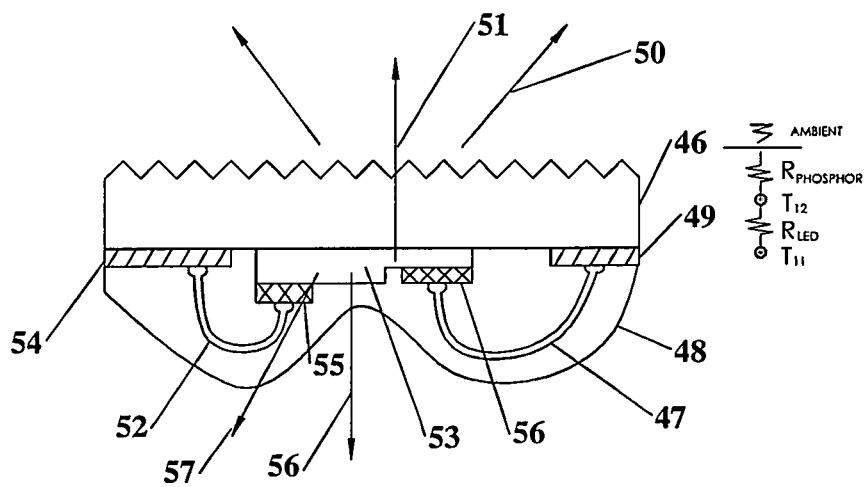
FIG. 2C depicts a side view of a lateral LED self cooling solid state light source of the present invention using luminescent thermally conductive luminescent elements and interconnects with thermal schematics of the present invention.

FIG. 2C depicts a lateral LED 53 mounted onto thermally conductive luminescent element 46. As in FIG. 2A and FIG. 2B, the optical emission 50 and thermal rays 51 travel in substantially the same direction. In this configuration, a transparent/translucent overcoat 48 couples thermal rays 56 and optical emission 57 out the backside of the device. Optical emission 50 and optical emission 57 may be the same or different from each other regarding emission spectrum, intensity, or polarization. Additives, coatings, and combinations of both can affect the emission spectrum, intensity and polarization within overcoat 48. Interconnect 49 and 54 may consist of, but are not limited to, electrically conductive materials in a dielectric matrix. A silver flake thick film paste screen can be printed and fired at greater than 400° C. with a reflectivity greater than 50% to form an electrically conductive material in a dielectric matrix. Wire bond 47 and 52 connect LED contacts 56 and 55 to interconnect 49 and 54 respectively. Gold wire is preferred but the wire bond can be silver, silver coated gold, and aluminum in wire, foil, and tape form. The thermal schematic illustrates the flow of heat through the device to ambient. Transparent/translucent overcoat 48 may also contain luminescent materials. As an example, transparent/translucent overcoat 48 may consist of inorganic/organic matrix material such as but not limited to HT 1500 Polysilazane (Clariant Inc.) containing at least one luminescent materials such as, but not limited to, Eljen EJ-284 fluorescent dye for conversion of green and yellow emission into red. Luminescent coatings can be applied via dip coating, spraying, inkjet, and other deposition techniques to form transparent/translucent overcoat 48 on a light emitting device containing at least one thermally conductive luminescent element 46.

Figure 3A:
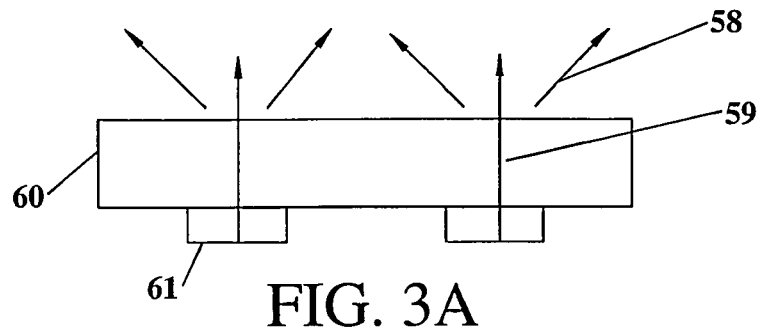
FIG. 3A depicts a side view of a single thermally conductive luminescent element attached onto at least one LED of a self-cooling solid state light source of the present invention.

FIG. 3A depicts a self cooling light source consisting of a single thermally conductive luminescent element 60 attached both thermally and optically onto at least one LED 61. LED 61 may consist of InGaN, GaN, AlGaN, AlInGaP, ZnO, AlN, and diamond based light emitting diodes. Both blue and red light emitting diodes such as, but not limited to, InGaN and AlInGaP LEDs are attached optically and thermally to at least one thermally conductive luminescent element 60. Heat 59 and emission 58 generated by the LED 61 and the thermally conductive luminescent element 60 are spread out over a substantially larger area and volume than the LED 61. In this manner the heat generated can be effectively transferred to the surrounding ambient.

Ce:YAG in single crystal, polycrystalline, ceramic, and flame sprayed forms are preferred materials choices for thermally conductive luminescent element 60. Various alloys and dopants may also be used consisting of but not limited to gadolinium, gallium, and terbium. The thermally conductive luminescent element 60 can be single crystal cerium doped YAG grown via EFG with a cerium dopant concentration between 0.02% and 2%, preferably between 0.02% and 0.2% with a thickness greater than 500 microns. Alternatively, the thermally conductive luminescent element 60 can be flame sprayed Ce:YAG with an optional post annealing. The thermally conductive luminescent element 60 can be formed by flame spraying, HVOF, plasma spraying under a controlled atmosphere directly onto the LED 61. This approach maximizes both thermal and optical coupling between the thermally conductive luminescent element and LED 61 by directly bonding to LED 61 rather than using an intermediary material to bond the LED 61 to thermally conductive luminescent element 60. Alternately, the thermally conductive luminescent element 60 maybe formed using at least one of the following methods; hot pressing, vacuum sintering, atmospheric sintering, spark plasma sintering, flame spraying, plasma spraying, hot isostatic pressing, cold isostatic pressing, forge sintering, laser fusion, plasma fusion, and other melt based processes. Thermally conductive luminescent element 60 may be single crystal, polycrystalline, amorphous, ceramic, or a melted composite of inorganics. As an example, 100 grams of alumina and Ce doped Yag powder, which have been mixed together, are placed into a container. The powders are melted together using a 2 Kw fiber laser to form a molten ball within the volume of the powder. In this manner the powder acts as the crucible for the molten ball eliminating any contamination from the container walls. The use of the fiber laser allows for formation of the melt in approximately 4 seconds depending on the beam size. While still in a molten state the ball may optionally be forged between SiC platens into a plate. Most preferably the molten ball is greater than 10 mm in diameter to allow sufficient working time as a molten material for secondary processing The plate may be further processed using vacuum sintering, atmospheric sintering, or hot isostatic pressing to form a translucent thermally conductive luminescent element 60. The use of fiber laser based melt processing is a preferred method for the formation of luminescent oxides, nitrides, and oxynitrides as a method of reducing energy costs compared to hot pressing or vacuum sintering. The use of controlled atmospheres including vacuum, oxygen, hydrogen, argon, nitrogen, and ammonia during the laser based melting processes is disclosed. While fiber lasers are preferred the use of localized actinic radiation to form a molten mass within a powder mass to form thermally conductive luminescent element 60 is disclosed.

Figure 3B:
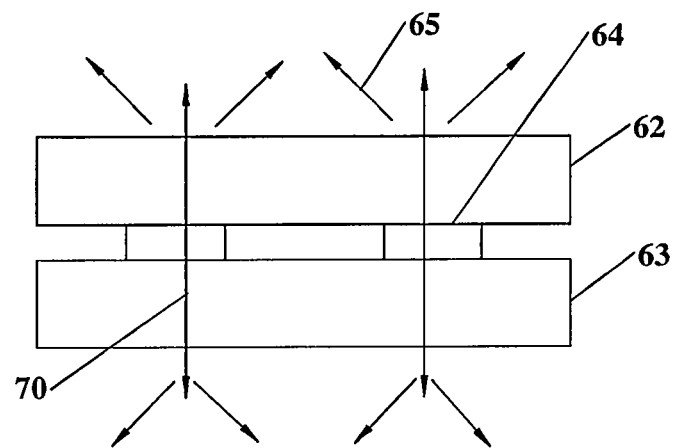
FIG. 3B depicts a side view of at least two thermally conductive luminescent elements attached to at least one LED of a self-cooling solid state light source of the present invention.

FIG. 3B depicts a self cooling light source consisting of at least two thermally conductive luminescent elements 62 and 63 attached to at least one LED 64. In this case, both thermal emission 64 and optical emission 65 can be spread out and extracted from both sides of LED 64. In all cases, multiple LEDs allow for parallel, series, anti-parallel, and combinations of all three with the appropriate electrical interconnect. In this case, optical emission 65 can be substantially similar or different on the two sides of the devices. As an example, thermally conductive luminescent element 62 can be 1 mm thick single crystal Ce doped YAG formed via EFG bottle, which is then sliced into 19 mm.times.6 mm wafers. The sliced surface enhances extraction of the Ce:YAG emission out of the high index of refraction Ce:YAG material. Alternately, thermally conductive luminescent element 63 may be a pressed and sintered translucent polycrystalline alumina with a thermally fused layer of Mn doped Strontium Thiogallate and a layer of Eu doped Strontium Calcium Sulfide within a glass frit matrix. In this manner, a wide range of optical emission spectrums can be created.

In this particular case, the two sides of the devices will emit slightly different spectrums. In general, unless an opaque reflector is placed between thermally conductive luminescent elements 62 and 63 there will be significant spectral mixing within this device. This configuration can be used for quarter lights, wall washers, chandeliers, and other light fixtures in which a substantial portion of the optical emission 65 is required to occur in two separate directions. Directional elements such as BEF, microoptics, subwavelength elements, and photonic structures impart more or less directionality to the optical emission 65 of either thermal conductive luminescent elements 62 and/or 63.

In another example, Cerium doped YAG is formed via flame, HVOF, or plasma spraying and then optionally annealed, spark plasma sintered, microwave sintering, or HIP to improve its luminescent properties for one or both thermally conductive luminescent element 62 and/or 63. At least one InGaN LED and at least one AlInGaP LEDs are used for at least one LED 64.

In yet another example, high purity aluminum oxide is flame sprayed directly onto at least one LED die 64 for thermally conductive luminescent element 62 forming a translucent reflector. The emissivity of flame sprayed aluminum oxide is typically 0.8 allowing for enhanced radiative cooling from that surface. Thermally conductive luminescent element 63 is single crystal Ce:YAG formed via skull melting and sliced into 0.7 mm thick wafers 0.5 inch.times.1 inch in area with a cerium doping concentration between 0.1% and 2%. In this case thermally conductive luminescent element 62 does not necessarily contain a luminescent material but acts as diffuse reflector and thermal spreading element for the heat generated by both LED 64 and thermally conductive luminescent element 62. By embedding LED 64 directly into thermally conductive luminescent element 62 it is possible to eliminate pick and place, die attachment processes and materials, and maximize both thermal transfer 64 and optical emission 65 by eliminating unnecessary interfaces. Additional luminescent materials and opaque reflectors can be positioned within or coating onto either thermally conductive luminescent elements 62 or 63. Pockets or embedded die can recess the die such that printing techniques including but not limited to inkjet, silkscreen printing, syringe dispensing, and lithographic means.

Figure 3C:
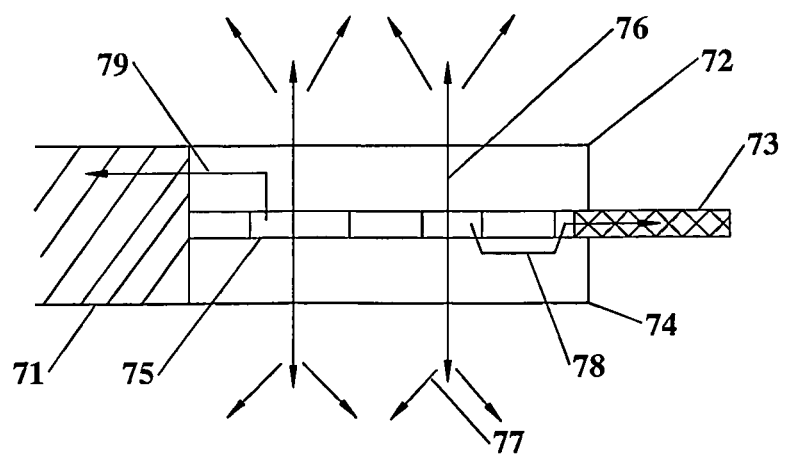
FIG. 3C depicts a side view of two thermally conductive luminescent elements of a self-cooling solid state light source of the present invention.

FIG. 3C depicts two thermally conductive luminescent elements 72 and 74 providing thermal conduction paths 74 and 79 to additional cooling means 71 and 73. In this case, thermally conductive luminescent elements 72 and 74 allow for thermal emission 76 and optical emission 77 and also provide for thermal conduction paths 74 and 79. Additional cooling means 71 and 73 may also provide for electrical connection to LED 75 via interconnect means previously disclosed in FIG. 2. One or more additional cooling means 71 and 73 further enhance the amount of heat that can be dissipated by the device. As an example, a typical natural convection coefficient is 20 W/m2/K and Ce:YAG has an emissivity of 0.8 near room temperature. A self cooling light source consisting of two ¼ inch.times.½ inch.times.1 mm thick pieces of Ce:YAG 72 and 74 with four direct attach LEDs 75 soldered on silver thick film interconnect traces has a surface area of approximately 2.3 cm2. Using natural convection and radiative cooling approximately 500 milliwatts of heat can be dissipated off the surface of the self cooling light source if the surface temperature is approximately 100° C. and the ambient is 25° C. and the emissivity is 0.8. Of the 500 milliwatts, 350 milliwatts of heat is dissipated via natural convection cooling and 150 milliwatts are dissipated via radiation. A typical 4000° K spectrum output has an optical efficiency of 300 lumens per optical watt. If the solid state light source has a electrical to optical conversion efficiency of 50%, 500 milliwatts of optical output is generated for every 500 milliwatts of heat generated. Under these conditions a ¼ inch.times.½ inch solid state light source operating with a surface temperature of approximately 100° C. can output 150 lumens without the need for additional heat sinking means. The use of additional cooling means 71 and 73 can be used to significantly increase this output level by increase the surface area that heat can be convectively and radiatively transferred to the ambient. As is easily seen in the example, increasing the surface area is directly proportional to amount of heat that can be dissipated. It is also clear that the electrical to optical conversion efficiency dramatically affects the amount of heat generated, which is a key attribute of this invention. Unlike conventional LED packages light generated within this self cooling solid state light source is extracted out of both sides of the device. Isotropic extraction as shown has a 20% theoretical higher efficiency than lambertian extraction. Also using this approach, the temperature difference between the LED 75 junction and the surfaces of thermally conductive luminescent elements 72 and 74 can be very low if the thermal conductivity is greater than 10 W/mK and the LEDs 75 are attached such that there is low thermal resistance to the surrounding thermally conductive luminescent elements 72 and 74. In addition, cooling means 71 and 73 may be physically different to allow for the device to connect to different external power sources correctly. As an example, cooling mean 71 may be a pin and cooling means 73 maybe a socket such that a keyed electrical interconnect is formed. Alternately, cooling means 71 and 73 may contain magnets, which allow for attachment of external power sources. Even more preferably the magnets have different polarity such that a keyed interconnect can be formed. Additional cooling means 71 and 73 may include, but are not limited to, heat pipes, metals, glass, ceramics, boron nitride fibers, carbon fibers, pyrolytic graphite films, and thermally conductive composites. As an example, boron nitride nanotube fibers, as provided by BNNT Inc., are pressed with exfoliated boron nitride flakes to form and thermally interconnected skeleton matrix using pressing, cold isostatic pressing, warm isostatic pressing, and/or hot isostatic pressing to form a solid sheet. The boron nitride nanotube fibers interconnect the boron nitride flakes and bond to the surface of the boron nitride flakes such that a continuous thermal matrix is formed. The resultant skeleton matrix may then be infused with polymeric or polymeric ceramic precursors including but not limited to polysilazane, polysiloxane, glasses, silicones, and other polymeric materials to form a composite. Alternatively, the boron nitride nanotube fibers may be foamed into a yarn and woven into a cloth or felt and then infused with to form a thermally conductive composite. Alternately, high thermal conductivity carbon fibers and films may be used but boron nitride is preferred due to its low optical absorption compared to carbon based approaches. Alternately, carbon based additional cooling means 71 and 73 may include a reflective layer to reduced absorption losses and redirect light from the source as well as provide additional cooling. Additional cooling means 71 and 73 may also diffuse, reflect, or absorb optical emission 77 emitting between or from the adjacent edge of thermally conductive luminescent element 72 or 74. In this manner the far field emission of the device can be adjusted both from an intensity and spectral standpoint. Doubling the surface cooling area using additional cooling means 71 and 73 approximately doubles the lumen output as long as the thermal resistance of the additional cooling means 71 and 73 is low.

Figure 4A:
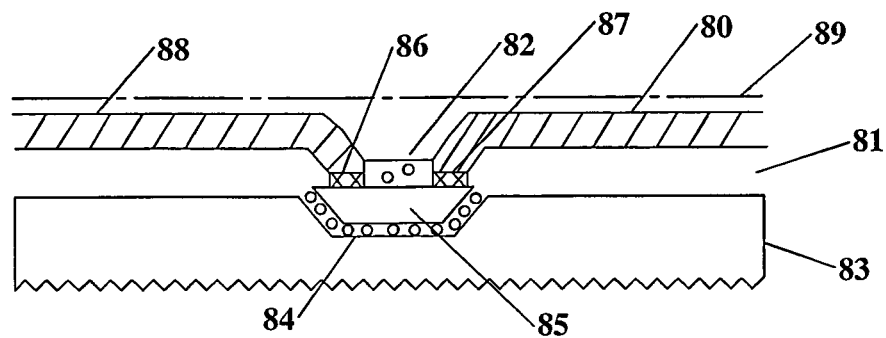
FIG. 4A depicts a side view of a LED embedded within a thermally conductive luminescent element of the present invention.

FIG. 4A depicts at least one LED 85 embedded within thermally conductive luminescent element 83. Thermally conductive luminescent element 83 may be formed via press sintering of aluminum oxide as known in the art to form a translucent polycrystalline alumina TPA with depressions sufficiently deep enough to allow for LED 85 to be recessed. Luminescent coating 84 may be substantially only in the pocket formed in thermally conductive luminescent element 83 or may cover substantially all the surfaces of thermally conductive luminescent element 83.

Alternately, single crystal, polycrystalline or amorphous phosphor, pieces, plates, rods and particles can be fused or bonded into or onto thermally conductive luminescent element 83. In this manner, the quantity of luminescent material can be minimized while maintaining high thermal conductivity for the thermally conductive luminescent element 81.

As an example, single crystal Ce:YAG pieces 1 mm×1 mm and 300 microns thick can be fusion bonded into 1.1 mm×1.1 mm×500 micron deep pockets formed into TPA press sintered plates and then fired at 1700° C. in a vacuum for 10 hours such that the single crystal YAG pieces are optical and thermally fused into the bottom of the TPA pockets. LED 85 can then be bonded into the remaining depth of pocket and be used to excite the single crystal Ce:YAG pieces locally. The combined optical emission from LED 85 and the single crystal Ce:YAG pieces would be spread out and extracted by the sinter pressed TPA while still maintaining high thermal conductivity.

Alternately, luminescent powders in glass fits, polysiloxane, polysilazane, and other transparent binders can food luminescent coating 84. In particular, high temperature binders in luminescent coating 84 such as polysilazane with luminescent powders, flakes, rods, fibers and in combination both pre-cured and as a bonding agent can be positioned between thermally conductive luminescent element 83 and at least one LED 85.

Materials with high visible spectrum transmission, lower refractive index, high thermal conductivity, and low processing costs for net and final shape are preferred materials for thermally conductive luminescent element 83. These materials include, but are not limited to, TPA, Spinel, Quartz, Glass, ZnS, ZnSe, ZnO, MgO, AlON, ALN, BN, Diamond, and Cubic Zirconia. In particular, Spinel and TPA formed via press sintering are low cost of manufacture of net shape parts. The use of techniques used to form TPA parts as seen in transparent dental braces as known in the art with luminescent elements either as coatings or bonded elements can create thermally conductive luminescent element 83.

With LED 85 recessed into thermally conductive luminescent element 83, printing and lithographic methods can be used to electrically interconnect at least one LED 83 to outside power sources and/or other LEDs or devices. Unlike wirebonding, this approach creates a low profile method of interconnecting LEDs, which eases assembly of multiple sticks and reduces costs.

In one example, LED 85 is bonded into a pocket formed via laser ablation in a 1 mm thick wafer of Spinel to form thermally conductive luminescent element 83. In this example the Spinel may or may not include luminescent elements or properties. The majority of the wavelength conversion instead occurs locally around LED 85 via luminescent coating 84 and/or additional luminescent coating 82. This minimizes the amount of luminescent material necessary yet still allows for a low thermal resistance to ambient for the luminescent materials. While only a single side is shown in FIG. 4, the light source may also be bonded to another light source, heat sink, another transparent/translucent thermally conductive element to further enhance cooling and optical distribution from LED 85 and any luminescent elements within the light source. LED 85 is bonded into the pocket using polysilazane containing 0.1% to 2% doped Ce:YAG powder with a particle size below 10 microns.

Transparent/translucent dielectric layer 81 is inkjet printed over at least one LED 85 except contact pads 87 and 86. In the case where LED 85 uses TCO based contacts, at least a portion of the TCO is not covered by transparent/translucent dielectric 81 to allow for electrical contact. Optionally an additional luminescent coating 82 may be printed or formed on at least one LED 85 to allow for additional wavelength conversion and to create a more uniform spectral distribution from the device. Interconnects 80 and 88 may then be applied either before or after curing of transparent/translucent dielectric 81. Polysilazane, polysiloxane, glass frit, spin-on glasses, and organic coatings are examples of transparent/translucent dielectric 81, preferably the coatings can maintain transparency above 300° C. Formulations containing Polysilazane with and without luminescent elements are preferred materials for additional luminescent coating 82, transparent/translucent dielectric 82 and luminescent coating 84. Preferred luminescent elements are powder phosphors, quantum dots, fluorescent dyes (example wavelength shifting dyes from Eljen Technologies) and luminescent flakes and fibers.

Electrical connection to LED 85 is via interconnects 80 and 88 for lateral LED designs. Precision inkjet printing of silver conductive inks and/or screen printing of thick film silver inks form interconnects 80 and 88. As an example thick film silver paste is screen printed and fired onto thermally conductive luminescent element 83 up to the pocket for LED 85. Transparent/translucent dielectric 81 is inkjet printed such that only contacts 87 and 86 are left exposed and the transparent/translucent dielectric 81 covers the rest of the exposed surface of LED 85 and at least a portion of thermally conductive luminescent element 83 in a manner to prevent shorting out LED 85 but still allowing access to the thick film silver paste conductors applied earlier. After or before curing of transparent/translucent dielectric 81 and optionally additional luminescent coating 82, conductive ink is inkjet printed connecting the thick film silver conductor applied previously to the contacts 86 and 87. Using this approach, alignment issues can be overcome due to the availability of inkjet systems with image recognition and alignment features while still allowing for low resistance conductors. In general, while inkjet printing of conductors can be very accurate and be printed with line widths under 50 microns, the thickness is typically limited to under 10 microns which limits the current carry capacity of long lines. Using this approach, thick film silver conductors which can be over 50 microns thick can be used to carry the majority of the current and then short inkjet printed traces can be used to stitch connect between the thick film silver conductors and contacts 87 and 86. Using this approach, gold wire bonding can be eliminated.

A transparent/translucent overcoat 89 may be applied over at least a portion of interconnects 80 and 89 and/or transparent/translucent dielectric 81, additional luminescent coating 82, and thermally conductive luminescent element 83 to environmentally and/or electrically isolate the device. Protective barrier layers on LED die 85 can be formed during LED fabrication to facilitate or even eliminate the need for transparent/translucent dielectric layer 81 and allow for direct printing of interconnect 89 and 88 onto contacts 87 and 86 respectively. Catalytic inks and/or immersion plating techniques allow for the formation of thicker/lower resistivity traces for interconnect 89 and 88, eliminate the need for thick film printing and allow for the use of inkjet printing for the entire interconnect. Preferred materials for transparent/translucent overcoat 89 include but are not limited to polysilazane, polysiloxane, spin-on glasses, organics, glass frits, and flame, plasma, HVOF coatings. Planarization techniques based on spin-on glasses and/or CMP can be used for transparent/translucent overcoat 89. Luminescent elements including but not limited to powders, flakes, fibers, and quantum dots can be incorporated in transparent/translucent overcoat 89, transparent/translucent dielectric 81, and additional luminescent coating 82. Luminescent elements may be spatially or uniformly dispersed in these layers.

Figure 4B:
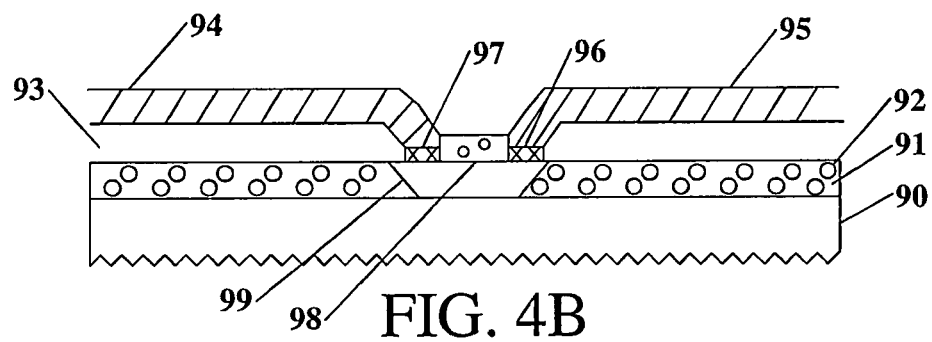
FIG. 4B depicts a side view of a luminescent layer formed on a transparent/translucent element containing extraction elements of the present invention.

FIG. 4B depicts a light source in which a luminescent layer 91 is formed on a transparent/translucent element 90 containing extraction elements. Transparent/translucent element 90 can be, but is not limited to, single crystalline materials such as sapphire, cubic zirconia, YAG (doped and undoped), ZnO, TAG (doped and undoped), quartz, GGG (doped and undoped), GaN (doped and undoped), AlN, oxynitrides (doped and undoped), orthosilicates (doped and undoped), ZnS (doped and undoped), ZnSe (doped and undoped), and YAGG (doped and undoped), polycrystalline materials, and amorphous materials such as glass, ceramic YAG (doped and undoped), ALON, Spinel, and TPA. In general, single crystal materials grown via verneuil, EFG, HEM, Czochralski, CVD, hydrothermal, skull, and epitaxial means can be the transparent/translucent element 90.

Luminescent layer 91 may be formed directly one transparent/translucent element 90 or be formed separately and then bonded to transparent/translucent element 90. Flame spraying, plasma spraying, and HVOF techniques can form either or both luminescent layer 91 and transparent/translucent element 90. The light source can have a transparent/translucent element 90 with an alpha less than 10 cm$^{-1}$ throughout the visible spectrum and a luminescent layer 91 containing at least one luminescent element emitting between 400 nm and 1200 nm. The luminescent layer 91 can exhibit a refractive index, which is not more than 0.2 different than transparent/translucent element 90. LED 99 may be InGaN, AlInGaP, ZnO, BN, Diamond, or combinations of InGaN, AlInGaP, ZnO, BN, or diamond. Both InGaN and AlInGaP LEDs can be used for LED 99 combined with a transparent/translucent element 90 consisting of at least one of the following materials; sapphire, Spinel, quartz, cubic zirconia, ALON, YAG, GGG, TPA, or ZnO and luminescent layer 91 and/or additional luminescent layer 98 containing Ce doped YAG. An additional red phosphor emitting between 585 and 680 nm can be used within luminescent layer 91 and/or additional luminescent layer 98. These elements form a self cooling light source, which emits an average, color temperature between 6500° K and 1200° K that lies substantially on the black body curve is a preferred embodiment of this invention. The self cooling light source can emit an average color temperature between 4000° K and 2000° K than lies substantially on the blackbody curve.

Multiple self cooling light sources can be used within a fixture, reflector, optic or luminaire such that color and intensity variations are averaged out in the far field. Three or more self cooling light sources within a fixture, reflector, optic or luminaire creates a uniform illumination at a distance greater than 6 inches from the sources. Transparent/translucent dielectric layer 93 may be inkjet printed, silk screen printed, formed via lithographic means and exhibits an alpha less than 10 cm$^{-1}$ throughout the visible spectrum. Interconnect 95 and 94 may be printed using inkjet, silkscreen, template, or lithographic means. Catalytic inks and immersion plating techniques increase conductor thickness and thereby reduce resistivity. Silver traces with a trace width less than 500 microns and a reflectivity greater than 50% for interconnect 95 and 94 reduce absorption of the light generated within the light source. Contacts 96 and 97 on LED 99 may be on one side only as in lateral devices or consist of one top contact and one side contact as previously disclosed in US Patent Application 20060284190, which is commonly assigned and incorporated by reference into this invention.

Figure 4C:
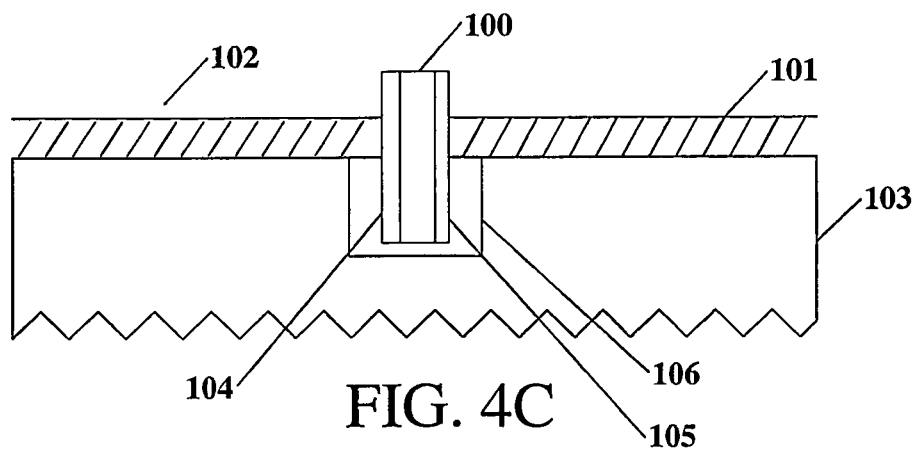
FIG. 4C depicts a side view of a self-cooling light source with at least one vertical LED mounted to or at least partially embedded in a thermally conductive luminescent element of the present invention.

FIG. 4C depicts a self-cooling light source with at least one vertical LED 100 mounted to or at least partially embedded in thermally conductive luminescent element 103. Composite, layer, single crystal, polycrystalline, amorphous, and combinations as described previously can be used for the thermally conductive luminescent element 103. In this particular example, one vertical LED 100 is mounted such that interconnect 101 and 102 may be printed via inkjet, silk screening, or lithographic means directly on thermally conductive luminescent element 103 and in contact with a side of vertical LED 100. This embodiment eliminates the need for an additional dielectric and allows for the use of vertical LED devices, which inherently exhibit lower Vf than lateral devices. A substrate free LED as described in US Published Patent Application No. 20090140279 (which is commonly assigned and incorporated by reference into this invention) is a preferred embodiment for LED 100. Direct die attach and flip chip mounting configurations may also be used for LED 100. For the substrate free case, InGaN and/or AlInGaP vertical LED 100 has TCO contacts 104 and 105 for LED 100 wherein the interconnects 101 and 102 are thick film silver inks which form ohmic contact to the adjacent TCO contact 104 and 105. In this manner, absorption losses are minimized and the need for lithographic steps to fabricate LED 100 is eliminated or minimized. A self cooling light source contains at least one vertical LED 100 with TCO contacts 104 and 105 connected via thick film silver traces for interconnect 101 and 102 directly bonded to TCO contacts 104 and 105 on a thermally conductive luminescent element 103. Optionally, bonding layer 106 may be used to mount, improve extraction, incorporate additional luminescent materials or position LED 100 onto or within thermally conductive luminescent element 103.

FIG. 5 depicts various shapes of thermally conductive luminescent elements. FIG. 5A depicts a substantially flat luminescent element 107. Thickness is a function of dopant concentration but typically the thickness ranges from 200 micron to 2 mm for a uniformly doped Ce doped YAG with a Cerium doping concentration between 0.02% and 10%. In order for efficient thermal spreading to occur, the thermal conductivity of the thermally conductive luminescent element 107 needs to be greater than 1 W/mK to adequately handle average power densities greater than 0.1 W/cm2 of surface area on luminescent element 107. If the thermal conductivity is to low there is insufficient thermal spreading of the heat generated within the device which decreases the ability of the flat luminescent element 107 to cool itself via natural convection and radiative means.

Figure 5A:
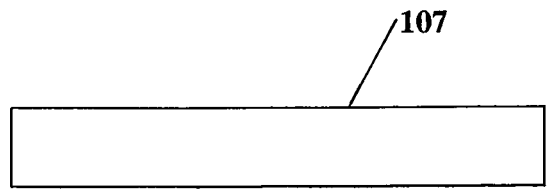
FIG. 5A depicts a side view of a substantially flat luminescent element of the present invention.
Figure 5B:
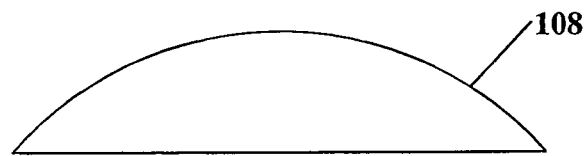
FIG. 5B depicts a side view of a hemispheric luminescent element of the present invention.

FIG. 5B depicts a non-flat (hemispheric) luminescent element 108. In this case, light extraction can be enhanced for those rays, which are waveguiding within the higher refractive index of non-flat luminescent element 108. In addition, far field intensity and wavelength distributions can be modified. Multiple smaller self cooling light sources with the same or different shaped thermally conductive luminescent elements create uniform or specific far field intensity and wavelength distributions. The extraction of light generated within a medium with a refractive index greater than air is restricted by total internal reflection per Snell's Law. Shaped luminescent elements 108 can be used to reduce the average optical path length of optical rays required to escape the luminescent element 108. Since absorption losses are directly proportional to the optical path length for a given absorption coefficient (alpha), reducing the average optical path length directly translates into reduced absorption losses. The spatial location of where the optical rays are generated within luminescent element 108, the refractive index of luminescent element 108, absorption coefficient (alpha) of luminescent element 108, bulk and surface scattering within and on luminescent element 108, and the geometry of luminescent element 108 can all be modeled as known in the art to optimize the extraction efficiency.

Figure 5C:
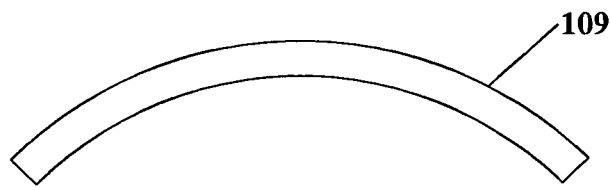
FIG. 5C depicts a side view of a curved thermally conductive luminescent element of the present invention.

FIG. 5C depicts a non-flat (curved) thermally conductive luminescent element 109 with a substantially uniform thickness. In this manner, extraction can be enhanced by maintaining a uniform thickness of luminescent material. Extrusion, pressing, molding, sawing, boring, and flame spraying techniques as known in the art may be used to fabricate various shapes of thermally conductive luminescent elements.

Figure 5D:
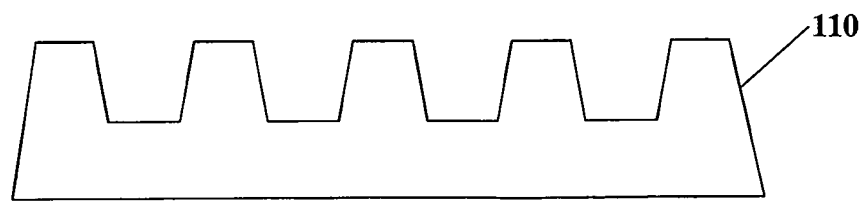
FIG. 5D depicts a side view of a rectangular saw tooth thermally conductive luminescent element of the present invention.

FIG. 5D depicts a non-flat (rectangular saw tooth) thermally conductive luminescent element 110 with additional surface elements to enhance convection cooling and optionally to modify or homogenize the emission output of the self-cooling light source. Extrusion, pressing, and molding techniques may be used to form thermally conductive luminescent element 110.

Figure 6A:
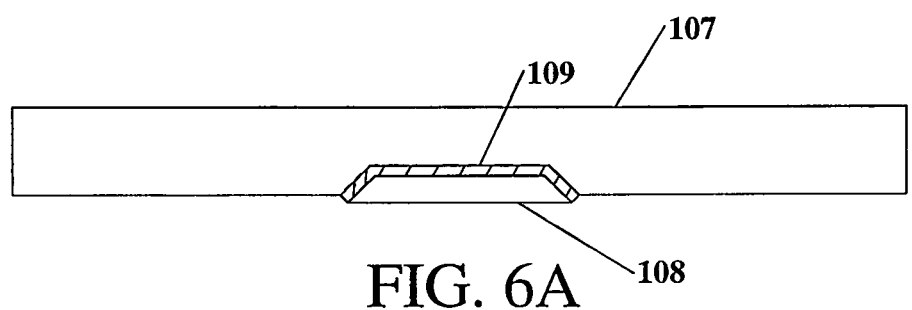
FIG. 6A depicts a side view of a partially embedded LED 108 within a thermally conductive luminescent element of the present invention.

FIG. 6A depicts a partially embedded LED 108 within a depression in thermally conductive luminescent element 107 mounted via bonding layer 109. The formation of the depression may be by laser machining, electron beam machining, etching (both chemical and mechanical), plasma etching, molding, and machining means. Substrate-free LEDs may be used for partially embedded LED 108 with a thickness less than 300 microns. By embedding partially embedded LED 108 in thermally conductive wavelength conversion element 107, the thermal resistance between the two elements can be reduced which lowers the junction temperature of the LED for a given drive level. Optionally, more of the emission from partially embedded LED into thermally conductive luminescent element 107 can be coupled thereby changing the color temperature of the self cooling light source.

Figure 6B:
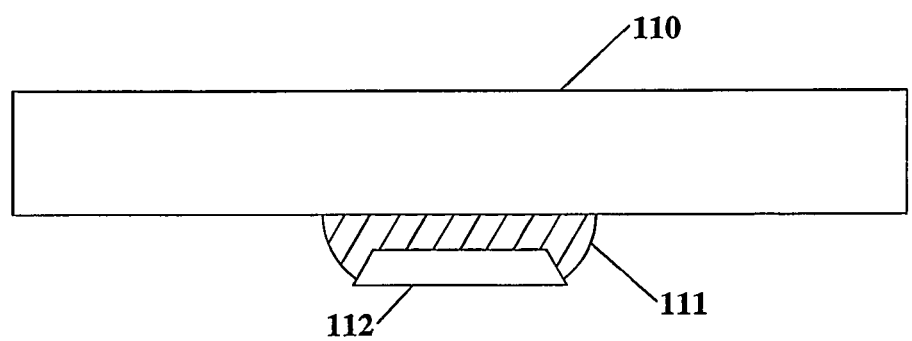
FIG. 6B depicts a side view of at least one LED bonded onto a thermally conductive luminescent element of the present invention.

FIG. 6B depicts at least one LED 112 bonded onto thermally conductive luminescent element 110 via bonding layer 111. In this case, bonding layer 111 should exhibit a thermal conductivity greater than 1 W/mK and an alpha less than 10 cm$^{-1}$ for the emission wavelengths of LED 112.

Figure 7A:
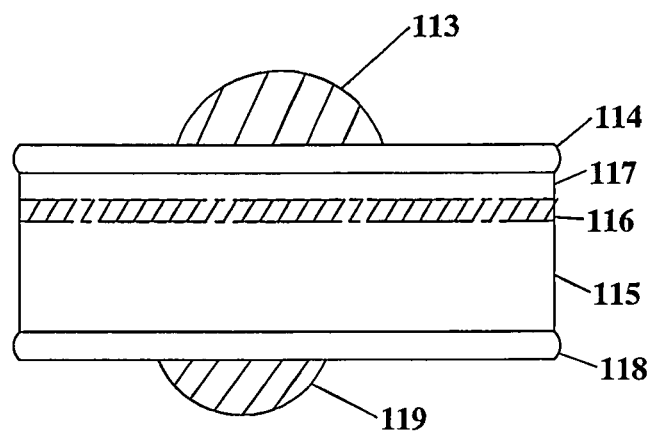
FIG. 7A depicts a side view of a vertical LED with printed interconnections of the present invention.

FIG. 7 depicts various printed contacts for TCO contact based LEDs. FIG. 7A depicts a vertical LED consisting of a top silver paste contact 113 on TCO layer 114 on p layer 117. Active region 116 is between p layer 117 and n layer 115 with n layer 115 covered with TCO contact 118 and bottom silver paste contact 119. A substrate free LED allows dual sided growth of TCO contact layers 114 and 118 on substrate free LED structures consisting of p layer 117, active layer 116 and n layer 115. Thick film high temperature silver paste contacts 113 and 119 can be printed on LEDs with TCO contacts 114 and 118 and fired at temperatures greater than 200° C. in various atmospheres to form a low optical absorption, low Vf, and substantially lithography free LED devices.

Figure 7B:
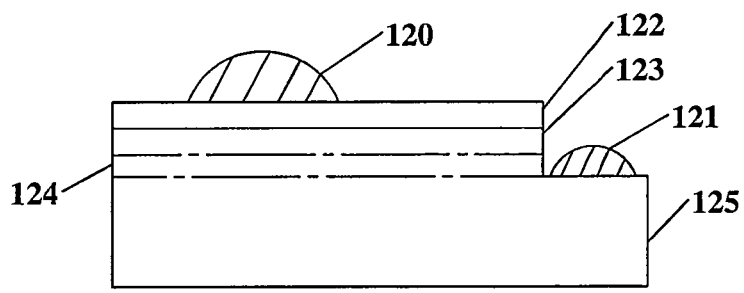
FIG. 7B depicts a side view of a lateral LED device with printed interconnections of the present invention.

FIG. 7B depicts a lateral device with printed/inkjet printed contacts 120 and 125. In all cases, ohmic contact to the n layer may include or not include an intermediary TCO layer to form reasonable ohmic contact. In FIG. 7B, TCO 122 is grown on p layer 123. Active layer 124 is between p layer 123 and n layer 125. TCO 122 is doped ZnO grown via CVD with a resistivity less than 0.003 ohm-cm and greater than 1000 Angstroms thick. Printed etch masks allow for etch of the step down to n layer 125. As an example, an AlInGaP LED epi may be grown on GaAs. The wafer can be etched and patterned to form the lateral device having TCO 122 on the p layer 123. Printed contacts 120 and 125 are formed on TCO 122 and n layer 125. Optionally an additional TCO layer maybe formed of n layer 125 to further reduce Vf. The addition of a eutectic solder layer to printed contact 120 and 125 to create a direct die attach die is also disclosed. In a preferred embodiment, the AlInGaP epi is removed via chemical etching using a sacrificial etching layer between the AlInGaP and GaAs substrate as known in the art. The resulting direct attach die may be additionally wafer bonded to GaN substrates as disclosed in U.S. Pat. Nos. 7,592,637, 7,727,790, 8,017,415, 8,158,983, and 8,163,582, and US Published Patent Applications Nos. 20090140279 and 20100038656, which all are commonly assigned and incorporated by reference into this invention.

Figure 7C:
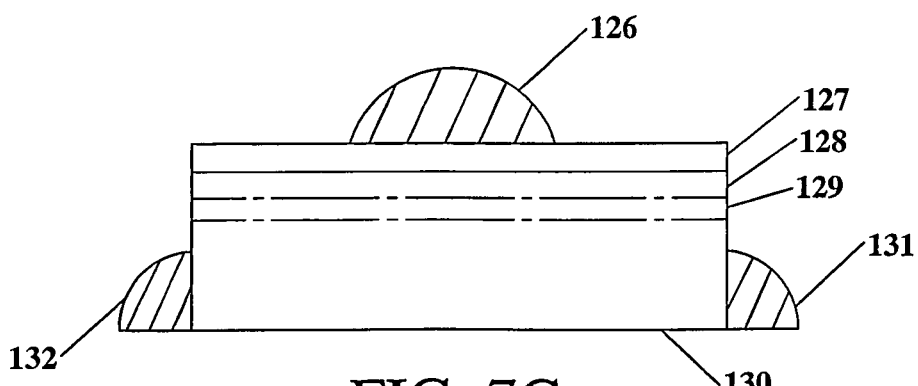
FIG. 7C depicts a side view of a printed contact with printed interconnects of the present invention.

FIG. 7C depicts a printed contact with a top contact 126 and side contacts 132 and 130. Again TCO 127 forms a low ohmic transparent ohmic contact to p layer 128 and the active region 129 is between p layer 128 and n layer 130. Side contacts 131 and 132 contact the side walls of n layer 130. N layer 130 is greater than 10 microns of thickness. Even more preferably, the thickness of n layer 130 is greater than 50 microns but less than 250 microns.

FIG. 8 depicts various methods of changing the far field distribution of single self cooling source. In FIG. 8A, the refractive indices, geometry, and spacing of the LEDs 136, the wavelength conversion elements 133 and 135, and the bonding material 137 will determine the far field distribution of the source. The far field distribution is determined by where the optical rays exit, how much of the optical rays, the direction of the optical rays and the spectrum of optical rays that exit a particular spatial point on the single self cooling source. FIG. 8 illustrates various reflectors, scattering elements, and diffusers, which modify where, how much, which way and the spectrum of the light rays emitted from the source. One or more wavelength conversion elements for mounting LEDs 136 can be used although two wavelength conversion elements 133 and 135 are depicted. Multiple LEDs 136 can be mounted on one or more surface of the one wavelength conversion element 133. Based on these parameters, radiation will be emitted from the structure or light guided within the source. Additionally, edge element 134 may also modify the far field distribution out of the device. Edge element 134 and bonding materials 137 may be translucent, transparent, opaque, and/or luminescent. Luminescent powders within a transparent matrix for edge element 134 and bonding materials 137 can modify the emission spectrum as well as the far field intensity distribution.

Figure 8A:
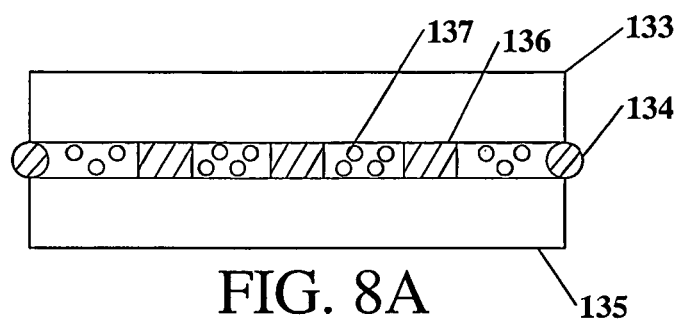
FIG. 8A depicts a side view of two wavelength conversion elements mounted on an LED for self cooling light sources of the present invention.
Figure 8B:
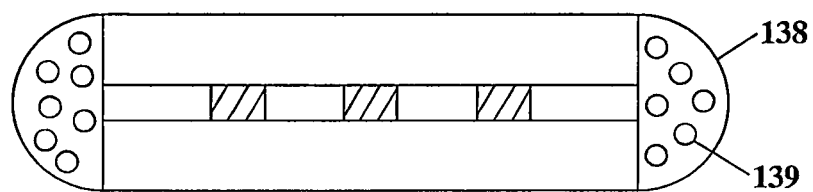
FIG. 8B depicts a side view of a self cooling light source where the entire end of the self cooling light source is substantially covered with a scattering element within a matrix of the present invention.

FIG. 8B depicts a self cooling light source where the entire end of the self cooling light source is substantially covered with a scattering element 139 within a matrix 138. Additionally, scattering element 139 and matrix 138 may extend to encompass not only edges of the self cooling light source but also substantial portions of the other surfaces of the self cooling light source. In this manner, light emitted from all the surface of the self cooling light source can be redirected to modify the far field intensity distribution. Luminescent materials for scattering element 139 are excited by at least a portion of the spectrum emitted by the self cooling light source.

Figure 8C:
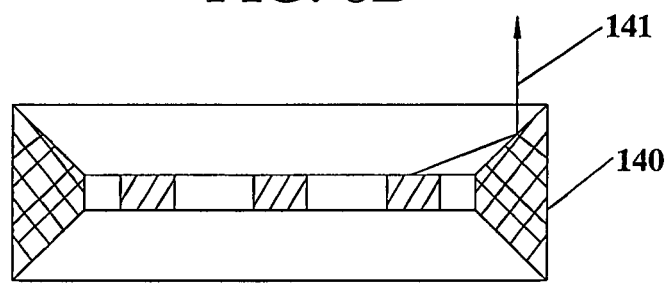
FIG. 8C depicts a side view of an edge turning element for self cooling light sources of the present invention.

FIG. 8C depicts edge turning element 140 consisting of metal, diffuse scatterer, dielectric mirror, and/or translucent material whereby at least a portion of the light generated within the LED or wavelength conversion elements are redirected as depicted in ray 141.

Figure 8D:
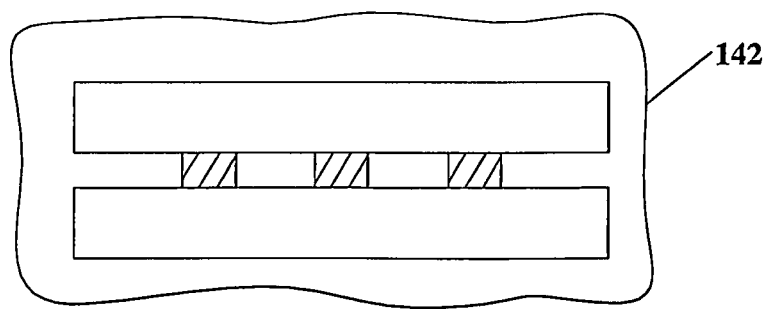
FIG. 8D depicts a side view of an outer coating for self cooling light sources of the present invention.

FIG. 8D depicts an outer coating 142 which may be translucent, partially opaque, polarized, and/or luminescent. The far field intensity, polarization, and wavelength distribution can be modified both in the near field and far field and spatial information can be imparted onto the self cooling light source. As an example, a self cooling light source with a shape similar to a candle flame may have a spectrally variable outer coating 142 such that red wavelengths are emitted more readily near the tip of the candle flame and blue wavelengths are emitted more readily near the base of the candle flame. In this fashion, the spatially spectral characteristics of a candle flame could be more closely matched. Using this technique a wide range of decorative light sources can be formed without the need for additional optical elements.

In another example, outer coating 142 may consist of a reflective coating such as aluminum into which openings are etched or mechanically formed. More specifically, sunlight readable indicator lights can be formed using this technique as warning, emergency, or cautionary indicators. The use of circular polarizers within outer coating 142 can enhance sunlight readability. Alternately, outer coating 142 could be patterned to depict a pedestrian crossing symbol that could be either direct viewed or viewed through an external optic thereby creating a ultra compact warning sign for crosswalks and other traffic related applications. In another example, outer coating 142 may consist of spectrally selective emissivity coating such that the emissivity of the self cooling light source is enhanced for wavelengths longer than 700 nm. By enhancing the infrared and far infrared emissivity of the self cooling light source more efficient light sources can be realized. As stated in the previous example of FIG. 3 the radiation cooling represents a significant percentage of the cooling in self cooling light sources. It is preferred that high emissivity coatings be used for outer coating 142 to maximize cooling from the surface of the self cooling light source. Most preferred is an outer coating 142 with an emissivity greater than 0.5. Depending on the maximum surface temperature the radiative cooling can represent between 20% and 50% of the heat dissipation of the source.

Figure 9A:
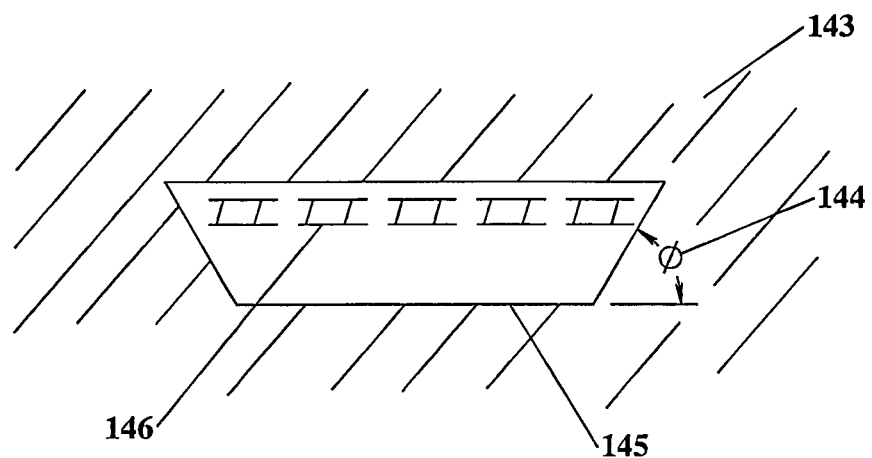
FIG. 9A depicts a side view of a LED containing an active region embedded within media for die shaping for enhanced dual sided extraction of the present invention.

FIG. 9A depicts the use of die shaping of optical devices within a media 143. As an example, LED 145 contains an active region 146 embedded within media 143. Using ray tracing techniques known in the art, there is an optimum angle 144 to maximize the amount of radiation transferred into media 143. Typically, semiconductor materials exhibit high refractive index, which tends to lead to light trapping within the LED 145. In FIG. 9A the optimum angle 144 subtends the active region 146 as shown in the figure.

Figure 9B:
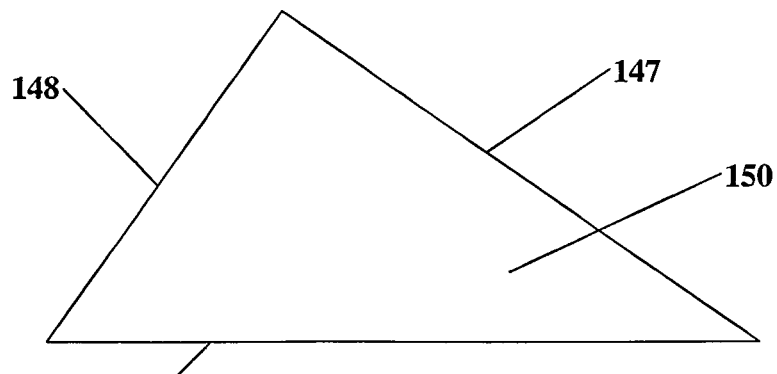
FIG. 9B depicts a side view of non-orthogonal side of the active region of FIG. 9A for die shaping for enhanced dual sided extraction of the present invention.

Alternately, FIG. 9B depicts that surfaces 149, 148 and 147 may be non-orthogonal forming a non square or rectangular die. In both these cases, light trapped within the LED 150 can more efficiently escape the die. The use of both forms of die shaping together is preferred. The use of non-rectangular shapes for LED 150 embedded within a wavelength conversion element to enhance extraction efficiency is a preferred embodiment of this invention.

Figure 10A:
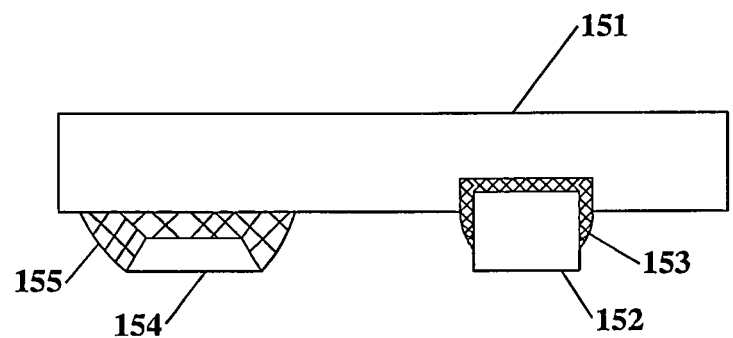
FIG. 10A depicts a side view of different mounting methods for LEDs within a wavelength conversion element and the use of bonding layers in wavelength conversion elements of the present invention.

FIG. 10A depicts different mounting methods for LEDs 152 and 154 within wavelength conversion element 151 and the use of bonding layers 153 and 155. Bonding layers 153 and 155 thermally, optically, and mechanically attach LEDs 152 and 154 to at least one surface of wavelength conversion element 151. LED 152 is at least partially embedded within wavelength conversion element 151 which can allow for both edge and surface coupling of radiation emitted by the LED 152 into wavelength conversion element 151 using bonding layer 153. Alternately, LED 154 is substantially coupled to the surface of wavelength conversion element 151 using bonding layer 155. Bonding layers 55 and 153 may be eliminated where wavelength conversion element 151 is directly bondable to LEDs 154 and 152 using wafer boding, fusion bonding, or melt bonding.

Figure 10B:
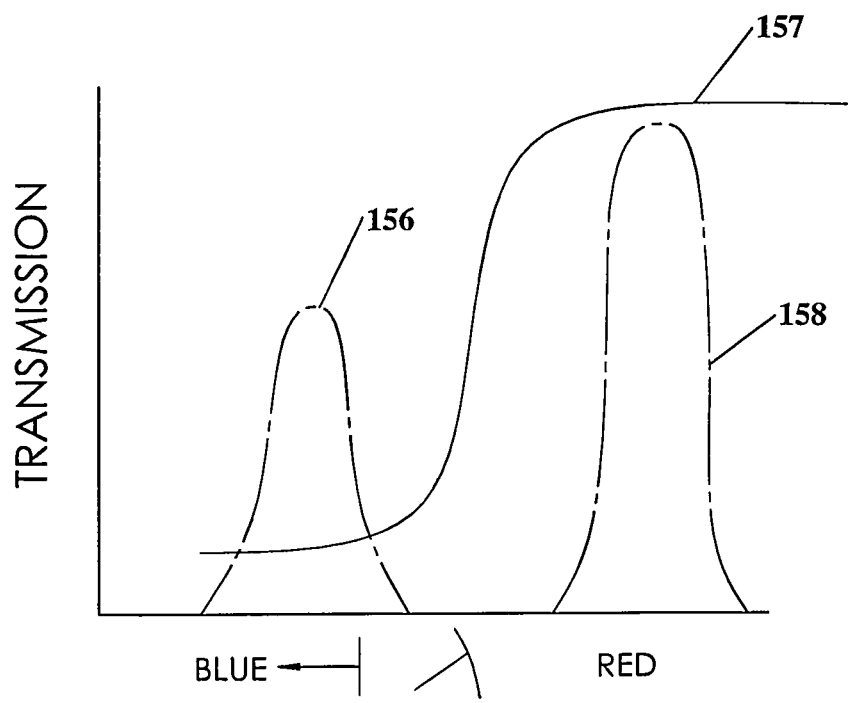
FIG. 10B depicts a graph of blue and red LEDs in wavelength conversion elements of the present invention.

FIG. 10B depicts a typical transmission spectrum 157 of wavelength conversion elements. Blue emission 156 is absorbed by the wavelength conversion element and then reemitted at longer wavelengths. Red emission 158 is typically not strongly absorbed and therefore behaves as if the wavelength conversion element 151 is simply a waveguide. Virtually any color light source can be realized by properly selecting the right combination of blue and red LEDs within the wavelength conversion element 151. While wavelength conversion is a preferred embodiment, FIG. 10B illustrates that self-cooling light sources do not require that the wavelength conversion element 151 be luminescent. In the case of a red self-cooling light source, wavelength conversion element 151 may be used to optically distribute and thermally cool the LEDS without wavelength conversion. Alternately, UV responsive luminescent materials can be used for wavelength conversion element 162 with UV LEDs 164 or 165. The transmission spectrum 157 is shifted to shorter wavelength which allows for the formation of self cooling light sources which exhibit white body colors, as seen in fluorescent light sources. This wavelength shift however is offset by somewhat reduced efficiency due to larger Stokes' shift losses.

Figure 11:
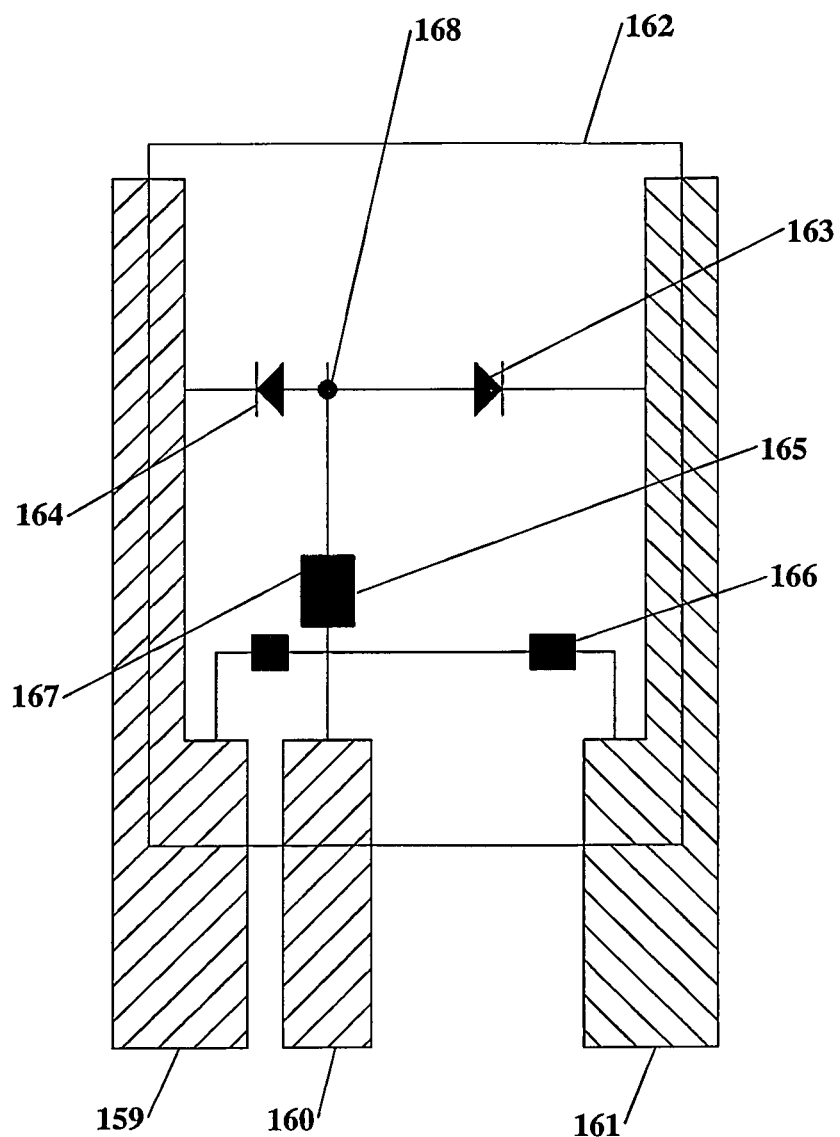
FIG. 11 depicts a top view of a three pin self cooling light source of the present invention.

FIG. 11 depicts a color tunable self-cooling light source containing at least one wavelength conversion element 162 with an electrical interconnect 168, at least one blue LED 164, at least one red LED 163, and drive electronics 165, 166, and 167. Electrical interconnect 168 is a thick film printed silver ink. Three separate pins 159, 160, and 161 to provide independent control of blue led 164 from red LED 163. Pins 159, 160, and 161 can be physically shaped to allow for keying thereby ensuring that the self-cooling light source is properly connected to external power sources. While pins 159, 160 and 161 are substantially shown on the same side of wavelength conversion element 162, the use of alternate pin configurations are anticipated by the inventors. In general, external electrical interconnect can be accomplished via pins 159, 160, and 161 as shown in FIG. 11 or via alternate interconnect means including, but not limited to, flex circuits, rigid elements containing electrical traces, coaxial wires, shielded and unshielded twisted pairs, and edge type connectors on or connected to wavelength conversion element 162 are embodiments of this invention. Additionally feedthroughs within wavelength conversion element 162 can be formed via mechanical, chemical etching, laser, waterjet, or other subtractive means to form external interconnects to any of the previous listed electrical interconnect elements in any plane of the wavelength conversion element 162. Drive electronics 165, 166, and 167 may consist of both active and passive elements ranging from resistors, caps, and inductors. In this manner, a variety of external drive inputs can be used to excite the light source. As an example, a current source chip may be mounted onto the wavelength conversion element 162 and connected to an external voltage source via pins 159, 160, and 161. As known in the art, typical current source chips can also have an external resistor, which sets the current that flows through the current source chip. The external resistor may be mounted on the wavelength conversion element 162 or be external to the source and connected to current source chip via pins 159, 160, and 161. As the functionality within the light source increases, the number pins may be increased. Integrated circuits can be used for drive electronics 165, 166, and/or 167.

Figure 12:
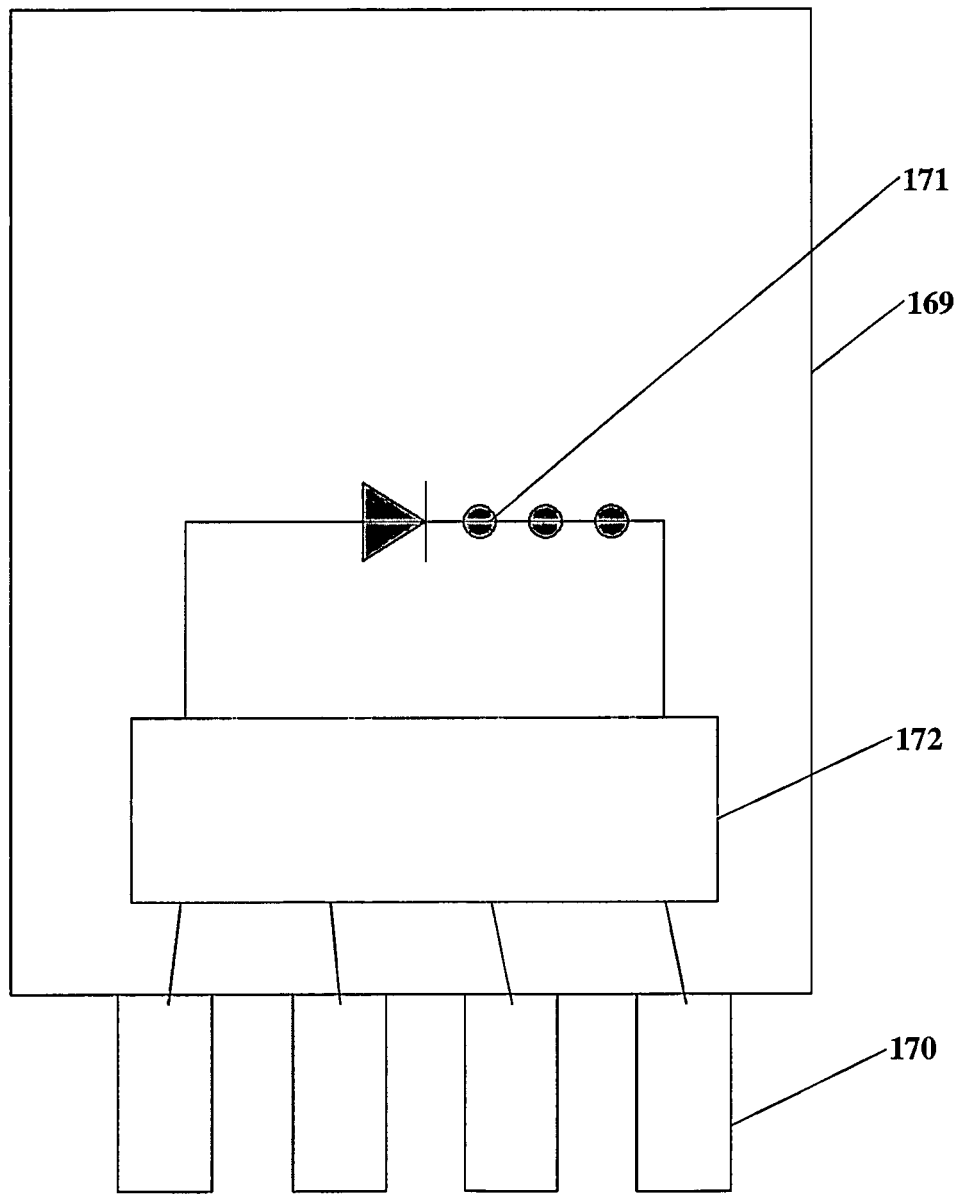
FIG. 12 depicts a top view of a self cooling light source with an integrated driver of the present invention.

Wavelength conversion element 162 also substantially cools the drive electronics 165, 166, and 167 as well as LEDs 164 and 165. Pins 159, 160, and 161 may be used to remove heat from the heat generating elements of the light source. Wavelength conversion element 162 is luminescent and provides for optical diffusion and cooling of the heat generating elements within the self cooling light source In this case, additional wavelength emitters may be added including, but not limited to, UV, violet, cyan, green, yellow, orange, deep red, and infrared FIG. 12 depicts a self cooling light source with an embedded active driver 172 capable of driving multiple LEDs 171, all of which are mounted and cooled substantially by wavelength conversion element 169. Input pins 170 may provide power input to active driver 172 but also provide outputs including, but not limited to, light source temperature, ambient temperature, light output levels, motion, detection, infrared communication links, and dimming controls. As previously disclosed, the transmission spectrum of the wavelength conversion element 169 allows for low absorption of longer wavelengths. An infrared/wireless emitter and receiver can be integrated into embedded active driver 172 so that the self cooling light source could also serve as a communication link for computers, TVs, wireless devices within a room, building, or outside. This integration eliminates the need for additional wiring and devices.

Figure 13A:
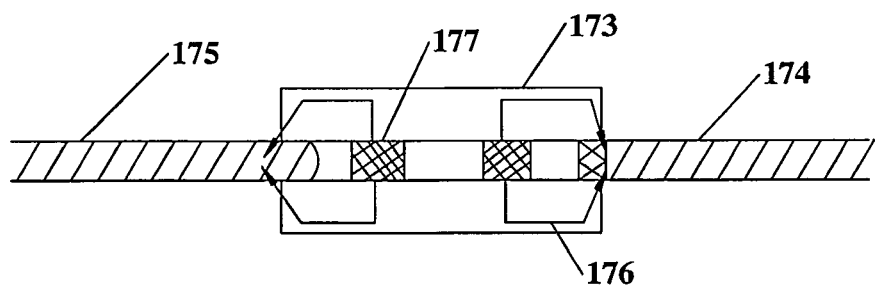
FIG. 13A depicts a side view of a self cooling light source with additional cooling means of the present invention.

FIG. 13A depicts the use of electrical contacts 174 and 175 as additional thermal conduction paths for extracting heat 178 out of the wavelength conversion elements 173 and 174 additionally cooling paths for LED 177. LED 177 may be direct attach or flip chip and may be a lateral, vertical, or edge contact die. As an example, electrical contact 174 and 175 may consist of 0.3 mm thick Tin plated aluminum plates sandwiched between wavelength conversion elements 173 and 174. In this manner both electrical input and additional cooling means for wavelength conversion elements 173 and 174 as well as LED 177 can be realized.

Figure 13B:
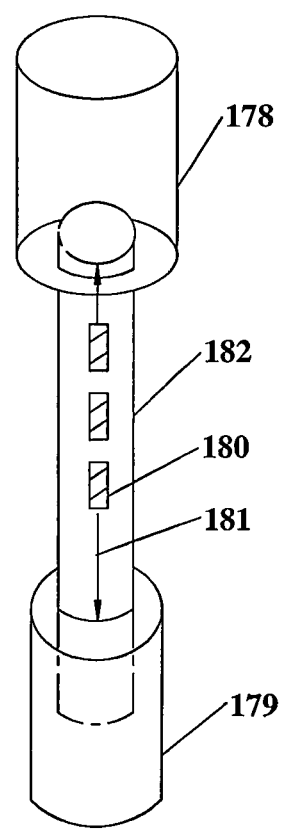
FIG. 13B depicts a perspective view of a self cooling light source with additional cooling means of the present invention.

FIG. 13B depicts a rod based light source with LEDs 180 within rod shaped wavelength conversion element 182 wherein heat 181 is additionally extracted via conduction to contacts 178 and 179. Alternately, hemispherical, pyramidal, and other non-flat shapes and Ce:YAGs may be used for wavelength conversion element 182 to create a desired intensity, polarization, and wavelength distribution. Ce:YAG and other shapes, such as spheres and pyramids, maximize the surface area to volume ratio, so that convective and radiative cooling off the surface of the wavelength conversion element 182 is maximized while using the least amount of material possible. As an example, contacts 178 and 179 may consist of 2 mm copper heat pipes thermally bonded via a bonding method including but not limited to gluing, mechanical, soldering, or brazing means to wavelength conversion element 182. In this manner additional cooling maybe realized. LEDs 180 may be mounted on the surface or inside of wavelength conversion element 182. As an example LEDs 180 may be mounted on the flat surface of two hemispherical wavelength conversion elements 182. The two hemispherical wavelength conversion elements 182 are bonded together to form a spherical self cooling light source with the LEDs 180 embedded within the wavelength conversion elements 182. Alternately, the LEDs 180 may be mounted on the spherical surface of the hemispherical wavelength conversion element 182 such the light generated by LED 180 generally is coupled into the hemispherical wavelength conversion element 182. Optionally, the flat surface of hemispherical wavelength conversion 182 may have additional luminescent coatings such that the light emitted by LEDs 180 is effectively coupled by the hemispherical wavelength conversion element 182 onto the luminescent bonding layer which reflects, transmits, converts or otherwise emits both the light emitted by the LEDs 180 and any luminescent elements back out of the hemispherical wavelength conversion element 182. The advantage of this approach is that the LEDs 180 are mounted closer to the cooling surface of the wavelength conversion element, a high degree of mixing is possible, and the angular distribution of the source can be controlled by how well the bonding layer is index matched to the wavelength conversion element 182. Bonding two hemispherical wavelength conversion elements 182 together forms a spherical source with externally mounted LEDs 180.

Figure 14:
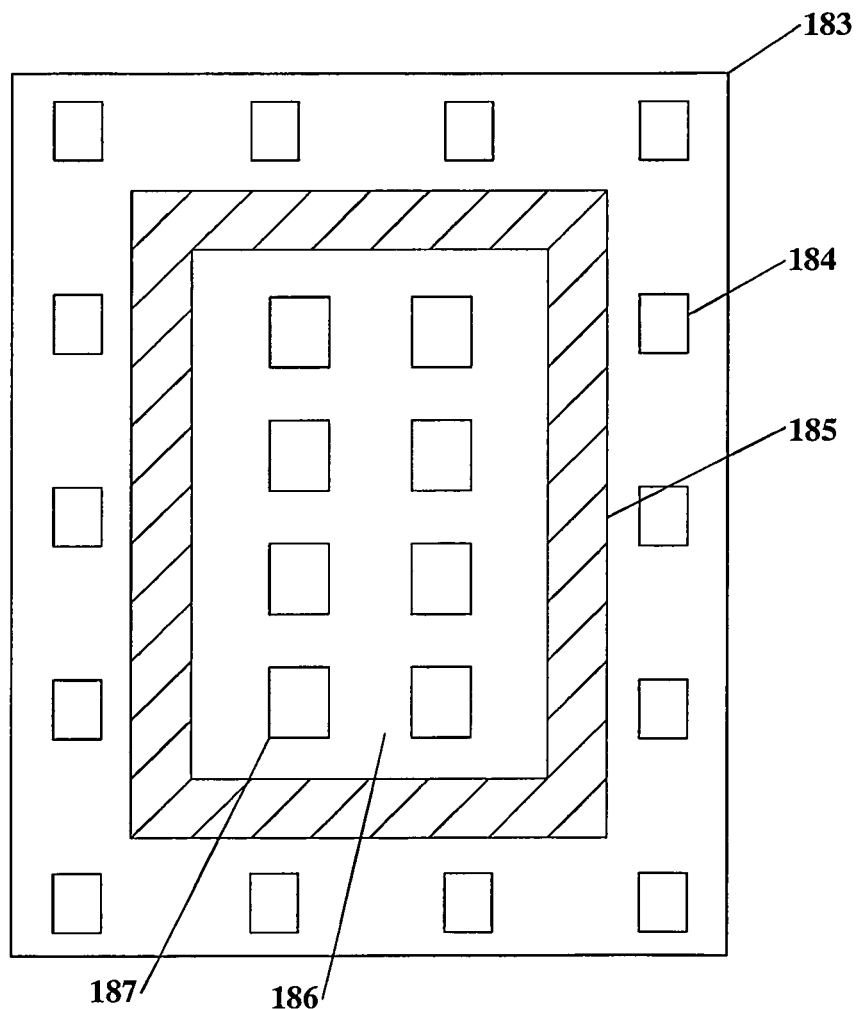
FIG. 14 depicts a top view of a self cooling light source with thermally isolated sections of the present invention.

FIG. 14 depicts a self cooling light source with at least two thermally and/or optically separated zones. Waveguide 183 containing LEDs 184 is optically and/or thermally isolated via barrier 185 from waveguide 186 and LEDs 187. Dual colored light sources can be formed. Alternately, temperature sensitive LEDs such as AlInGaP can be thermally isolated from more temperature stable InGaN LEDs. Waveguide 183 and 186 may or may not provide luminescent conversion. LEDs 184 are AlInGaP (red) LEDs mounted to waveguide 183 made out of sapphire. LEDs 187 are InGaN blue LEDs mounted onto waveguide 186, which is single crystal Ce:YAG. The barrier 185 is a low thermal conductivity alumina casting material. AlInGaP efficiency drops by 40% for junction temperatures over 60° C. while InGaN efficiency will drop only by 10% for a similar junction temperature. White light sources can be realized by thermally isolating the AlInGap from the InGaN high overall efficiency. Using this approach the two sections operate at different surface temperatures. The InGaN LED 187 and waveguide 186 operates at a higher surface temperature while the AlInGaP LED 184 and waveguide 183 operates at a lower surface temperature.

Figure 15:
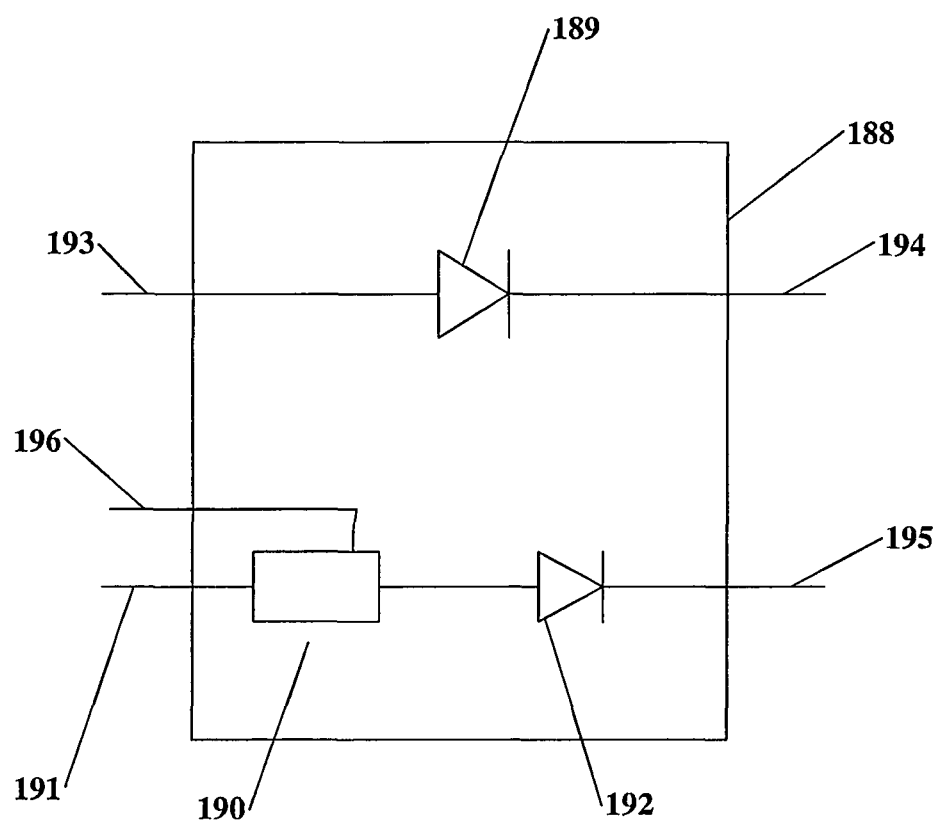
FIG. 15 depicts a top view of a self cooling light source with separate drive scheme for blue and red die of the present invention.

FIG. 15 depicts Blue LED 189 mounted to wavelength conversion element 188 and Red LED 192 with driver 190. Power lines 191, 193, 194, and 195 and control line 196 are also shown. Red LED 192 drive level is set via control line 196 by controlling the voltage/current flow available via power line input 191 and output 195. Typically driver 190 would be a constant current source or variable resistor controlled via control line 196. As stated earlier, blue LED 189 is typically InGaN with more stable regarding temperature, life and drive levels than red LED 192 typically AlInGaP. As an example, TPA coated with europium doped strontium Thiogallate singularly or as a multiphase with another gallate, such as Eu doped magnesium gallate for wavelength conversion element 188 is excited by 450 nm LED 189. 615 nm AlInGaP red LED 192 is also mounted on the wavelength conversion element 188 along with driver 190. Heat is spread out via wavelength conversion element 188 as well as the radiation emitted by blue LED 189 and red LED 192. Control line 196 is used to adjust the color temperature of the source within a range by increasing the current to red LED 192 relative to the fixed output of blue LED 189. Additional LEDs and other emission wavelengths can be used.

Figure 16A:
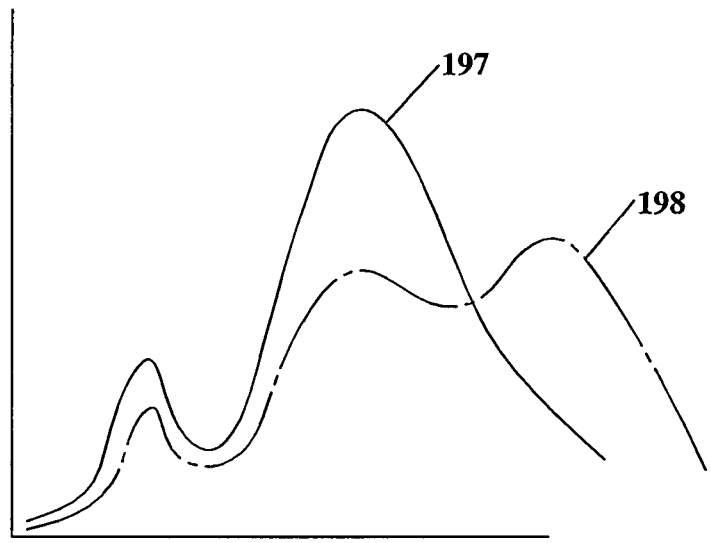
FIG. 16A depicts a first graph of subtractive red phosphor and additive red LED of the present invention.

FIG. 16 depicts a white light spectrum for a typical solid state light source. FIG. 16A illustrates high color temperature low CRI spectrum 197 typically created by blue LEDS and Ce:YAG phosphors. Additional phosphors are typically added to add more red content in order to lower the color temperature as shown in spectrum 198. This red addition however requires that a portion of the blue and in some cases some of the green be absorbed which reduces overall efficiency.

Figure 16B:
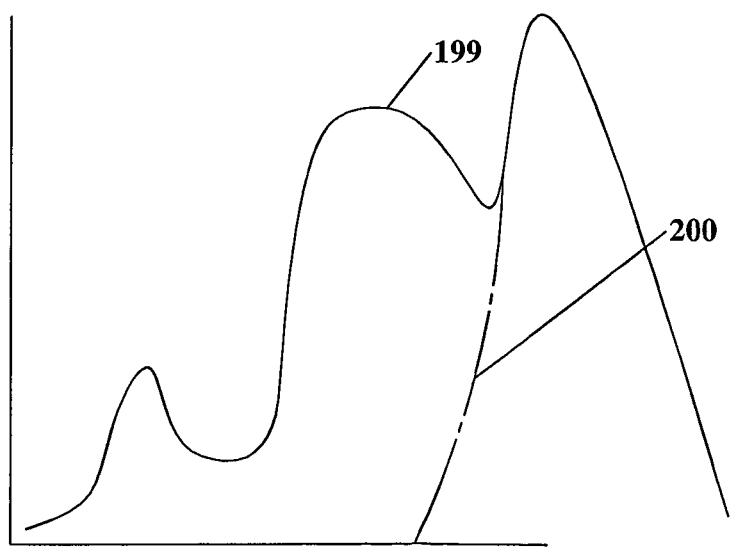
FIG. 16B depicts a second graph of subtractive red phosphor and additive red LED of the present invention.

FIG. 16B depicts the typical spectrum 199 from a blue LED, Ce:YAG phosphor, and red LED. The red LED spectrum is additive as shown in spectrum 200. In general, both methods of FIG. 16 are used to form self-cooling light source described in this invention.

Figure 17:
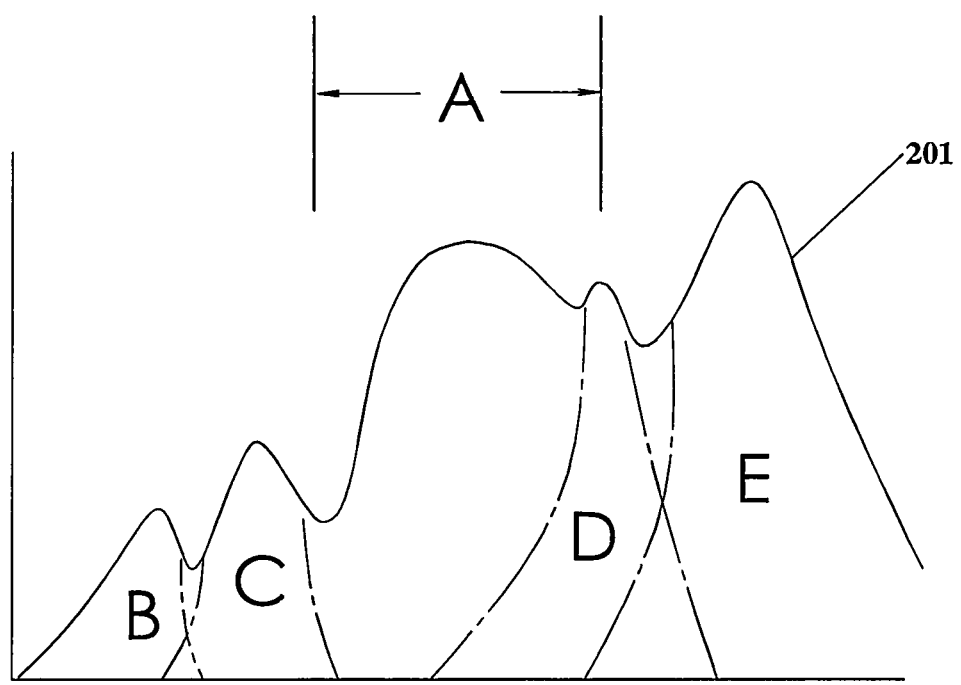
FIG. 17 depicts a graph of the spectrum from a self cooling light source with cyan and yellow LEDs of the present invention.

FIG. 17 depicts a high CRI white light spectrum 201 formed by mixing phosphor and LED spectrums A, B, C, D, and E. Spectral ranges can be mixed, diffused and converted within the wavelength conversion elements disclosed in this invention in addition to cooling, mechanically mounting, environmentally protecting, and electrically interconnecting the devices needed to generate the spectrums depicted. As an example, spectrum B may be derived from a blue 440 nm emitting LED, a portion whose output is used to excite a single crystal Ce:YAG luminescent element as previously disclosed to form spectrum A between 500 nm and 600 nm. Spectrum C may consist of a cyan quantum dot, which also converts a portion of output of the blue 440 nm emitting LED into 490 to 500 nm wavelengths. Spectrum D maybe produced by using a wavelength shifter die such as Eljen-284 (Eljen Technologies Inc.) to convert a portion of Spectrum A into wavelengths between 580 nm and 700 nm and Spectrum E maybe a AlInGaP red LED emitting between 600 and 800 nm. Infrared emitters or converters may also be added for communication links, security, and night vision applications.

Figure 18A:
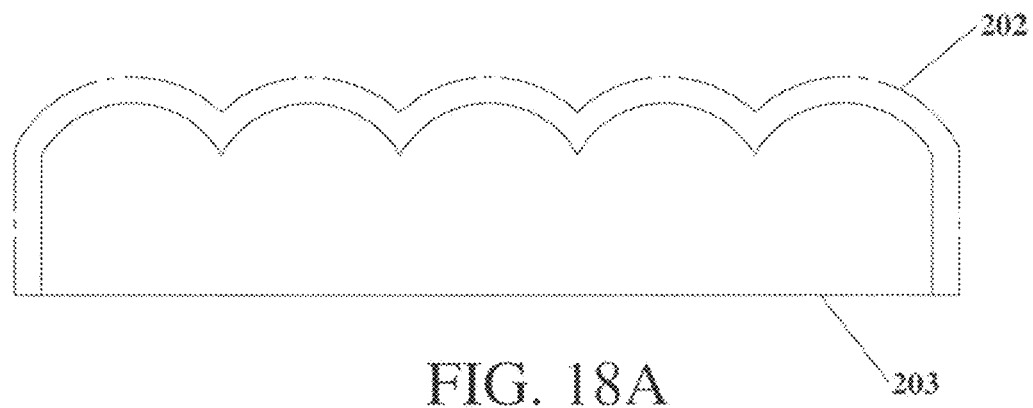
FIG. 18A depicts a side view of a textured thermally conductive waveguide with a luminescent coating of the present invention.
Figure 18B:
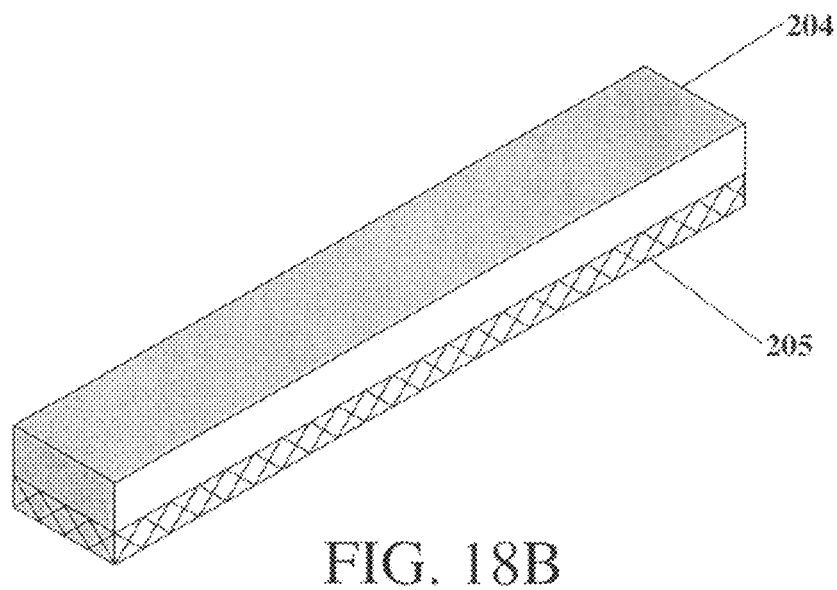
FIG. 18B depicts a perspective view of an EFG formed single crystal rod with a luminescent coating of the present invention.

FIG. 18 depicts various shapes of waveguides and luminescent coatings. FIG. 18A depicts a textured thermally conductive waveguide 203 with a luminescent coating 202. As an example, a micro lens array may be press sintered out of TPA and coated with Ce:YAG via flame spraying. FIG. 18B depicts an EFG formed single crystal Ce:YAG rod 204 coated with a high emissivity coating 205 with a refractive index substantially equal to the geometric mean of Ce:YAG and air and a thickness greater than 300 angstroms. In the previous example of FIG. 3 the importance of radiative cooling even at low surface temperatures is disclosed. In this example the radiative cooling can represent up to 30% of the total heat dissipated as long as the emissivity of the surface is above 0.8. Emissivity varies from very low (0.01) for polished metals to very high 0.98 for carbon black surfaces. The use of high emissivity coatings 205 that are also transparent in the visible spectrum are most preferred. These include but not limited to silicates, glasses, organics, nitrides, oxynitrides, and oxides. Even more preferred is high emissivity coating 205 that also exhibit a thermal conductivity greater than 1 W/mK. The high emissivity coating 205 thickness is preferably between 1000 angstroms and 5 microns thick. The emissivity coating 205 may also be luminescent.

Figure 19A:
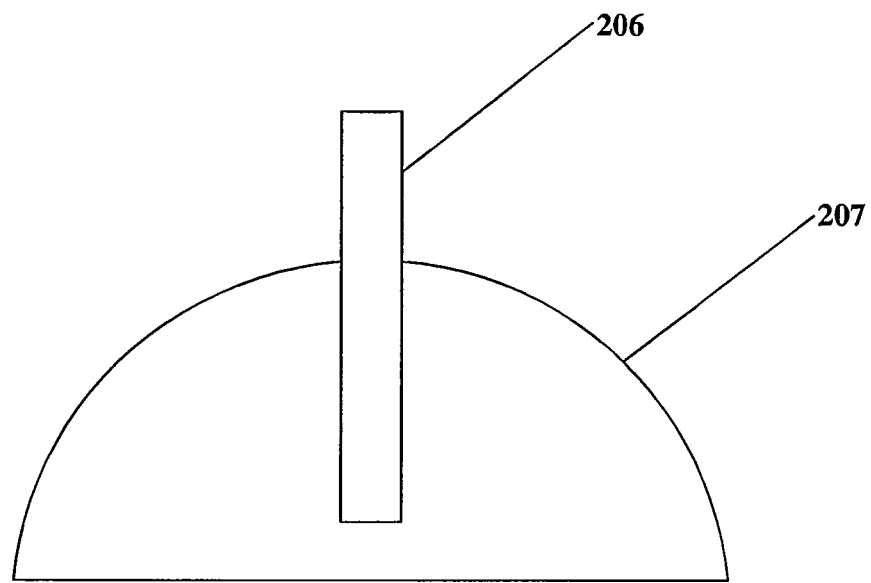
FIG. 19A depicts a side view of a self cooling light source and an optic of the present invention.

FIG. 19A depicts a self cooling light source 206 and an optic 207. Optic 207 may be reflective, transparent, translucent or opaque. Both decorative and directional means may be used as an optic. Parabolic, elliptical, non-imaging and other optical configuration as known in the art may be used as an optic. In particular, the use of prismatic surface elements on optic 207 wherein a substantial portion of the light emitted by self cooling light source 206 are redirected in a direction orthogonal to their original direction are embodiments of this invention. Optic 207 redirects a portion of the light from light source 206 downward. The optic 207 may consist of, but is not limited to, glass, single crystal, polymer or other translucent/transparent materials. Colored translucent/transparent materials create a specific decorative or functional appearance. As an example a light source 206 may be embedded into an orange glass glob to form a decorative lamp. The elimination of the need for a heat sink greatly simplifies the optical design and allows for a wider range of reflectors and optical elements.

Figure 19B:
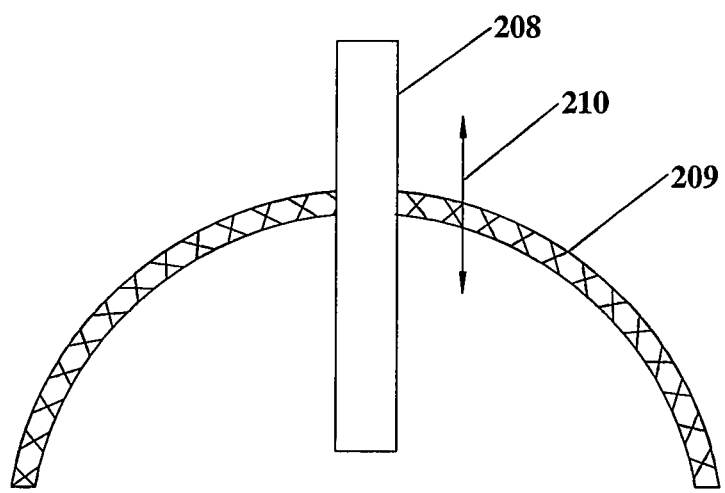
FIG. 19B depicts a side view of an external movable reflector which slides up and down the self cooling light source of the present invention.

Alternately, FIG. 19B depicts an external movable reflector 209, which slides 210 up and down light source 208. Using this approach the percentage of downward light can be adjusted relative to the amount of diffuse lighting. Again the elimination of heat sinks and the formation of an extended source greatly simplifies the optical design of the light fixture.

Figure 20A:
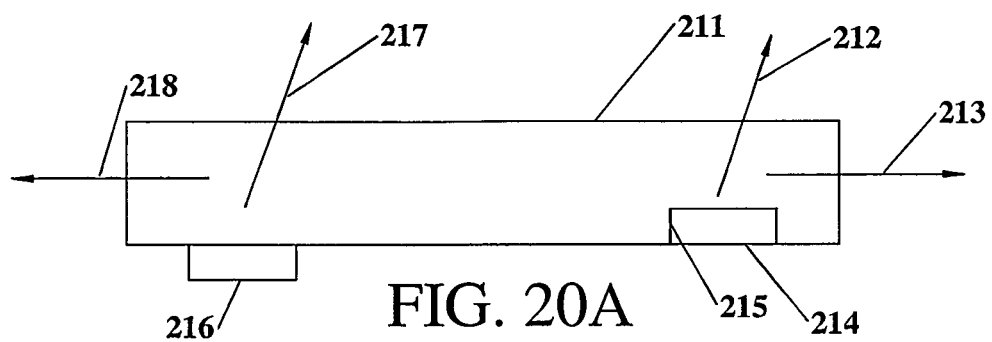
FIG. 20A depicts a side view of two LEDs mounted within or onto a wavelength conversion element for modifying the far field optical patterns of self cooling light sources of the present invention.

FIG. 20 depicts methods of adjusting the far field distributions of single light sources. In FIG. 20A, the far field distribution both intensity and wavelength can be adjusted by mounting methods for the LEDs 214 and 216 within or onto wavelength conversion element 211. LED 214 depicts an embedded LED 214 in which a pocket or depression is formed in wavelength conversion element 211. This embedded LED changes the ratio of transmitted rays 212 to waveguided rays 213 relative to surface mounted LED 216 which has a substantially different ratio of transmitted rays 217 to waveguided rays 218.

Figure 20B:
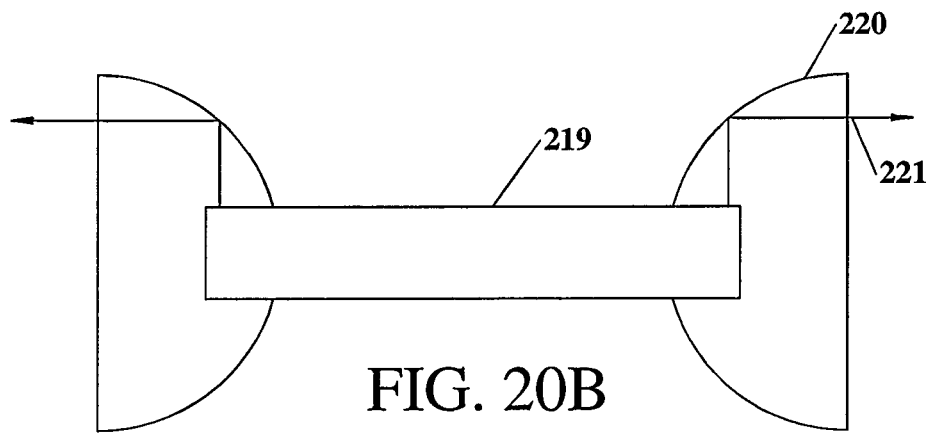
FIG. 20B depicts a side view of an optic for extracting light off of more than one surface of a light source for modifying the far field optical patterns of self cooling light sources of the present invention.

In FIG. 20B an optic 220 extracts light off of more than one surface of light source 219. In this case, rays 221 are redirected substantially orthogonally to the surface the rays were emitted from and mixed with the rays from other surfaces of light source 219. The optic 220 may be a prism, lens, parabolic, elliptical, asperical, or free formed shape.

Figure 20C:
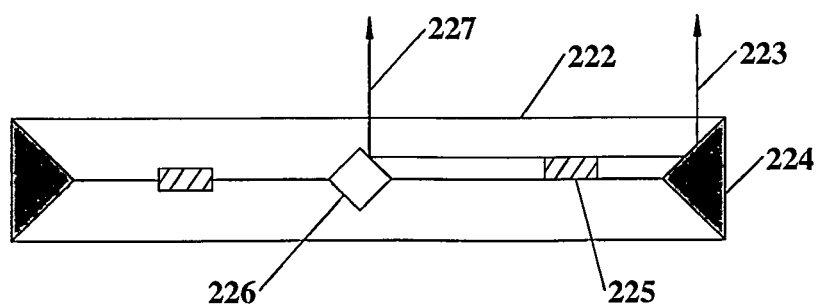
FIG. 20C depicts a side view of embedded LEDs in embedded occlusions with edge-turning elements for modifying the far field optical patterns of self cooling light sources of the present invention.

FIG. 20C depicts embedded LEDs 225 in embedded occlusions 226 with edge-turning elements 224 which were previously disclosed. Rays 227 and 223 can be directed substantially orthogonally out of the wavelength conversion element 222.

Figure 21A:
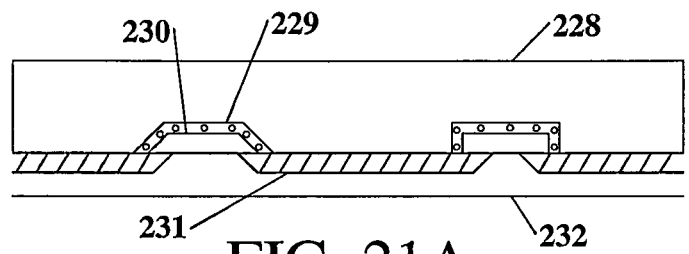
FIG. 21A depicts a side view of a light emitting diode bonded to a wavelength conversion element of the present invention.

FIG. 21A depicts a LED die 230 bonded into a wavelength conversion element containing depressions or pockets 228 using a bonding layer 229, a electrical interconnect layer 231 and protective dielectric layer 232. As an example, a 500 microns thick Ce:YAG single crystal wafer is laser drilled to have a pocket into which lateral LED die 230 is placed and bonded using a polysilazane. The polysilzane is at least partially cured. The polysilazane is further coated using inkjet printing techniques to cover all but the metal contact pads of lateral LED die 230. Conductive ink is printed via, but not limited to, inkjet, screen printing, tampo, or lithographic means such that the exposed metal contact pads of lateral LED die 230 are interconnected electrically via electrical interconnect layer 231. Nanosilver, silver paste, and other highly reflective printable electrically conductive inks, pastes or coatings are the preferred conductive ink. A protective dielectric layer 232 is applied via, but not limited to, inkjet, spin coating, dip coating, slot coating, roll coating and evaporative coating means.

Figure 21B:
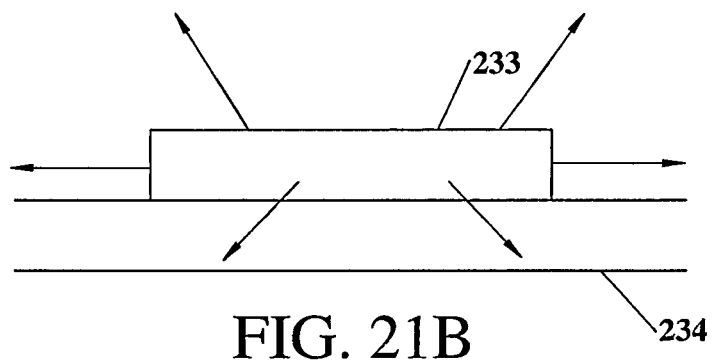
FIG. 21B depicts a side view of a light emitting diode mounted to a surface of a waveguide of the present invention.
Figure 21C:
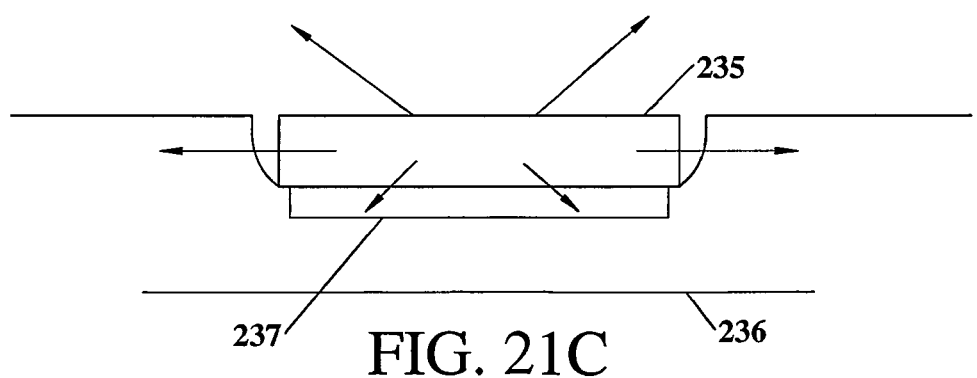
FIG. 21C depicts a side view of a light emitting diode embedded in a waveguide of the present invention.

FIG. 21B depicts LED 233 mounted to the surface of waveguide 234 most of the rays do not couple to the waveguide efficiently. FIG. 21C depicts embedded LED 235 within a pocket in waveguide 236. Optically and thermally there is more coupling into waveguide 236. In addition the use of embedded LED 235 allows for simplified interconnect as depicted in FIG. 21A. Further luminescent insert 237 may be used to convert at least a portion of the spectrum from LED 233 or 235. In this case lower cost materials may be used for waveguide 234 and 236 respectively. As an example, single crystal Ce:YAG inserts 50 microns thick with a Ce doping concentration greater than 0.2% with substantially the same area as embedded LED 235 can be inserted into press sintered TPA waveguides. In this manner, the amount of luminescent material can be minimized while still realizing the benefit of a thermally conductive element including, but not limited to, waveguide, increased thermal cooling surface, and optical spreading of the light over an area larger than either luminescent insert 237 or LED 235. Ceramic, polycrystalline, amorphous, composite and pressed powders of luminescent materials may be used for luminescent insert 237. A waveguide 236 with a thermal conductivity greater than 1 W/mK can work with a luminescent insert 237. LED 235 consists of one or more of the LED which is an InGaN, AlGaN, and/or AlInGaP based LED in waveguide 236 with a thermal conductivity greater than 1 W/mK with at least one luminescent insert 237.

Figure 22:
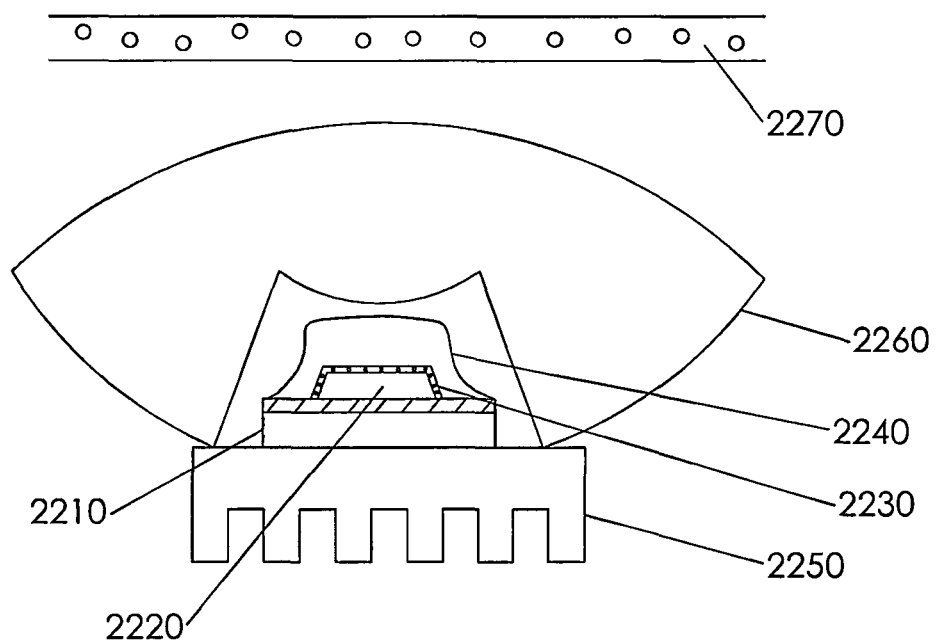
FIG. 22 shows a side view of the prior art light source incorporating an LED package and appended heat sink.

FIG. 22 is a prior art solid state light source. Conventional LED light sources incorporate a substrate 2210 upon which is mounted a printed circuit and bond pads for the LED 2220. The LED is coated with a phosphor 2230, and encapsulated with a clear encapsulant or adhesive 140. These elements 2210, 2220, 2230, and 2240 are typically called an LED package. The package is mounted to a heat sink 2250, which spreads and dissipates the heat generated by the LED 2220. The U.S. Department of Energy (DOE) estimates that 70% of the cost of LED lighting is due to the heat sink (30%) and the package (40%). To complete the light source a lens 2260 is mounted above the LED and a diffuser 2270 is added to get a more uniform distribution of light emanating from the light source. All of these components add weight, size, cost and complexity to LED light sources.

Figure 23A:
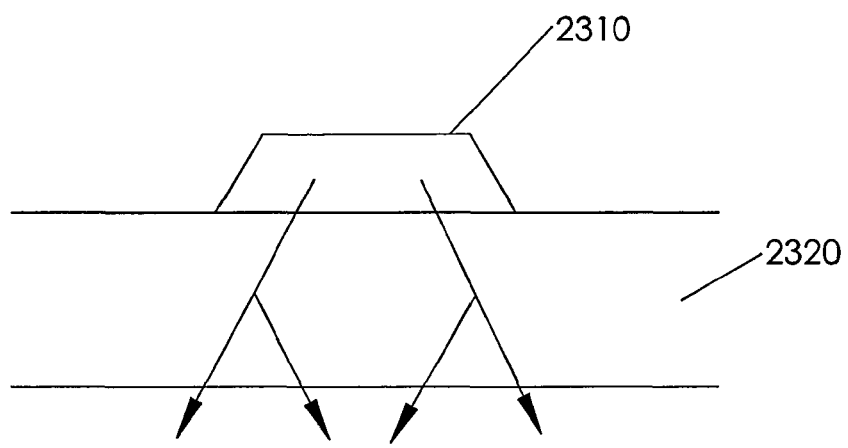
FIG. 23A shows a side view of an LED mounted directly to a single element that forms the heat sinking and light emitting function of the light source of the present invention.

In U.S. Published Patent Application No. 20130099264 (which is commonly assigned and incorporated by reference into this invention), means to eliminate many of these components are by combining the diffuser, heat sink, and package into one component. The LED 2310 of FIG. 23A is mounted to a light transmitting thermally conductive translucent element 2320, which acts a heat sink and light emitting diffuser.

Figure 23B:
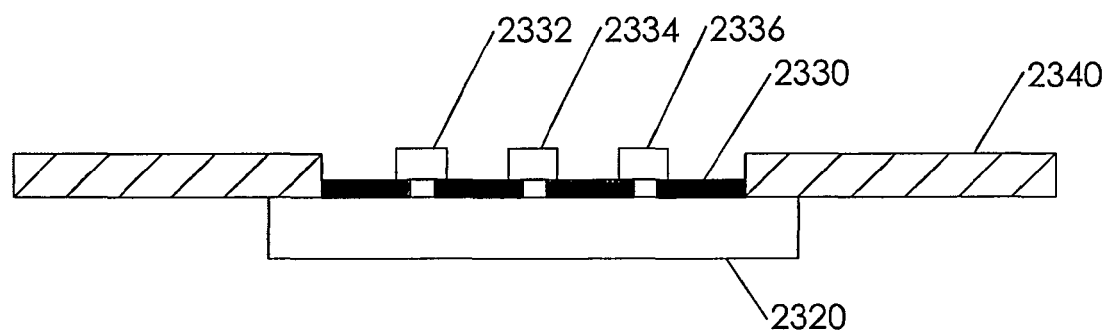
FIG. 23B depicts a side view of a printed circuit to interconnect multiple LEDs of FIG. 23A of the present invention.

As shown in FIG. 23B, the thermally conductive translucent element 2320 also contains a printed circuit 2330 to interconnect the LED 2332 to other multiple LEDs 2334, 2336, and to electrical leads or connectors 2340 so it may be connected to an external power source (not shown). In U.S. Publication No. 20130099264, it has been shown how by coupling the light from the LED(s) into the thermally conductive translucent elements the light is waveguided within and then extracted from the elements. An embodiment of this invention shows a method where lower cost materials may be utilized to practice the basic tenets described in U.S. Publication No. 20130099264.

For the light sources embodied herein, there are two compelling reasons to utilize more surface area for the partially transmitting thermally conductive elements. The method of cooling is natural convection and radiation. For both of these cooling means the rate of cooling is directly proportional to the surface area exposed to ambient. Therefore, the more surface area exposed to ambient the higher rate of heat dissipation. In addition the luminous flux density is decreased with higher surface area which may be desired in some applications where the light source is unshielded (to the human eye) or not in a shade or luminaire. To accommodate larger surface areas requires more thermally conductive translucent material. To economically compete with conventional incandescent light sources requires that the cost of those materials be as low as possible.

It has been found that less expensive thermally conductive translucent materials that are more optically reflective than optically transmissive may be utilized by forming them into light recycling cavities. In fact, it has been found that materials with greater than 50% reflectivity (less than 50% transmissivity), when formed into a light recycling cavity, can extract over 50% of the light emitted by the LEDs enclosed in the closed cavity. Therefore, it is an embodiment of this invention that the light recycling cavity of this self cooling light source has a light extraction efficiency that exceeds the light transmissivity of the light transmissive thermally conductive elements forming the cavity.

Figure 24A:
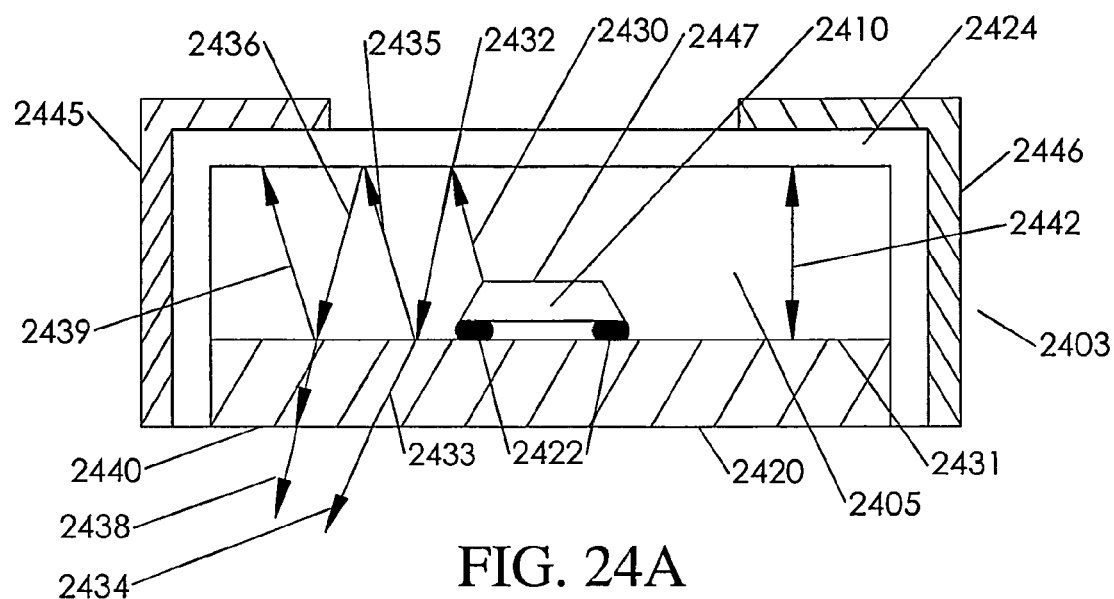
FIG. 24A depicts a side view of one highly reflective thermally conductive element with LEDs mounted to it and a reflector to form a light recycling cavity of the present invention.

A translucent (optically transmissive and reflective) light transmitting thermally conductive element 2420 in FIG. 24A, (e.g. alumina ($Al_2O_3$), TPA, BeO, AlN, BN, and other thermally conductive ceramics, amorphous, composites, polycrystalline, oriented polycrystalline, or single crystalline materials which exhibit low absorption losses to emission wavelengths being used) with an LED 2410 or multiple LEDs mounted on its surface is combined with a light reflector that forms a reflective enclosure 2424 to redirect most of the light emitted by the at least one light-emitting diode 2410 back to and through the light transmitting thermally conductive material (element) 2420. It is advantageous that the thickness 2442 of the recycling cavity be as thin as possible to make low profile light sources and also to minimize material. Many of the aforementioned translucent materials are simultaneously reflective, transmissive and scattering to incident light. Translucent as used herein refers to materials that are capable of being light reflective, light transmitting, light scattering and waveguiding (wherein the light can travel significant distances within the material). There are some materials that are capable of being alternately reflective, transmitting or scattering without waveguiding (e.g. metals) as an alternate method of making the light transmitting thermally conductive element as described below. LED 2410 may be a direct die attach LED, vertical LEDs, lateral LEDs, LED packages and/or arrays of LEDS in packages with and without wavelength conversion layers or elements. The use of high temperature materials for the light transmitting thermally conductive element 2420 allows for LED 2410 to be soldered, adhesively bonded, welded, or otherwise attached both electrically and physically. The high temperature nature of the partially reflective and partially light transmissive thermally conductive element 2420 also allows for the formation of electrical interconnect circuitry on the surface of the thermally conductive element 2420 up to temperatures exceeding 850° C.

The light reflector 2424 may be metal, aluminum, enhanced reflectivity aluminum or metals, plastic, silver coated plastic, white plastic, ceramic, glass, painted surfaces, barium sulfate coated surfaces, expanded Teflon or other low absorption polymers, composite materials exhibiting high reflectivity, filled polymers, and may either be a specular or diffuse reflector, or a combination of both. Light reflector 2424 may also be enhanced to reflect both light and heat. In general, both light and heat generated in the device is substantially transmitted through the light transmitting thermally conductive element 2420. The thermal conductivity may be lower for the light reflector 2424 than the light transmitting thermally conductive element 2420 as the majority of the heat generated within the light source is dissipated through and to the outer surface of the light transmitting thermally conductive element 2420. As such even thermally insulative materials such as White Optics™ polymers can be used for the light reflector 2424 with a low thermal conductivity of approximately 0.1 W/mK. A further embodiment of this invention is a light reflector 2424 that is partially light reflective and partially light transmitting. In that case a reflective and light transmitting thermally conductive element may be used for the light reflector 2424. This is further detailed below (e.g. FIG. 25).

Alanod™ Miro products that are aluminum with reflective enhanced coatings and thermal conductivity greater than 100 W/mK may also be used for the light reflector 2424 in FIG. 24A. In this case, some portion of the heat generated can be dissipated through the light reflector 2424 or transferred to the light source's external mounting surface. The light reflector 2424 also may be used as a thermal barrier to protect heat sensitive surfaces to which the light source is attached. As such, the use of thermal barrier coatings 2445, 2446 on the outer surface of light reflector 2424 is also an embodiment of this invention. As described and in general an embodiment of this invention is a self cooling light source where at least one light-emitting diode 2410 is mounted on at least part of the light transmitting thermally conductive element 2420 and is combined with a light reflector 2424 that recycles the light emitted by the at least one light-emitting diode 2410 back to and through the light transmitting thermally conductive element 2420. Alternatively, multiple light transmitting thermally conductive elements may be combined with a single light reflector to form larger emitting surface area light sources.

Light emitted by the LED(s) 2410 is reflected by the light reflector 2424 and incident on the light transmitting thermally conductive element 2420 on which the LED 2410 is mounted. A portion of the light incident on the light transmitting thermally conductive element 2420 is transmitted and scattered and emitted on the output surface of the light transmitting thermally conductive element 2420. Due to the reflectivity of the light transmitting thermally conductive and optionally translucent element 2420 a portion of the light is reflected back into the cavity formed by the light reflector 2424 and the light transmitting thermally conductive element 2420. Whereas low reflectivity high transmissivity materials (e.g. TPA, Spinel, sapphire, etc.) may be used to practice this invention, it has been found that highly reflective (low transmissivity) elements may be used while still achieving high light output efficiency.

LED 2410 is mounted to the reflective translucent thermally conductive element 2420 via the printed interconnect pad 2422. The printed interconnect and pad 2422 is an electrically conductive trace (gold, silver, copper, ITO, etc.), which can be screen printed or ink jet printed onto the thermally conductive translucent element.

At least one light reflector 2424 mounted to at least one reflective and light transmitting thermally conductive element 2420 can be a specular or diffuse reflector of light incident upon it and can be made from any material as long as it has a highly light reflective >95% surface substantially facing the LED 2410 light emissive surface(s) 2447 and the interior of the recycling cavity formed by the inward facing surface(s) 2431 of the light transmitting thermally conductive element 2420 and light reflector 2424. Again, the light reflector 2424 does not have to be thermally conductive because most of the heat from the at least one LED 2410 is dissipated through the light and heat emitting surface 2440 of the light transmitting thermally conductive element 2420. The light reflector 2424 therefore can be made from a myriad of different materials including metal, aluminum, plastic, ceramic, etc. It is desirable that the light reflector 2424 has a reflectivity of greater than 85%. It is preferable that the light reflector 2424 has a reflectivity of greater than 90%. And it is most preferable that the light reflector 2424 has a reflectivity of greater than 95%. Reflectivity can be limited to the visible wavelength range or more preferably to include also the infrared range as well, such that heat is redirected through light transmitting thermally conductive element 2420 to ambient.

Figure 24B:
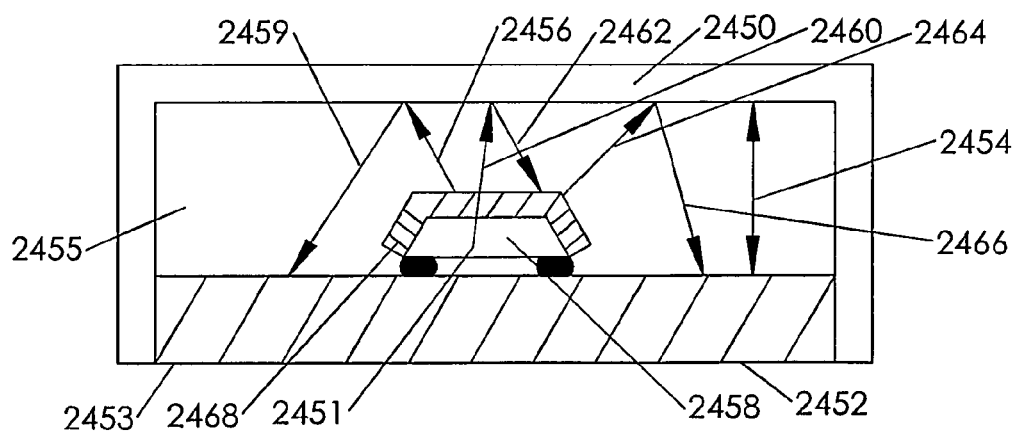
FIG. 24B depicts a side view of a light recycling cavity with wavelength conversion elements.

The LED 2410 is mounted to the light transmitting thermally conductive element 2420 so that its light emitting surface(s) 2447 are facing or are directed substantially towards the light reflector 2424. This allows the LED 2410 to have a metallic contact to the metallic pad 2422 on the light transmitting thermally conductive element 2420 providing a low thermal impedance from the LED 2410 to the reflective and light transmitting thermally conductive element 2420. The thermal conductivity of reflective and light transmitting thermally conductive element 2420 is critical to spread heat laterally so that the outer cooling/light emitting surface 2440 of the reflective and light transmitting thermally conductive element 2420 can dissipate the heat generated by LED 2410 to the surrounding ambient environment. The outer surface 2440 of the reflective and light transmitting thermally conductive element 2420 thereby becomes the primary heat emitting surface and cooling surface of the light source. The metallic contacts on the LED 2410 may be bonded to the metallic pads 2422 on the reflective and light transmitting thermally conductive element 2420 via soldering, thermocompression, conductive adhesive, etc. These contacts and pads can provide electrical contact to the LEDs via the interconnect on the reflective and light transmitting thermally conductive element 2420 (as previously depicted in FIG. 23 above). Light emitted by the LED 2410 is depicted by a sample light ray 2430, which is reflected 2432 off the interior surface of the light reflector 2424 and then impinges on the interior surface 2431 of the reflective transmissive thermally conductive element 2420. If the reflective and light transmitting thermally conductive element 2420 is more reflective than transmissive, only a small portion of the light incident is transmitted and scattered 2433 through and emitted 2434 from the thermally conductive translucent element 2420. If the light transmitting thermally conductive element is highly reflective, then a large portion of the light is not transmitted and is reflected 2435 back to the light reflector 2424 where it is reflected 2436 back again to the light transmitting thermally conductive element 2420. Here again another small fraction of light 2438 is transmitted through the light transmitting thermally conductive element 2420 and a larger portion again is reflected 2439 back to the light reflector 2424. This process continues until most of the light is transmitted through and out of the outer/light emitting surface 2440 of the light transmitting thermally conductive element 2420. The outer surface 2440 therefore becomes the light emitting and (as described above) is simultaneously the primary heat emitting (e.g. cooling) surface for the light source). The LED 2410 or multiple LEDs mounted on the surface of light transmitting thermally conductive element 2420 are encased by the reflector 2424 and the light transmitting thermally conductive element 2420 which act as a partial light reflector and partial light transmitter. The more reflective (less transmissive) the light transmitting thermally conductive element 2420 the more mixing and the longer the optical pathlength of the light rays within the recycling cavity which improves uniformity which in turn decreases the number of LEDs 2410 needed per unit area to create a given uniformity. The light emitted by the LED 2410 or multiple LEDs is reflected and recycled to and through the reflective and light transmitting thermally conductive element 2420. Due to the many reflections and recycling of the light, it has been found that only a small distance or gap 2442 is required between the reflector 2424 and the reflective and light transmitting thermally conductive element 2420 to provide a very uniform luminance or brightness across the output and emitting surface of the light source. To create very low profile (thin) light sources, most preferably gap 2442 is less than 8 mm. Even more preferably gap 2442 is less than 5 mm. This uniformity is due to the large percentage of recycling within the so formed light recycling cavity. Higher uniformity is attained by utilizing higher reflecting materials for the reflective and light transmitting thermally conductive elements 2420. As such, preferred materials for the reflective and light transmitting thermally conductive element 2420 have in line light transmission of less than 20%. While this might normally be considered opaque and not suitable for use as an emitting element (in a prior art non-light recycling system) this material is quite useable for the light recycling system of this invention with overall system efficiencies exceeding 70% and 80%. Therefore as described a preferred embodiment of this invention is a self cooling solid state light source 2403 comprising: at least one light transmitting thermally conductive element 2420 that functions as part of a light recycling cavity 2405; and at least one light emitting diode 2410 for emitting light 2430, the at least one light emitting diode 2410 enclosed within the light recycling cavity 2405; wherein said at least one light transmitting thermally conductive element 2420 also functions both as a light emitter 2438 and as a cooling element for the at least one light emitting diode 2410. The self cooling light source further comprising: at least one light reflector 2424 that forms part of said light recycling cavity 2405 and redirects light 2430 from said at least one light emitting diode 2410 to at least one light transmitting thermally conductive element 2420. The light transmitting thermally conductive element 2420 can consist of at least one of the following materials; reflective perforated metals, layered composites with arrays of holes, alumina ($Al_2O_3$), TPA, BeO, MN, BN, and other thermally conductive ceramics, amorphous, composites, polycrystalline, oriented polycrystalline, or single crystalline materials which exhibit low absorption losses to emission wavelengths from the light emitting diode 2410 or the wavelength conversion element(s) (e.g. 2468 in FIG. 24B) utilized inside the cavity. The key difference is that low absorption is required of all the elements used within the recycling cavity and that the reflective and light transmitting thermally conductive element 2420 must exhibit very low absorption or alpha for the light to be eventually transmitted through it. Alpha should be less than 1 $cm^{-1}$ for the wavelength emitted by the source. Color correcting can be accomplished by either wavelength dependent scatter or absorption. FIG. 24B depicts one embodiment of the use of wavelength conversion elements 2468 within the recycling cavity. In this embodiment at least one wavelength conversion element 2468 is interposed between said light emitting surface 2451 of said at least one light-emitting diode 2458 and said light transmitting thermally conductive element 2452. As shown light emitted by the LED 2458 must pass through the wavelength conversion element before being reflected back and incident on the light transmitting thermally conductive element 2452. In this embodiment the wavelength conversion element 2468, covering the LED 2458 light emission surface 2451 is positioned to face substantially towards light reflector 2450. To minimize the cavity gap 2454 between the light transmitting thermally conductive element 2452 and the reflector 2450 and still produce uniform light emission from the outer emitting surface 2453 of the light transmitting thermally conductive element 2452 it is necessary to increase the amount of light recycling within the light recycling cavity 2455. In this case LED 2458 is covered with wavelength conversion element 2468. Wavelength conversion element 2468 may be powder within an organic or inorganic binder, an inorganic thermally conductive wavelength conversion material as disclosed earlier, luminescent thin film deposition, quantum dots within a binder, or dyes within organic and inorganic binders. Light emitted ray 2456 from LED 2458 passes through wavelength conversion element 2468 and at least a portion of the ray is converted to a longer wavelength range by wavelength conversion element 2468 such that emitted ray 2456 has a broader spectrum. Emitted ray 2456 reflects off light reflector 2450 such that reflected ray 2459 is redirected to reflective and light transmitting thermally conductive element 2452 where some portion will be reflected and some portion transmitted as disclosed in FIG. 24A. It has been found with this invention that wavelength conversion performed within a recycling cavity lowers the color temperature of the LED 2458 and wavelength conversion element 2468 inside the light recycling cavity as compared to outside the recycling cavity. This is due to light recycling of the emitted light ray 2460 from LED 2458 which (on first pass) is only partially converted by wavelength conversion element 2468 and then by reflecting off 2462 light reflector 2450 and then back to the wavelength conversion element 2468 where more of the shorter wavelengths are converted to longer wavelengths. The ray 2462 undergoes further wavelength conversion as well as scattering and reemerges as ray 2464. This ray 2464 now has a higher percentage of longer wavelengths which then reflects off light reflector 2450 as reflected ray 2466 and is eventually transmitted through reflective and light transmitting thermally conductive element 2452. Typically, the color temperature is 100° K to 300° K lower for light emitted by wavelength converted LEDs inside a recycling cavity than outside.

Figure 24C:
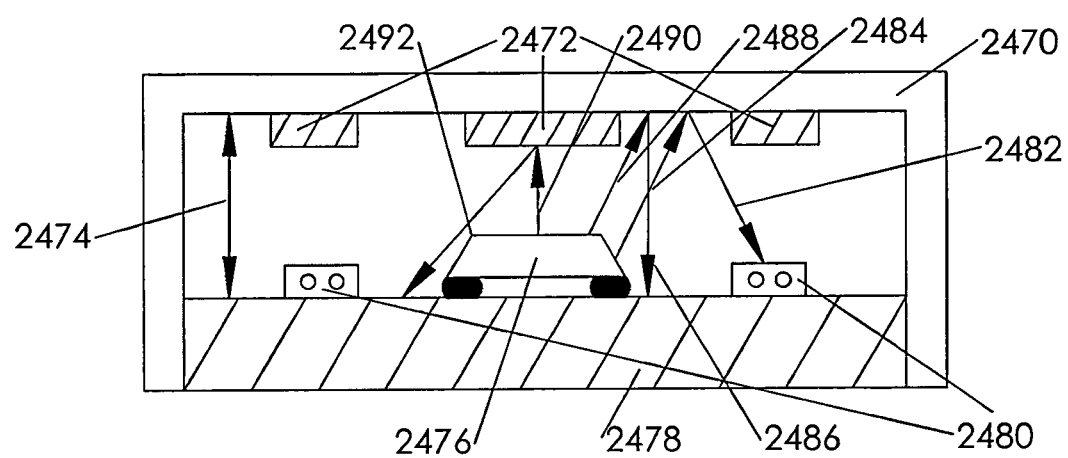
FIG. 24C depicts a side view of a light recycling cavity with distributed wavelength conversion elements.

If LED packages (e.g. LEDs mounted on small ceramic substrates with wavelength conversion elements on the light output surfaces) are used, the use of small area packages is preferred to minimize shadowing and other non-uniformities (seen when the source is off or on). The use of direct attach LED die with wavelength conversion coatings are more preferred with die sizes less than 1 mm$^2$. Alternately, if LED packages are used for LED 2458 and wavelength conversion element 2468 it is most preferred to have package areas less than 4 mm$^2$ with heights less than 1 mm and highly reflective submounts to minimize shadowing and absorption losses. This also allows for the fabrication of very thin light sources with uniform output luminance. It should be noted that in this configuration LED 2458 and wavelength conversion element 2468 (or optionally LED packages) are mounted such that the majority of their emission is emitted towards light reflector 2450. The use of LED packages (LEDs mounted on a small ceramic surface mount substrate) with color corrected wavelength conversion (phosphor) caps allow for simple assembly of the light source of this invention. The indirect lighting approach within the light recycling cavity provides for a very uniform light source without hotspots in a very thin low profile configuration. Also, the requirement for an appended heat sink is eliminated as the emitting surface and cooling surface are the same (common) surface. In general, the use of a wavelength conversion element 2468 interposed between the LED 2458 and the interior of at least one light recycling cavity such that a portion of the light within the light recycling cavity re-impinges on the wavelength conversion element 2468 is an embodiment of this invention. FIG. 24C depicts another embodiment in which the wavelength conversion elements 2472 and 2480 are distributed within or on the light reflector 2470 and/or optionally on the light transmitting thermally conductive translucent element 2478 respectively. In this embodiment LED 2476 emits emitted light ray 2490 which is partially converted and reflected off wavelength conversion element 2472 on light reflector 2470. The reflected ray 2492 impinges on reflective and light transmitting thermally conductive element 2478 as previously disclosed. Alternatively, emitted ray 2488 can reflect off light reflector 2470 reflected ray 2486 on light transmitting thermally conductive element 2478 without wavelength conversion. Also emitted ray 2484 may reflect off light reflector 2470 and then reflected ray 2482 impinges on wavelength conversion element 2480 of which some portion of the light ray is transmitted or reflected as previously disclosed. This arrangement of the wavelength conversion elements 2472, 2480 will keep the wavelength conversion elements cooler than if they were mounted on the LED 2476. As can be seen various combinations of the above arrangement of the wavelength conversion elements are possible.

Figure 25A:
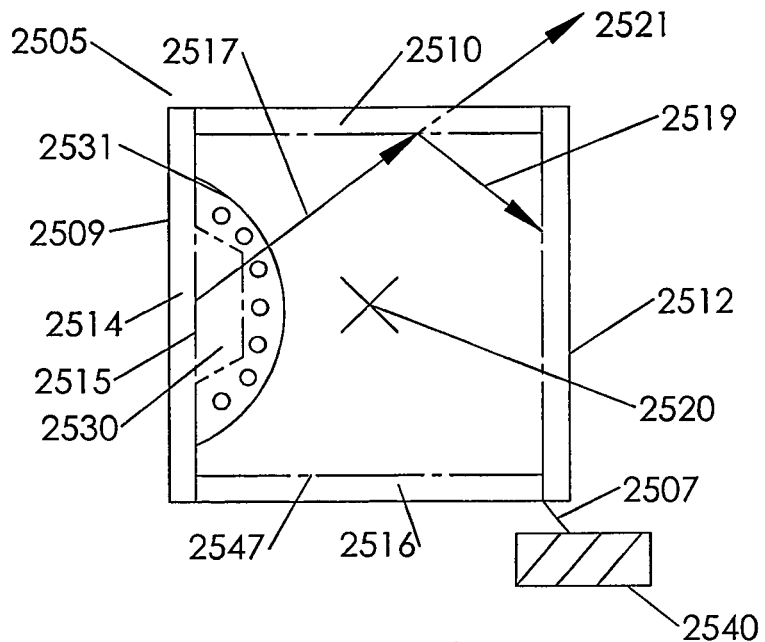
FIG. 25A depicts a cross-section view of one embodiment of this invention where multiple highly reflective, thermally conductive elements are arranged to form a light recycling cavity without a light exit aperture.
Figure 25B:
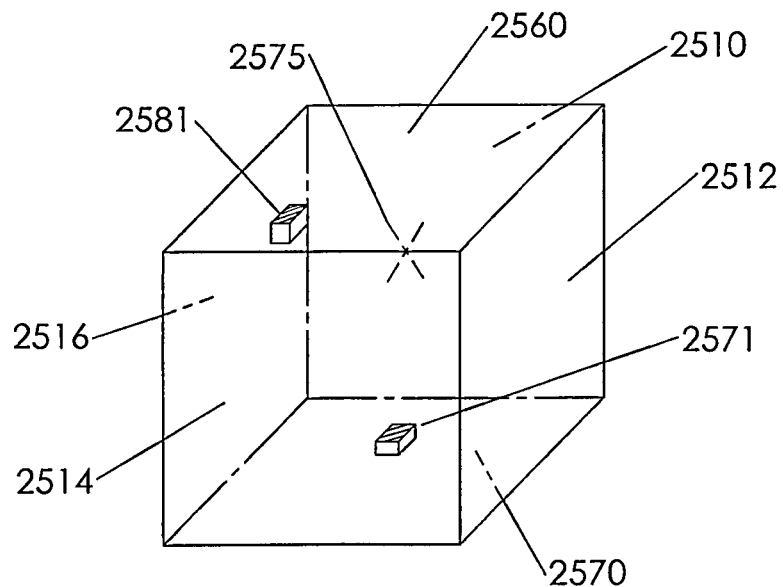
FIG. 25B shows a perspective view of the invention of FIG. 25A.

Shown in FIGS. 25A and 25B is another embodiment of the invention. Six thin reflective/transmissive thermally conductive (optionally translucent) elements form an enclosed light recycling cavity 2520 (shown in perspective as 2575 in FIG. 25B). These reflective/transmissive thermally conductive elements may optionally be more or mostly reflective (>50% reflectivity) or mostly transmissive (>50% transmissivity). Generally, the more transmissive elements will have slightly higher efficiency. However, it has been discovered that even highly reflective elements can attain high light extraction efficiency while producing more uniform and less costly light sources. Extraction occurs because photons couple to the inner surfaces of light recycling cavity 2520 (or 2575). To be accurate, the photons are either backscattered or transmitted at the surfaces or within the bulk of the elements that make up the light recycling cavity 2520. Unlike an imaging or non-imaging optical system, neither scatter nor Fresnel reflections create optical losses within a recycling optical systems because of the inherent ability of the photons to get another chance to exit the system if they are purely reflected or scattered. In imaging or non-imaging optical systems scattered or reflected rays are unable to exit the optical system. In the recycling optical systems the presence of optical absorption is the main contributor to loss in extraction efficiency. To create recycling optical systems as disclosed in this invention, the elements making up the light recycling cavity 2520 and the elements within the light recycling cavity 2520 must have low optical absorption. Extraction efficiency is therefore defined as the percentage of light emitted by at least one LED 2530 which exits anywhere from the light recycling cavity 2520 to the surrounding ambient environment. High extraction efficiency is defined as greater than 30% of the light emitted by at least one LED 2530 exiting light recycling cavity 2520. In this disclosure, light is said to pass through an element with the meaning that light exits the light recycling cavity 2520 and is emitted into the surrounding ambient environment. It may take multiple reflections or scattering events but eventually all the light emitted by at least one LED 2530 either pass through the elements making up the light recycling cavity 2520 or it is absorbed and transferred to the surrounding ambient environment as heat by the same elements through which the light is emitted or exiting. Extraction means include but are not limited to; low optical absorption materials, surface features, index matching coatings, low optical absorption materials with controlled crystal grain sizes, microoptical elements, reflective elements, and partial and through holes, on, in, or near the reflective/transmissive (optionally translucent) thermally conductive elements 2510, 2512, 2514, 2516, 2570 and 2560. While a cubical light recycling cavity 2575 is shown even a single element can be used to form the light recycling cavity based on the reflective light transmitting (optionally translucent) thermally conductive element being a hollow sphere or single pieced hollow enclosure with at least one LED 2530 mounted inside the element. FIG. 25A depicts a cross-section of the cavity 2520 showing four of the reflective/transmissive (optionally translucent) thermally conductive elements 2510, 2512, 2514, and 2516 that form the light recycling cavity 2520. These are further shown in a perspective view in FIG. 25B, which more completely shows the recycling cavity 2520 by depicting the top, and bottom reflective and light transmitting (optionally translucent) thermally conductive elements 2560 and 2570. Referring back to FIG. 25A, at least one LED 2530 is mounted to at least one surface 2515 of the cavity formed using reflective/transmissive thermally conductive elements 2510, 2512, 2514, and 2516. The at least one LED 2530 may be mounted anywhere within the light recycling cavity 2520 as further depicted in FIG. 25B with LEDs 2581 and 2571.

As in our previous example (FIG. 24) light rays 2517 emanating from the at least one LED 2530 are reflected 2519 and transmitted 2521 from the adjacent reflective/transmissive thermally conductive elements 2510. Light reflected back to the other reflective/transmissive thermally conductive elements 2512, 2514, and 2516 on which the LED(s) 2530 are mounted will transmit a fraction of the incident light and reflect a portion of it. This process repeats until most of the light is transmitted through the reflective/transmissive thermally conductive elements 2510, 2512, 2514, and 2516. Because of the multiple reflections, the exterior emitting surfaces of the light transmitting thermally conductive elements will achieve a very uniform luminance. The overall size of the light source is determined by the desired light output.

Sufficient surface area is required to dissipate the heat generated by the LEDs in the cavity. Assuming an LED is utilized having an intrinsic lumen per watt efficiency of 120 lumens per watt and the light recycling cavity efficiency is 70%, then the light source will have an overall efficiency of 84 lumens per watt. Assuming a convective heat transfer coefficient of 0.1 watt/cm$^2$, a 1000 lumen light source will require a surface area of 120 cm$^2$ or 18.6 in$^2$. This can be achieved with a relatively small cube of dimensions 1.75 inches per side. The convective heat transfer coefficient is directly proportional to the temperature difference between the hot surfaces and the ambient. Therefore, higher surface temperatures can be used to make smaller source sizes.

Radiative cooling is proportional to the difference between the fourth power of the emitting surface temperature and the fourth power of the ambient temperature. Therefore, having a higher surface temperature is very advantageous in increasing the rate of cooling of the light source. By the method of this invention, the LEDs are mounted directly to the opposite side of the emitting surface of the element(s). This results in the emitting surface having a very low thermal resistance to the LED p-n junction such that the LED temperature is kept close to the light source's emitting surface temperature. This maximizes the emitting surface temperature, which, therefore, maximizes the radiation and convection cooling of the light source.

In general, larger volumes (with their associated higher surface area) are preferred to improve not only the efficiency of the LEDs 2530 but also to improve overall reliability. Because the emitting surface and cooling surfaces are essentially the same surfaces in this embodiment, no appended heat sink is required. The ability to not only eliminate the need for additional heat sinks but also the ability to thermally isolate the heat generated by the LEDs 2530 from any drive electronics module 2540 is also an embodiment of this invention.

There have been many failures and recalls of solid state light source products associated with drive electronics and interconnect wires. These failures are mainly caused by the use of shared heat sinking by both the LEDs 2530 and drive electronics module 2540. The embodiments disclosed in this invention enable complete thermal isolation of the drive electronics and the light source. As such, an AC light bulb is disclosed consisting of a drive electronics module 2540 and a light recycling cavity 2520 light source (as described herein) where the heat generated within the drive electronics module 2540 and the heat generated within recycling cavity 2520 light source are cooled using thermally separate means. As the drive electronics module can be remotely connected via an interconnect 2507, there is minimal heat transfer between the LEDs and the drive electronics.

Whereas optically high transmitting (low reflectivity) materials (e.g. sapphire, Spinel, TPA, etc.) may be used to form the luminous light recycling cavity disclosed herein, lower cost high reflectivity materials may be used as well. Cavity as used herein (e.g. light recycling cavity) is a completely closed or nearly closed, nearly hollow, enclosure. As an example, a recycling cavity 2520 can be formed using six thin (0.5 mm) sheets of 96% alumina with a reflectivity of ~84% (e.g. in line transmission approximately 16%). In this case, the LEDs 2530 depicted in FIG. 25 are 1.6 mm×1.6 mm×0.7 mm LED packages 2530 with a color corrected wavelength conversion element 2531 on their light emitting face and have an output color temperature of 3000° K. These are mounted on the inside surfaces of the alumina elements facing into the cavity. However, once this cavity is formed due to wavelength dependent scattering inside the cavity, the color temperature is reduced by approximately 300° K to 2700° K. Shorter blue and green wavelengths are more highly scattered which increases their optical pathlength within the recycling cavity 2520.

Alternately, direct attach LED die 2530 can be used to make a white light source where wavelength conversion means is covered over the emitting surfaces of the LEDs 2530. This can be a phosphor cap, a ceramic phosphor chip or a phosphor coated on the LED 2530 with a clear adhesive coating like silicone or epoxy. Alternately the wavelength conversion materials can be dispersed and applied to other surface within the recycling cavity 2530. Using this approach, the color temperature can be varied to form a wide range of colors (e.g. simulating candle light). Whereas materials with high light transmissivity (TPA, Spinel, sapphire, etc.) may be used as the light transmissive thermally conductive element, these materials are relatively expensive. Lower cost ceramics tend to be more opaque and have low light transmission and higher reflectivity.

However, it has been found by practicing the tenets of this invention that high net light extraction efficiency may be achieved with these materials. Using these more reflective (84%) materials, light emitted from the LEDs 2530 and optionally wavelength converted, impinges on the opposite sides of the light recycling cavity 2530 and 16% would be emitted on the outside surface of that particular element. However, the light not transmitted (84%) is reflected back to the opposite and other sides of the cavity and ~13.4% (16% of the 84% reflected light) is transmitted through and emitted out the other surfaces of the recycling cavity 2520. This diminishing cycle, for each reflection, continues until a very high percentage of the original light emitted by the LED(s) 2530 passes through the white reflective (almost opaque) alumina and is emitted by the light source. Remarkably, extraction efficiencies of greater than 80% have been achieved with alumina (Al$_2$O$_3$) elements that have less than 17% in line transmittance. These efficiencies are measured by measuring the raw lumen output of the LED(s) 2530 themselves at a given voltage and current and then measuring the output from the light recycling cavity 2520 with the LED(s) 2530 (enclosed within the closed cavity) driven at the same voltage and current.

As described above and in general a preferred embodiment of this invention is a self cooling light source comprising at least one light-emitting diode (LED) 2530 and at least one light transmitting thermally conductive element 2514 to which the LED 2530 is mounted, the light transmitting thermally conductive element 2514 having a heat emitting surface 2509 through which most of the heat from the LED 2530 is dissipated. Ideally, the light source 2505 is structured to redirect light emitted by the LED 2530 to pass through and exit from the light transmitting thermally conductive element through its heat emitting surface 2509. The at least one light transmitting thermally conductive element 2514 also functions as a light reflector. Thereby reflecting some of the light incident upon it where the reflected light can be reflected or transmitted by other light transmitting thermally conductive elements 2510, 2512, 2516 forming the light recycling cavity. The multiple light transmitting thermally conductive elements 2510, 2512, 2414, 2516 function to redirect light emitted 2587 by said at least one light-emitting diode 2530 back to and through said multiple light transmitting thermally conductive elements 2510, 2512, 2414, 2516. Depicted in FIG. 25A is a cross-section of the cavity formed by the multiple elements 2510, 2512, 2414, and 2516. The complete light recycling cavity 2575 is shown in FIG. 25B formed by multiple elements 2510, 2512, 2414, 2516, 2560 and 2570 thereby creating a completely closed enclosure. As described above light extraction efficiencies can be achieved that exceed 50% while utilizing light transmissive thermally conductive elements having less than 50% light transmissivity when formed into a light recycling closed cavity enclosure. Therefore the light recycling cavity 2575 has a light extraction efficiency that exceeds the light transmissivity of the multiple light transmitting thermally conductive elements 2510, 2512, 2414, 2516, 2560 and 2570 forming the light recycling cavity and is an embodiment of the invention. The ability to use high reflectivity light transmitting thermally conductive elements with a reflectivity greater than 50% and more preferably greater than 80% allows the use of less costly materials to form the self cooling light source. Therefore a further embodiment of the invention is a self cooling light source consisting of multiple thermally conductive light transmitting elements 2510, 2512, 2514, 2516, 2560, and 2570 that have a reflectivity of greater than 50%, but over 50% of the light emitted by the at least one light emitting diode 2571 enclosed in the light recycling cavity 2575 is extracted through multiple light transmitting thermally conductive elements 2510, 2512, 2514, 2516, 2560, and 2570 that form the light recycling cavity 2575. Again the key attribute is minimization of the absorption losses within the recycling cavity 2520 such that very long optical pathlengths are possible without cutting the overall efficiency of the light source. While not shown, the addition of leads, pins or other interconnect means including wireless inputs is disclosed in this embodiment. Additional functionality including but not limited to antenna, IR laser communications, and sensors can also be incorporated into or on the recycling cavity light source 2520. A self cooling light source may further comprise, at least one light transmitting thermally conductive elements 2510, 2512, 2514, 2516, 2560, and 2570 and at least one light emitting diode (LED) 2530 for emitting light wherein the at least one light transmitting thermally conductive elements 2510, 2512, 2514, 2516, 2560, and 2570 acts as the primary heat dissipation means of the at least one light emitting diode 2530 and also acts as a light extraction means for at least a portion of the light emitted by the at least one light emitting diode 2530. Alternately, The self cooling light source can further comprise multiple light transmitting thermally conductive elements where the at least one light emitting diode 2530 mounted to at least one of the multiple light transmitting thermally conductive elements and where the multiple light transmitting thermally conductive elements form a light recycling cavity 2520 with a high efficiency in extracting light from the at least one light emitting diode 2530 through the multiple light transmitting thermally conductive elements.

The advantages of light recycling cavities were described in U.S. Pat. No. 6,869,206 and U.S. Pat. No. 6,960,872, (both of which are commonly assigned and incorporated by reference into this invention) where it was shown that an increase or gain in optical luminance could be achieved by having a high reflectivity cavity including high reflectivity LEDs in the cavity. In this embodiment, light recycling is used to create not only a highly efficient light source (with material typically considered opaque) but also the multiple reflections and high level of scattering creates a uniform brightness source. Again, the long optical pathlengths created in the recycling cavity 2520 leads to the higher uniformity.

In the two patents cited above, for an optical gain to be achieved the LED surface area needed to exceed the exit aperture area of the cavity. In that case, because the LEDs typically have lower reflectivity but higher surface area than the other materials making up the cavity this lowers the efficiency of the cavity. In this invention, there is no physical exit aperture. The exit aperture, in effect, is the entire outer surface of the recycling cavity light source 2520.

By design in this invention the light transmissive thermally conductive elements making up the cavity have much larger areas than the LEDs in the cavity to dissipate the heat from the LEDs. In the examples above, homogenous materials are used to form the reflective/transmissive light transmitting thermally conductive elements. Alternately, non-homogenous reflective/transmissive thermally conductive elements may be used as well.

As an example, reflective aluminum may be drilled, etched or otherwise perforated with an array of holes to form a reflective perforated metal material, which acts as a mostly reflective light transmitting thermally conductive element. Small holes, with their total area representing less than 50% of the surface area of the reflective aluminum, is preferred. Even more preferred is that the areas of the holes cover less than 20% of the surface area of the reflective aluminum (which can be flexible in the form of a foil) to form at least one of the light transmissive (with reflection) thermally conductive elements 2510, 2512, 2514, and 2516. In this embodiment the light transmitting thermally conductive element (e.g. 2510, 2512, 2514, 2516 in FIG. 25 or 2420 in FIG. 24) is a reflective perforated metal material. Optionally, additional scattering coatings or layers may be added to one or both sides of the reflective perforated (porous) metal (e.g. aluminum) element.

The LED(s) 2530 surface area will be small compared to the overall interior surface area of the recycling cavity 2520. This is desired because the outer surface of the elements making up the light recycling cavity 2520 are required to dissipate the heat generated by the LED(s) 2530 along with any Stokes' losses in the wavelength conversion elements inside the recycling cavity 2520. For ceramic translucent elements, there are no physical exit apertures. However, there is light extraction through the recycling cavity 2520 by the light being partially transmitted through the thermally conductive partially reflective translucent elements 2510, 2512, 2514, and 2516 making up the sides of the cavity.

As mentioned, the invention can be practiced alternatively with highly reflective metal sides, which have been perforated with micro holes distributed evenly or un-evenly (to pattern the light) across their surfaces or combinations of both homogenous (e.g. ceramic, alumina, etc.) and non-homogenous materials. Designs based on porous flexible metal foil as the light transmissive thermally conductive elements 2510, 2512, 2514, and 2516 allow for large area and flexible light sources to be constructed using the high thermal conductivity metal as the heat dissipating luminescent elements. Any of the sides for example 2560 and 2570 can be emitting or non-emitting surfaces with or without air holes for additional convective cooling. The only requirement is that they be highly reflective (>90%) on their inside surfaces. Porous flexible metal foils may optionally be made to allow or not to allow air flow into and out of the recycling cavity 2520.

In general, the light recycling cavity 2520 allows for light from the LED(s) 2530 to be spread out over a larger area and to have multiple opportunities to interact with any wavelength conversion elements within the light recycling cavity 2520. It should also be noted that scatter is wavelength dependent, with shorter wavelengths being more strongly scattered than longer wavelengths. As a result, LED packages containing wavelength conversion layers create light sources with significantly lower color temperatures when contained in light recycling cavities compared to the LED package as measured outside the light recycling cavity 2520. This is due not only to increased recycling of the shorter wavelengths back to the wavelength conversion layer but is also due to slightly higher emission efficiency of longer wavelengths (green, yellow, red, infrared) compared to shorter wavelengths (UV and blue) through the light transmissive thermally conductive elements. Based on these two effects, the color temperature can be reduced by several hundred degrees Kelvin using a light recycling cavity. For the non-homogenous approach, specular surfaces can be used to reduce this wavelength dependence. An embodiment of this invention, therefore, is that light recycling cavities as described herein enable lower color temperature sources while minimizing the amount of wavelength conversion material required because the recycling allows for multiple interactions between the shorter wavelength excitation (UV and blue) and the wavelength conversion layer.

In general, low optical absorption plastics are preferred (fluorinated polymers, polysiloxanes, polysilazanes, halogenated polymers, non-halogenated polymers, polycarbonates, acrylics, silicones, and inorganic/organic composites comprising low optical absorption organics). An example of a low absorption strongly scattering polymeric film is WhiteOptic™. While this film exhibits low absorption losses and white body color, it also has very low thermal conductivity. While this material can be used for parts of the recycling cavity, which are not used to cool the LED, materials with thermal conductivity higher than 1 W/mK are preferred for the thermally conductive translucent elements disclosed in this invention. A preferred embodiment of this invention is a self cooling light source where the multiple light transmitting thermally conductive elements have a white body color.

In general, all unfilled organic materials exhibit low thermal conductivity (less than 1 W/mK and typically less than 0.1 W/mK) and cannot be used effectively to spread the heat generated in the LEDs within the recycling cavity. While one could in theory operate the LEDs at such a low level and use hundreds of LEDS within the recycling cavity and use a lower thermal conductivity material, the cost would be prohibitive. In almost all solid state light sources the LEDs themselves typically represent 50% to 80% of the overall cost. The intent of this invention is to disclose materials, which enable the minimum number of LEDs while still not requiring additional heat sinking means. Based on experimental results, thermal conductivities of greater than 5 W/mK is preferred and greater than 20 W/mK is most preferred for the light transmitting thermally conductive elements. In addition, most unfilled polymer systems, which exhibit low optical absorption, have low use temperatures typically below 150° C. and even below 100° C. Therefore, strongly scattering organic materials, which can withstand greater than 200° C. are preferred and even more preferred are in organic materials, which can withstand greater than 300° C. High quality low resistance interconnects compatible with wirebonding and/or direct die attach fire at temperatures over 400° C. Also direct die attach LEDs typically solder at greater than 300° C. While lower temperature interconnects and conductive adhesive may be used, there are significant trade-offs in performance both electrically and optically. Finally, most unfilled organic materials also are flammable. As such inorganic materials like alumina or porous metal foils are preferred. However, organic/inorganic composites are possible.

As an example of thermally conductive inorganic/organic composite with a thermal conductivity over 5 W/mK capable of withstanding greater than 300° C., is boron nitride filled polysilazane that may be used to form either a thermally conductive layer on the porous flexible metal foils or inorganic thermally conductive light transmitting elements or be used as a freestanding element forming at least one surface of the light recycling cavity. Other polymeric binders are also possible, however, the high temperature performance, optical transparency and compatibility of the polysilazanes with boron nitride make this inorganic/organic composite a preferred materials choice. Filled thermoplastic composites are especially preferred.

Figure 26A:
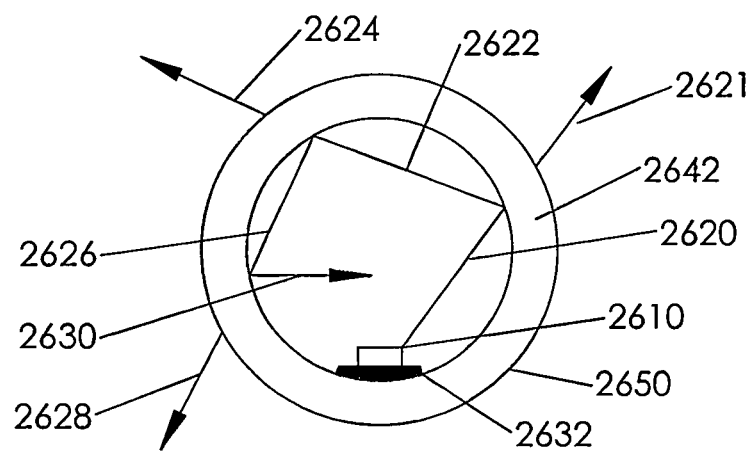
FIG. 26A depicts a side view of another embodiment of this invention where the highly reflective thermally conductive element is in the form of a tube with LEDs mounted on the inside of the tube and thermally in contact with the tube.
Figure 26B:
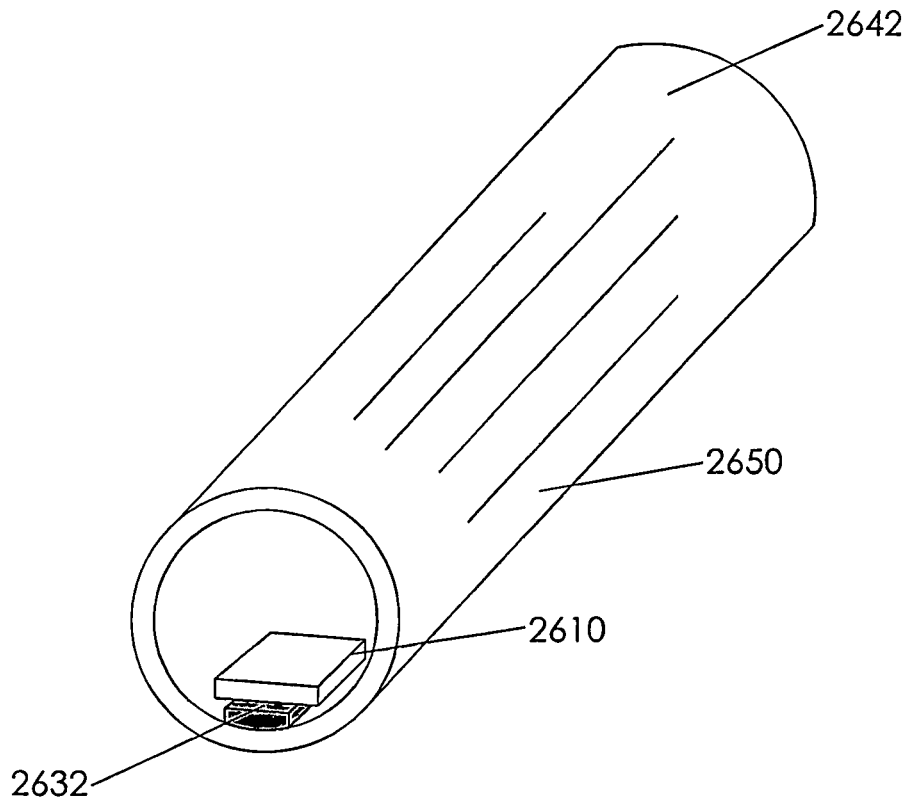
FIG. 26B shows a perspective view of the present invention of FIG. 26A.

FIG. 26A depicts another embodiment of the invention shown in perspective in FIG. 26B. At least one LED 2610 is mounted to an electrically conductive interconnect 2632 printed on the inside wall of the reflective/transmissive thermally conductive tube 2642. The interconnect 2632 may be printed using a specially designed screen printer or pad printer to allow insertion and printing on the inside of wall of the tube. Optionally, the interconnect 2632 also may be printed using a specially constructed inkjet printer having a long reach head or nozzle to fit inside the tube 2642. Once printed the conductive ink is deposited and then cured or fired in a furnace. The interconnect 2632 can be gold, silver, copper or any other suitable electrical conductor including transparent conductors like indium tin oxide (ITO) or zinc oxide. For white light sources materials such as silver with high reflectivity throughout the visible range is preferred. For red or infrared sources gold is preferred. At least one LED 2610 or surface mount LED package is then soldered onto the pads that are part of the interconnect 2632 on the inside wall of the tube 2642. This operation can also be performed by a suitably designed pick and place mechanism that locates the pads via optical recognition and places the LED 2610 on the pads. The LED or LED package 2610 light emitting surface is mounted to face inward into the cavity.

As stated above, mounting the LEDs this way creates indirect lighting, which enhances uniformity. A sample light ray 2620 of light emitted by the LED 2610 is shown impinging on the inside surface of the mostly reflective semi-translucent thermally conductive tube 2642. A portion of this light is transmitted 2621 however most of the light is reflected 2622 and impinges again on the inside of the tube 2642 with again a small fraction transmitted 2624 and a major fraction reflected 2626. This reflected portion shown as light ray 2626 impinges again on the inside of the tube 2642 and a small portion is transmitted 2628 and a major portion reflected 2630. This continues in this way with the light reflected and scattered around the light recycling cavity formed by the tube 2642 until all of the light is either absorbed or transmitted through the walls of the mostly reflective (optionally translucent) light transmitting thermally conductive tube 2642. This makes for a very uniform emitting surface 2650 on the outside of the tube 2642. Typically to get sufficient mixing requires putting many LEDs or LED packages 2610 inside a tube 2642 and distributing them so that you get a uniform emission pattern. However with the LEDs facing inward and the reflective and light transmitting thermally conductive tube 2642 there is enough reflection, bounces and scattering of the light before its transmitted that a very uniform luminance is achieved on the entire outside surface 2650 of the tube 2642. The tube can be made from the materials previously disclosed (e.g. metal, alumina, TPA, etc.).

The FIG. 27A through FIG. 27G show different embodiments of the invention where the mostly reflective and light transmitting thermally conductive elements are simultaneously both light emitting surfaces and heat dissipation surfaces of the light source. In all of the examples, the LEDs or LED packages 2710 are mounted on the inside walls of the mostly reflective translucent thermally conductive elements 2720, which in each case form closed or mostly closed cavities, enclosures, or envelopes. The interconnects 2730 to the LEDs 2710 and interconnect 2730 printed on the inside walls of the reflective/transmissive thermally conductive elements 2720, 2734, 2736, and 2738 are connected by an electrically conductive through hole or via or pins 2740 that pass through the walls of the envelope formed by the reflective and light transmitting (and optionally translucent) thermally conductive elements 2736. Optionally, one of the sides (thermally conductive reflective/transmissive elements) can overlap another side, which will expose the interconnect printed on the inside surface of the side to the outside of the cavity. This would eliminate the need for a through hole or via in the side.

Figure 27A:
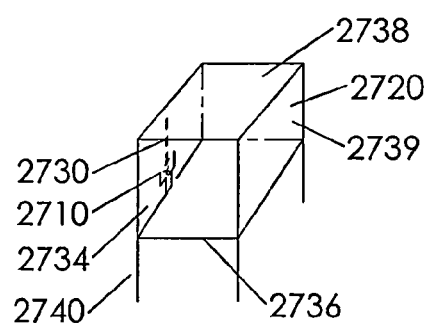
FIG. 27A depicts a side view of a cubicle or rectangular structure of the present invention where the highly reflective thermally conductive elements are both the light emitting surface and the heat dissipation surface of the light source.
Figure 27B:
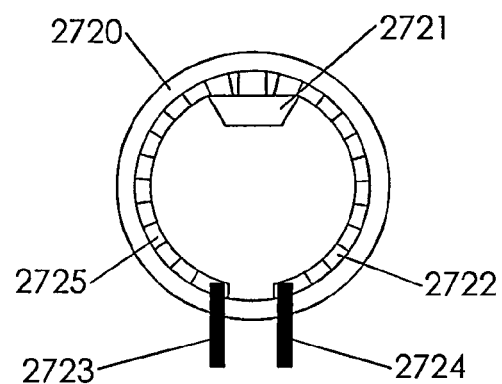
FIG. 27B depicts a side view of a sphere structure of the present invention where the highly reflective thermally conductive elements are both the light emitting surface and the heat dissipation surface of the light source.
Figure 27C:
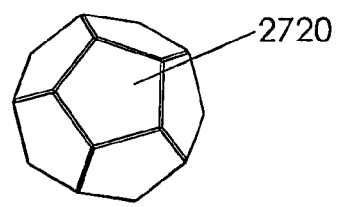
FIG. 27C depicts a side view of a dodecahedron structure of the present invention where the highly reflective thermally conductive elements are both the light emitting surface and the heat dissipation surface of the light source.
Figure 27D:
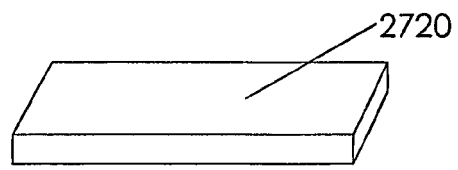
FIG. 27D depicts a side view of a side view of a large and small flat light panels structure of the present invention where the highly reflective thermally conductive elements are both the light emitting surface and the heat dissipation surface of the light source.
Figure 27E:
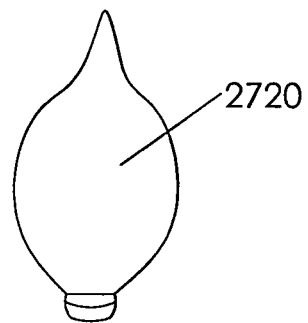
FIG. 27E depicts a side view of a flame shape structure of the present invention where the highly reflective thermally conductive elements are both the light emitting surface and the heat dissipation surface of the light source.
Figure 27F:
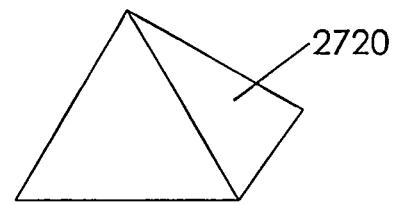
FIG. 27F depicts a side view of a pyramidal shaped structure of the present invention where the highly reflective thermally conductive elements are both the light emitting surface and the heat dissipation surface of the light source.
Figure 27G:
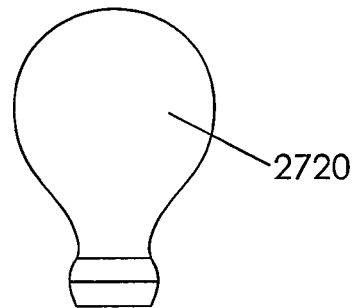
FIG. 27G depicts a side view of a bulb structure of the present invention where the highly reflective thermally conductive elements are both the light emitting surface and the heat dissipation surface of the light source.

In FIG. 27A a cubicle or rectangular structure is shown. In FIG. 27B, a sphere is shown. In this example, at least one LED 2721 is soldered to interconnect 2722 and 2725 also within the spherical light recycling cavity. External pins 2724 and 2723 connect to interconnect 2722 and 2725 respectively. In this manner a single light transmitting thermally conductive element can be used to form a light recycling cavity. In the embodiments of this invention the light transmitting thermally conductive elements not only function as a light emitter but also as a cooling element for at least one LED 2721 mounted on them. In FIG. 27C, a sphere can be approximated via a dodecahedron structure. Large and small flat light panels can also be constructed as shown in FIG. 27D using the principles of this invention. Also various artistic shapes can be made, for example in FIG. 27E, a flame shape is formed to simulate the look of a candle flame. FIG. 27F shows where the invention can be utilized to form a pyramidal shaped light source. In FIG. 27G, a bulb mimicking an Edison incandescent can also be made using the teachings of this invention. In general, a preferred embodiment for this invention is a self cooling light source comprising, at least one light transmitting thermally conductive element that functions as part of a light recycling cavity 2720, and at least one light emitting diode 2721 for emitting light where the at least one light emitting diode 2721 is enclosed within the light recycling cavity 2720 where the at least one light transmitting thermally conductive element also functions both as a light emitter and as a cooling element for said at least one light emitting diode 2721.

In all the configurations shown either homogenous or non-homogeneous materials can be used for the light transmissive thermally conductive elements 2720. A wide range of body colors and/or patterns can be created on the outer surfaces of the partially reflective partially transmissive thermally conductive elements 2720 for functional and/or aesthetic reasons. As described there are many ways to form a luminous self cooling light recycling cavity. A most elemental one can be formed comprising a single thermally conductive light transmitting element that is in the form of a closed cavity or envelope with a least one LED mounted and in thermal contact to the inside surface of the envelope. The LED may be powered by an external power source that is connected to the LED through a small wire or via penetrating the envelope or cavity.

Figure 28:
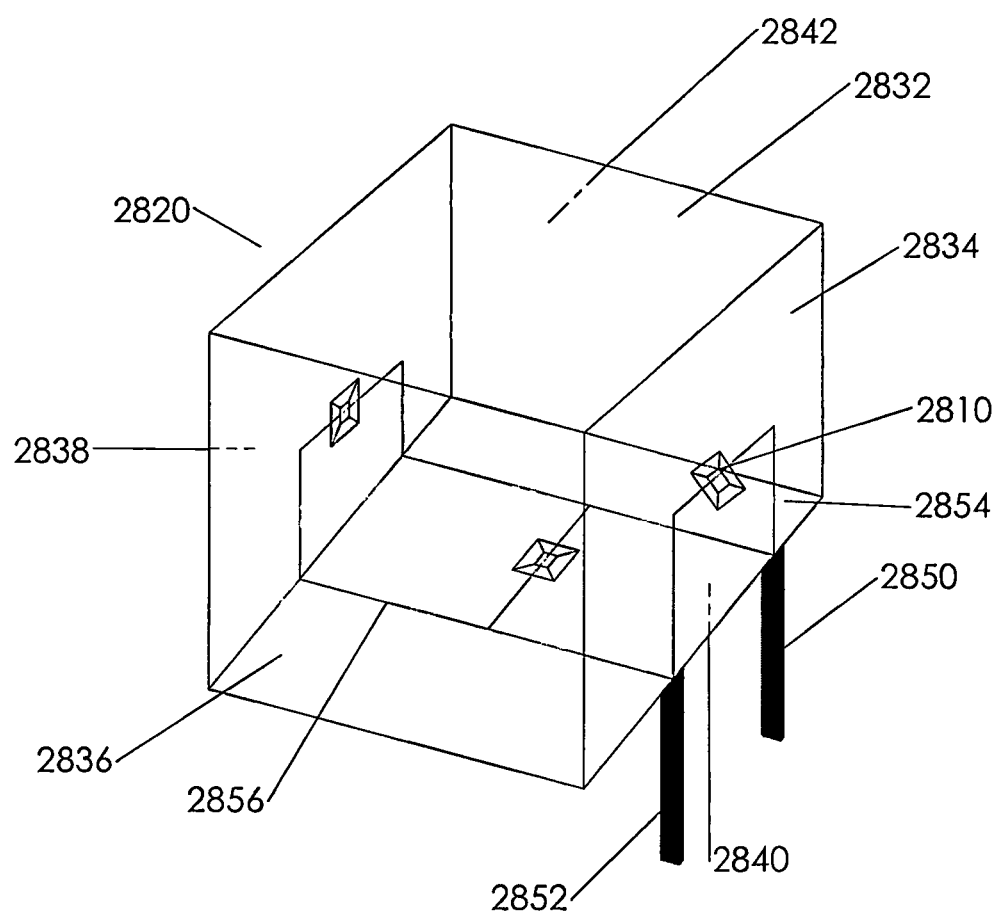
FIG. 28 shows a perspective view of another embodiment of the invention where multicolored LEDs are utilized to form light sources that can be tuned to any color.

FIG. 28 depicts yet another embodiment of the invention where multicolored LEDs 2810 are utilized inside the light recycling cavity envelope 2820 formed by the simultaneously light reflective and transmissive thermally conductive elements 2832, 2834, 2836, 2838, 2840, and 2842. By using multicolored LEDs 2810 and the teachings of this invention, a light source may be produced that can be tuned to any color within the natural light spectrum. Because of the many reflections, the light incurs prior to exiting of the envelope (cavity) sufficient wavelength mixing of the different colors is achieved so that a uniform color and brightness is seen on all of the outside emitting surfaces of the light recycling cavity/envelope 2820.

Interconnect circuits 2854 and 2856 are also within the light recycling cavity envelope 2820 and may connect multicolored LEDs 2810 either separately or jointly to external contacts 2850 and 2852. As shown, most preferred interconnects are thin traces due to the cost of the metal materials used. Most preferred are low surface roughness silver thick film pastes with an RMS roughness less than 5 microns. An example is Hereaus silver thick film paste CL80-9364 which enables the use of direct attach LED die 2810 such as DA-500 die produced by Cree. Direct attached die and/or soldered LED packages 2810 are preferred embodiments due to the elimination of wirebonding costs. In general, high reflectivity and high conductivity materials are preferred for interconnect circuits 2854 and 2856. Typical trace widths are 100 microns with thickness typically 5 microns or thicker depending on current and distance required. External contacts 2850 and 2852 may attach to interconnect circuits 2854 and 2856 using conductive epoxy, soldering, ultrasonic bonding, tab bonding, mechanical means, and other connection means known in the art. The use of flex circuits for external contacts 2850 and 2852 are disclosed however other means including but not limited to pins, clips, pads, strips, and other mechanical contact means are disclosed.

A preferred embodiment is continuation of interconnect circuits 2854 and 2856 outside inner surfaces of the light recycling cavity envelope 2820 such that external contacts 2850 and 2852 are simply metalized pads on the outside surface of light recycling cavity envelope 2820. These approaches and properties of the interconnect circuits 2854 and 2856 are common to and can be utilized by the other embodiments in this disclosure. The use of adhesives, clips, solders, mechanical means, and fusion processes to physically hold simultaneously light reflective and transmissive thermally conductive elements 2832, 2834, 2836, 2838, 2840, and 2842 together is also disclosed. A preferred embodiment is that the interconnect circuits 2854 and 2856 also provide soldering joints for the assembly. Once formed this embodiment can create a wide range of colors when lit, while still maintaining a substantially white body color. As previously disclosed, additional semiconductor devices and elements may be incorporated within and/or on the light recycling cavity envelope 2820 besides just LEDs.

In addition interconnect circuits 2854 and 2856 may be used to form antennas for RFID and other communication and sensor applications. Interconnect circuits 2854 and 2856 may also be used to create inductive or capacitive couplers to external modulated energy source eliminating the need for external contacts 2850 and 2852. Additional functions which can be incorporated into these self cooling light sources are but not limited to RFID sensing, smoke detection, ambient temperature detection, RF emitters, strobe sources, optical data links, motion sensors, and wireless communications.

As lighting is required in virtually all occupied spaces it is only natural that sensor, communication, and security functions be integrated into the light sources. The simultaneously light reflective and transmissive thermally conductive elements 2832, 2834, 2836, 2838, 2840, and 2842 especially if constructed of low cost alumina provides an ideal substrate for integrating these extra functions into the light source. The strongly scattering white body color of these light sources allow for the concealment of security functions such as cameras and sensors. As an example, a store owner could buy a light source based on this invention, which queried RFID tags at the exit from the story while an externally identical light source could be detecting motion elsewhere in the store. In this manner, lighting and security become the same element reducing cost, concealing the security, and improving the aesthetics. Interconnect circuits 2854 and 2856 and external contacts 2850 and 2852 may be single circuits as shown or multiple circuits. The extra functions may be powered separately and in tandem with the LEDs 2810.

Figure 29:
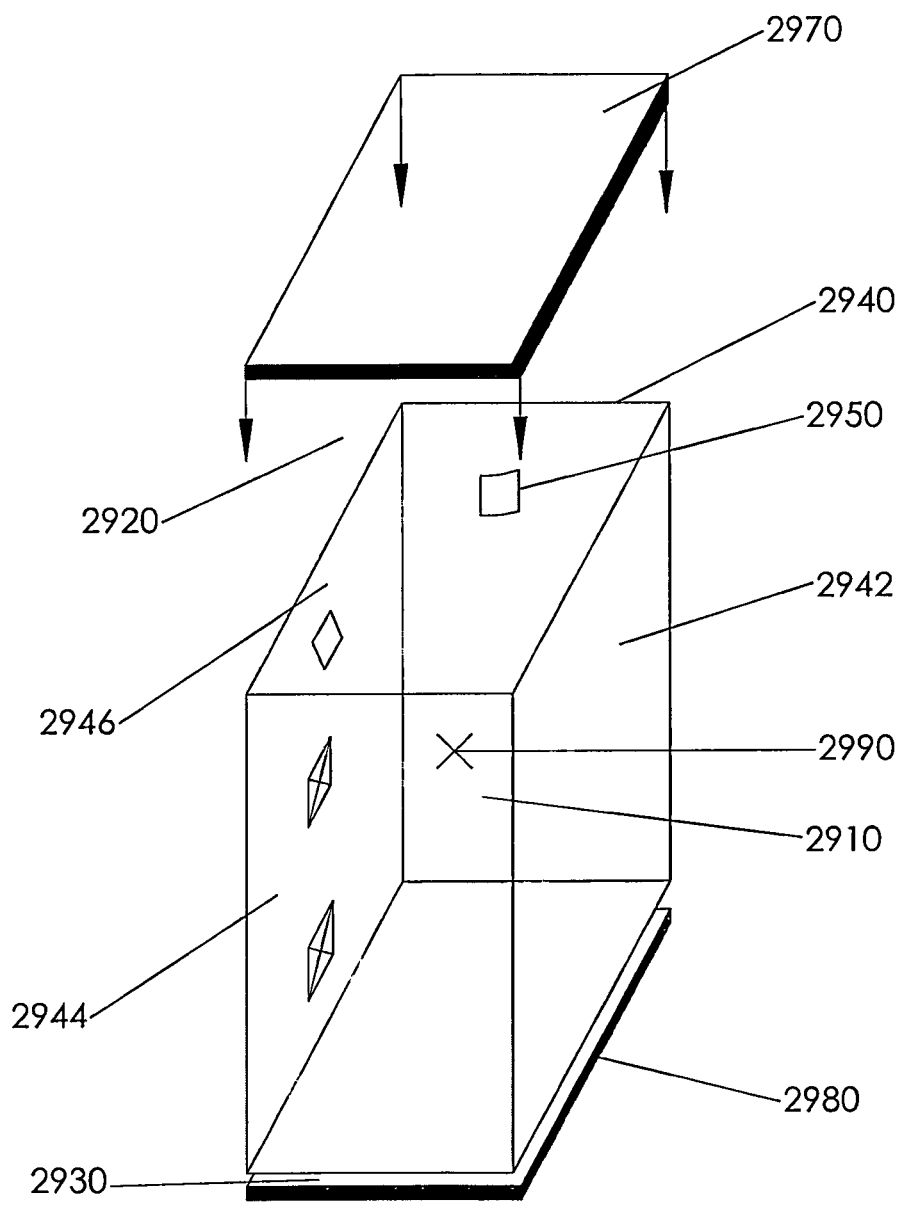
FIG. 29 shows a perspective view of another embodiment of the invention where the light source has open tops and bottoms to allow air to flow on both side of the highly reflective thermally conductive material.

In the prior examples and embodiments, a mostly closed light recycling cavity or envelope was formed. FIG. 29 shows another embodiment of the invention where the self cooling light source 2910 has open top 2920 and bottom 2930. This allows air to flow on both sides of the multiple light transmitting thermally conductive elements 2940, 2942, 2944, and 2946 thereby producing more cooling to the LEDs 2950. Using this approach a self cooling light source consisting of multiple light transmitting thermally conductive elements 2940, 2942, 2944, 2946, 2920, and 2930 that form the light recycling cavity 2910 are arranged to allow air to flow through said light recycling cavity 2910 but also to prevent light from escaping without passing through said multiple light transmitting thermally conductive elements 2940, 2942, 2944, 2946, 2920, 2930.

FIG. 29 shows top end cap 2970 and bottom end cap 2980 which are staggered such that light is substantially reflected back into the recycling cavity 2990 while still allowing air to flow from bottom to top (on the inside of the cavity or envelope) creating a chimney cooling effect. The objective is to allow air to flow through the cavity but prevent light emitted by the LEDs inside the cavity from escaping without passing through the light transmissive thermally conductive elements. Alternately, top end cap 2970 and/or bottom end cap 2980 may be porous in nature to allow for air flow. However, in most cases a mostly closed envelope is preferred which provides more structural rigidity and is easier to fabricate. This can simplify production of the light sources. The light recycling cavities or envelopes formed by the reflective and transmissive thermally conductive elements can be optionally hermetically sealed or a small opening can be provided to allow air pressure to equalize on the inside of the cavity or envelope with the ambient air pressure.

This invention creates solid state light sources where the light emitting surface of the solid-state light source also is used to cool the source. Such a self cooling source preferably will have an emitting surface that is close in temperature to the LED junctions to maximize both convective and radiative cooling. The emitting surface is constructed of a material that exhibits sufficient thermal conductivity to allow for the heat from small but localized LED die or LED mounted on small thermally conductive substrates to be spread out over a sufficiently large enough area to effectively cool the LEDs. In this invention this is accomplished by spreading the heat generated over a larger volume, using a relatively high thermal conductivity light transmitting and optionally reflective and optionally diffusing element, that spreads the heat generated in the semiconductor devices (e.g. LEDs) via conduction over a larger surface area than the semiconductor devices. The radiative and convective cooling is maximized by selecting materials with high emissivity or with high emissivity coatings, and utilizing large surface areas, and higher surface temperatures created by efficient coupling of the heat generating components (e.g. LEDs) to the outside surfaces of the self cooling light source. Also an embodiment of this invention is self cooling light sources that are formed into light recycling cavities where the only light escaping or extracted from the closed cavity passes through the walls of the cavity and is emitted by the outer heat dissipating surfaces of the luminous cavity. The walls or sides of the cavity may be fabricated by any element or material that exhibits reflection and transmission of light and exhibits high thermal conductivity. These include both high and low optically transmissive ceramics. Also taught in this invention is that materials that have relatively high optical reflectivity (and therefore, low optical transmissivity) may be used, which permits the use of lower cost ceramics and even metals perforated with multiple small apertures.

For example, it has been shown that even using alumina with a reflectivity of >80% (and in line light transmissivity of <20%) as the material for the light transmissive thermally conductive elements very high extraction efficiencies can be attained from closed light recycling cavities made with these materials. It has been shown that over 70%, and in some cases over 80%, of the light emitted by LEDs inside the completely closed light recycling cavities can be extracted through and emitted by these thermally conductive materials. A further benefit of using these highly reflective ceramic materials is that they have white body color. Therefore, when the light source is in the off state they have a very aesthetically pleasing appearance. This is in contrast to many commercially available solid state light bulbs that look yellow when they are not lit.

A key attribute of this invention is the formation of efficient recycling cavities similar to those disclosed in U.S. Pat. No. 7,040,774 (commonly assigned and incorporated by reference into this invention). In light recycling optical cavities, multiple bounces or reflections are purposefully caused to occur. If the cavity is formed using materials with low enough optical absorption losses, the efficiency can be very high. This invention discloses the formation of light recycling optical cavities in which at least a portion of the light recycling cavity is constructed of partially transmitting (optionally translucent) thermally conductive elements. This is based on the recognition that even materials typically considered opaque can be used to form efficient emitters if optical absorption is minimized. The importance of this discovery is that low cost materials such as white body color alumina (e.g. 96% $Al_2O_3$) can now function as translucent thermally conductive emitters with or without wavelength conversion. The ability to form white body color or even off-white body color light sources is important from both an aesthetic and marketing standpoint. Consumers prefer white body color or off-white body color light sources for many applications due to their familiarity with incandescent and fluorescent lamps. As such, thermally conductive luminescent elements with white or off-white body colors when they are not emitting light are preferred. This can be further extended to include a wide range of body colors and patterns when non-homogenous thermally conductive luminescent elements are used such as reflectors with arrays of holes. The use of texture and other outer surface treatments to create various aesthetic looks is also an embodiment of this invention. In particular, the formation of thermally conductive luminescent elements, which match or contrast or blend aesthetically with their surroundings (e.g. lamp shades, ceiling tiles, etc.) are embodiments of this invention. In general, the ability to create a wide range of body colors for the thermally conductive luminescent element is a preferred embodiment of this invention.

Figure 30:
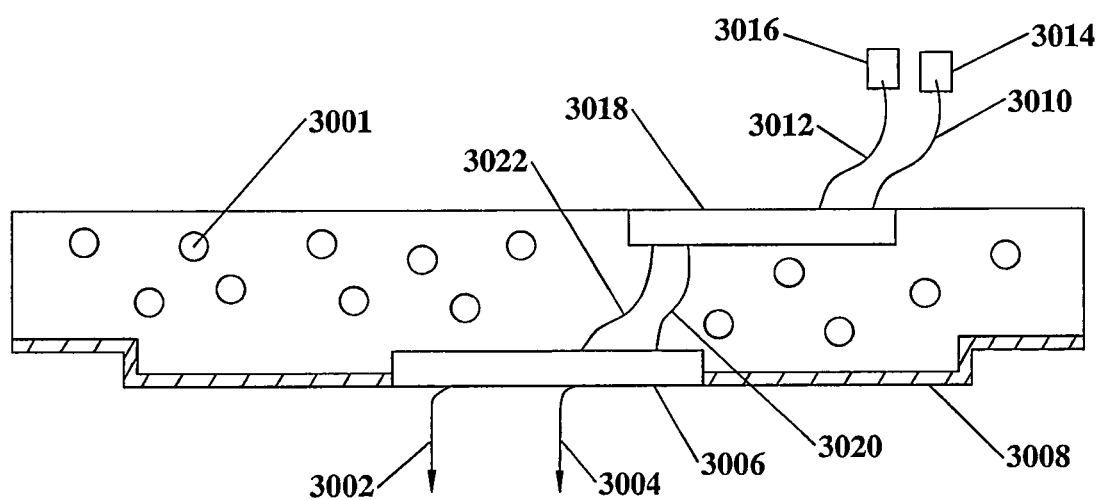
FIG. 30 depicts a side view of a self cooling light source embedded within a ceiling tile.

FIG. 30 depicts at least one self cooling light source 3006 embedded within a low thermal conductivity element 3001 which may consist of but not limited to a ceiling tile, wood, plaster, foamed materials, glass, porous glass, sheetrock, wallpaper, lathe, paneling, or other building material. The majority of the heat is dissipated to the surrounding ambient via convection and radiative means 3002 off the same surface the light 3004 is emitted from at least one self cooling light source 3006. Power may be supplied directly to at least one self cooling light source 3006 via power leads 3020 and 3022 which may also be embedded in or on a surface of low thermal conductivity element 3001. Decorative overlay 3008 may include but not limited to scrim, wallpaper, paint, veneers, foils, and other decorative elements. Decorative overlay 3008 may provide additional reflection or reflective means, cooling means, light spreading means, or concealment means for at least one self cooling light source 3006. Alternately, power leads 3020 and 3022 may connect to a power module 3018 and then to external power via external power leads 3010 and 3012 with connectors 3014 and 3016. Using this approach very light weight, thin solid state light sources can be incorporated into a wide range of building materials while maintaining temperature well within safety limits. A typical surface temperature of the light source disclosed emits greater than 8000 ft-1 while maintaining a surface temperature under 60 C. This is necessary to prevent combustion and reasonable touch temperatures. The use of non-combustible materials such as ceramics, highly filled polymer, and metals is preferred to construct the light recycling cavity of the self cooling light sources disclosed in this invention.

Figure 31:
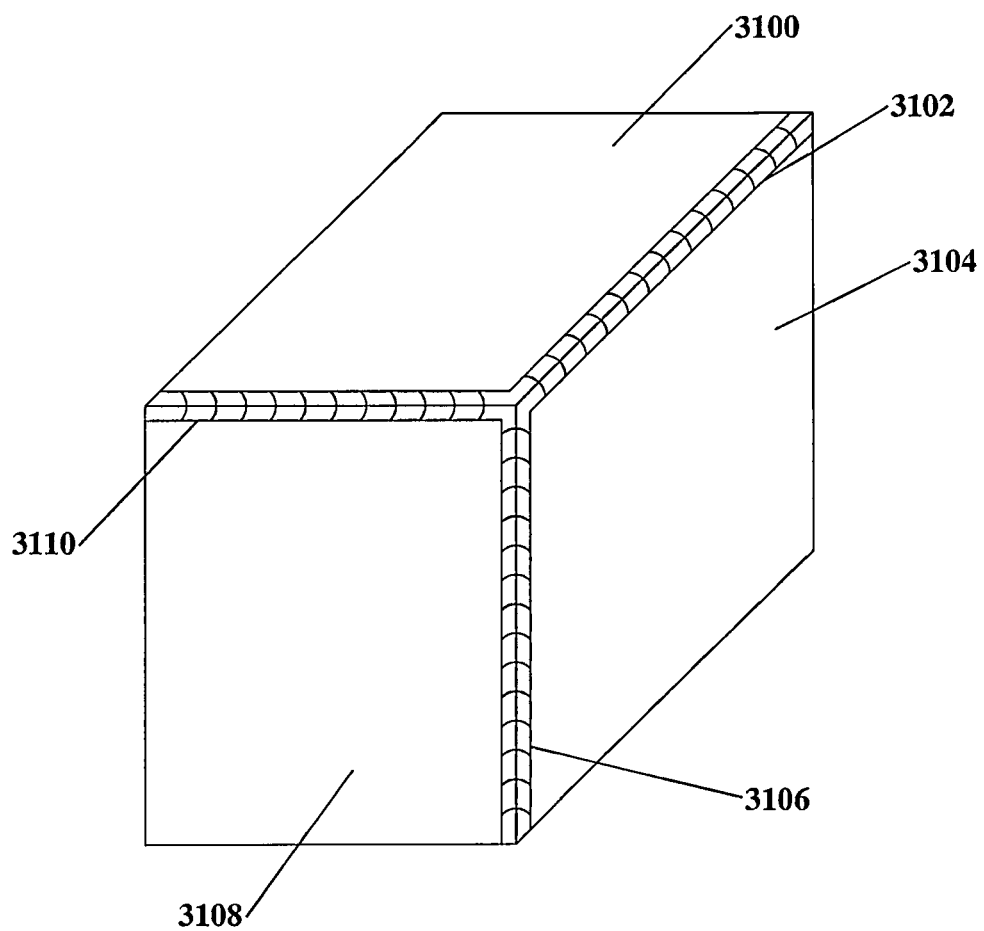
FIG. 31 depicts a perspective view of a fold up light source with a battery pack.

FIG. 31 depicts a foldable light recycling cavity based on thermally conductive translucent elements 3100, 3104, and 3108 (other two sides not shown). Which are hinged together via hinges 3106, 3102, and 3110. As previously disclosed the thermally conductive translucent elements once assembled into a cube or other volumetric shape forms a recycling cavity with LEDs (not shown) within the recycling cavity and radiating the light and heat out thru the thermally conductive translucent elements. The ability to store, compress, or otherwise change the recycling cavity form a larger volume to a more compact shape is an embodiment of this invention.

Figure 32:
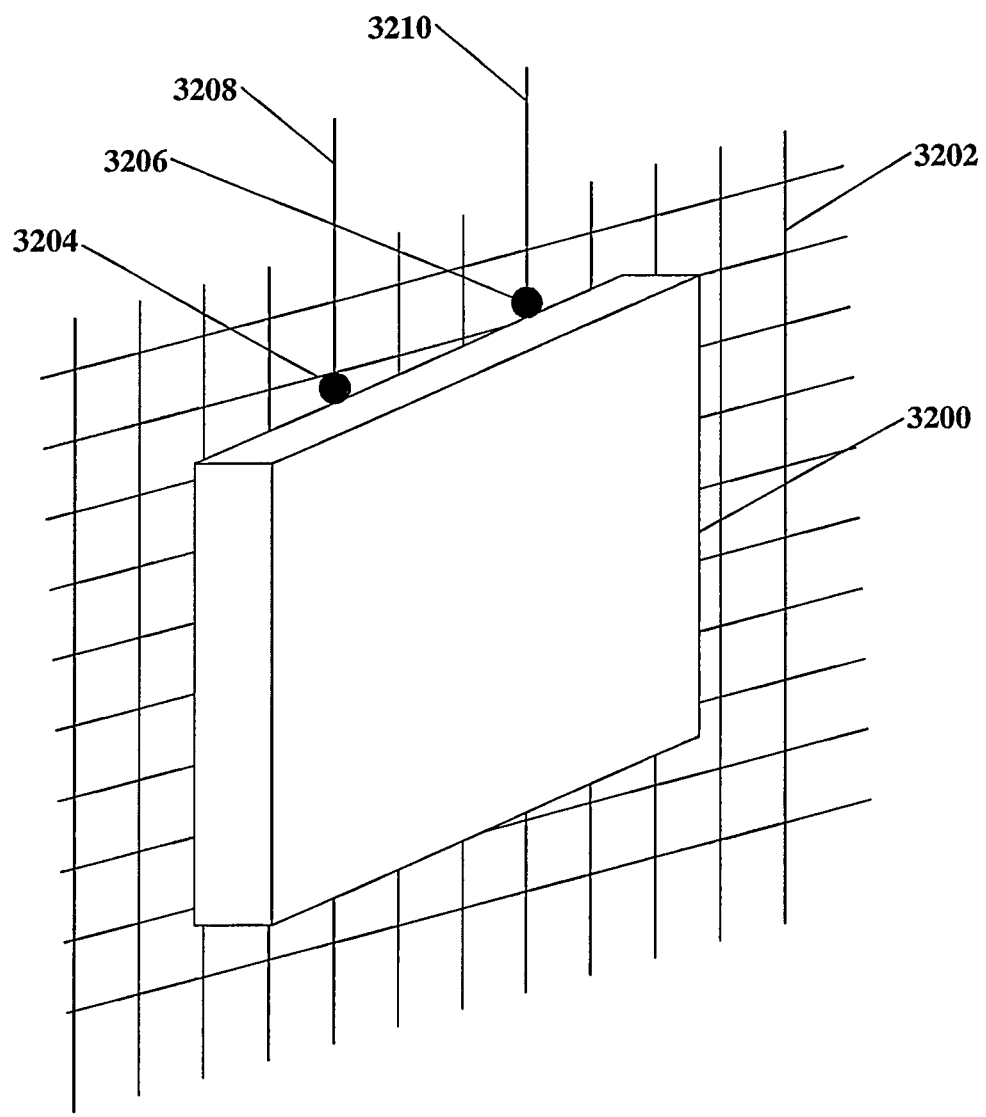
FIG. 32 depicts a perspective view of a self cooling light source attached to a woven or non-woven fabric containing at least two electrically conductive elements.

FIG. 32 depicts a self cooling light source 3200 attached to a woven or non-woven material 3202 including but not limited to fabrics, metal fabrics, fiberglass, paper, plastic mesh, or wood based products. Power may also be provided to self cooling light source 3200 via power lead 3210 and 3208 which may be attached to, woven in, hidden behind, glued to, and otherwise bonded to the woven or non-woven material 3202. Contacts 3204 and 3206 may be solder contacts, magnetic contacts, mechanical contacts, or RF wireless contacts.

Figure 33:
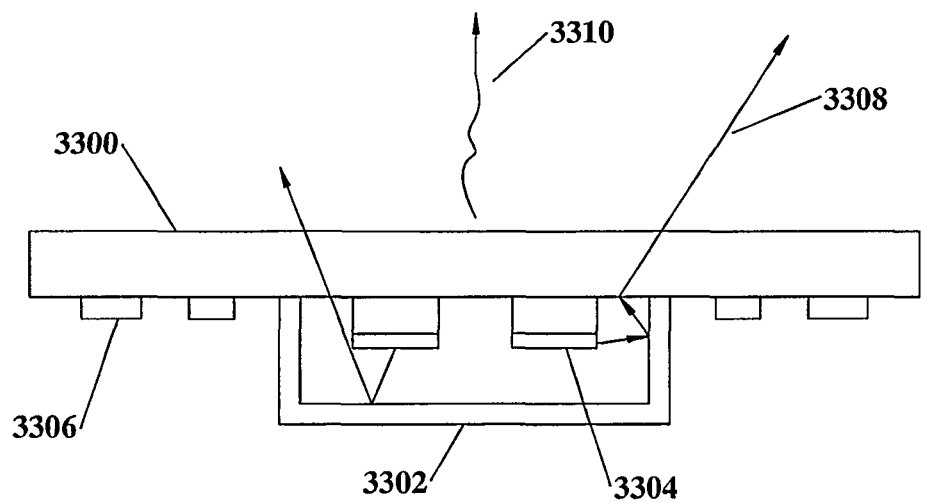
FIG. 33 depicts a side view of a light source with power conversion elements on the thermally conductive translucent element.

FIG. 33 depicts a recycling cavity containing a single thermally conductive translucent element 3300 on which electronics 3306 and solid state light sources 3304 are integrated. The electronics 3306 may provide power conversion, filtering, switching, and control of the solid state light sources 3304 or other sensor applications such as proximity, temperature, occupancy, fire, or smoke. This configuration is ideal suited for low cost light sources with higher levels of functionality. The light recycling cavity is formed using a reflector element 3302 as shown for lambertian or directional emission, alternately the reflector element 3302 may include other thermally conductive translucent elements or apertures (not shown) to allow for dual sided or isotropic emission. The heat generated by the solid state light sources 3304 and the electronics 3306 is substantially dissipated by convection and radiation 3310 to the surrounding ambient. While some light 3308 may leak into the region onto which the electronics 3306 are mounted onto thermally conductive translucent element 3308, the majority of the light emitted will be localized by the reflector 3302. While not shown surface mount interconnect is preferred on the surface of thermally conductive translucent element. Materials such as alumina, ceramics, highly loaded polymers and holey metals are preferred. The concept of a light transmitting multi chip module or printed circuit board is disclosed and is an embodiment of this invention. As such visa and other feed thru means known in the art are possible and while the electronics 3306 are shown on the same side of the thermally conductive translucent element 3300 as the solid state light sources 3304 it is disclosed that both sides of thermally conductive translucent element 3300 may be used for devices of any type.

Figure 34:
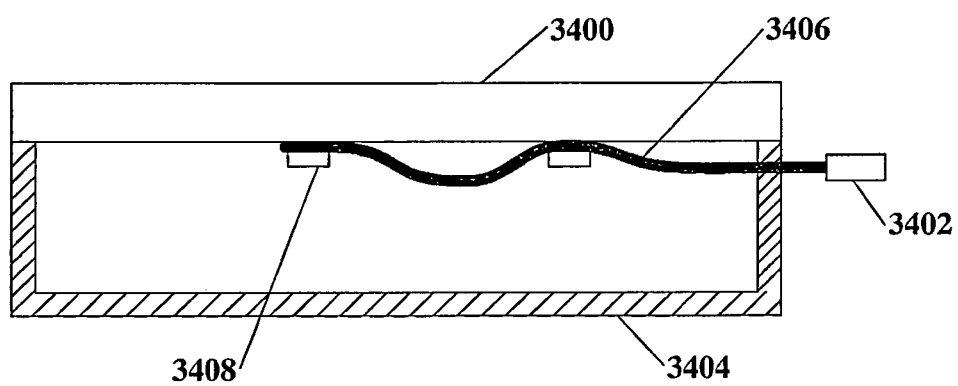
FIG. 34 depicts a side view of a recycling cavity light source with an integral low absorption flex circuit.

FIG. 34 depicts a recycling cavity formed using at least one thermally conductive translucent element 3400 and a reflector 3404. A low optical absorption flex circuit 3406 onto which LED die or LED packages 3408 are mounted extends into the interior the recycling cavity. The LED die or LED packages 3408 on low optical absorption flex circuit 3406 are thermally attached to at least one thermally conductive translucent element 3400. This minimizes the dark spots which can be seen on the output surface of at least one thermally conductive translucent element 3400. Ideally the low optical absorption flex circuit has highly reflective metal traces embedded in a clear or low optical absorption material including but not limited to Teflon, FEP, Alar, Tedlar, Acrylic, Polycarbonate, fluorinated polyimides, or other non colored polymers. As an example, silver coated copper strips may be melt bonded onto FEP strips to form low optical absorption flex circuit 3406 which may additionally exit the recycling cavity and be attached to connector 3402.

Figure 35:
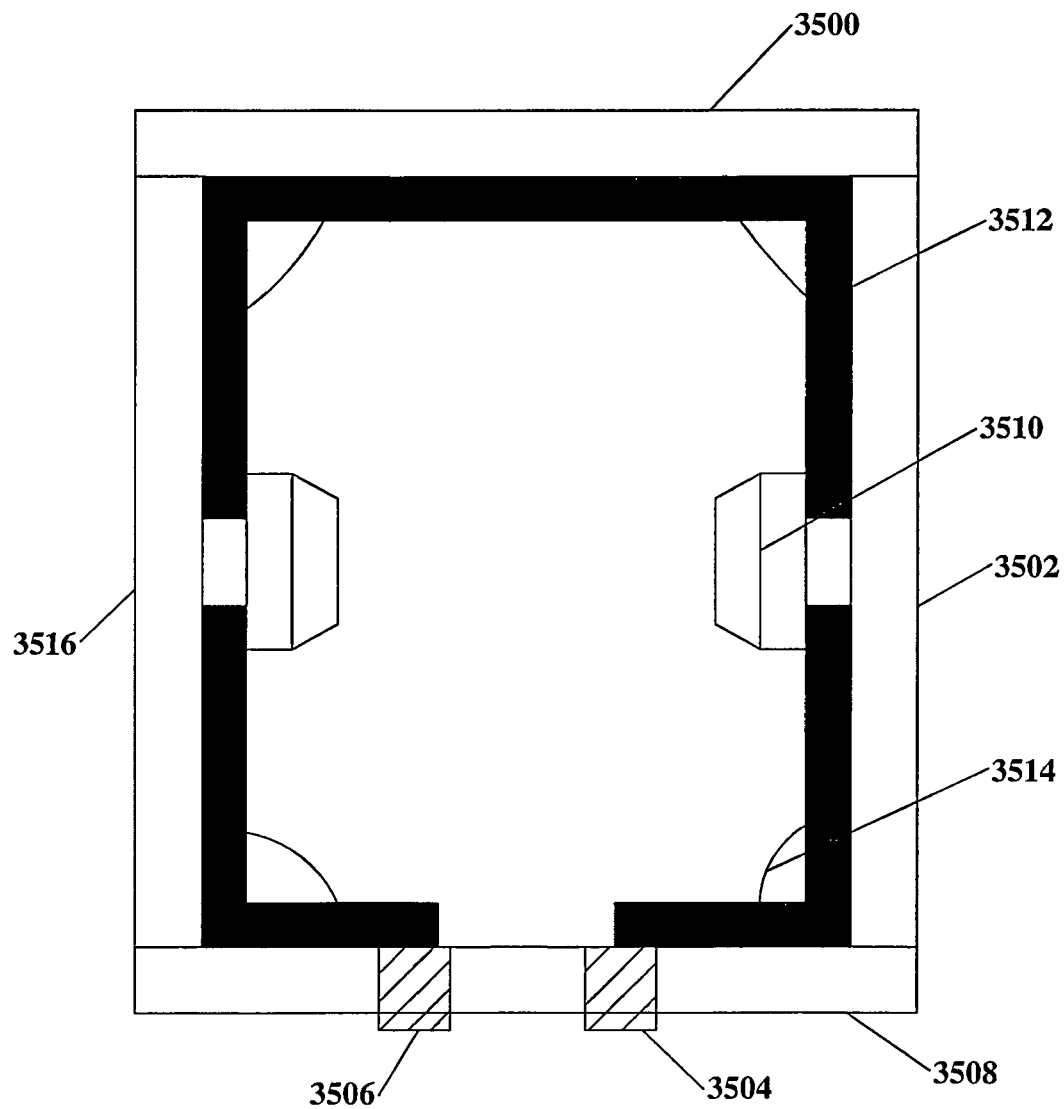
FIG. 35 depicts a side view of a self cooling light source glued together with magnetic feedthrough contacts.

FIG. 35 depicts a recycling cavity light source with magnetic feedthrus 3506 and 3504. While shown in cross-section the interconnect 3512 is very narrow traces only sufficiently wide enough to carry the current to LED packages 3510. As shown the interconnect 3512 is on inner surface of the recycling cavity formed by the thermally conductive translucent elements 3508, 3502, 3500, and 3516 (other two sides of cube not shown) which are glued, soldered, or otherwise attached via attachment means 3514. Attachment means 3514 is also most preferably translucent to the light emitted by LED packages 3510. In this manner a lightweight emitting volume can be formed. LED packages 3510 may be on only one or any number of thermally conductive translucent elements.

Figure 36:
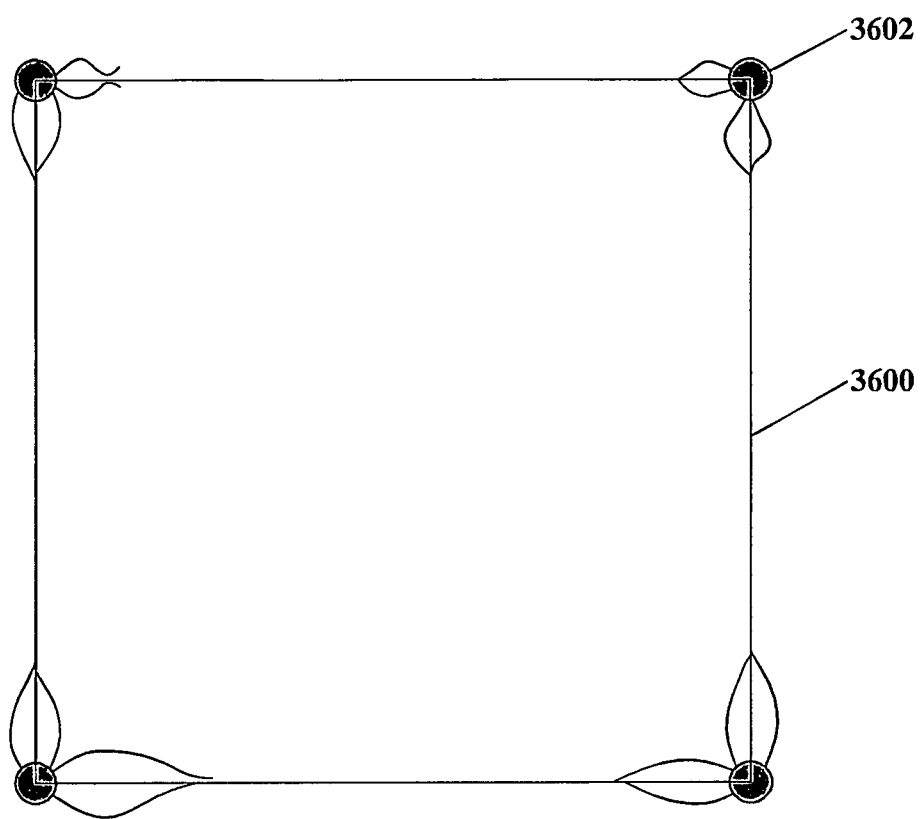
FIG. 36 depicts a side view of a snap together self cooling light source.

FIG. 36 depicts an alternate method of assembling a recycling light cavity whereby the thermally conductive translucent elements 3600 are assembled using mechanical clips 3602. While some light leakage at edges may be possible using this approach there will still be significant recycling and in some decorative applications the light leakage at the gaps may be used to create particular look.

Figure 37:
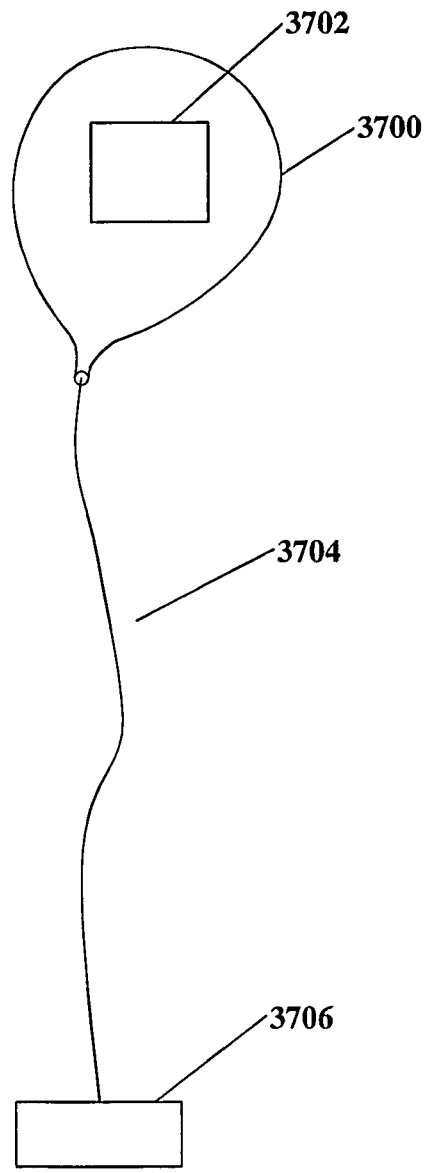
FIG. 37 depicts a side view of a self cooling light source attached to deployable safety balloon.

FIG. 37 depicts a tethered safety balloon 3700 to which a self cooling light source 3702 is attached. Power can be provided by cord 3704 via battery pack or mechanical, solar, thermoelectric or other power sources 3706. This application is enabled by the high lumens per gram output of the light source. This could be useful for backpackers, marine rescue, or avalanche protection. Flashing and non-visible emission is also disclosed. For avalanche in particular flashing of non-visible wavelengths which penetrate the snow is disclosed.

Figure 38:
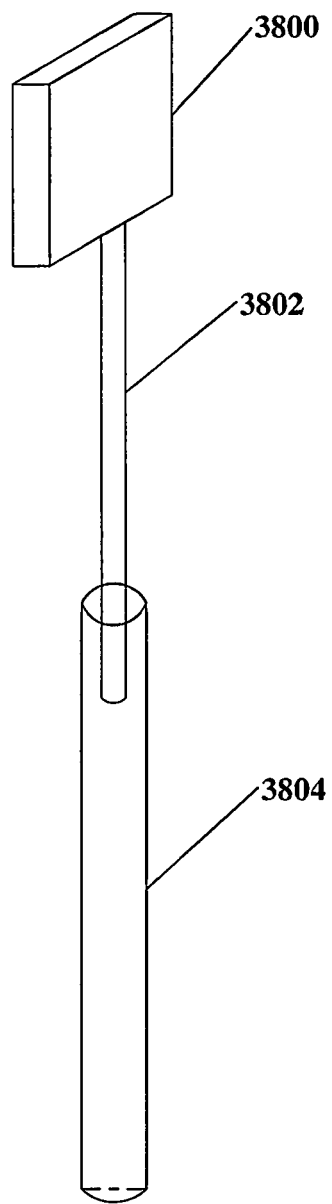
FIG. 38 depicts a perspective view of a self cooling light source attached to an extension pole for construction sites.

FIG. 38 depicts a self cooling light source 3800 on an extendable pole consisting of multiple sections 3802 and 3804. The light weight nature of the self cooling light source 3800 can allow for hand held operation of very high intensity light sources. As an example a self cooling light source 3800 which can deliver over 100 lumens per gram translates into a 10,000 lumen source weighing only 100 grams. This could be easily handled on end of a very long extendable pole for emergency, rescue, construction sites, and other places where a lot of light is needed on a temporary basis. In contrast a typical 10,000 lumen solid state light source emitting 1 lumen per gram with a heatsink would weigh 10 kilograms which would not be reasonable to use at the end of an extendable pole even if the user could support the weight. Alternately, the self cooling light source 3800 may be only temporarily attached to the extendable light pole for remote installation in hard to reach applications like high ceilings.

Figure 39:
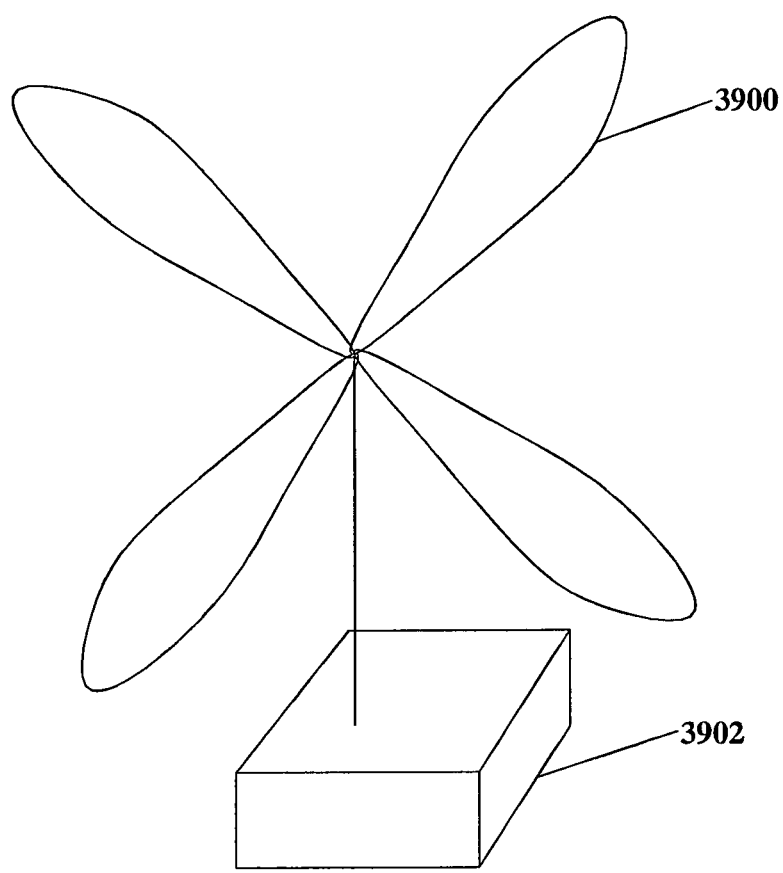
FIG. 39 depicts a perspective view of an RPV with a self cooling light source.

FIG. 39 depicts a remotely piloted vehicle (RPV) 3900 to which a self cooling light source 3902 is attached. While not shown a power tether may be used or batteries may be used to supply power. Alternately, power may be derived via an alternator from the gas powered engine of the RPV 3900 to power self cooling light source 3902. The low weight of the self cooling light source 3902 is the critical element of the invention. The RPV 3900 could deliver over 10,000 lumens with only a 100 gram payload associated with the lights. This could be used to illuminate sports venues, play areas, accident scenes, or venues in which lighting is needed and fixed lighting is unavailable. Concerts, visual effects, and other outdoor venues could be economically lit using this approach.

Figure 40:
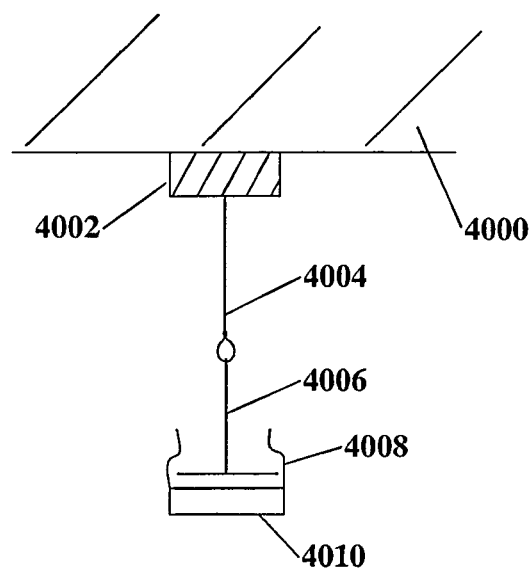
FIG. 40 depicts a side view of a high bay ceiling grid with self cooling light sources.
Figure 40:
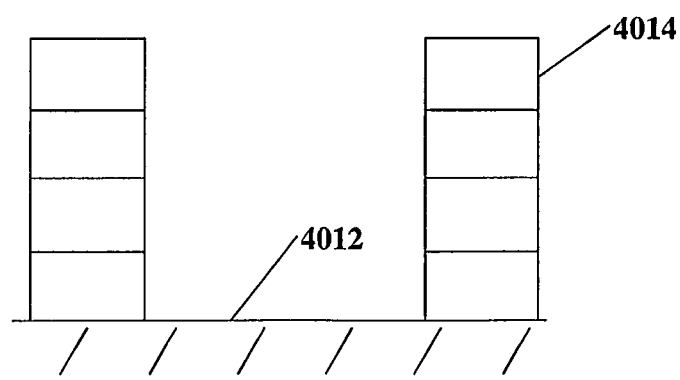

FIG. 40 depicts a high bay application containing recycling cavity light sources 4010 attached via clips 4008 to a support grid 4006, suspended via a wire 4004 attached to the main ceiling 4000 via anchor 4002. The light weight nature of the disclosed recycling cavity light source 4010 enables the use of lighter weight grid 4006 but also enables the installation of the recycling light sources 4010 via extendable poles as previously disclosed. In this manner installation, repair, and upgrades can all occur without the need for a maintenance crew to physically be lifted up to the ceiling. The use of Class 2 circuits is preferred to allow for safety and ease of installation. As such 110 VA is an upper limit for the power in Class 2 applications using 80 to 100 lumens per watt self-cooling light sources for 8000 to 10,000 lumen output fixtures. A fore mentioned sources have a weight to output efficiency of 50 to 100 lumens per gram which results in light sources which weigh between 100 and 200 grams and are thus easily installed, removed, changed, repaired, or re-positioned using extendable poles even in high bay applications. The ability to re-position the lighting is especially important when shelves, racks desks, cubicles etc, 4014 are moved on the retail, office, factory, or grocery floor 4012 the light fixtures can be easily and simply moved to align with the new need.

Figure 41:
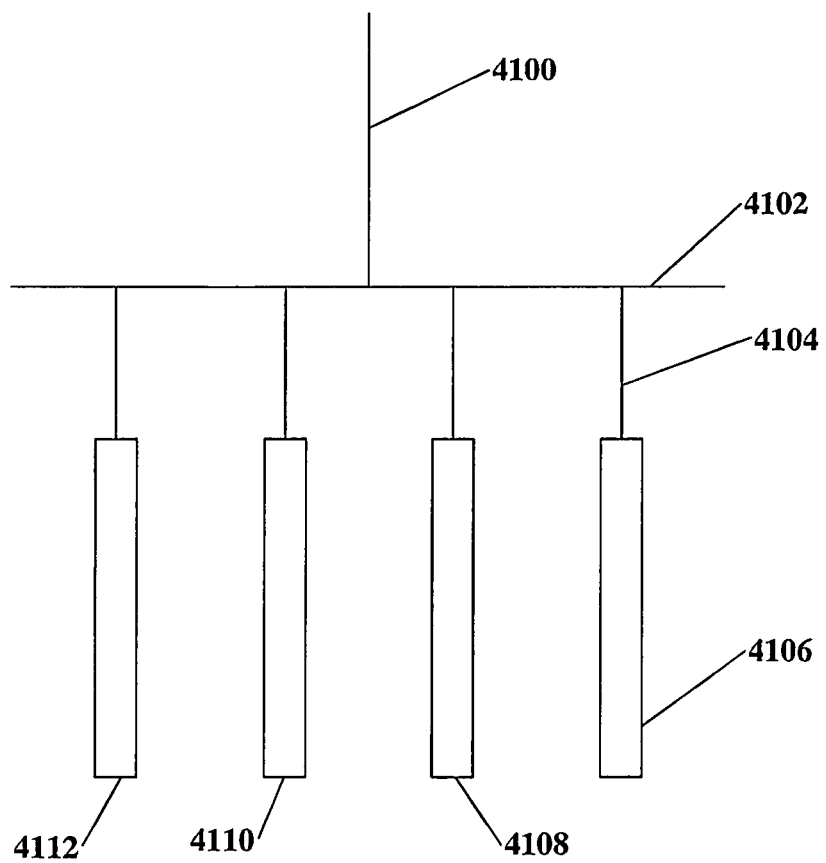
FIG. 41 depicts a side view of multiple self cooling light sources arranged parallel to each other.

FIG. 41 depicts multiple self-cooling light sources 4106, 4108, 4110, and 4112 are arranged substantially parallel to each other. In this case support 4100 physically supports the fixture 4102 and provides power. The fixture 4102 distributes the power via wires 4104 which also support the individual multiple self-cooling light sources 4106, 4108, 4110, and 4112. The lightweight nature of the sources allow for fixture 4102 to be lightweight. The multiple self-cooling light sources 4106, 4108, 4110, and 4112 may be isotropic, side emitting, or directional sources as previously disclosed. In this configuration self-cooling light sources 4106 and 4112 may be directional sources blocking sideways light. The remaining self-cooling light sources 4108 and 4110 may be isotropic light sources. This approach forms a visual effect of a large emitting volume while reducing sideways glare. In general the use of multiple self-cooling light sources to modify the far field light distribution from the fixture is disclosed. Fixture 4102 may be a reflector element, diffuser, partial reflector, or decorative element as well.

Figure 42:
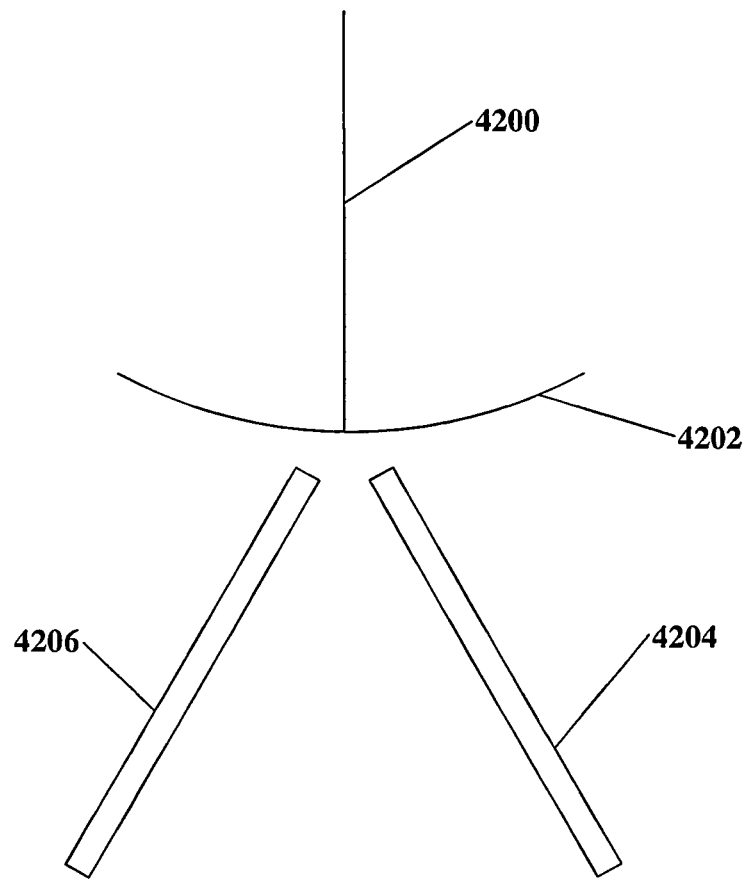
FIG. 42 depicts a side view of multiple self cooling light sources arranged non-parallel to each other.

FIG. 42 depicts multiple self-cooling light sources 4206 and 4204 are arranged non-parallel to each other such that the far field light distribution controlled. Again support 4200 provides physical support and power to fixture 4202 which in turn provides support and power to the self-cooling light sources 4206 and 4204. The fixture 4202 and/or emission nature of the self-cooling light sources 4206 and 4204 determines the directionality of the lighting system.

Figure 43A:
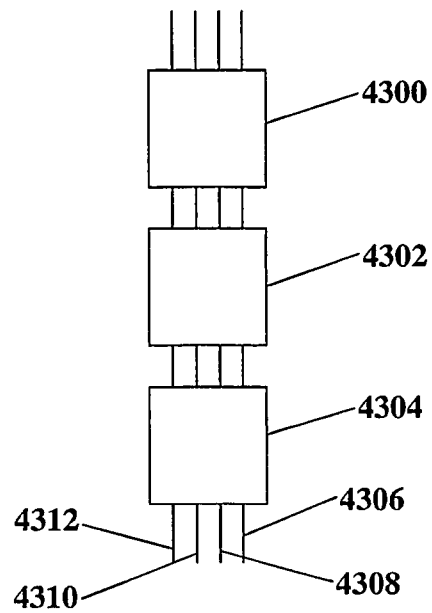
FIG. 43A depicts a side view of a flat surface of multiple self cooling RGBW light sources which are individually controllable.
Figure 43B:
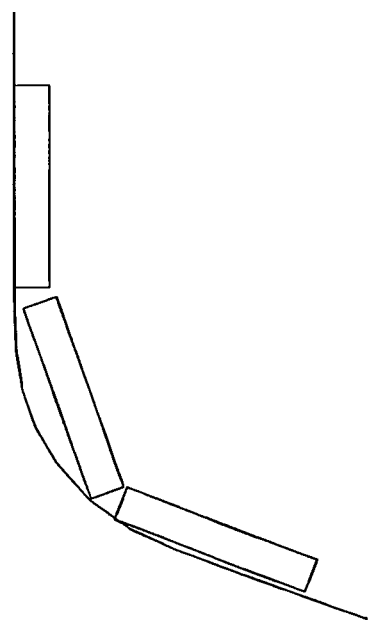
FIG. 43B depicts a side view of a curved surface of multiple self cooling RGBW light sources which are individually controllable.

FIG. 43A depicts multiple self-cooling RGBW light sources 4300, 4302, and 4304, (each consisting of some number of red, green, blue, light emitting diodes and/or a blue light emitting diode combined with a phosphor that converts blue light to white light), which are individually controllable via power/control lines 4312, 4310, 4308, and 4306. By adjusting the gap between the self-cooling RGBW light sources, curved surfaces as shown in FIG. 43B can be covered with the tiles.

Figure 44A:
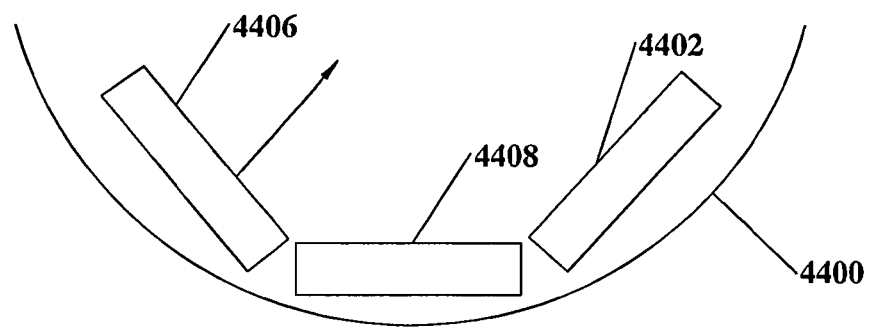
FIG. 44A depicts a side view of multiple self cooling light sources tiled on a concave curved surface.
Figure 44B:
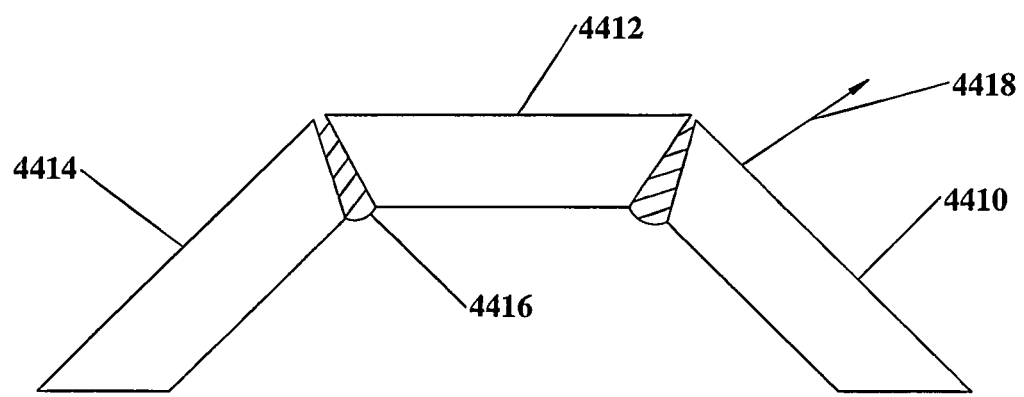
FIG. 44B depicts a side view of multiple self cooling light sources tiled on a convex curved surface.

FIG. 44A depicts multiple self-cooling light sources 4406, 4408, and 4402 tiled or otherwise arranged on a concave curved surface 4400. FIG. 44B depicts a convex surface can be covered using self-cooling light sources 4410, 4412, and 4414. In this case the self-cooling light sources may be chamfered as shown to allow the emitting surfaces 4418 to meet up. Alternately, a membrane 4416 may be used to fill in the gap between self-cooling light sources. The membrane 4416 may be plastic, rubber, plaster, grout, adhesive, wood, or caulk. The membrane 4416 may be rigid, temporary, flexible, or permanent. The membrane 4416 may also be used to affix the self-cooling light sources to another surface.

Figure 45:
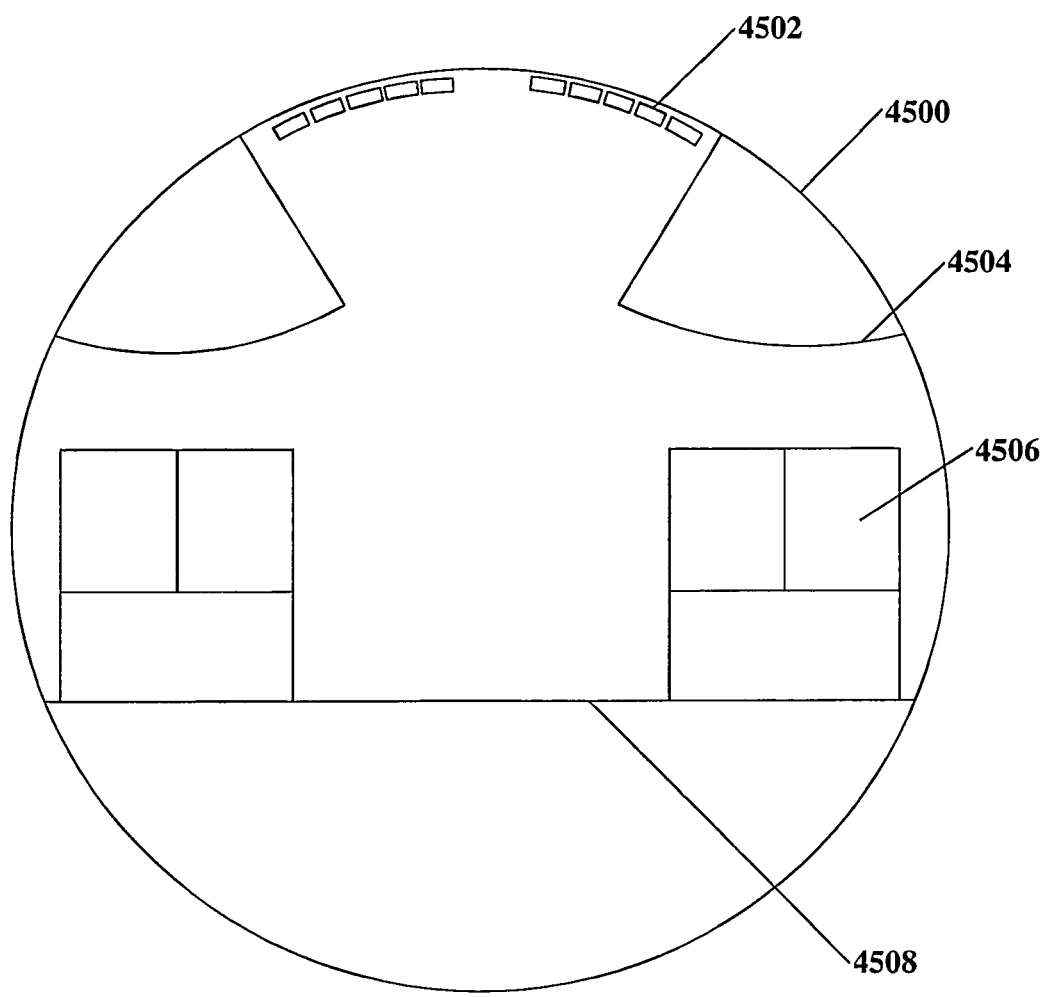
FIG. 45 depicts a side view of multiple self cooling light sources arranged on the inner surface of an aircraft cabin.

FIG. 45 depicts multiple self-cooling light sources 4502 arranged on the inner surface of an aircraft. The fuselage 4500 typically has an inner Tedlar covering. In present designs the lighting is typically mounted above and below the overhead bins 4504. Light for the occupants in the seats 4506 and floor 4508 is at least partially provided by wall washing, in which light is cast on the interior surface from fixtures mounted to the side or below. Placement of such fixtures reduces the amount of bin storage. By integrating the self-cooling light sources 4502 into the Tedlar covering on the inner surface of the fuselage 4500 an entirely different appearance can be realized. In addition the lightweight nature of the self-cooling light sources 4502 can save hundreds of lbs compared to existing solid state lighting approaches. Typical solid state lighting outputs between 1 and 8 lumens per gram can be compared to the disclosed light sources which output 20 to 100 lumens per gram.

Figure 46:
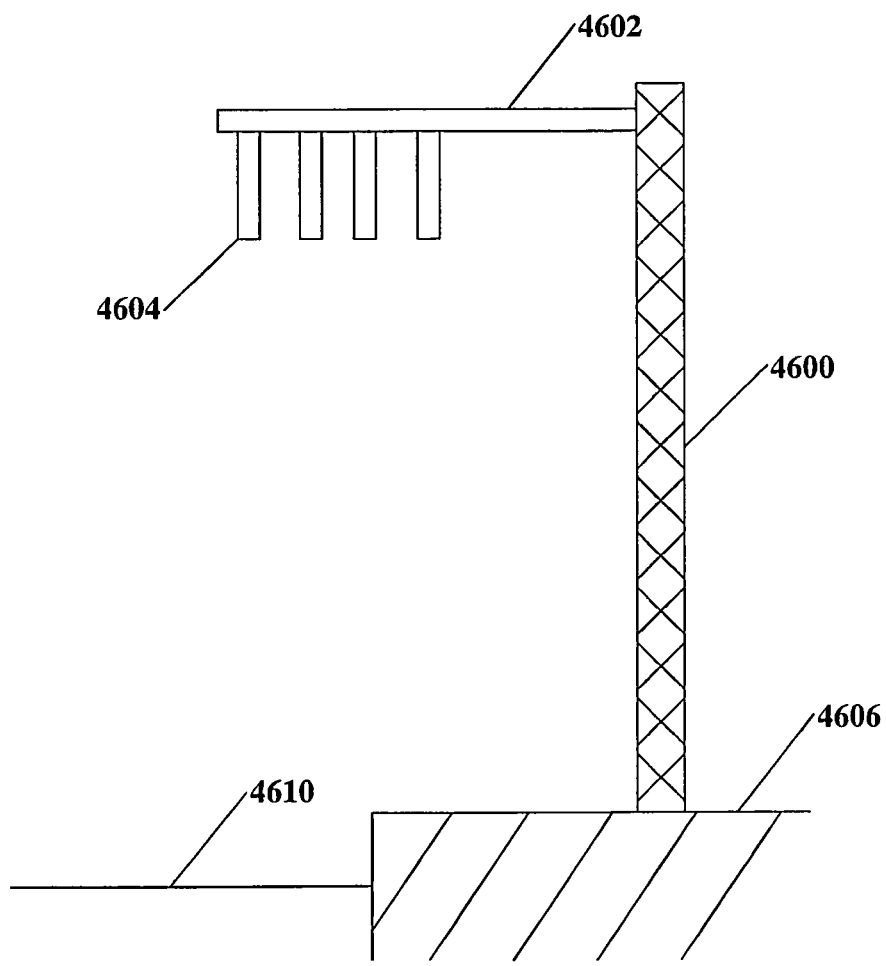
FIG. 46 depicts a side view of a streetlight containing multiple self cooling light sources.

FIG. 46 depicts a streetlight containing multiple self-cooling light sources 4604 mounted to support bar 4602 which in turn is attached to pole 4600. The streetlight needs to illuminate the ground/sidewalk 4606 and street 4610. A typical solid state street light can weigh over 45 lbs. This increases the structural requirements on support bar 4602 and pole 4600 at increase cost and materials. By reducing the weight of the light sources by 10× the overall cost of the streetlight can be reduced. In addition as previously disclosed the self-cooling light sources 4607 can be replaced from ground/sidewalk 4606 using extendable poles eliminating the need for an elevated work platform.

Figure 47:
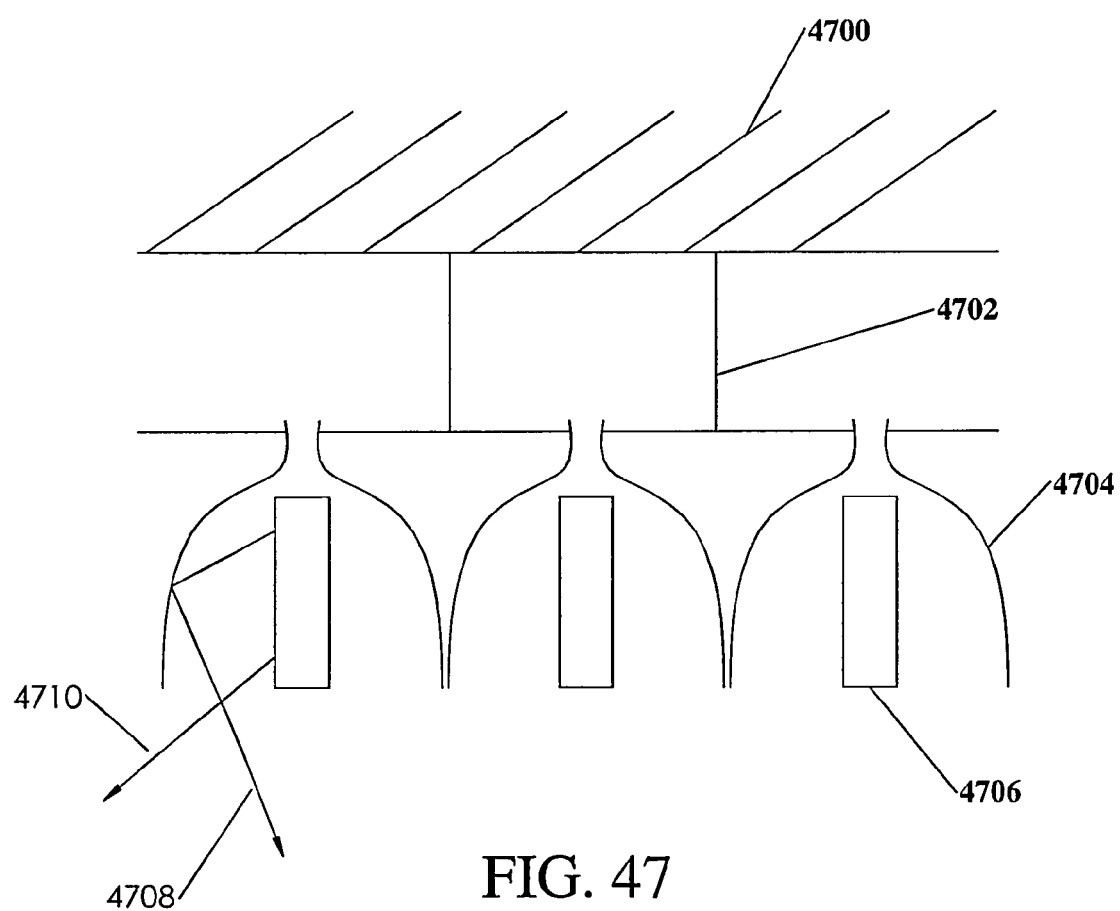
FIG. 47 depicts a side view of a high bay fixture containing multiple self cooling light sources.

FIG. 47 depicts a high bay fixture containing multiple self-cooling light sources 4706. In this case the fixture 4704 may contain a reflective element which provides directivity to the output of self-cooling light sources 4706. This is accomplished by redirecting reflected ray 4708 into to a specific solid angle. Depending on the relative size of the self-cooling light sources 4706 and the reflector in fixture 4704 some rays 4710 can escape without impinging on the reflector. The reflectors in fixture 4704 may be the same or different depending on the far field output distribution desired. It is preferred that the reflector in fixture 4704 allow for airflow past the self-cooling light sources 4706. Alternately, additional cooling can be provided by thermally attaching the reflector of fixture 4706 to the self-cooling light source 4706. Support wires 4702 may be used to attach fixture 4704 to the ceiling 4700. The light weight enabled by the use of previously disclosed self-cooling light sources with outputs of 20 to 100 lumens per gram reduces the load carrying requirements on both the support wires 4702 and ceiling 4700.

Figure 48:
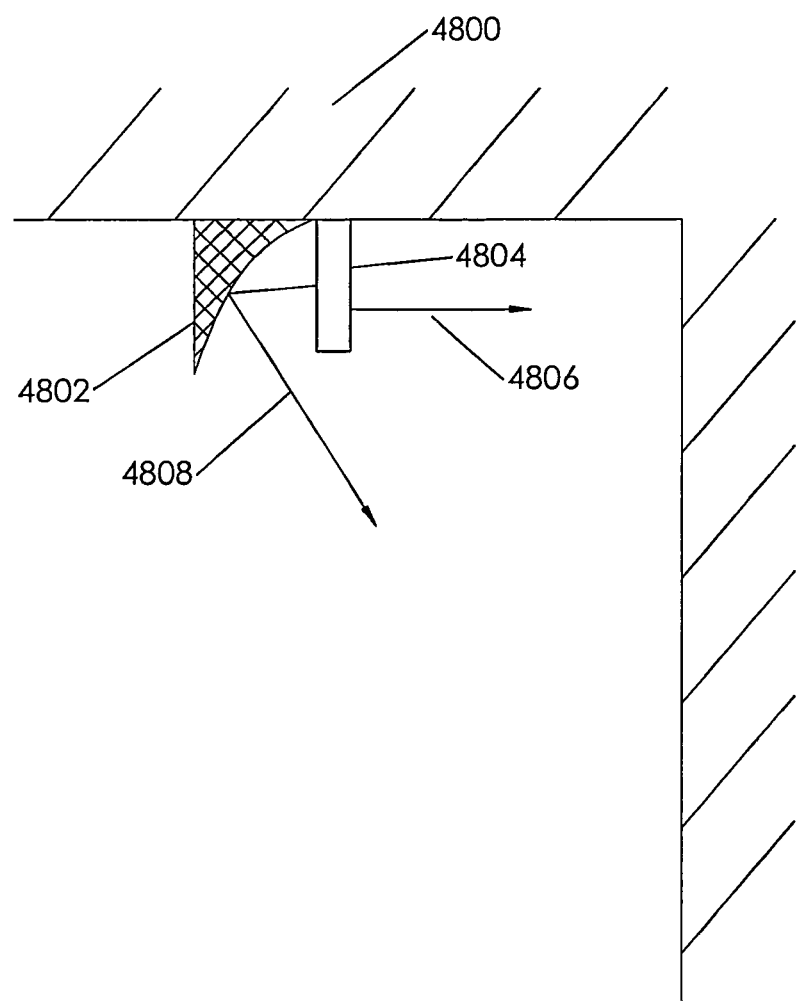
FIG. 48 depicts a side view of a self cooling light source with a separate reflective optic.

FIG. 48 depicts a self-cooling light source 4804 with a separate reflective optic 4802 attached to an interior surface, (wall, ceiling, floor) of room 4800 to make a "wall washing" effect. The relative position of the separate reflective optic 4802 will determine the amount of reflective rays 4808 versus the number of un-reflected rays 4806. Using this approach a wide range of wall washing effects can be realized in the room 4800.

Figure 49:
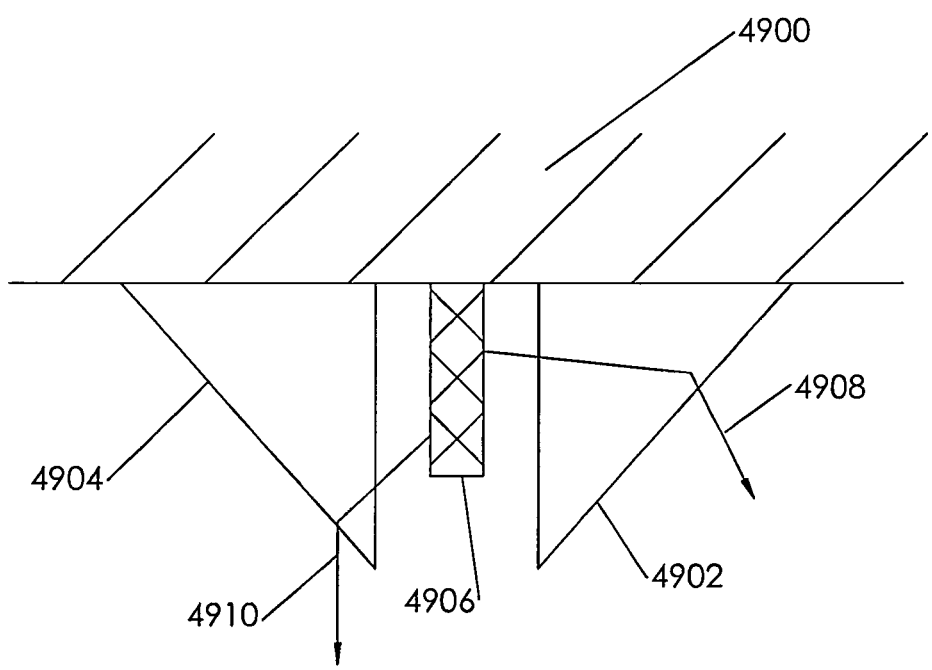
FIG. 49 depicts a side view of a self cooling light source with at least two separate transmissive optical elements.

FIG. 49 depicts a self-cooling light source 4906 with transmissive optical elements 4902 and 4904 which gather and redirect the light from the self-cooling light source 4906. Both the transmissive optical elements 4902 and 4904 and the self-cooling light source 4906 can be attached to mounting surface 4900 which may include but not limited to a ceiling, wall, floor, grid, or other building material. In this configuration at least a portion of the light rays 4908 and 4910 from self-cooling light source 4906 are collected and refracted by the transmissive optical elements 4902 and 4904. Transmissive optical elements 4902 and 4904 may be clear, translucent, scattering, colored, patterned, or decorative in nature.

Figure 50:
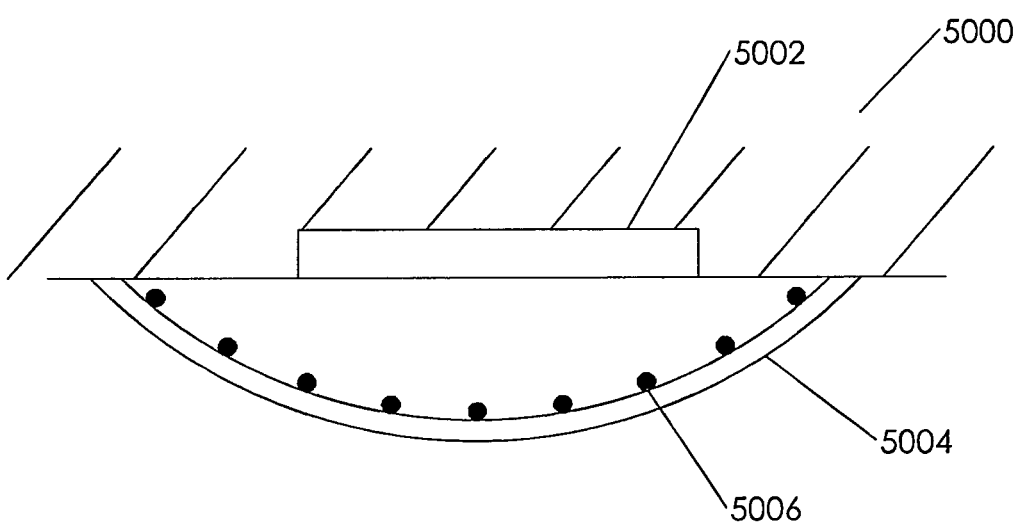
FIG. 50 depicts a side view of a decorative overlay over at least one surface of the self cooling light source.

FIG. 50 depicts a decorative overlay 5004 and 5006 over at least one surface of the self-cooling light source 5002 mounted into surface 5000. As an example, colored glass rods can be formed into an open weave as decorative overlay 5004 and 5006. This not only provides for decoration but can also be used to redefine a larger image plane for the light source 5002.

Figure 51:
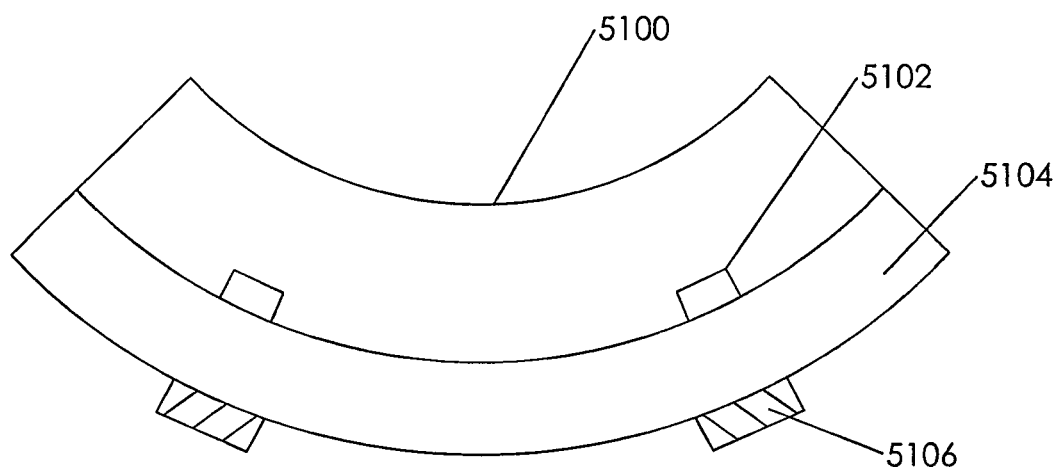
FIG. 51 depicts a side view of an external element which hides at least a portion of the light emitting surface of the self cooling light sources.

FIG. 51 depicts an external element 5106 which hides at least a portion of the light emitting surface of the thermally conductive translucent element 5104. The external element 5106 is positioned on the external surface of thermally conductive translucent element 5104 immediately opposite the LED package 5102 on the inner surface of the thermally conductive translucent element 5104. In this embodiment the thermally conductive translucent element 5104 and reflector 5100 are curved or non-flat.

Figure 52:
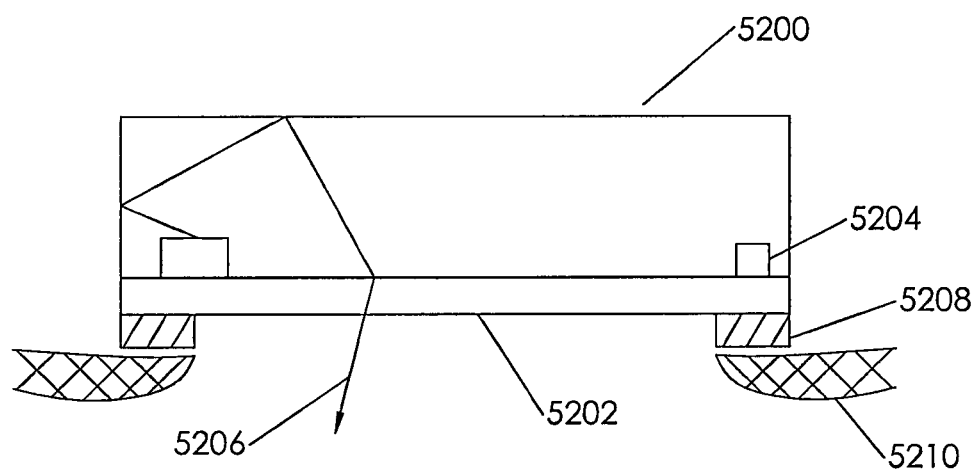
FIG. 52 depicts a side view of a self cooling light source in which the LEDs are located near the edge of the thermally conductive translucent element.

FIG. 52 depicts a self-cooling light source in which the LEDs 5204 are located near the edge of the thermally conductive translucent element 5202. This embodiment further hides any dark areas associated with light being blocked by the LEDs 5204 attached to thermally conductive translucent element 5202 and within the recycling cavity formed by reflector 5200. Heat from the LEDs 5204 is still transferred to the surrounding ambient via the thermally conductive translucent element 5202 based on thermal conduction. The dark areas can be covered using an external element 5208 or via mounting hardware 5210.

Figure 53:
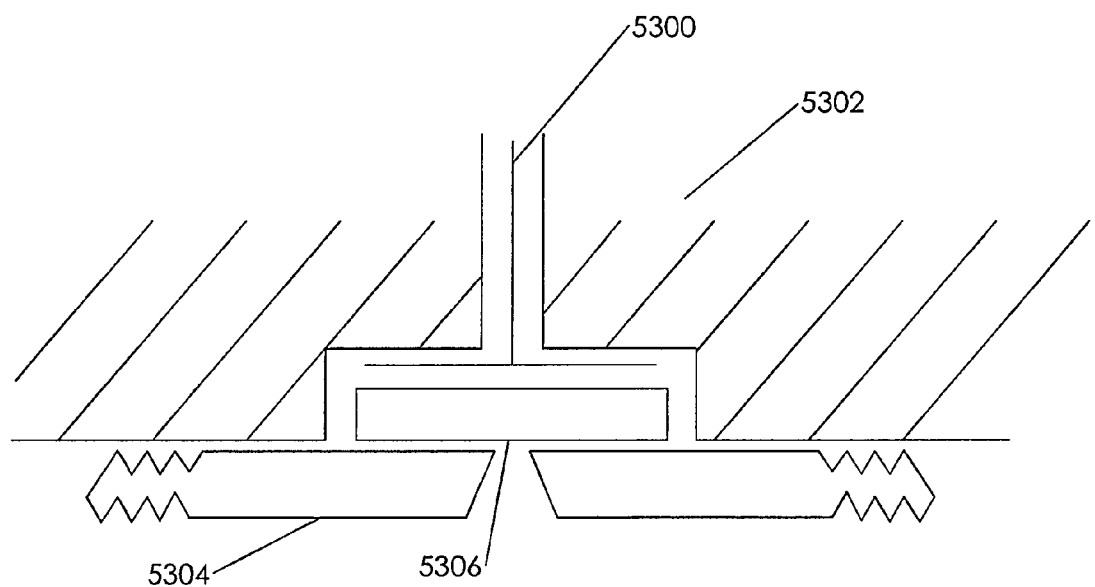
FIG. 53 depicts a side view of an array of wave guiding elements which redirect at least a portion of the light emitted from the light emitting surface into a larger area.

FIG. 53 depicts an array of waveguiding elements 5304 which redirect at least a portion of the light emitted from the light emitting surface self-cooling light source 5306 into a larger area. In this embodiment the self-cooling light source 5306 is attached to DC power grid 5300. The array of waveguiding elements 5304 can extend the emitting surface of self-cooling light source out over the ceiling tiles 5302 to reduce glare or to create a specific decorative look. As shown a 45 degree turning element is used to harvest at least a portion of the light emitted from the self-cooling light source 5306 using total internal reflection. Alternately, opaque reflective elements or dichroic coatings may be used to couple light into a waveguiding element 5304 where it can be spread out and then reflected off the ceiling tile or the surrounding ambient using scattering, reflective, or refractive elements within the array of waveguiding elements 5304. Most preferably the array of waveguiding elements 5304 only partially covers the self-cooling light source 5304 to allow for airflow to the emitting surface. The array of waveguiding elements 5304 may be strips, fibers, woven fabrics, non-woven, and combinations of materials which transmit at least a portion of the spectrum emitted by the self-cooling light source 5306. The array of waveguiding elements 5304 may be supported by the self-cooling light source 5306, the grid 5300 and/or the ceiling tile 5302 via adhesive, Velcro, mechanical clips, pins, magnets or other attachment means. Directionality may be imparted to the array of waveguiding elements 5304 via micro-optical elements, polarization dependent elements, and aligned reflective elements. The array of waveguiding elements 5304 may filter or otherwise modify the spectral output of the self-cooling light source 5306 including wavelength conversion.

Figure 54:
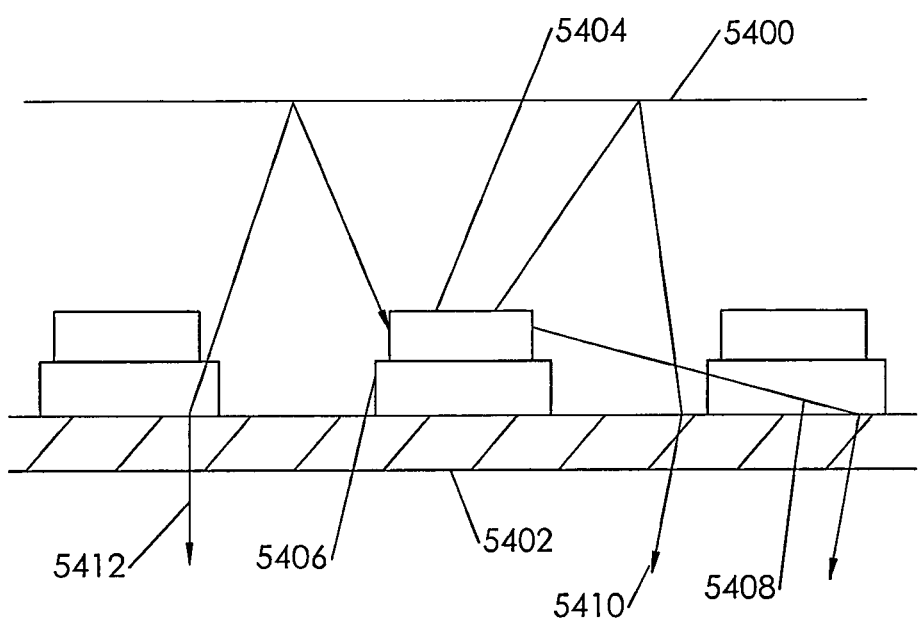
FIG. 54 depicts a side view of a LED package with a translucent or transparent submount for redirecting at least a portion of the light within the recycling cavity into the area directly under the LED package and out thru the thermally conductive translucent element.

FIG. 54 depicts a LED package with a translucent or transparent submount 5406 on to which an LED or LED package 5404 is mounted. Within the recycling cavity formed by thermally conductive translucent element 5402 and reflector 5400, rays 5412 and 5408 can be coupled to the thermally conductive translucent element 5402 directly under the LED or LED package 5404 via transmittance through translucent or transparent submount 5406. By allowing at least a portion of the light within the recycling cavity into the area directly under the LED or LED package 5404 the dark areas can be reduced.

Figure 55:
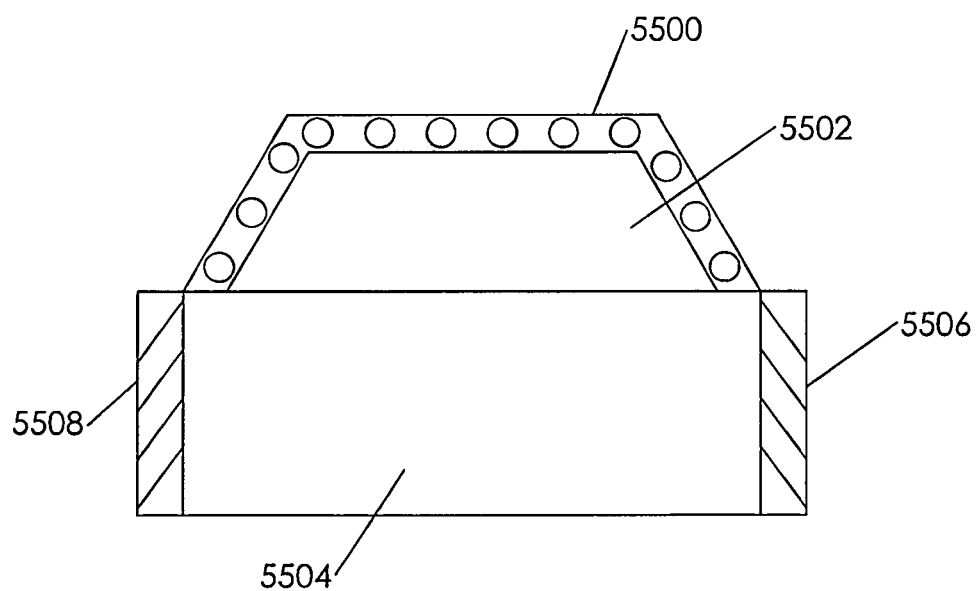
FIG. 55 depicts a side view of a chip scale package formed on a low optical absorption substrate further coated with a luminescent element.

FIG. 55 depicts an LED chip scale package, that is, a surface-mountable integrated circuit in which the package area is not greater than 1.2 times the area of the die, formed on a mostly reflective light transmitting low optical absorption substrate 5504 with side contacts 5506 and 5508 onto which a direct attach LED die 5502 is attached and further coated with a wavelength conversion layer 5500. While a side view is shown side contacts 5506 and 5508 do not fully cover the surfaces of low optical absorption substrate 5504 allowing for light to couple into the low optical absorption substrate 5504. The low optical absorption substrate 5504 may be a sapphire, alumina, TPA, YAG, ZnO, Glass, CeYag, Diamond, BN or other clear or translucent materials. The wavelength conversion layer 5500 may be powdered phosphor within a clear matrix, ceramic wavelength conversion elements, or quantum dot layers.

Figure 56:
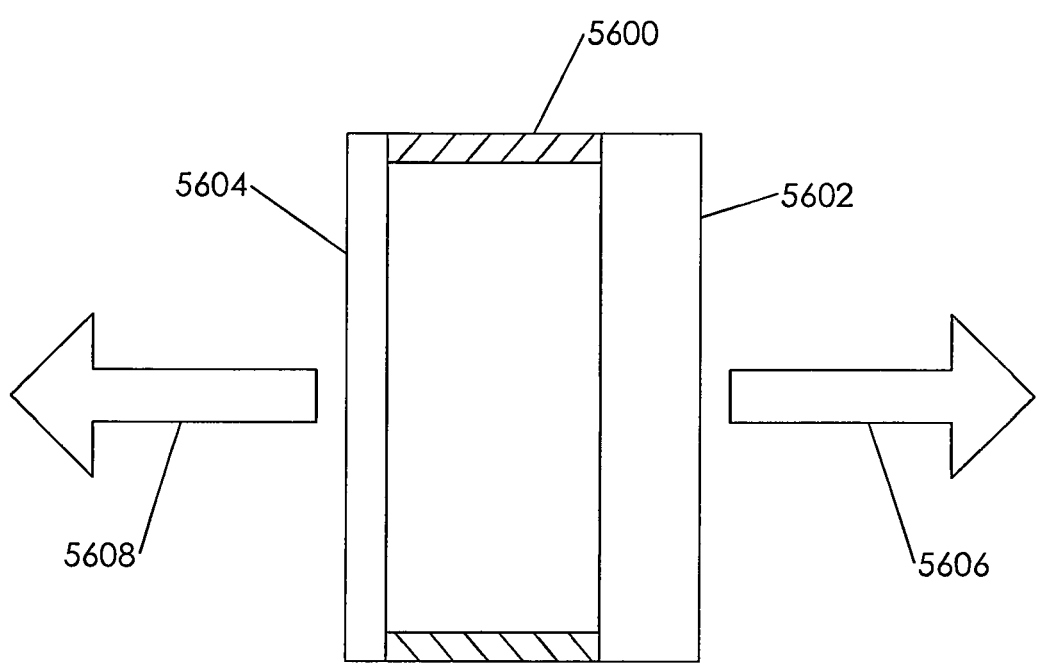
FIG. 56 depicts a side view of a recycling cavity with two different thicknesses of thermally conductive translucent elements.

FIG. 56 depicts a recycling cavity with two different thicknesses of thermally conductive translucent elements 5602 and 5604 coupled using a reflective ring 5600. In this case the thicker thermally conductive translucent element 5604 has a lower optical output 5606 than the thinner thermally conductive translucent element 5604 which has a higher optical output 5608. This can be useful in up/down lighting fixtures where it is desirable to have a different light output level in one direction and a different output level in another direction.

Figure 57:
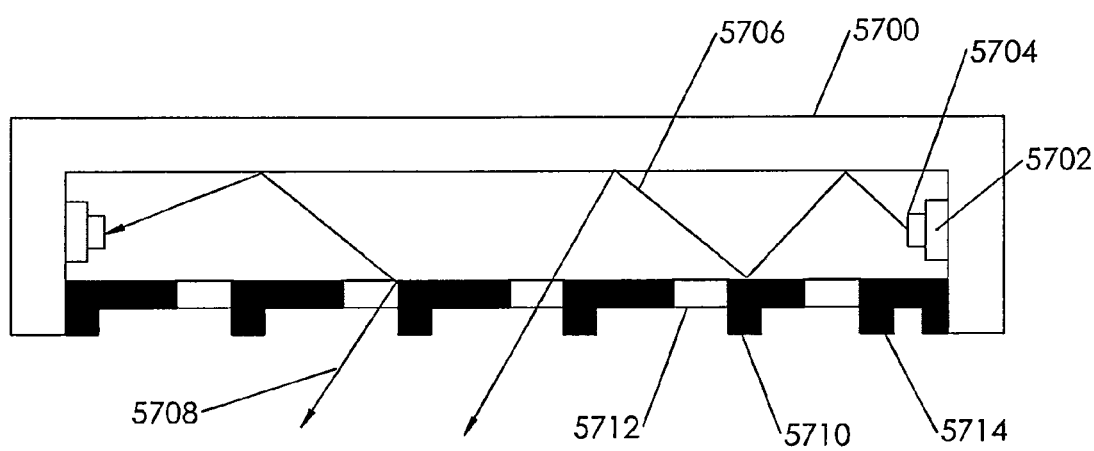
FIG. 57 depicts a side view of a recycling cavity containing at least one perforated reflector with reflective elements.

FIG. 57 depicts a recycling cavity containing at least one perforated reflector 5710 with reflective elements 5714 formed from the material used to create holes 5712. This embodiment shows LED packages 5704 mounted onto the side of back reflector 5700. Light rays 5706 and 5708 escape the recycling cavity via holes 5712 and at least a portion of the rays exiting the recycling cavity through the holes 5712 impinge on the reflective elements 5714 and are redirected. A punching process can be used to form reflective elements 5714 in the at least one perforated reflector 5710. While the higher thermal conductivity of the metals used to form this recycling cavity can be used to mount the LED packages 5704 on a surface other than the emitting surface, some electrical isolation must be included (not shown) to power the LED packages 5704 which increases the thermal resistance to ambient.

Figure 58:
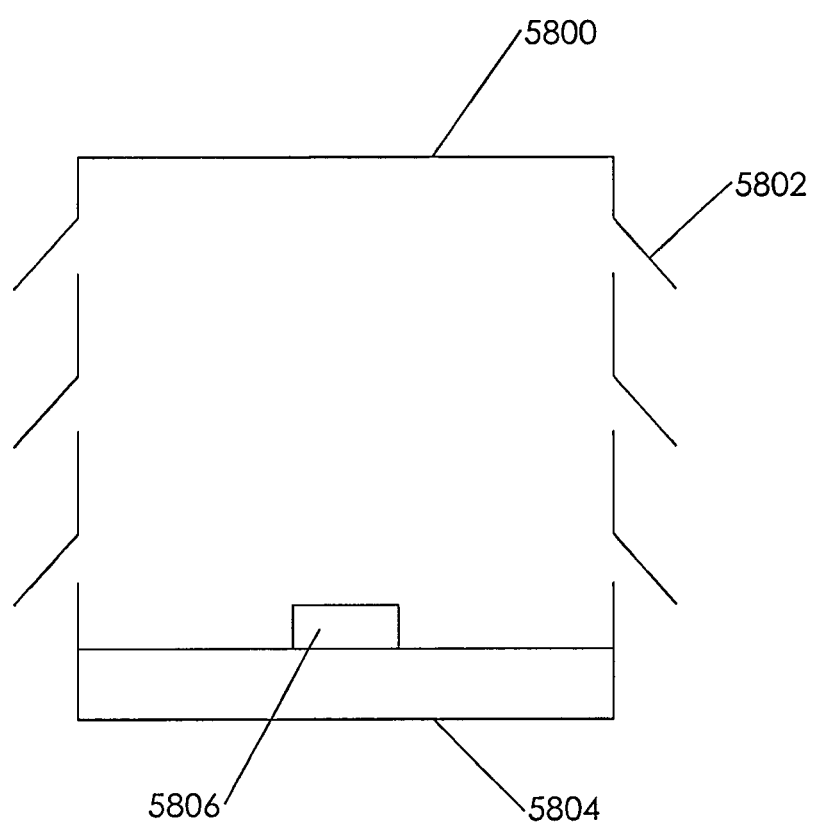
FIG. 58 depicts a side view of a recycling cavity containing at least one shaped thermally conductive translucent element and at least one perforated reflector.

FIG. 58 depicts a recycling cavity containing at least one shaped thermally conductive translucent element 5804 with at least one LED or LED package 5806 attached and at least one perforated reflector 5800 with reflective elements 5802. In this embodiment a combination of diffuse uniform lighting and point sources are realized.

Figure 59:
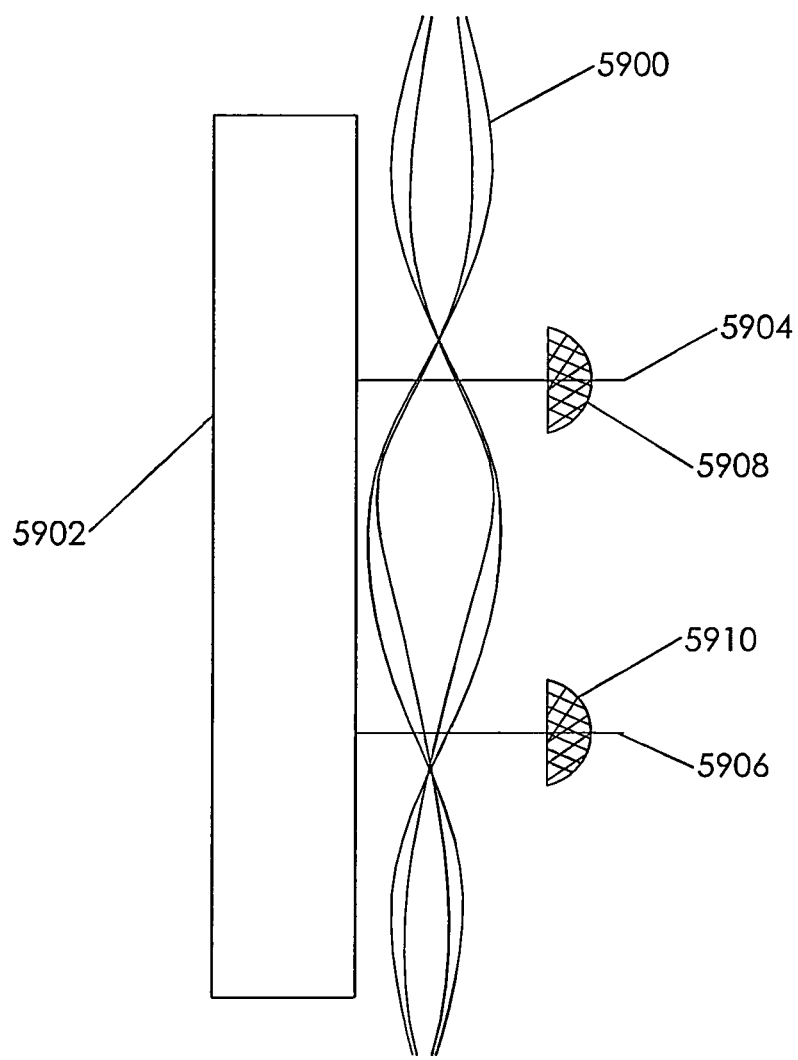
FIG. 59 depicts a side view of a self cooling light source with push pin connectors into a woven fabric containing woven in low voltage DC conductors.

FIG. 59 depicts a self-cooling light source 5902 with push pin connectors 5904 and 5906 with clips 5908 and 5910 respectively into a woven fabric 5900 incorporating low voltage DC conductors (not shown) within the weave. In this embodiment multiple contact points are envisioned between the push pin connectors and their associated clips and multiple conductors in the fabric.

Figure 60:
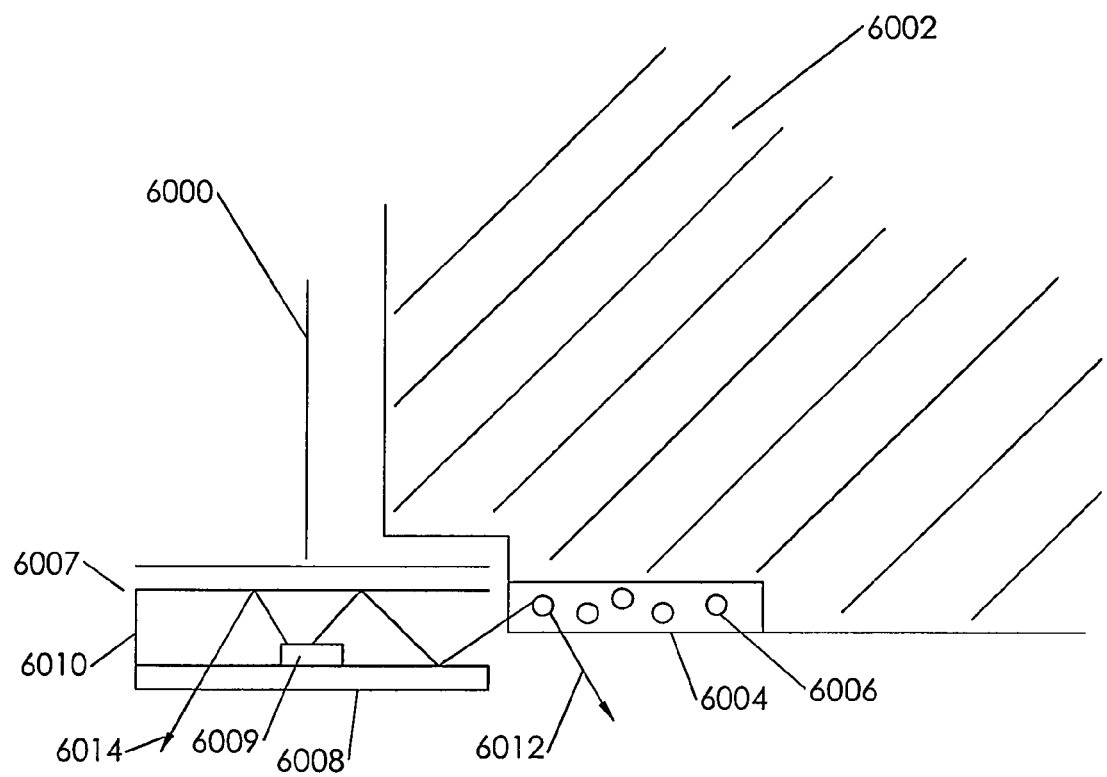
FIG. 60 depicts a side view of a ceiling tile with embedded air guides or light guides where at least a portion of the light is derived from at least one self cooling light source.

FIG. 60 depicts a ceiling tile 6002 with embedded air guides or light guides 6004 where at least a portion of the light 6012 is derived from at least one self cooling light source 6007 formed by thermally conductive translucent element 6008 and reflector 6010 mounted on grid 6000 containing at least one LED or LED package 6009. While some light 6014 can escape through the thermally conductive translucent element 6008 at least a portion of the light 6012 is coupled into the air guides or light guides 6004 within the ceiling tile 6002. Additional scattering or wavelength conversion elements 6006 may be added to air guides or light guides 6004 to further enhance or modify the light emitted from the air guides or light guides 6004.

Figure 61:
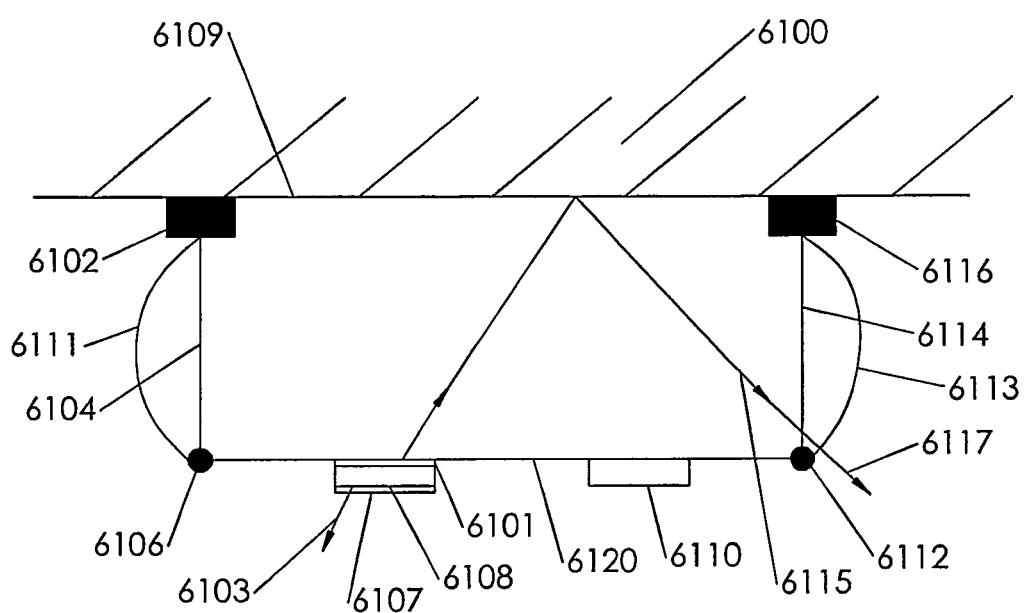
FIG. 61 depicts a side view of a deployable ceiling cloud.

FIG. 61 depicts a deployable ceiling cloud based on tension rods 6106 and 6112 between which a membrane 6120 is stretched. In a manner similar to camping tents light weight fabrics can be tensioned by tension rods 6106 and 6112 which may include carbon fiber rods, plastic rods, aluminum rods, fiberglass rods, and other lightweight materials with circular, square, rectangular and ribbon cross sections. The light weight nature of the disclosed light sources 6108 and 6110 can be attached and powered using conductor within or attached to the membrane 6120. The tension rods 6106 and 6112 may form square, round, elliptical, and other shapes defined by the rods used and membrane 6120 used. Three dimensional shapes may be formed as well based on multiple layers or interconnecting elements providing a wide range of aesthetic looks. Once deployed the cloud can be suspended using wires 6104 and 6114 and anchors 6102 and 6116 to ceiling 6100. As an example, the lights for a 1000 square foot room would weigh less than 300 grams, a weight which can easily be suspended using the membrane 6120. The power leads (not shown) for the light sources 6108 and 6110 could provide additional support for the membrane 6120 as well as providing power. In another embodiment the support membrane 6120 can be a translucent material and could be used to form an enclosed cloud forming a three dimensional element by also forming sides 6111 and 6113 which cover the openings between the ceiling 6109 and the horizontal membrane supporting the self cooling light sources 6108 and 6110. A portion of the recycled light 6105 form source 6108 can be emitted into the recycling cloud 6107 and be reflected by ceiling 6109 and then exit the membrane 6120 or side of the membrane 6111 or 6113. More specifically, the light source 6108 may consist of a top mostly reflective light transmitting thermally conductive element 6101 and bottom mostly reflective light transmitting thermally conductive element 6107. Light rays 6103 emitted by bottom mostly reflective light transmitting thermally conductive element 6107 is directly viewable by the occupants below the deployable ceiling cloud. Light 6115 form the top mostly reflective light transmitting thermally conductive element 6101 can be transmitted through the membrane 6120 and reflected off of ceiling 6109. If the membrane 6120 is a 3 dimensional element the light rays 6115 can be recycled in within the membrane 6120 and its associated sides 6111 and 6113 until they exit via light rays 6117.

Figure 62:
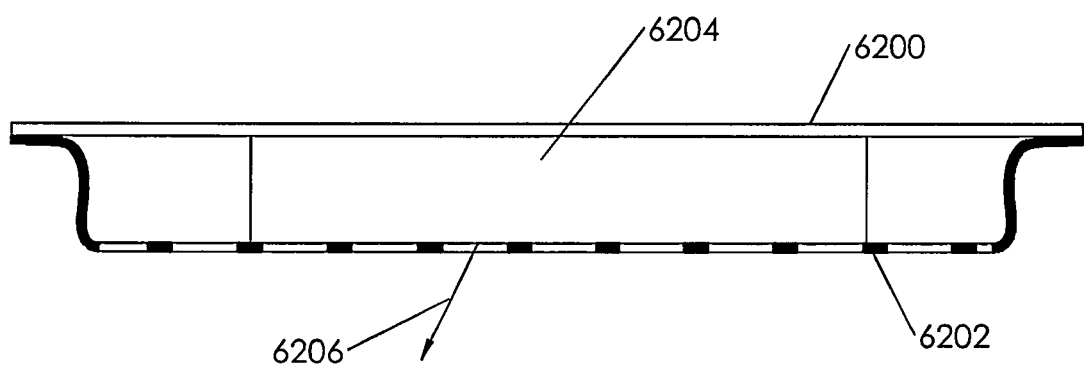
FIG. 62 depicts a side view of a clamp together metal ceiling tile with embedded self cooling light sources.

FIG. 62 depicts clamp together metal ceiling tile with embedded self cooling light source 6204. Because the light emitting surface is also the heat transfer surface in the self cooling light sources 6204, its surface can be used to conduct heat to external elements. In this case the self cooling light source 6204 is sandwiched between two metal ceiling tiles 6200 and 6202 one of which is perforated to allow light 6206 to escape. If the two metal ceiling tiles 6200 and 6202 are electrically isolated one of both can be used as a power conductor to the embedded self cooling light source 6204. The two metal ceiling tiles 6200 and 6202 may be metals, woven metals, and other reflective high thermal conductivity materials.

Figure 63:
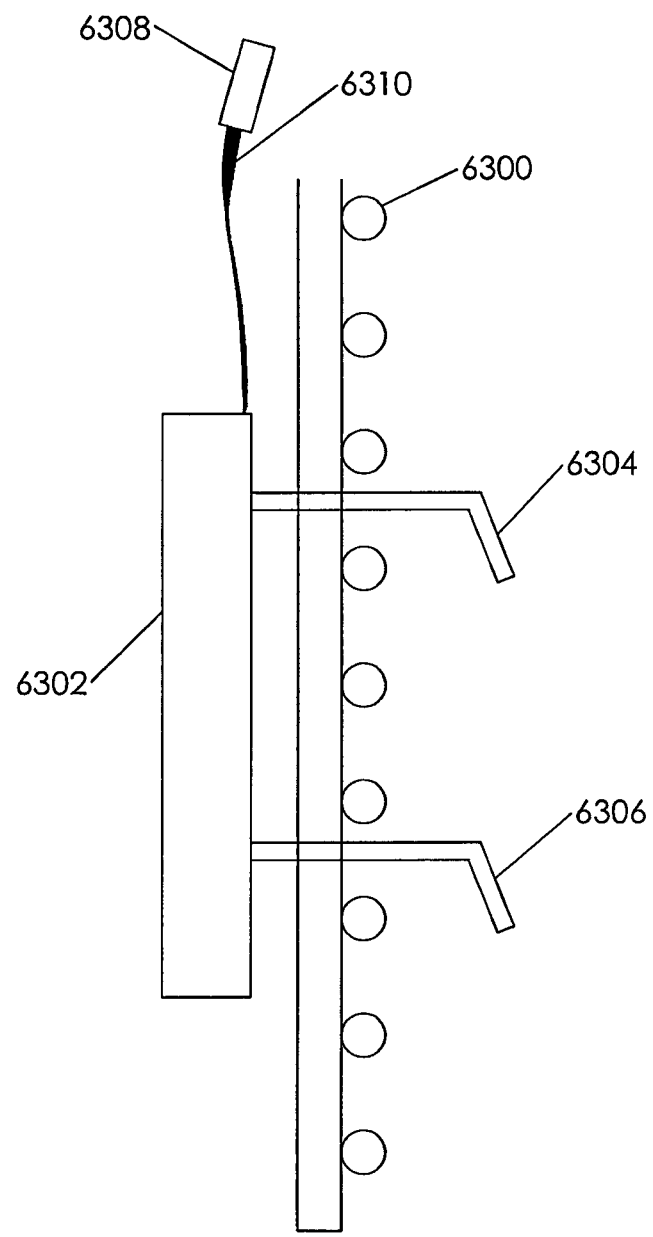
FIG. 63 depicts a side view of a woven metal fabric with detachable self cooling light sources.

FIG. 63 depicts a woven metal panel 6300 with detachable self cooling light sources 6302 via clips 6304 and 6306. The woven metal panel 6300 may or may not be used as part of the power circuit for the detachable self cooling light sources 6302. If the woven metal panel 6300 is part of the power circuit clips 6304 and/or 6306 would be electrically connected to the LEDs or LED packages (not shown) within the detachable self cooling light sources 6302. At least one power lead 6310 would be used with an associated connector 6308 if only one woven metal panel 6300 is used. If two woven metal panels 6300 are used and are electrically isolated from each other power can be provided via clips 6304 and 6306 to detachable self cooling light sources 6302 as long as the clips are attached to the appropriate woven metal panels 6300.

Figure 64:
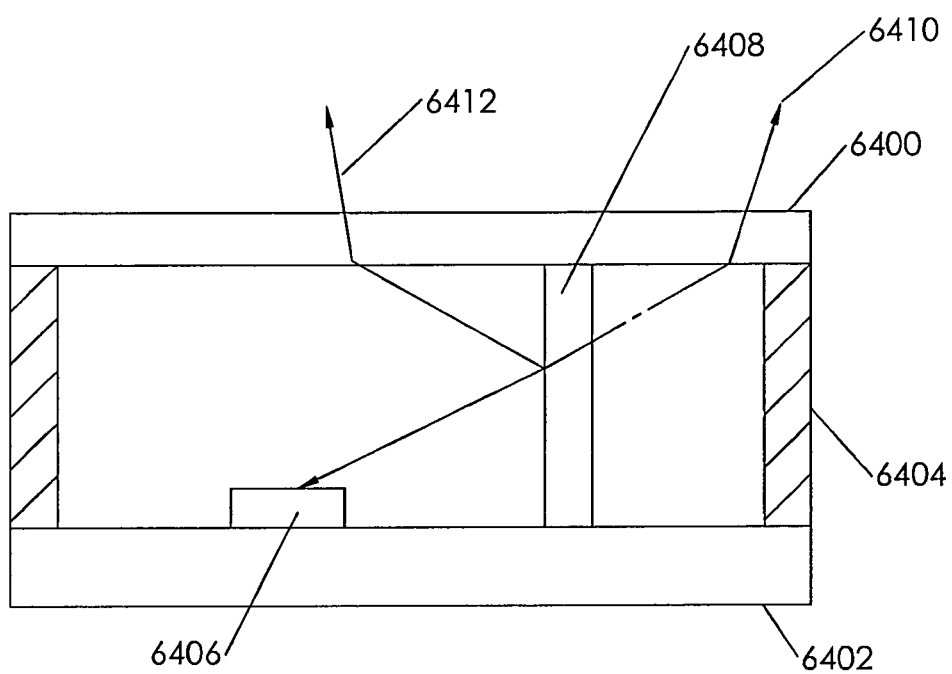
FIG. 64 depicts a side view of a recycling cavity containing at least one color separation element.

FIG. 64 depicts a recycling cavity containing at least one separation element 6408 which may include but not limited to diffuser, dichroic, absorptive filter, wavelength conversion element, glass, plastic, metal, mirror, partial mirror, or other optical element which restricts or expands the solid angle, wavelength range, polarization, or intensity of light rays within the recycling cavity. In this example, the recycling cavity is composed of thermally conductive translucent elements 6400 and 6402 onto which at least one LED or LED package 6406 and reflective ring 6404. Power is provided as previously disclosed (not shown). Reflected light 6412 from LED or LED packages is shown to reflect off the separation element 6408 while transmitted light 6410 is allowed to enter into the rest of the recycling cavity before exiting. This can be used to separate colors, polarizations, and modify intensities both inside and outside the light source.

Figure 65:
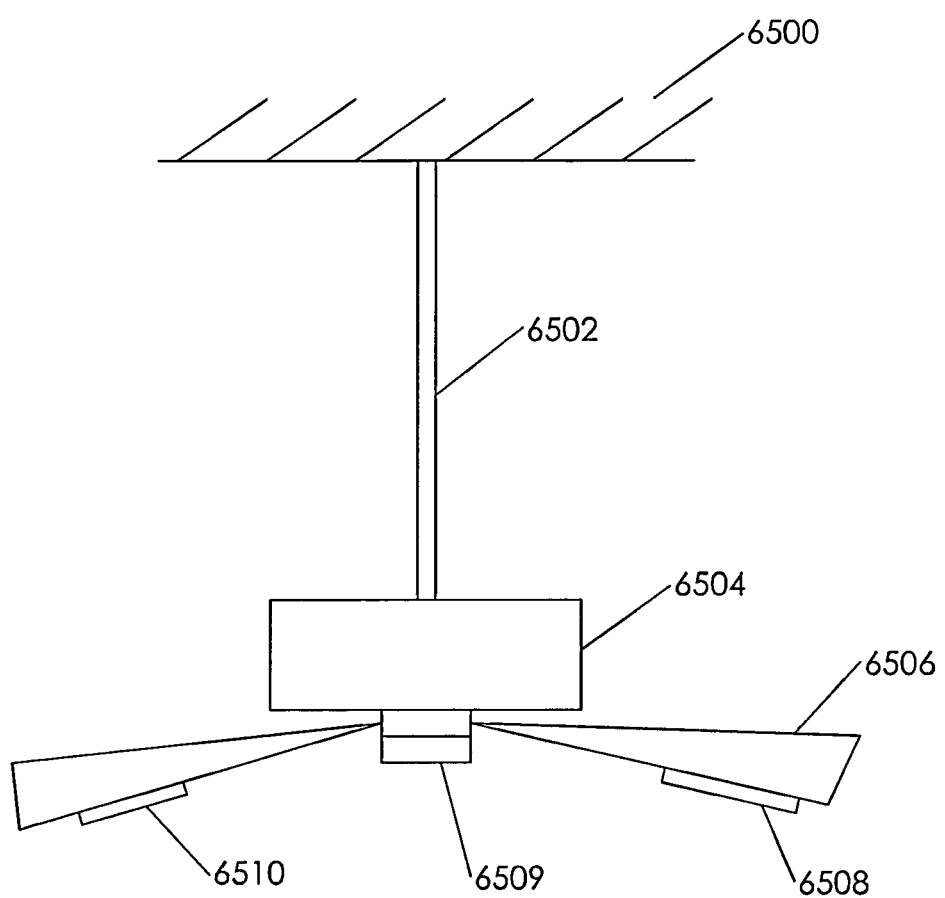
FIG. 65 depicts a side view of a self cooling light source on a moving element.

FIG. 65 depicts self cooling light sources 6508, 6509 and 6510 mounted on a moving element 6506 such as a fan blade, fan blade rotor or other moving structures. The light weight of the self cooling light source 6508 enables their incorporation in these types of applications. Power for the self cooling light source 6508 can provided via the motor 6504 or via kinetic or electromagnetic means caused by the motion of the self cooling light source 6508 relative to a fixed object like the motor 6504 or support 6502 or ceiling 6500.

Figure 66:
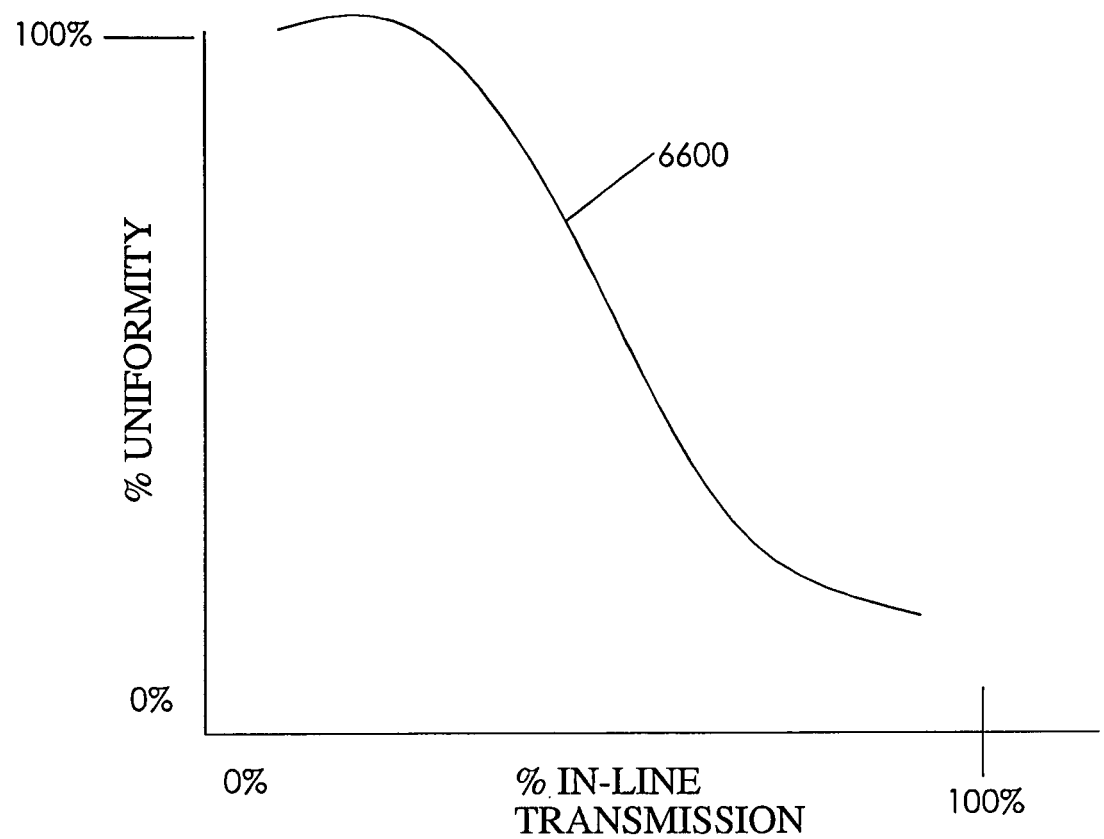
FIG. 66 depicts a graph showing in-line transmission effect on mixing.

FIG. 66 depicts in-line transmission affect on mixing. The curve 6600 illustrates that low in-line transmission leads to more uniform mixing within recycling cavities. However, more mixing must be coupled with low optical absorption within the recycling cavity. As an example, 500 micron thick polycrystalline 96% alumina has an in-line transmission of approximately 16% which translates into greater than 40 transmission and reflections within the light recycling cavity while maintaining 80% overall system efficiency.

Figure 67A:
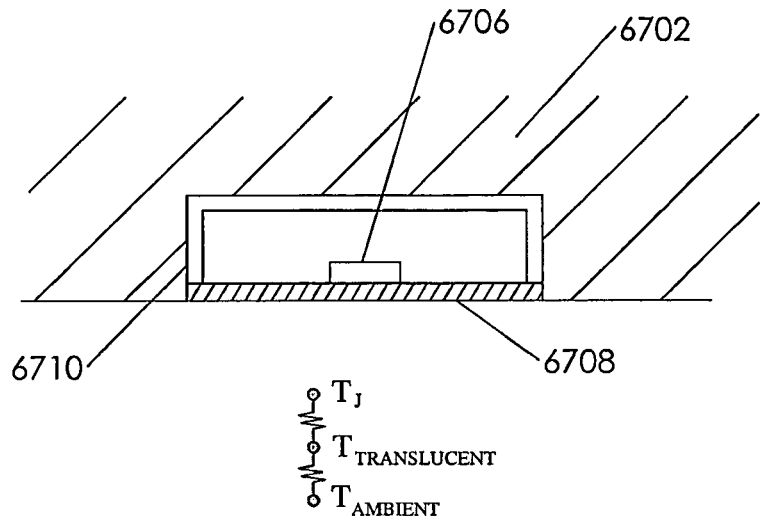
FIG. 67A depicts a side view of a thermal impedance schematic of self cooling light sources.
Figure 67B:
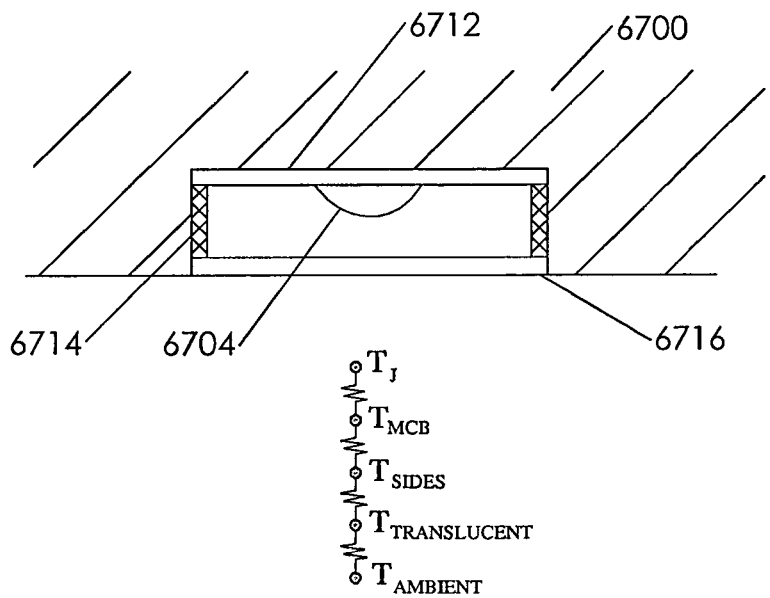
FIG. 67B depicts a side view of a thermal impedance schematic of a prior art metal core board self cooling light sources.
Figure 68:
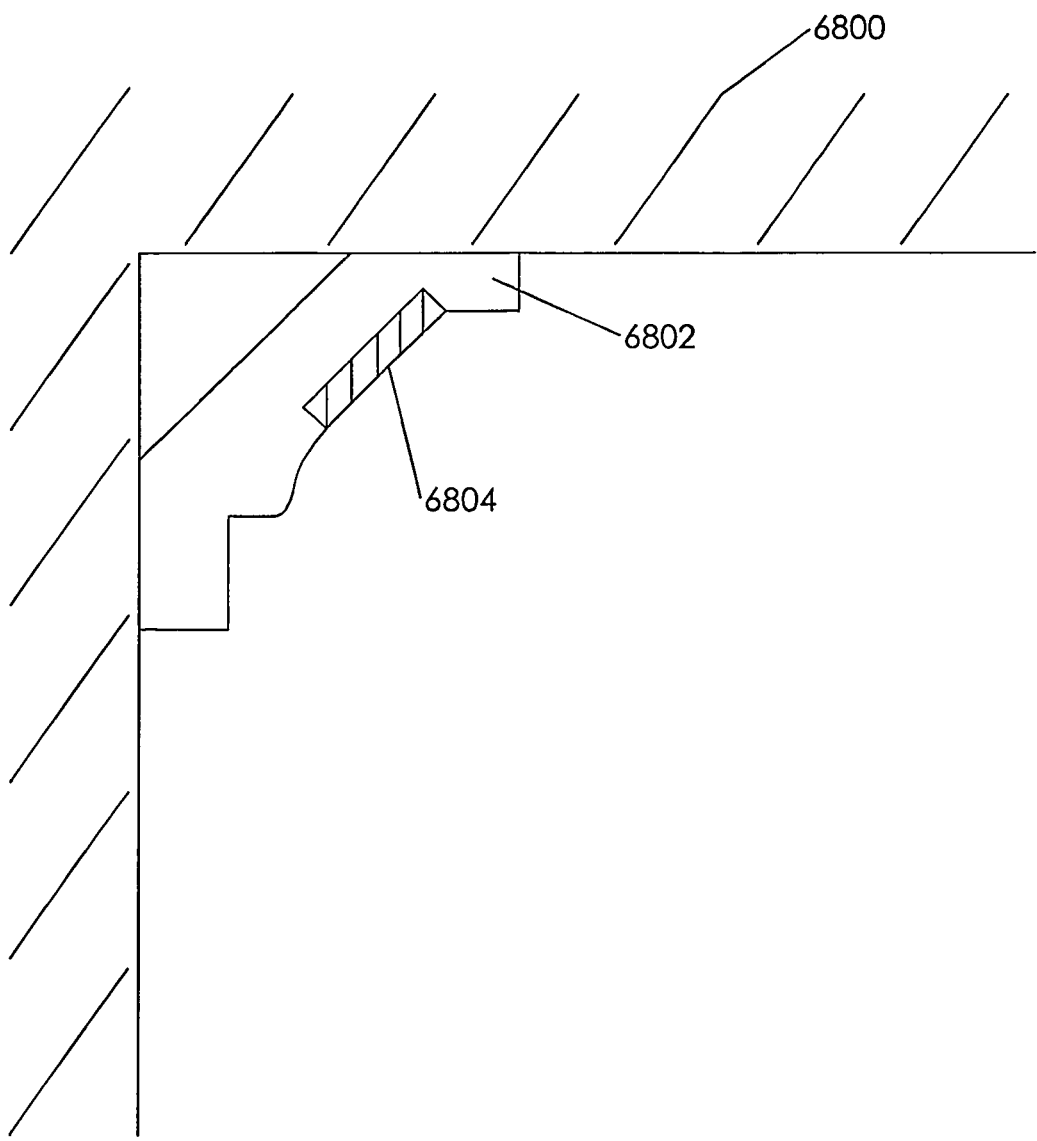
FIG. 68 depicts a side view of a decorative molding containing self cooling light sources.

FIG. 67A and FIG. 67B compares the thermal impedance of the light source disclosed and prior art light sources. This is depicted via thermal impedance schematics of self cooling light sources and prior art metal core board approaches respectively. In FIG. 67A the self cooling recycling source is formed from thermally conductive translucent element 6708 and reflector 6710 with LED or LED package 6706 mounted to thermally conductive translucent element 6708. The thermal schematic shows that the only thermal impedance elements are the thermal impedance of the thermally conductive translucent element 6710 and the thermal impedance associated with convection and radiative cooling to the ambient. This represents a greatly simplified impedance path as compared to conventional solid state light sources. FIG. 67B depicts a prior art metal core board solid state light source which is formed from metal core board 6712, side pieces 6714 and translucent element 6716 form a cavity around LED or LED packages 6704 mounted onto metal core board 6712. In this case heat from the LED package must be conducted through the thermal impedances associated with the metal core board 6712 and side pieces 6714 before the heat is conducted into a translucent element 6716 where the heat can be transferred to the ambient. In the case where both light sources are embedded in a low thermal conductivity material 6702 and 6700 such as a ceiling tile, sheetrock wall, paneling, or wooden lathe the majority of the heat must be transferred to the ambient via the light emitting surface. In construction a wide range of building materials may be used many of which have very low thermal conductivity. Any light source embedded in low thermal conductivity material 6702 and 6700 must be designed assuming little to no cooling off of the non-light emitting surfaces. As such the thermal impedance schematic shows that the LED and LED packages 6706 in the self cooling light source has a much more direct thermal path to the surrounding ambient than the LED package 6704 mounted in a conventional metal core board approach does. In addition, metal core boards 6712 have higher optical absorption than the enhanced metal reflector 6710 which is preferred in the disclosed self cooling light sources. In recycling cavity light sources the light source efficiency is strongly dependent on the losses within the cavity. It should also be noted that in the case where thermally conductive translucent elements 6708 are dielectric materials like alumina, the interconnect is greatly simplified. The interconnect (not shown) can be just printed silver traces in the FIG. 67A as compared to multi-layered interconnects required in metal core boards 6712 of FIG. 67B FIG. 68 depicts decorative molding 6802 containing self cooling light sources 6804. The molding 6802 may be attached to the room 6800 via nails or adhesives. The power lines can be hidden within the space behind the decorative molding 6802 and room 6800 (not shown).

Figure 69:
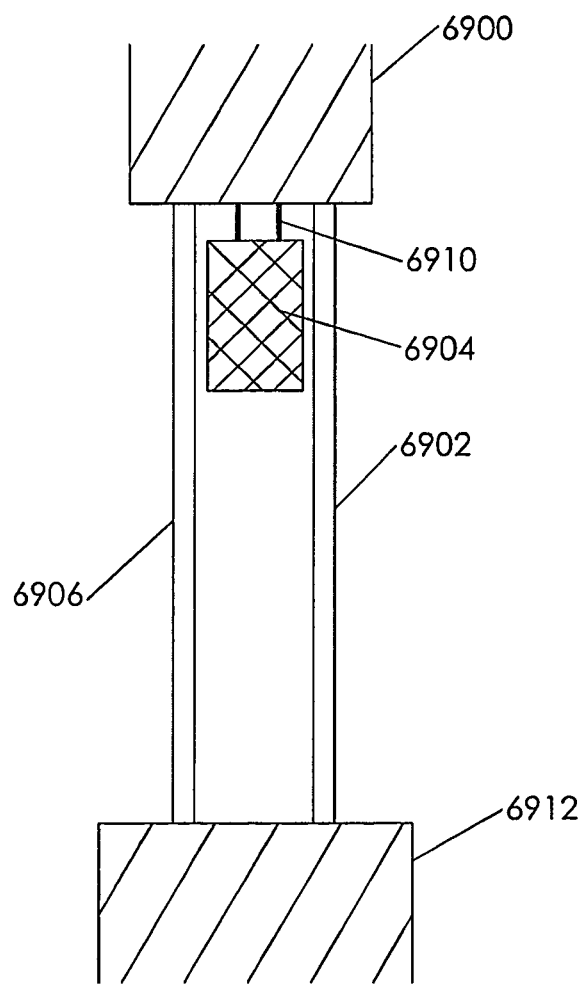
FIG. 69 depicts a side view of a self cooling light sources embedded within multi pane windows.

FIG. 69 depicts self cooling light sources 6904 is within multi pane window sheets 6902 and 6906. Power leads 6910 may feed-thru the seals 6900 and 6912 as wires or via conductive coating on the inner surfaces of the window sheets 6902 and 6906. In this embodiment many windows are filled with gases like helium which will further enhance convective heat transfer from the self cooling light source 6904 to the window sheets 6902 and 6906. While the self cooling light sources 6904 are not transparent but they are translucent so ambient outdoor lighting can still be allowed to enter the room. The diffuse nature of the transmission through the self cooling light sources 6904 allows external light to be scatter into the room. Alternately, the same approach can be used for skylights and arenas.

Figure 70:
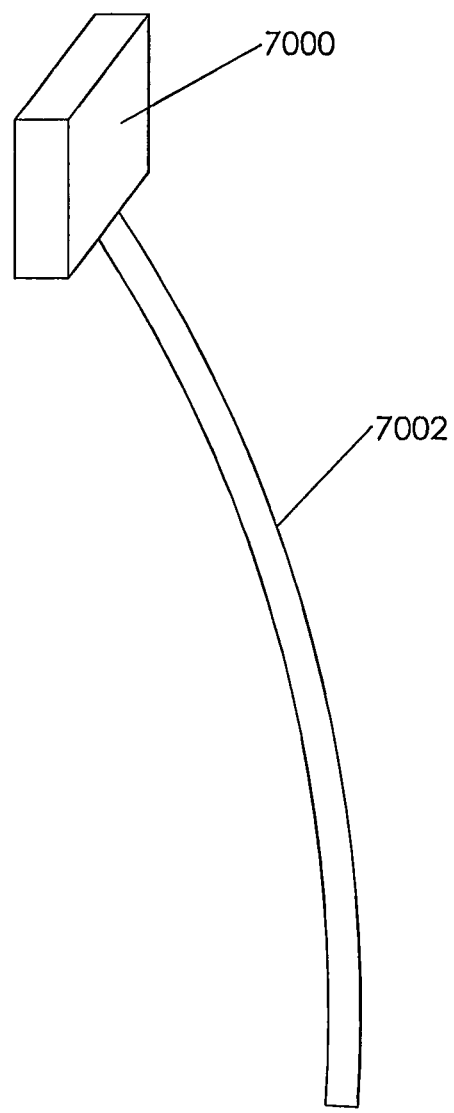
FIG. 70 depicts a perspective view of a self cooling light sources mounted on flexible pole.

FIG. 70 depicts self cooling light sources 7000 mounted on flexible pole 7002 which may be used to create decorative and functional lighting for venues and events. The light sources can deliver high lumen output and the flexible nature of the poles can be used to resist wind loading and to aid in maintenance. The servicing can be accomplished simply by reeling down the light source closer to the ground via a guide wire (not shown). This would be especially useful in stadiums and other large venues. The flexible poles could also be part of tents or membrane based enclosures including but not limited to circuses, theatrical performances, and weddings.

Figure 71:
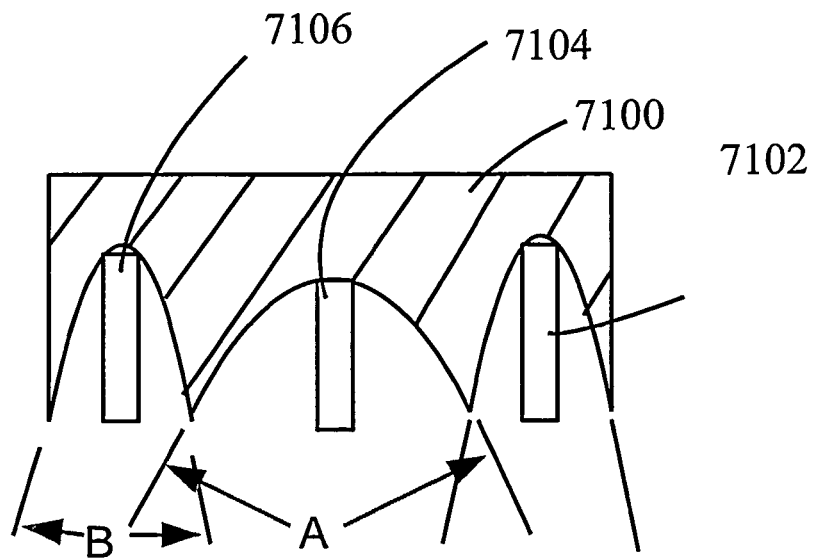
FIG. 71 depicts a side view of arrays of self cooling light sources with adjustable reflectors.

FIG. 71 depicts arrays of self cooling light sources 7102, 7104 and 7106 with adjustable reflectors 7100. By varying the solid angles A and B across the array as shown in the figure, soft output patterns can be created which are more pleasing to the eye and safer for applications such as street lighting. Also glare can be reduced if a cover glass is used. The robust and inorganic nature of the disclosed light sources enables direct exposure to outdoor elements unlike organic based packages.

Figure 72:
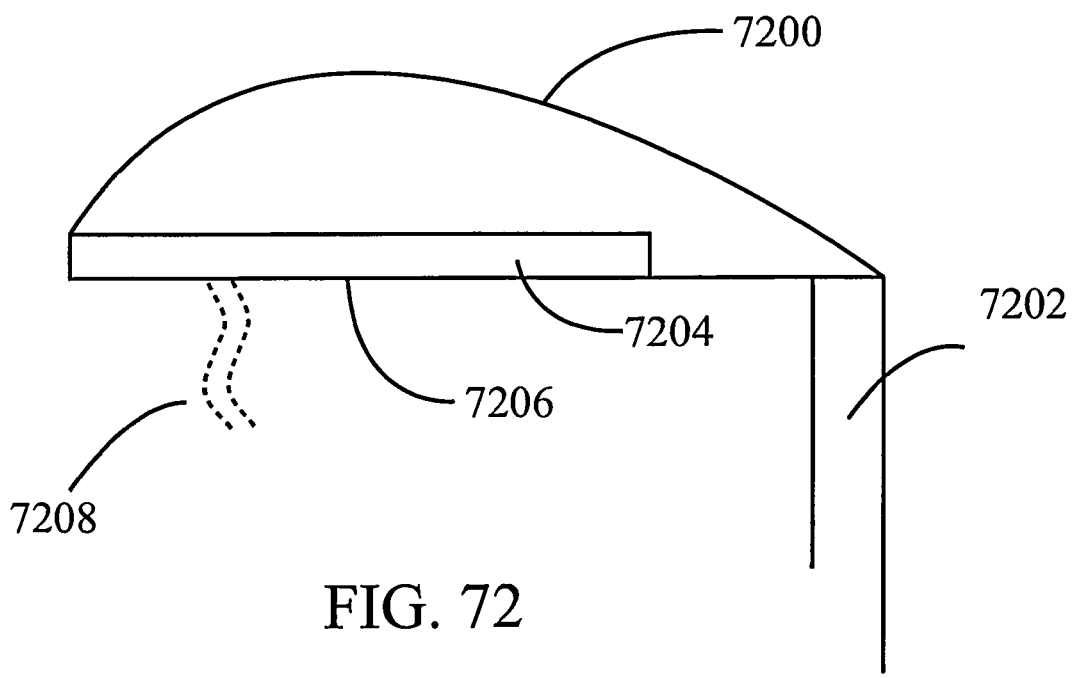
FIG. 72 depicts a side view of a heated surface streetlight.

FIG. 72 depicts heated surface streetlight based on recycling cavity light sources 7204 in which the light emitting and heat transfer surface 7206 are substantially the same surface. In this case the heat 7208 emitted off of light emitting and heat transfer surface 7206 may also function to remove ice or snow buildup. While the outer casing 7200 typically is used for heat transfer this surface is exposed to solar incidence and grim build up due to birds. The lighter weight of the recycling light sources 7204 reduces the amount of material and weight of the outer casing 7200 and the mounting pole 7202.

Figure 73:
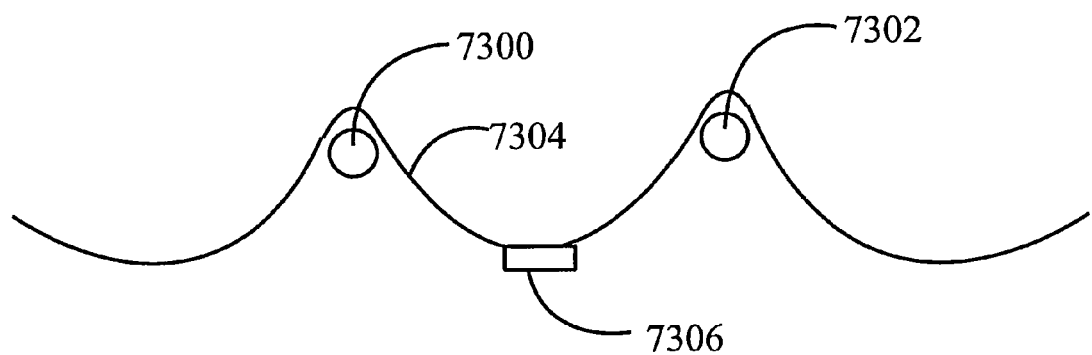
FIG. 73 depicts a side view of tape based self cooling light sources.

FIG. 73 depicts a flexible tape 7304 containing multiple self cooling light sources 7306. The tape 7304 may be strung over ceiling rafters 7302 and 7300. The lumens per gram performance of the self cooling light sources 7306 enable this application. As an example over 2000 lumen can be generate with less than 30 grams of weight in a warehouse or big box application stores can be hundreds of feet wide requiring 10 to 20,000 lumens every 400 square feet. A typical single 20,000 lumen solid state light fixture can weigh over 10 kg. The tape 7304 would not be able to provide power and support for fixtures this heavy. Using the self cooling light sources 7306 only 300 grams are required to generate 20,000 lumens in this application. The limiting factor for tape 7304 becomes the current carrying capability not weight of the light sources using this approach.

Figure 74:
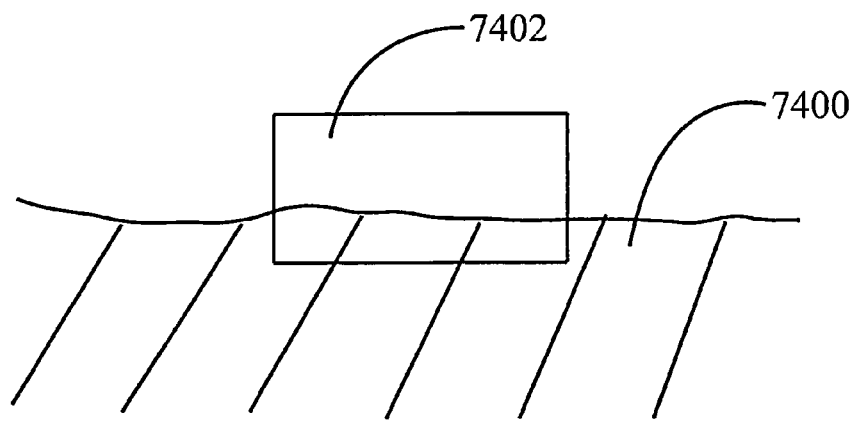
FIG. 74 depicts a side view of floating sealed self cooling light sources.

FIG. 74 depicts buoyant self cooling light sources 7402. The recycling cavities disclosed in this invention are typically air filled. If the recycling cavity is sealed the resulting light source is able to float. Alternately a transparent bladder may be placed within the recycling cavity or the self cooling light sources 7402 can be sealed externally in a waterproof transparent bag. As stated earlier, batteries can be integrated internal or external to the recycling cavity. The fluid 7400 may be part of the power circuit in conductive and incident solar energy may be used to charge the floating light sources.

Figure 75:
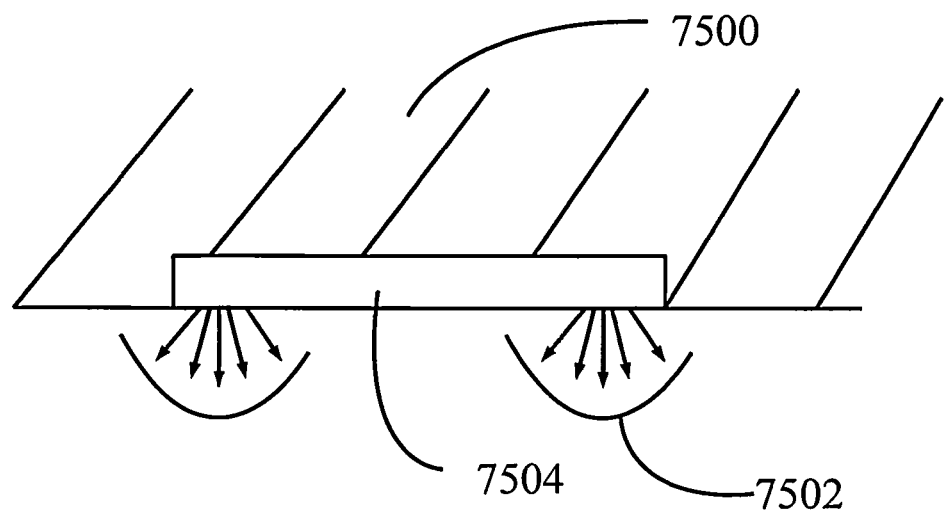
FIG. 75 depicts a side view of a low glare self cooling light source.

FIG. 75 depicts low glare self cooling light source 7504 embedded with building material 7500. Because low in-line transmission materials such as alumina can be used the output distribution form the self cooling light source 7504 approximates a uniform lambertian distribution 7502 due to high levels of mixing in the recycling cavity. The use of low optical loss materials, direction of primary emission from the LEDs, and the construction of the recycling cavity virtually eliminates bright spots. As such higher brightness levels can be used without glare. This enables less raw materials to be used further reducing costs. As an example, a low glare self cooling light source 7504 maybe glued into a pocket cut in building material 7500. Building material 7500 can have a thermal conductivity of zero W/mK and the self cooling light source can still operate efficiently because the heat generated by the self cooling light source 7504 is transmitted to the ambient using the surfaces not embedded in building material 7500.

Figure 76:
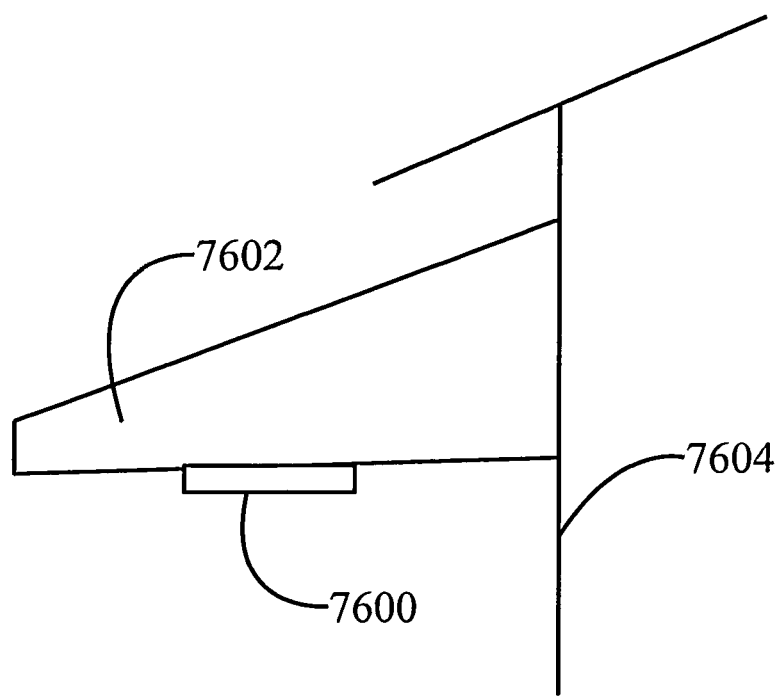
FIG. 76 depicts a side view of awning self cooling light sources.

FIG. 76 depicts awning 7602 with attached self cooling light sources 7600. The awning 7602 is attached to a building 7604. The light sources because they are light weight and low surface temperature can be directly attached to fabrics, wood, vinyl siding, and other building materials. The inorganic construction makes these light sources robust enough for outdoor exposure.

Figure 77:
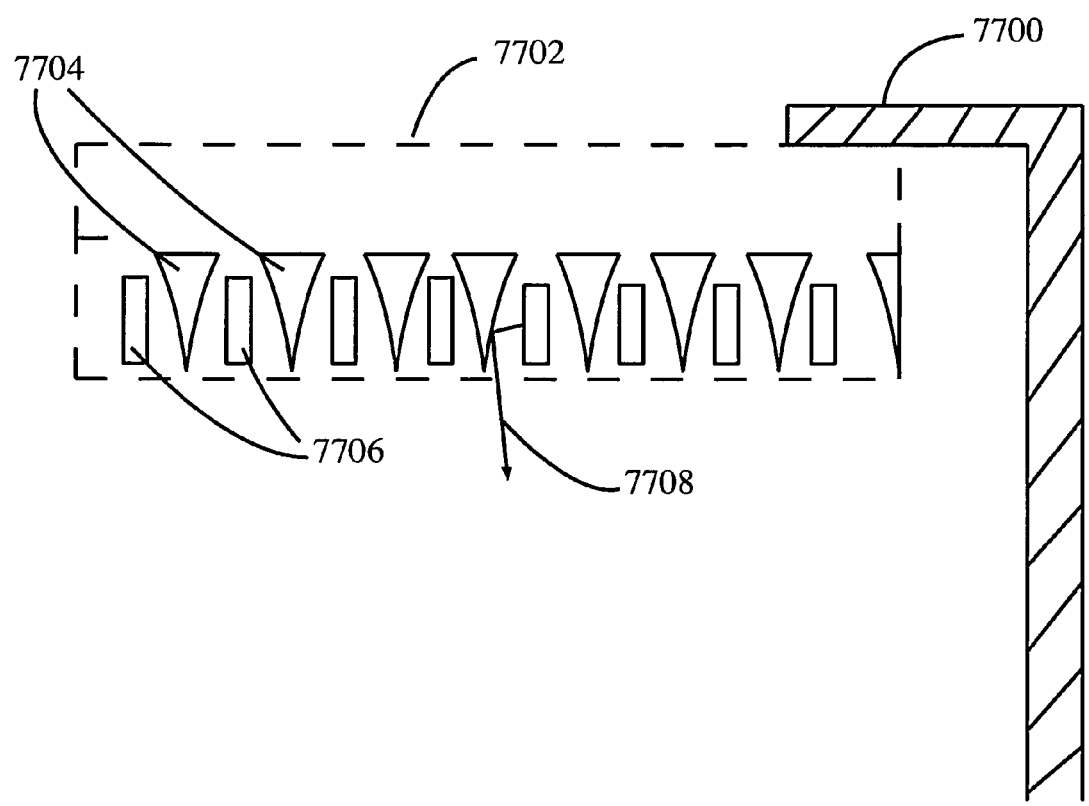
FIG. 77 depicts a side view of low glare street lights based on self cooling light sources.

FIG. 77 depicts low glare street lights based on self cooling light sources 7706 arranged in arrays of reflective CPC elements 7704 with air flow passing the self cooling light sources 7706. The fixture 7702 would further allow exit of the heated air from the fixture. The majority of the light 7708 emitted from the self cooling light sources 7706 are reflected downward. The rest of the light can only escape by exiting the fixture 7702 through another CPC element in the array of reflective CPC elements 7704. In this case the fixture 7702 forms a recycling optical cavity with the self cooling light sources 7706 external to the recycling optical cavity. The fixture 7702 may be mounted on a pole 7700. Because the light emitting surface and heat transfer surfaces are the same using this approach both visible and IR radiation can be directed in the same direction.

Figure 78:
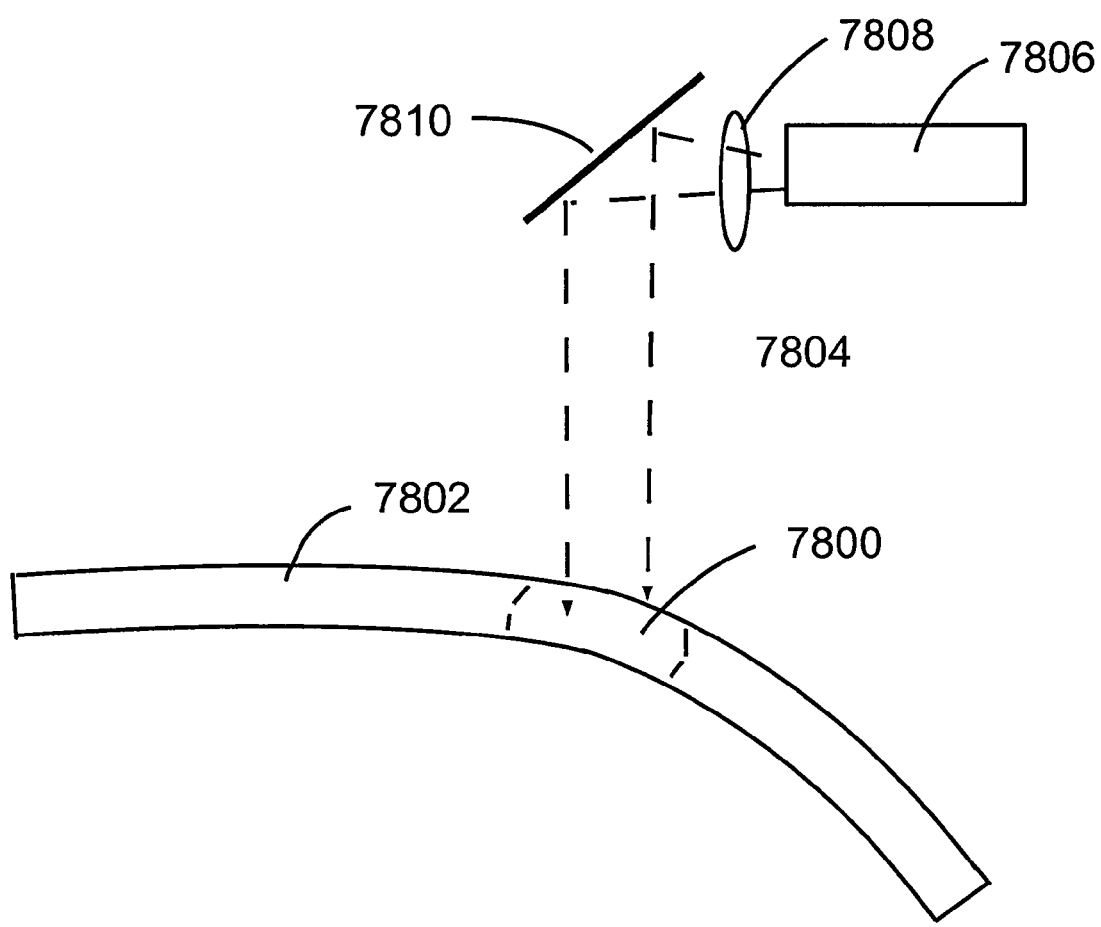
FIG. 78 depicts a side view of laser formed curved alumina elements.

FIG. 78 depicts laser formed curved alumina elements 7802. In some cases non-flat thermally conductive translucent elements are desirable. Alumina is especially preferred due to its high thermal conductivity, low cost and low optical absorption in the visible region. Alumina has a melting point of 2015 centigrade. Thin films can be bent using laser irradiation. In this case a fiber laser 7806 is imaged via transmissive optics 7808 and reflective optics 7810 onto the surface of the alumina. The expanded beam 7804 heats the deflection region 7800 of the thin alumina plate 7802. It is critical that the expanded beam 7804 has a non-abrupt intensity profile to provide a preheat zone and a post anneal zone to prevent cracking of the alumina plate 7802.

Figure 79A:
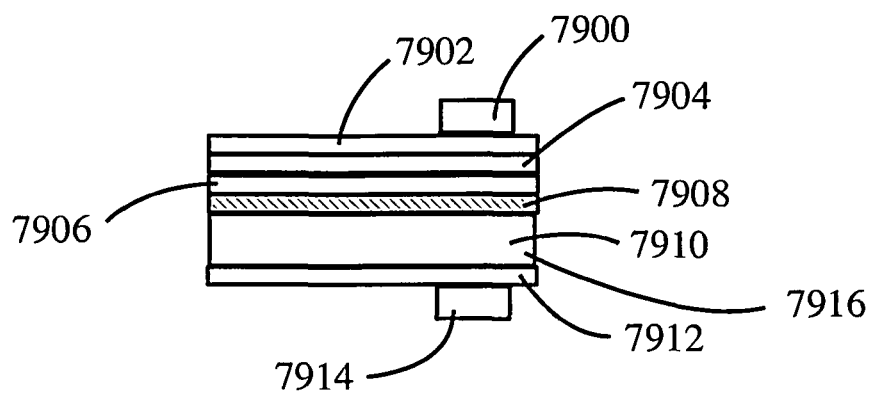
FIG. 79A depicts a side view of substrate free LEDs both single and multiple die.
Figure 79B:
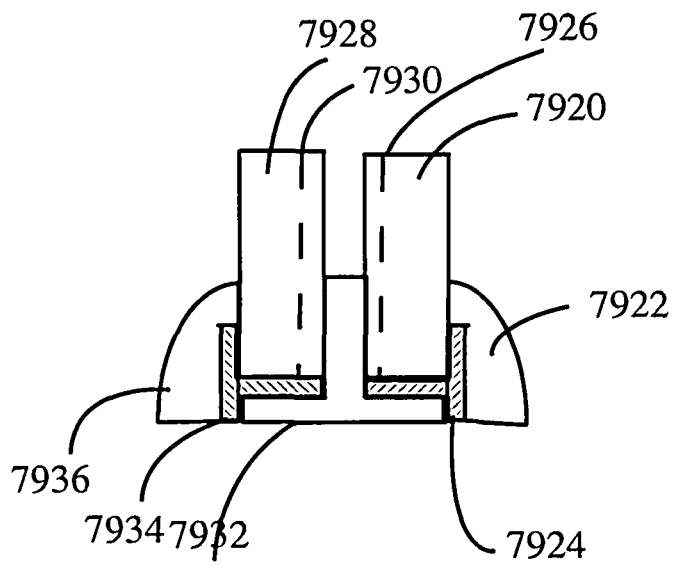
FIG. 79B depicts a side view of substrate free LEDs both single and multiple die in a dual die edge mounted configuration.

FIG. 79 depicts substrate free LEDs both single and multiple die elements. FIG. 79A depicts substrate free LED consisting of the following layers; outer thick film fired metal contacts 7900 and 7914, outer semiconductor layers 7902 and 7912 are degenerative TCOs such as aluminum doped ZnO. P layer 7904, electron blocking layer 7906, MQWs 7908, and n layer 7910 complete the device structure. Previously disclosed by the author these substrate free LEDs are grown on freestanding n doped nitride foils which make up the majority of n layer 7910. Because the devices are substrate free and have degenerative oxide outer layers high temperature firing of the contacts is possible similar to the processes and materials used in silicon solar cells. Using this approach vertical LEDs can be formed based on dual sided printing of thick film contacts followed by laser scribing and breaking thereby eliminating all lithographic and etching steps. If the metal contacts 7900 and 7914 are offset towards the edge of the LED die, novel mounting configurations can be realized based on edge mounting the die. FIG. 79B shows a dual die edge mounted configuration. The p sides 7930 and 7926 of LED die 7928 and 7920 respectively are mounted on T channel element 7932 via soldering. The n contacts 7922 and 7936 are electrically isolated from the T channel element 7932 by insulator 7934 and 7924 respectively. Given that the typical thickness of the LED die 7926 and 7928 is around 30 microns very compact CSP sources can be realized.

Figure 80A:
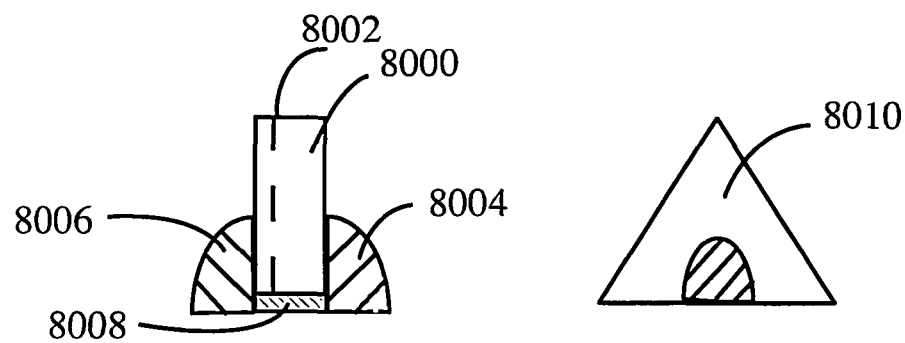
FIG. 80A depicts a side view of a vertically mounted triangular shape substrate free chip scale packages.
Figure 80B:
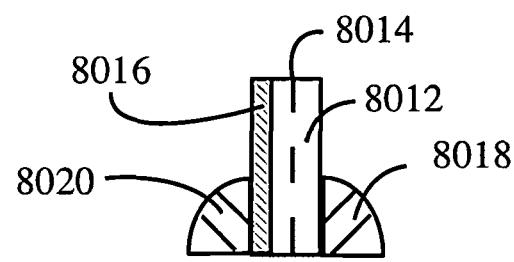
FIG. 80B depicts a side view of a vertically mounted triangular shape substrate free chip scale packages with a reflector layer.
Figure 80C:
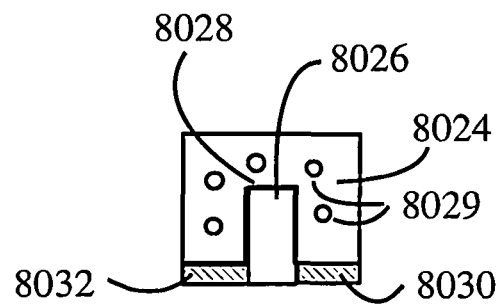
FIG. 80C depicts a side view of a vertically mounted triangular shape substrate free chip scale packages with wavelength conversion or translucent element.

FIG. 80 depicts substrate free chip scale packages with various additional elements. FIG. 80A depicts a vertical device 8000 with p side 8002 with thick film contacts 8006 and 8004. Insulative layer 8008 may be added to prevent shorting of the edges. The side view illustrates how a variety of shapes are possible using this approach. It should be noted that 100 micron square 30 micron thick LED die has more emitting surface area on the edges than the top surface. In addition, the vertically mounted triangular shape 8010 shown in FIG. 80A maximizes both extraction efficiency and forward emission compared to square die. This is mainly due to waveguiding within the active layers of the die. By mounting the die as shown the maximum amount of edge emission is coupled out of the die. In addition, thermal boundary resistance layers can be bypassed in this configuration. In most devices each epitaxial layer reflects phonons in manner similar to the Fresnel reflection that photons experience at an index of refraction change. By mounting the die on its edge heat can be coupled out of the edge of the die as well as the contact regions. FIG. 80 B depicts a substrate free die 8012 with a p side 8014 in which a reflector layer 8016 extends over the majority of the p side 8014 of substrate free die 8012. Contacts 8020 and 8018 are again used to form contacts to the underlying interconnect (not shown). FIG. 80C depicts a vertically mounted chip scale package containing at least one substrate free vertical device 8026 with a p side layer 8028 embedded in a slot in a wavelength conversion or translucent element 8024 which may include ceramics, single crystalline, polycrystalline, and amorphous materials which are thermally conductive and transparent or translucent to the wavelengths emitted by the at least one substrate free vertical device 8026. Additional wavelength conversion or scattering elements 8029 may be incorporated in or coated on wavelength conversion or translucent element 8024 which is also metalized with contacts 8032 and 8030 which are isolated by the trench and the at least one substrate free vertical device 8026. In this case, the metal contacts previously discussed are press fit into the trench and connect to contact 8032 and 8030. Further, laser spot welding, solder reflow, mechanical pressure, and annealing can also be used to ensure good electric bonding between the metal surfaces of the device and contacts 8032 and 8030.

Figure 81:
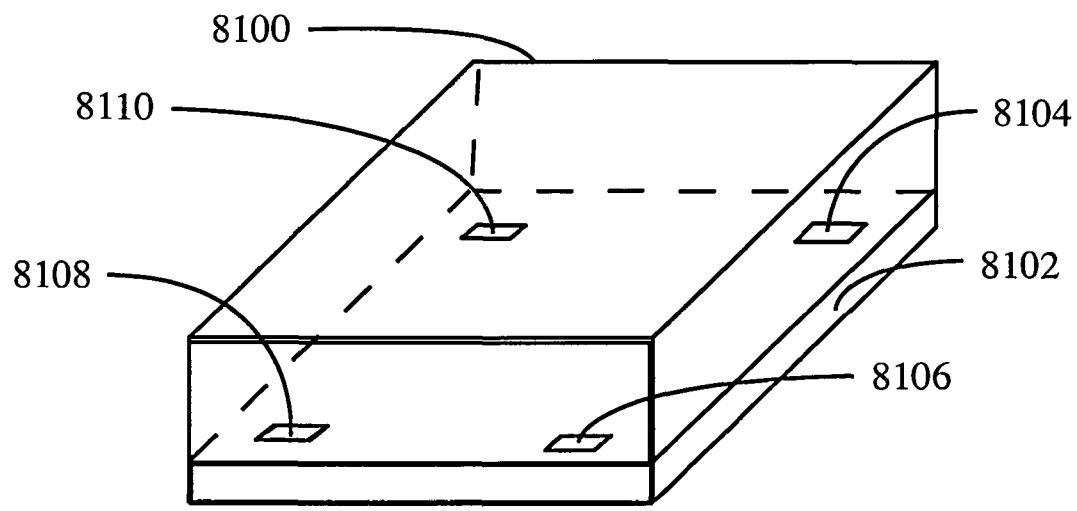
FIG. 81 depicts a perspective view of a RGBW self cooling light source.

FIG. 81 depicts a RGBW self cooling light source formed using a reflector 8100 and at least one thermally conductive translucent element 8102 to which red LED 8108, blue LED 8110, green LED 8104 and white LED 8106 are mounted thermally and connected electrically (not shown). The high degree of mixing creates a uniform output even though the LEDs are spatially separated.

Figure 82:
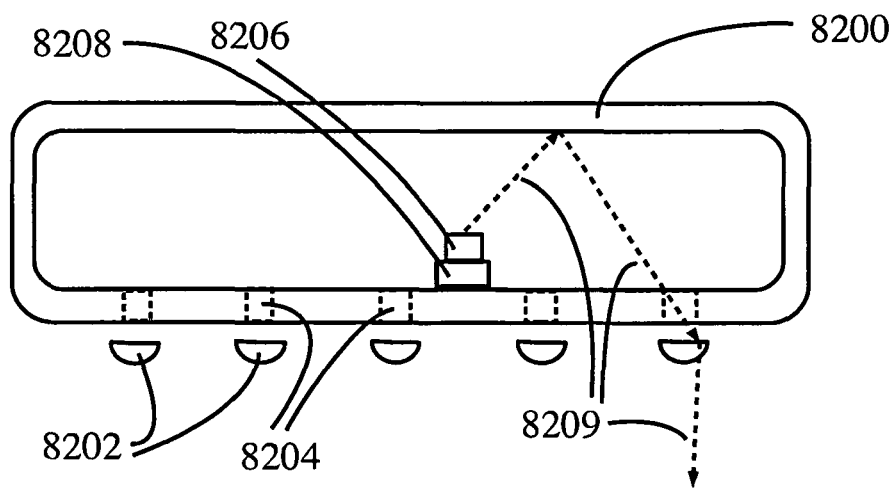
FIG. 82 depicts a side view of a directional self cooling low profile light source based on perforated reflector and recycling cavity with secondary optical array elements.

FIG. 82 depicts directional self cooling low profile light source in which a perforated reflector forms a recycling cavity

8200 with secondary optical array elements 8202 aligned to the output holes 8204 of the perforated reflector and recycling cavity 8200. The LED package 8206 in this configuration is mounted onto a dielectric submount 8208. While the perforated reflector and recycling cavity 8200 may be part of the electrical circuit for LED package 8206 more typically two leads are required to provide power to the LED packages 8206 (not shown). The use of enhanced reflectivity aluminum is preferred for the perforated reflector and recycling cavity 8200. Using this approach a very thin directional light source can be realized.

Figure 83:
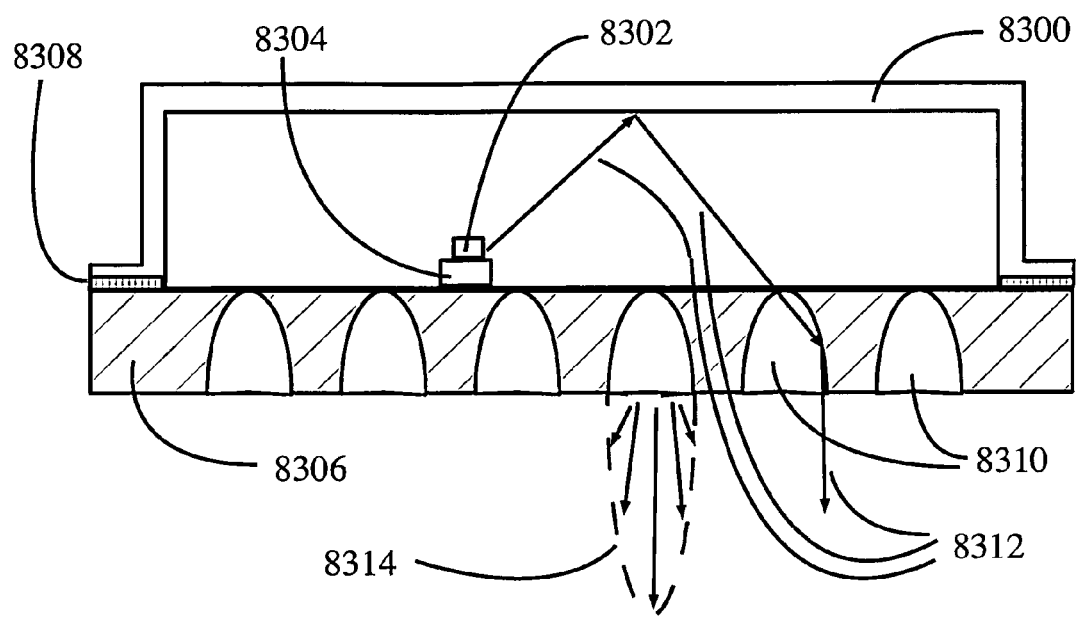
FIG. 83 depicts a side view of a directional self cooling low profile light source based on perforated reflector and recycling cavity with integrated micro CPC elements.

FIG. 83 depicts a directional self cooling low profile light source based on perforated reflector with integrated micro CPC elements 8306. In this case a perforated reflector with integrated micro CPC elements 8306 can be based on a thermally conductive translucent element like alumina in which an array of CPC elements are formed. If the CPC elements 8310 have specular surfaces the majority of the light rays 8312 will be directed into a limited solid angle distribution 8314. Some rays from LED and LED packages 8302 may escape the recycling cavity formed by reflector 8300 and perforated reflector with integrated micro CPC elements 8306 through the CPC elements 8310 and some via transmission through the alumina material itself. The reflector 8300 maybe attached via bonding means 8308 which can be solder, adhesive, welding, brazing or mechanical means. In all embodiments it is disclosed that a recycling cavity may consist of an opaque reflector, a translucent element, or both. In this manner all embodiments can be used to create directional and non-directional sources.

Figure 84:
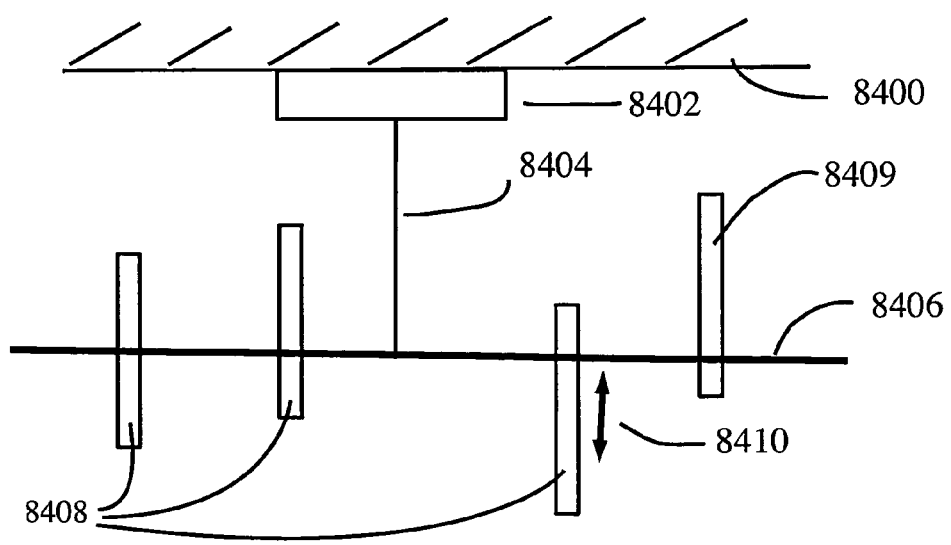
FIG. 84 depicts a side view of a an adjustable light fixture based on sliding self cooling light sources.

FIG. 84 depicts an adjustable light fixture based on sliding self cooling light sources 8408 and 8409 which slide up and down on fixture plate element 8406 which provides both structural support and power to the sliding self cooling light sources 8408 and 8409. The fixture is attached to the ceiling via support 8404 to base 8402 which in turn attaches to ceiling 8400. The sliding motion 8410 determines what percentage of sliding self cooling light sources 8408 and 8409 is above or below the fixture plate element 8406 which can be reflective, translucent, diffuse, or colored.

Figure 85:
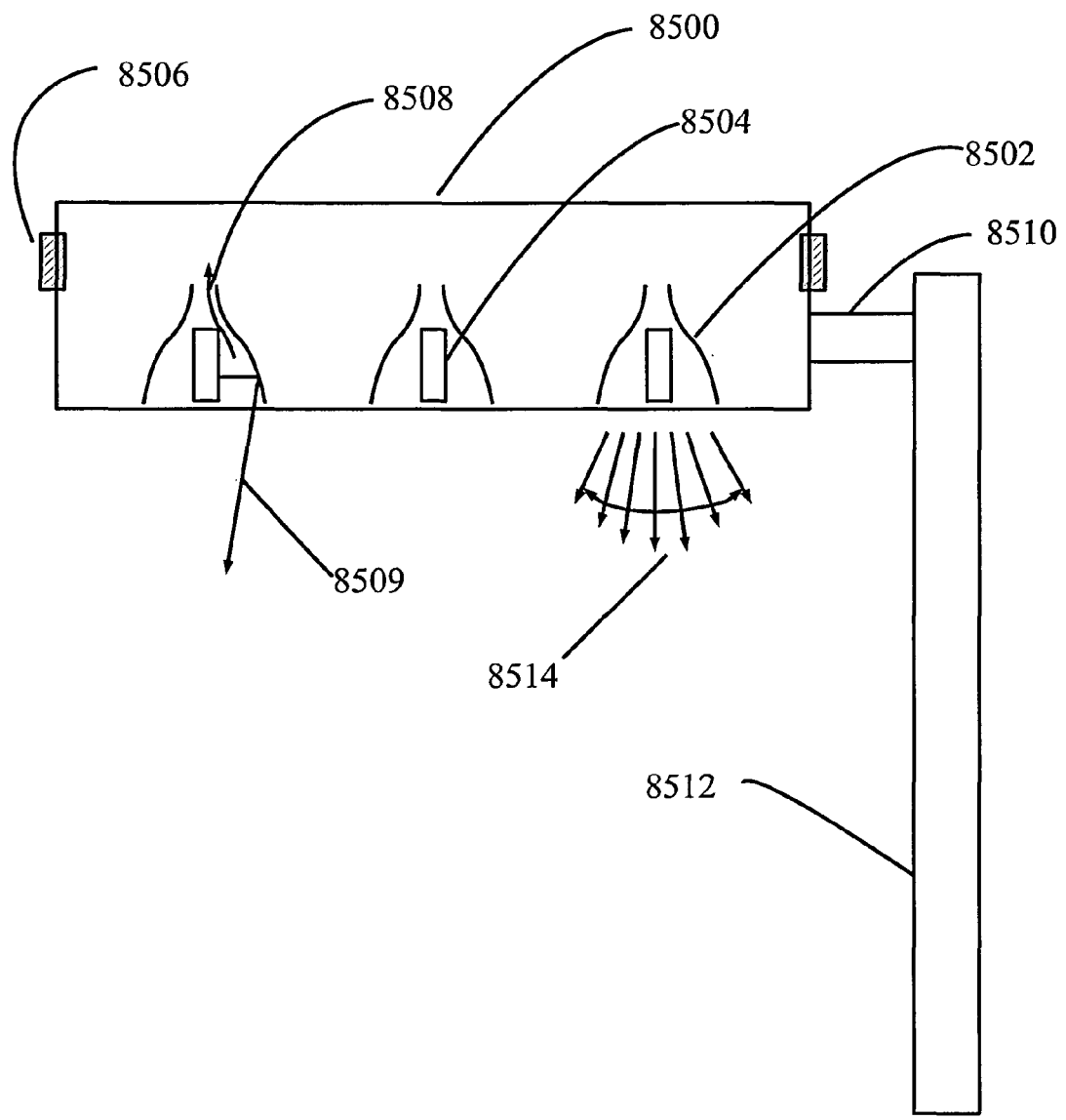
FIG. 85 depicts a side view of a an etendue matched street light cut down on light pollution and glare.

FIG. 85 depicts an etendue matched street light that cuts down on light pollution and glare. A typical solid state outdoor light has an emission area of greater than 1 square foot. Even if an output of 20,000 lumens and an output angular distribution of plus or minus 60 degrees in both axis is required the source brightness may be as low as 40,000 FtL based strictly on etendue requirements. High intensity LED sources have source brightnesses in excess of several million FtL. Glint and glare occurs because dust, scratches, and other causes of skew rays allow for direct observation of at least a portion of this source brightness. This creates road hazards and discomfort to viewers. A simple cover glass can degrade over time due to dust and scratches. Alternatively lens based optical approaches suffer from skew rays due to Fresnel reflections. When the source brightness is several million ft L, even a 4% Fresnel reflection exposes the viewer to glint brightnesses an order of magnitude higher than the 40,000 ft L required by etendue. FIG. 85 consists of linear recycling cavity sources 8504 mounted in multiple reflector elements 8502 which define a solid angle output distribution 8514. The LED packages (not shown) are converted via the recycling cavity as previously discussed into much lower surface brightness source (typically 10,000 to 100,000 ft L). The light emitted 8509 originates from a much lower brightness source so any glint or glare is dramatically reduced compared to incandescent, halogen, and conventional solid state sources. This is roughly equivalent to the effect of frosting the bulb of an incandescent light. Alternately, the source brightness is much higher than fluorescent bulb. As such a reasonable sized fixture 8500 can be designed which is lighter and smaller than a fluorescent based approach but essentially glare free compared to conventional solid state approaches. Air flow 8508 is allowed to flow through the fixture 8500 and out output ports 8506. The result is a light weight etendue matched light source for a wide range of applications. The fixture 8510 can be supported by arm 8510 and attached to pole 8512.

Figure 86:
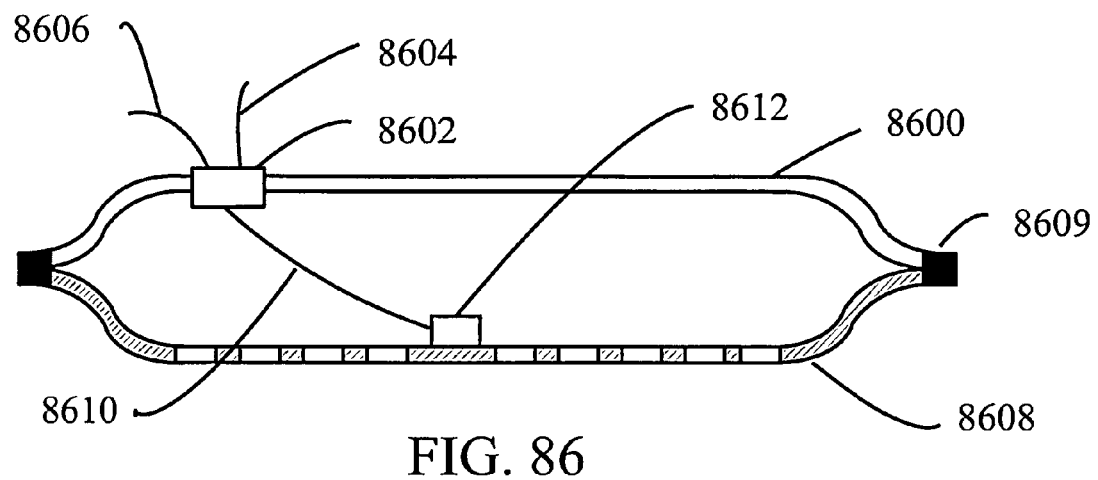
FIG. 86 depicts a side view of a laser welded recycling cavity with perforated reflector and low absorption flex circuit with LED packages thermally attached to perforated reflector.

FIG. 86 depicts a laser welded recycling cavity with perforated reflector 8608 and reflector 8600 with an internal low absorption flex circuit 8610 with LED packages 8612 thermally attached to perforated reflector 8608. The low absorption flex circuit 8610 exits the recycling cavity via feed-thru 8602 to become or connect to power leads 8604 and 8606. Weld joints 8609 can be done via laser, resistive welding, gluing, crimping, clips, or other attachment means to form the recycling cavity. Using this approach the external surfaces of the recycling cavity can be virtually any color or finish as long as it doesn't degrade the convective or radiative performance of the outer surface.

Figure 87:
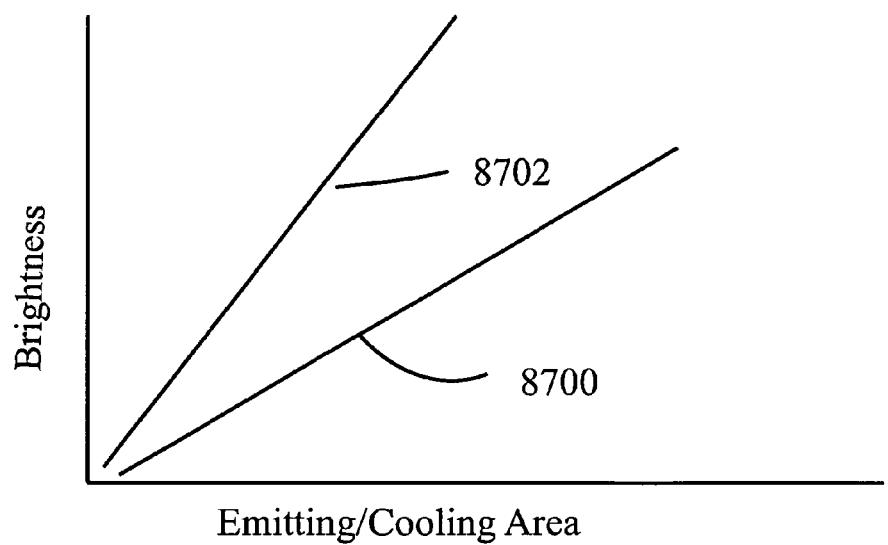
FIG. 87 depicts a graph showing brightness versus emitting/cooling area.

FIG. 87 depicts brightness versus emitting/cooling area graph. Curve 8700 is associated with low lumens per watt LED packages or high absorption losses with the recycling cavity or both. Curve 8702 is associated with high lumen per watt LED packages and low absorption losses within the recycling cavity or both. As an example, a recycling cavity where all the surfaces are constructed of alumina 500 microns thick emits more than 82% of the light emitted by the LEDs within the recycling light cavity even though the in-line transmission of the 500 micron alumina is less than 16%. Alanod reflectors and alumina show similar performance levels. White optics plastics which claims similar reflectivity to Alanod show more than 10% lower overall efficiency. In general this approach is enabled by high lumen per watt LED sources and low optical absorption materials like alumina and enhanced metal reflectors.

Figure 88A:
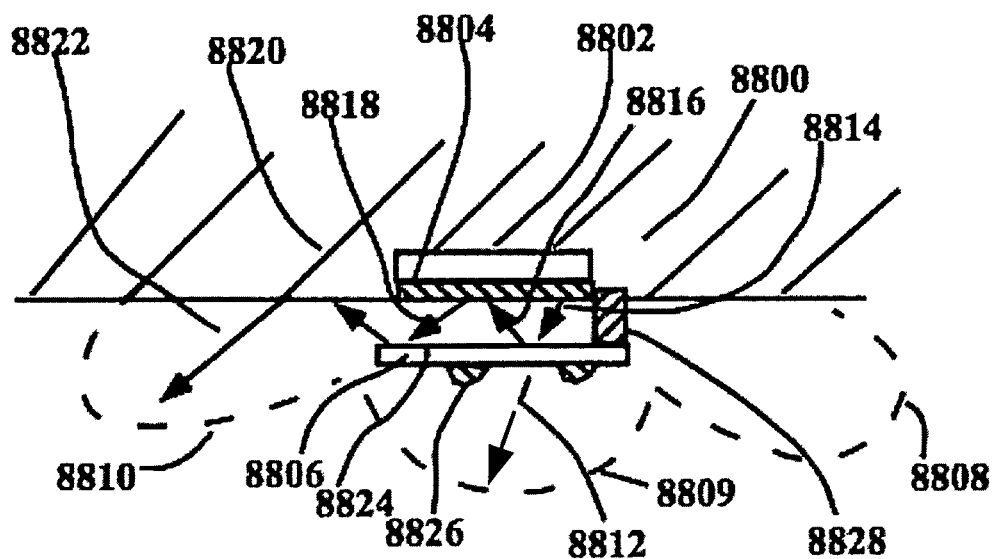
FIG. 88A depicts a side view of a highly reflectivity solid state light sources with recycling etendue transformation elements.
Figure 88B:
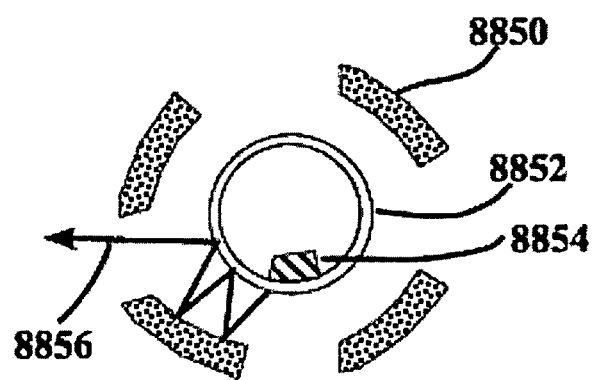
FIG. 88B depicts a side view of a non-planar highly reflectivity solid state light sources with recycling etendue transformation elements.

FIG. 88A depicts a light fixture comprising at least one highly reflective solid state light source 8802 with at least one highly reflective heat and light emitting element 8804. As an example, at least one highly reflective heat and light emitting element 8804 may be 500 micron thick alumina with an in-line transmission less than 20%. By itself, the at least one highly reflective heat and light transmitting element 8804 via Kirchoff's Law must have a reflectivity of at least 80% to externally incident light rays 8816. The reflectivity if further enhanced due to the recycling cavity construction of at least one highly reflective solid state light source 8802 which can push the reflectivity above 90% for externally incident light rays 8816. In conventional solid state light sources diffusers typically have in-line transmissions greater than 50% because the optical losses of the various components within the light source prohibit a large number of reflections within the light source. For perspective, a recycling cavity with 80% average reflectivity in which there is an average of 8 reflections within the recycling cavity has an output efficacy of less than 20%. In comparison, if the same recycling cavity has 98% average reflectivity with an average of 8 reflections with the recycling cavity the output efficacy is over 85%. In general, very high reflectivity sources can be used in recycling systems to create very compact light sources with virtually any output distribution. As such, if the at least one highly reflective heat and light emitter 8804 has a high reflectivity to external incident light rays 8816 the etendue of the at least one self cooling light source can be decreased, left the same, or increased efficiently. Typically, the emitted light ray 8814 has a substantially lambertian output distribution due the highly diffusive nature of at least one highly reflective heat and light transmitting element 8804. Recycling etendue transformation element (RETE) 8806 and 8800 can be used to redirect or otherwise modify the output distribution of at least one highly reflective solid state light source 8802. The resulting output distribution 8808, 8810, and 8809 are determined by the reflectivity, geometric, and transmission properties of RETE 8806 and 8800. As shown recycled ray 8818 reflects off of at least one highly reflective heat and light transmitting element 8804 and then reflects off of RETE 8806 inner surface 8824 to form RETE recycled ray 8820 which then reflects off of RETE 8800 before forming output ray 8822 which makes up part of output distribution 8810. Alternately, emitted ray 8814 may be partially reflected such that transmitted ray 8812 becomes part of transmitted output distribution 8809. By using RETEs to modify the output of the self cooling light sources 8802, standardization of at least one highly reflective solid state light source 8802 can be more easily realized. In conventional solid state lighting standardization is difficult because lighting designers want a wide range of aesthetic looks. RETE 8806 may be attached via mounting means 8828 and a wide range of surface finishes 8826 may be used including paint, fused glass, metals, porous metals, ceramics, electroplating, and other surface finishing materials and techniques. As an example a piece of porous aluminum may be used for RETE 8806. Inner surface 8824 may be highly reflective and surface finish 8826 may be matte black and still have high system efficiency. In this case the output distribution 8808 and 8810 are indirect lighting sources and transmitted output distribution 8809 is based on transmitted rays 8812. In a sense, a secondary recycling cavity is formed wherein the recycling cavity functions efficiently due to the high reflectivity of the at least one high reflectivity heat and light emitter 8804. FIG. 88B depicts a non-planar self cooling light source 8852 containing at least one LED package 8854 within the recycling cavity of non-planar highly reflective solid state light source 8852. Again the reflectivity of the non-planar highly reflective solid state light source 8852 is critical for efficient recycling of light 8856 off of external RETE 8850. RETE 8850 can be louvers, porous metals, ceramics, plastics, and other reflective materials or optical elements which recycle at least a portion of the light emitted by the non-planar highly reflective solid state light source 8852 back to the non-planar solid state light source 8852.

Figure 89:
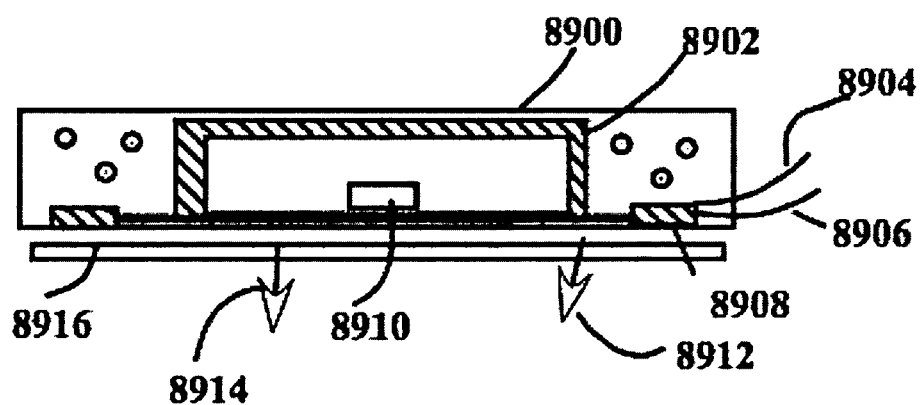
FIG. 89 depicts a side view of a diffuse self cooling light source with integrated power conditioning elements.

FIG. 89 illustrates a distributed solid state light source with integrated power conditioning elements 8908. The LED source 8910 and the integrated power conditioning elements 8908 are both electrically connected and cooled via light transmitting thermally conductive element 8916. A reflector 8902 surrounds the LED source 8910 such that the majority of the light emitted 8914 exits the light source as a uniform substantially lambertian emission area as defined by the reflector 8902. Potting 8900 can be used to environmentally and electrically isolate the integrated power conditioning elements 8908 as well as provide support for power leads 8904 and 8906. Because the majority of the heat 8912 is transferred to the surrounding ambient off the surface of the light transmitting thermally conductive element 8916 the potting 8900 does not require high thermal conductivity. Using this approach high output solid state sources can be embedded within low thermally conductive materials such as polymers without concern. As an example, the embodiment above could be glued into a recessed pocket in a Tedlar panel as seen in aircraft interiors. The heat generated is dissipated into the aircraft ambient. The integrated power conditioning elements 8908 could be used to stabilize the optical output within the electrical operational range of 22V to 32V of the aircraft. Additionally, EMI filtration could also be easily integrated as well. As shown the integrated power conditioning elements 8908 and LED source 8910 are on the same side. The use of vias or other double-sided interconnect means are also envisioned. As previously stated a wide range of electrical, sensing, and communication functions can be added to light sources using this approach. Most preferably the total thickness of the light source including potting 8910 is between 1 mm and 1 cm. More preferably, the overall thickness is between 2 mm and 6 mm. As an example, a 24 VDC input which varies between 22V and 32V is converted to 18 VDC over the input voltage range using power conditioning elements 8908. A single 18 VDC multi-chip LED package is used for LED source 8910. The light source is 20 mm×20 mm×5 mm thick with an output area of 10 mm×20 mm which uniformly emits up to 80 lumens while maintaining a surface temperature of under 60 C within a 25 C ambient while embedded within a ½ inch thick Tedlar panel. The area and output levels can be scaled accordingly.

Figure 90:
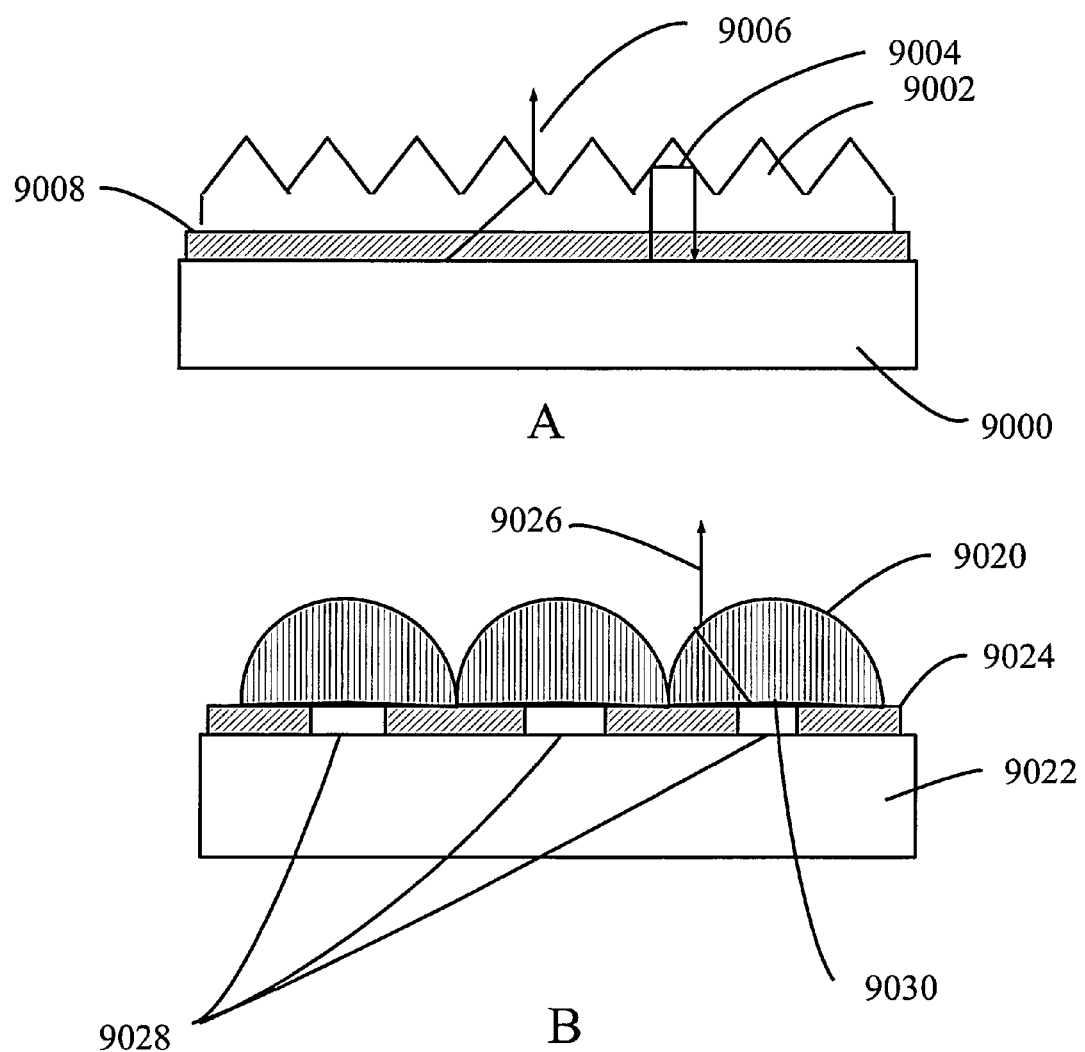
FIG. 90A depicts a side view of a high surface reflectivity self cooling light source with solid angle restrictions.
FIG. 90B depicts a side view of a high surface reflectivity self cooling light source with more solid angle restrictions.

FIG. 90A depicts a recycling optic 9002 mounted onto a self cooling light source 9000 via a bonding layer 9008. Bonding layer 9008 most preferably has a refractive index less than 1.4 to allow for effective recycling to occur. An example, of a recycling optic 9002 is 3M's BEF or DBEF products. While a bonding layer 9008 can be eliminated it is more preferable to bond the recycling optic 9002 to the self cooling light source 9000. By controlling the refractive index of self cooling light source 9000, the bonding layer 9008, and the recycling optic 9002 the light output distribution (angle) of the lighting system can be reduced or modified as shown by light rays 9004 and 9006. The reflectivity of the self cooling light source 9000 directly impacts the efficiency of the lighting system. As such self cooling light source 9000 with external reflectivity greater than 95% is preferred and even more preferably external reflectivity is greater than 98%. FIG. 90B depicts another embodiment to restrict or modify the angular distribution from the lighting system. In this case, reflective pattern 9024 is formed on self cooling light source 9022. Examples are reflective inks like aluminum or silver with reflectivity greater than 95% are preferred. Alternately, vapor depositing techniques can be used to deposit reflective material directly on the self cooling light source outer surface and patterned via subtractive methods. The reflective pattern 9024 can restrict the light emitted by the self cooling light source 9022 such that light emitted by the light source is restricted to openings 9028 in the reflective layer 9024. A lens 9020 can be positioned over such an aperture or opening 9028 such that light ray 9026 is substantially located at the focal point 9030 of the lens 9020 allowing for focusing, collimation, reduction of the solid angle, etc. of the light emitted by the light source 9022.

Figure 91:
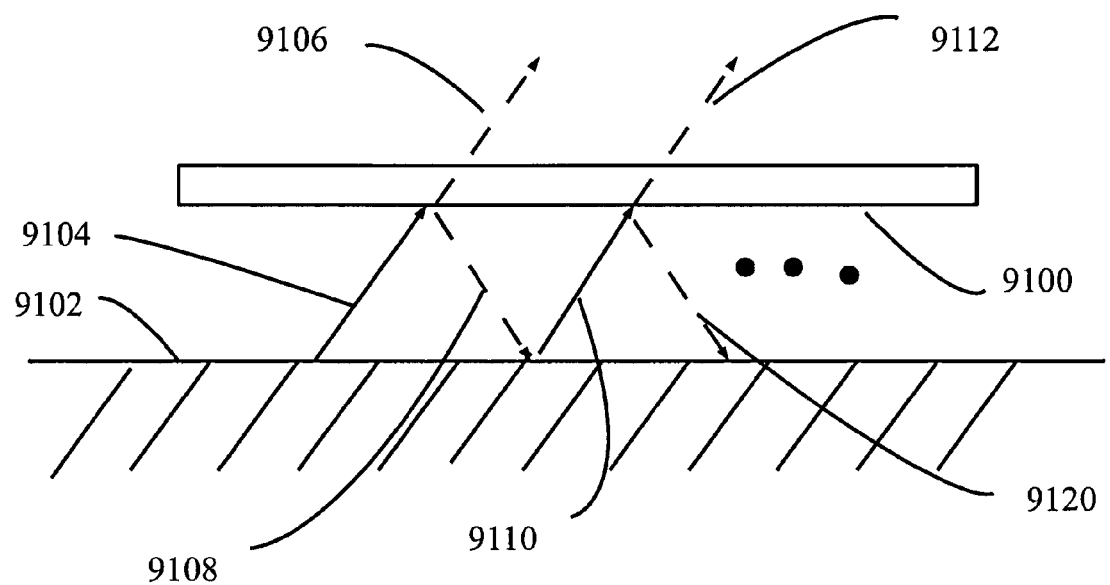
FIG. 91 depicts a side view of a high surface reflectivity self cooling light source with polarization recycling element.

FIG. 91 depicts a recycling element 9100 remotely mounted, positioned, or displaced from the light emitting surface of the self cooling light source 9102. The light emitting surface is As an example recycling element 9100 can be a reflective polarizer. Emitted ray 9104 is unpolarized in this example. As such recycling element 9100 reflects one polarization ray 9108 and transmits the other polarization ray 9106. Because the high reflectivity self cooling light source 9102 which have been disclosed in this filing exhibit high reflectivity, reflected ray 9110 can be efficiently returned to recycling element 9100 where it is again split into two polarizations states one reflected and one transmitted. This effect continues based on the spacing and geometry of recycling element 9100 relative to high reflectivity self cooling light source 9102. Typically reflectivity greater than 90% is required to make efficient use of this approach. It should be noted that transmitted rays 9106 and 9112 are essentially polarized in the same manner. If the high reflectivity light source 9102 is diffuse reflected ray 9108 can be depolarized increasing the percentage of energy that will be transmitted through the recycling element 9100. While a reflective polarizer is shown as an example, similar effects can be realized using dichroic bandpass filters, neutral density mirrors, patterned mirrors, and colored filters. The recycling element 9100 may be flat or non-flat in geometry. Polymer based dichroic filters in particular are a preferred embodiment for forming non-flat recycling elements 9100

Figure 92A:
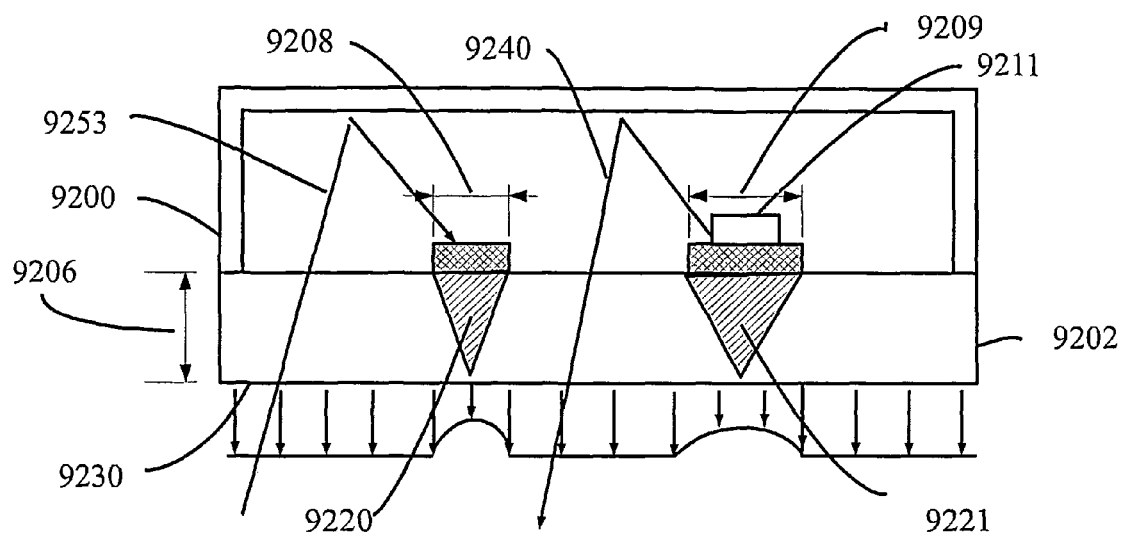
FIG. 92A depicts a side view of one embodiment of structural elements for concealment of features within recycling cavity.
Figure 92B:
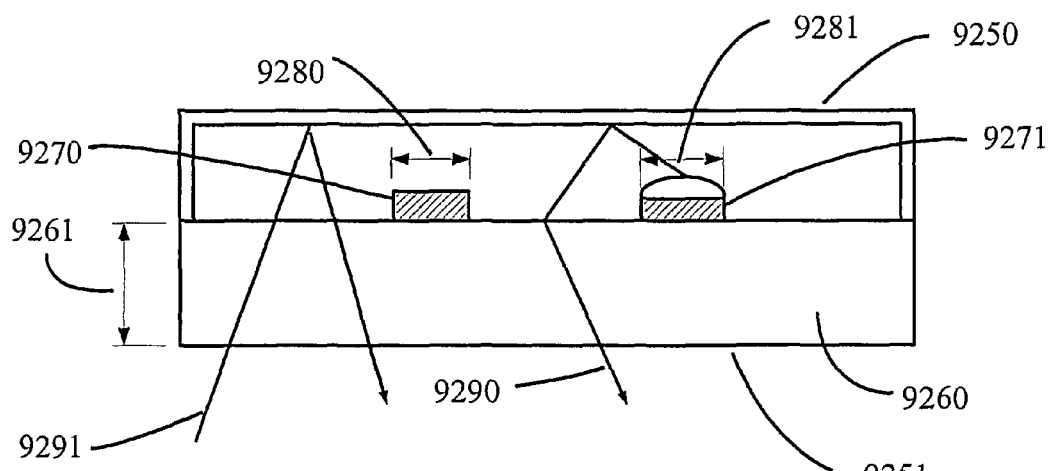
FIG. 92B depicts a side view of another embodiment of structural elements for concealment of features within recycling cavity.

FIG. 92A and FIG. 92B depict how components of the light source can be concealed or made less visible to an observer in both the on and off state of the light source. By controlling feature dimensions of the components on the inside surface of the mostly reflective light transmitting thermally conductive element, components within the light recycling cavity can be concealed or made less visible. Further by controlling feature dimensions in relation to the thickness of the mostly reflective light transmitting thermally conductive element and appropriate selection of scattering characteristics of mostly reflective light transmitting thermally conductive element a featureless light emitting surface may be attained. FIG. 92A depicts a light recycling cavity formed by reflector 9200 mounted to light transmissive thermally conductive element 9202 of thickness 9206 and light emitting surface 9230. Linear feature 9204 (long axis not shown) with width 9208 and square feature 9205 with width and length 9209 are on the inside surface of the light transmitting thermally conductive element and can be comprised of silver ink for electrical interconnects and mounting of devices such as solid state emitters or other electrical devices. Solid state emitter 9211 is mounted to square feature 9205 and emits light ray 9240 which is recycled by reflector 9200 back toward the LTTCE 9202. It is desirable for the emitting surface of light transmitting thermally conductive element to have a uniform level of light output across the entire emitting surface. Features on the inside surface of the LTTCE can affect the uniformity of the light emitting surface by blocking light ray 9240 from entering LTTCE 9202 and thus from exiting emitting surface 9230. In addition external light ray 9250 is incident on emitting surface 9230 of LTTCE 9202 and is transmitted to the inside of the light recycling cavity where it can be reflected back to the LTTCE 9202 by reflector 9200 and be transmitted through and emitted from LTTCE 9202, or it can either be blocked or reflected by features 9208 or 9209. In this manner features 9208 and 9209 can create a shadow 9220 or 9221 in the lighting system by blocking light emitted by solid state emitter in the on state or by the preventing the recycling of externally incident light that has been recycled and transmitted back to light transmitting thermally conductive element LTTCE 9202 in the off state.

FIG. 92B depicts a light recycling cavity formed by reflector 9250 mounted to LTTCE 9260 with thickness 9261 and light emitting surface 9251. Linear feature 9270 with width 9280 (length not shown) and square feature 9271 with 9281 are on the inside surface of LTTCE 9260. The width of linear feature 9270 is equal to ⅒ the thickness 9261 of the LTTCE 9260 and the width of square feature 9271 is equal to the thickness of LTTCE 9260. Alumina is preferred material for LTTCE 9260 due to high diffuse reflectivity and low optical absorption. The high diffuse reflectivity is a property of alumina that when combined with the thickness 9261 of the LTTCE 9260 and the width of features 9270 and 9271 that allow the shadow created by features 9270 and 9271 to be diminished to the point that they are not visibly noticeable in the on or off state. This is due the fact that light rays 9290 and 9291 that enter the alumina adjacent to features 9270 and 9271 are subject to a high level of scattering in the alumina which ears bends light under the feature where it can be emitted from the surface of the LTTCE 9260 directly below features 9204 and 9205. The degree of contrast of the shadow created by features 9270 and 9271 is proportional to the ratio of the width of features 9270 and 9271 to the thickness 9261 of LTTCE 9260. For large aspect ratio or line features such as 9270 the ratio of the line width 9280 to the thickness 9261 is most preferably less than ⅒ and for features with aspect ratio's close to 1:1 the most preferable ratio of the maximum dimension of these features 9271 to thickness 9261 is 1/1. For nearly square features 9271, a thickness 9261 that is equal to the width of feature 9271 is sufficient to provide enough scatter and diffusion of light rays underneath feature 9271 to raise the level of light emission form emitting surface 9251 directly below feature 9271 such that a visible shadow is not noticeable. The smaller ratio of the width of linear features to thickness of the mostly reflective light transmitting thermally conductive element required for concealment of these features is due to the sensitivity of human vision to detection of line shapes or linear patterns over perception of small features with aspect ratios near unity. As previously stated the desire is to conceal components inside the self cooling light source. A feature 9204 with a width 9208 within the recycling cavity will appear as a shadow 9210 when illuminated with external light 9212. The shadow 9210 represents a dip in the reflected light intensity distribution 9230 at the output surface 9220 of light transmitting thermally conductive element 9202 when the light source is not energized. The thickness 9206 and scattering characteristics of light transmitting thermally conductive element 9202 relative to feature 9204 width 9208 determines the intensity drop of shadow 9210 at the output surface 9230. As an example, if alumina is used width 9208 preferably is 5 times smaller than thickness 9206 even more preferably width 9208 is 10 times smaller than thickness 9206. There is a secondary effect related to the size and reflectivity of reflector 9200 relating to external light 9212 recycling in the cavity. But for high efficiency sources reducing feature 9204 width 9208 to fraction of the thickness 9206 is preferred if a uniform reflected light intensity distribution 9212 is desired. It should be noted that the use of external RETEs as previously disclosed may also be used to further conceal elements within the recycling cavity. In-line transmission of less than 20% for light transmitting thermally conductive element 9202 is also preferred such that a larger percentage of the external incident light 9212 is reflected before entering the recycling cavity. It should also be noted that the feature 9208 preferably is also highly reflective. As an example, silver ink is a preferred material for electrical interconnects for devices concealed within the recycling cavity.

Figure 93:
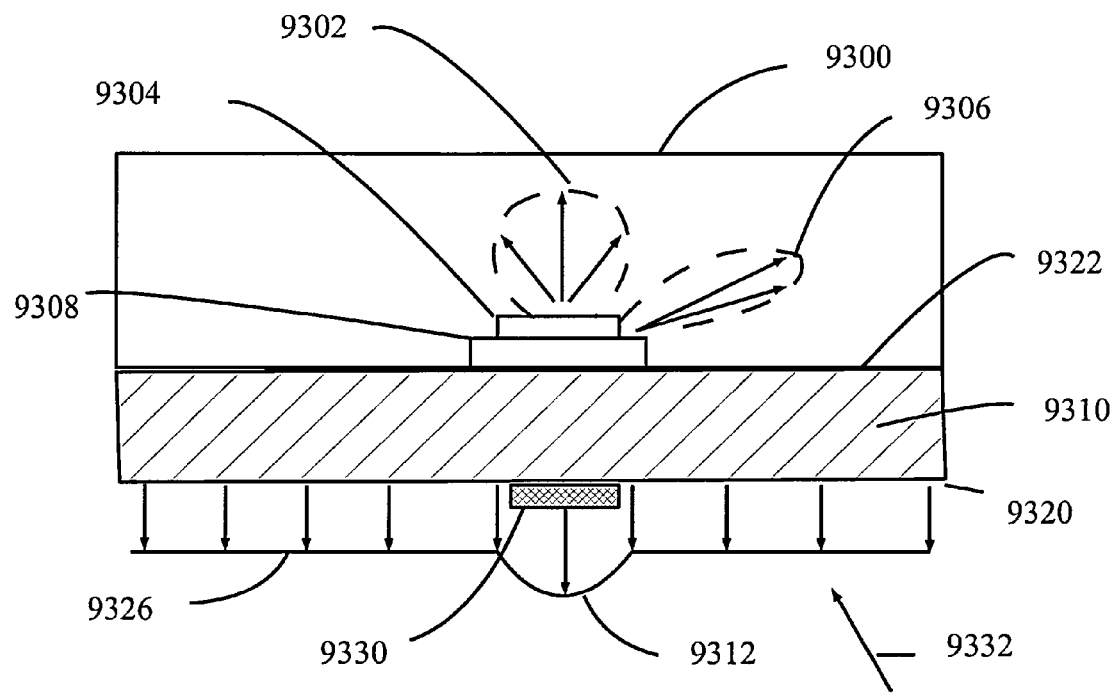
FIG. 93 depicts a side view of structural elements for reduction of hotspots.

FIG. 93 depicts structural elements for reduction of hotspots 9312 created by light sources 9308 mounted on light transmitting thermally conductive element 9310. As previously stated light transmitting thermally conductive element 9310 preferably has a low in-line transmission and a very low absorption so that the emission 9302 from light sources 9308 bounces around within the recycling cavity formed by reflector 9300 and light transmitting thermally conductive element 9310. In this case, output distribution 9326 is a combination of the reflected light from external light 9332 and the light from light sources 9308. If the desire is to create a uniform output distribution 9326 hot spots 9312 must be minimized. Again minimizing the light source 9308 physical size does help reduce the size of the hot spot 9330 but more importantly minimizing the high angle light emission 9306 from the light source 9308 is disclosed. A critical element in reducing high angle light emission 9306 is to minimize the phosphor layer thickness 9304 on the light source 9308. In general, light source 9308 has a preferred output emission 9302 in which substantially all the light emitted from light source 9308 impinges on reflector 9300 before impinging on the inner surface 9322 of light transmitting thermally conductive element 9310. By properly matching the scattering, thickness, feature sizes, and reflectivity of the elements that make up the recycling cavity uniform output distributions 9326 can be realized. This is especially important when low output brightness is being used where eye acuity to intensity variations are at their peak sensitivity. It should also be noted that by creating uniform distributed source it is possible to maximize the source brightness for a given glare restriction. This is especially important in indoor applications such as office buildings. On one hand the need exists for high brightness small area light sources for reduced cost and raw material usages on the other hand glare levels must be maintained within an acceptable level. The hot spot 9312 may also be reduced using an external feature 9312 on the outer surface 9320 of light transmitting thermally conductive element 9310. External feature 9312 may be opaque or transmissive including paints, reflective inks, or other decorative elements. Most preferred is a decorative element for external feature which is aesthetically pleasing or forms a camouflage look to conceal the non-uniformities in the output distribution 9312.

Figure 94A:
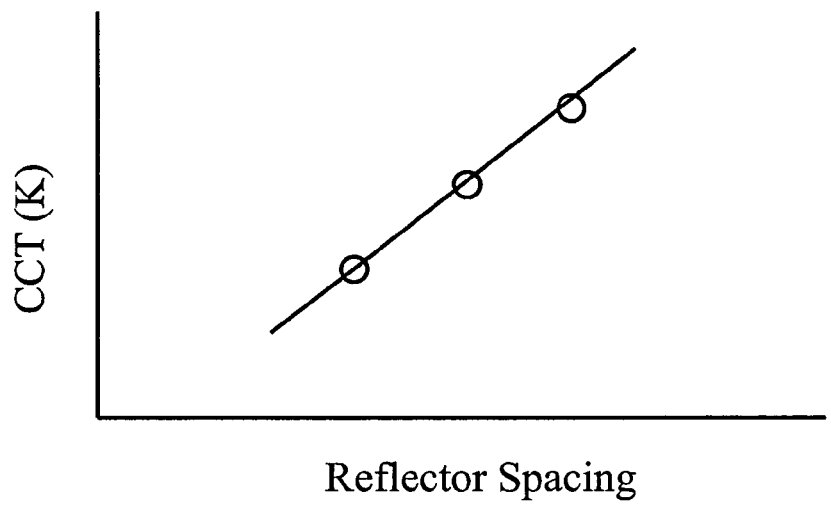
FIG. 94A depicts a graph of color temperature dependence on reflector spacing.
Figure 94B:
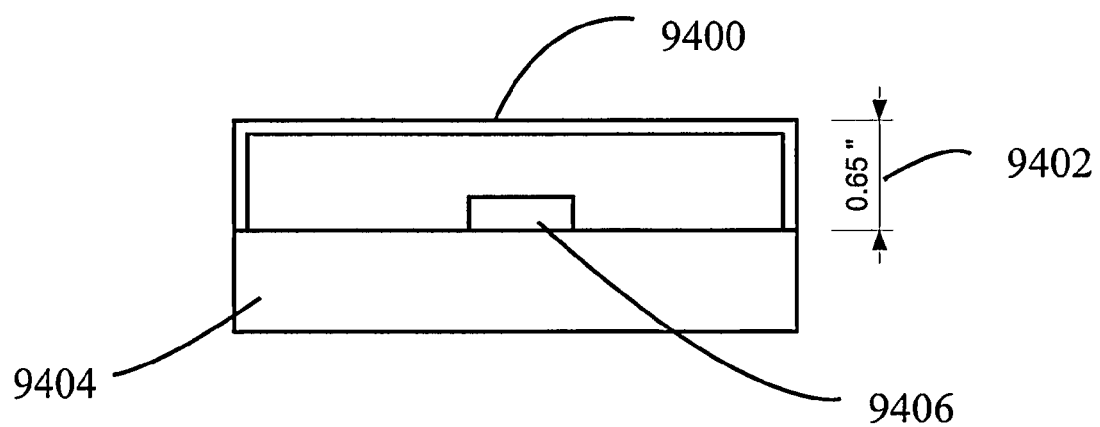
FIG. 94B depicts a side view of a reduced space self cooling light source.

FIG. 94A depicts color temperature dependence created by recycling with the recycling cavity based on reflector spacing in millimeters. As an example, reducing the space 9402 between reflector 9400 and light transmitting thermally conductive element 9404 inner surface as shown in FIG. 94B from 5 mm to 2 mm will lower the color coordinate temperature of the light source by over 200K. This is due to increased light recycling with the cavity back the phosphor coated LED 9406. As such it is possible to tune the color temperature of the overall light source by varying space 9402.

Figure 95A:
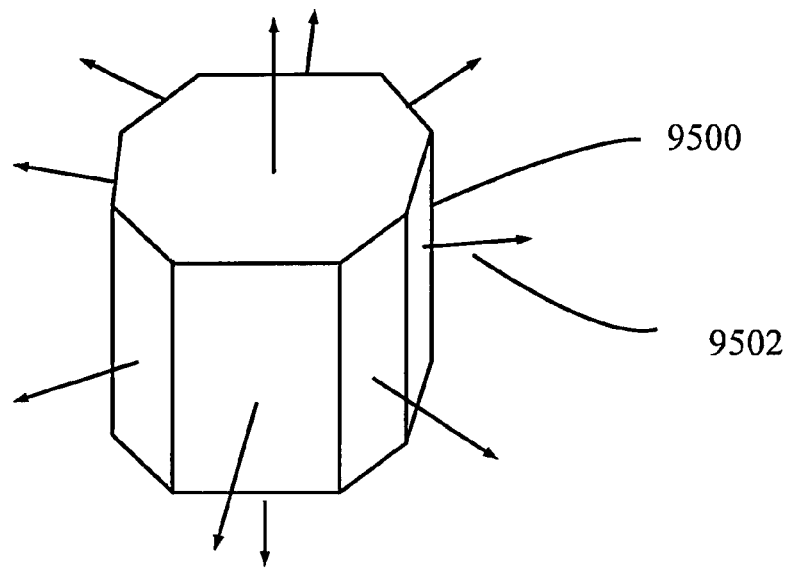
FIG. 95A depicts a perspective view of an octagonal cylinder for cooling efficiency for a self cooling light source.
Figure 95B:
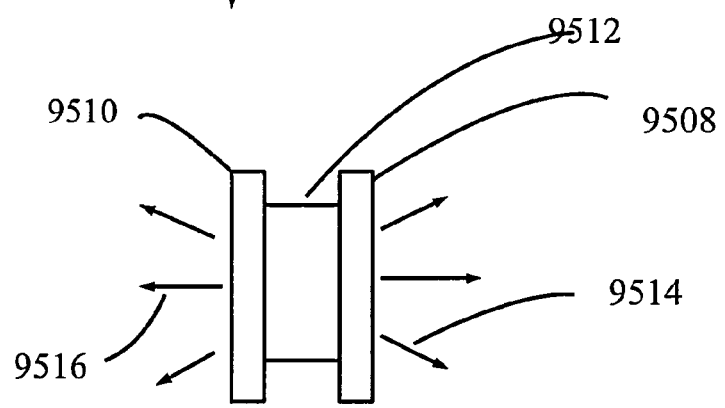
FIG. 95B depicts a side view of a reflector for cooling efficiency for a self cooling light source.
Figure 95C:
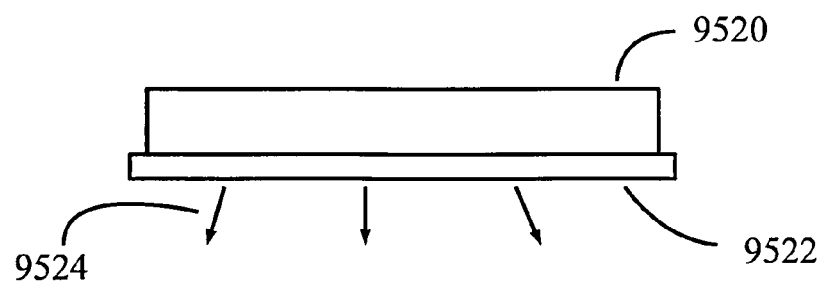
FIG. 95C depicts a side view of cooling efficiency for a single self cooling light source.

FIG. 95 depicts examples of cooling efficiency for different self cooling light sources. FIG. 95A depicts an octagonal cylinder 9500 in which light 9502 is emitted off of each surface forming a substantially isotropic emitter. As an example if the octagonal cylinder is constructed of 96% alumina 500 microns thick approximately 80% of the light emitted by light sources (not shown) with the octagonal cylinder 9500 will be emitted from the light source. Higher purity alumina will increase the light emitted slightly. In the specific case where the octagonal cylinder 9500 has a surface area of 10 inches square greater than 700 lumens can be emitted while maintaining a surface temperature under 60 C using natural convection cooling. In this example, the surface area is approximately 10 square inches while the volume is approximately 2 cubic inches for a surface area to volume ratio of 5. Self cooling light sources with surface area to volume ratios less than 10 are preferred. Even more preferably self cooling light sources in which the majority of the light and heat emitting surfaces are vertically oriented is preferred for enhance natural convection. FIG. 95B depicts a light source in which two light transmitting elements 9508 and 9510 are connected by a reflector 9512 such that two substantially lambertian emitters 9514 and 9516 respectively are formed. In this case a slightly larger surface area is required to maintain a given surface temperature versus lumens out but the volume can be significantly reduced allowing for a lower surface area to volume ratio. This configuration also allows for the light and heat emitting surfaces to be vertically oriented. As such for very high output self cooling light sources this configuration is a preferred embodiment. It should also be noted that this configuration also allows for light emitting sources to be one light transmitting element 9508 and other electrical components to on the other light transmitting surface. This allows for some thermal isolation of the light emitting sources from the other electrical components. FIG. 95C depicts a single light transmitting element 9522 with a substantially lambertian output 9524. Reflector 9520 along with light transmitting element 9522 forms the recycling cavity which contains the light sources (not shown). In all these cases heat generated in the light source is being dissipated to the surrounding ambient via natural convection and radiation substantially from the light transmitting thermally conductive elements. It should be noted that greater that these sources can output greater than 20 lumens per gram of source weight while maintaining a junction temperature under 70 C. As LED efficiency increases the effectiveness of using the light emitting surface as the cooling surface also increases allowing for outputs that exceeds 100 lumens per gram of source weight. In general, the light sources, fixtures, lighting systems in which the heat generated by the light emitters and other electrical components is dissipated using the light emitting surface is an embodiment of this invention. The ability to conceal, hide, or camouflage light emitters and other electrical components using the light transmitting thermally conductive elements is a preferred embodiment of this invention.

Figure 96A:
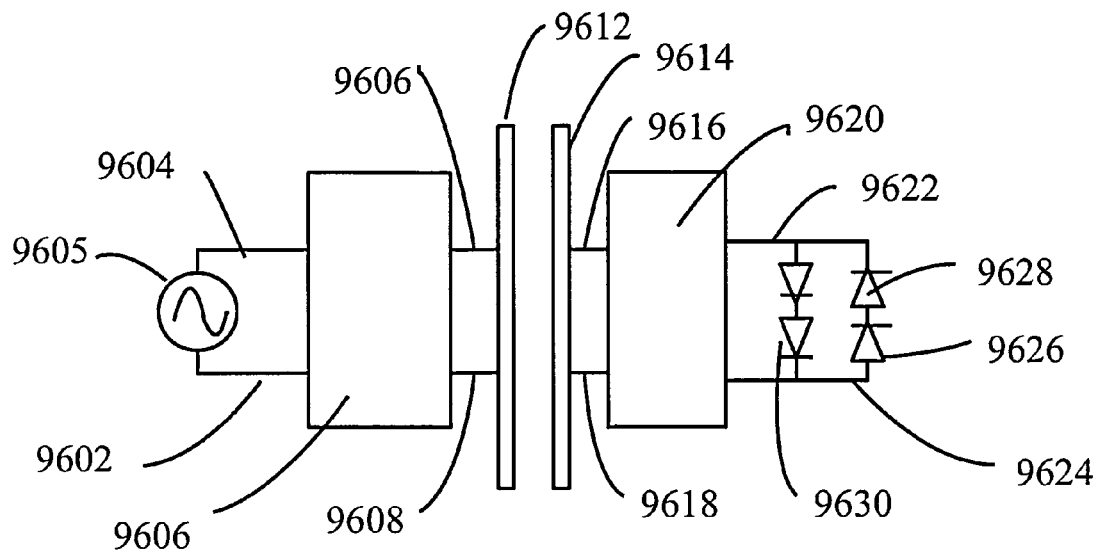
FIG. 96A depicts a side view of a matrix converter drive scheme for self cooling light sources.
Figure 96B:
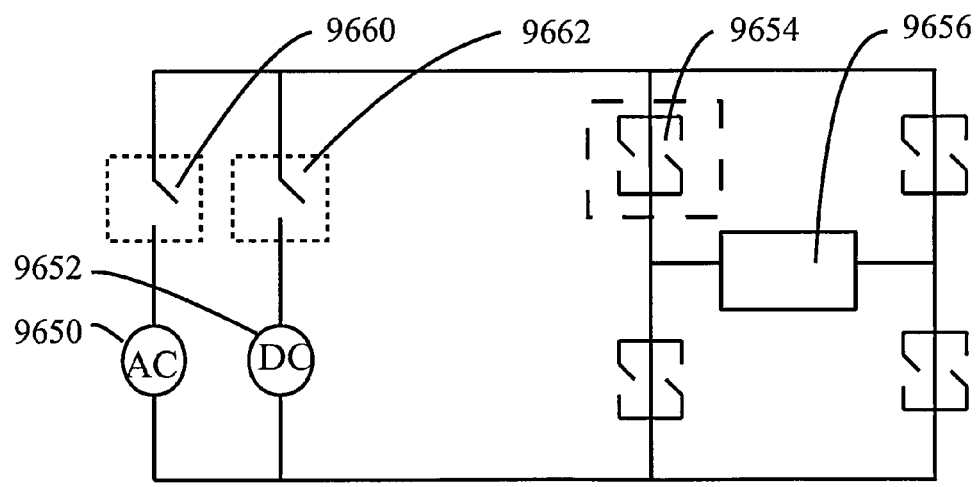
FIG. 96B depicts a side view of a basic matrix converter drive scheme for self cooling light sources.

FIG. 96A depicts a block diagram for LED driver based on a AC to AC matrix converter 9606 which converts AC input 9605 into a higher frequency AC output. The higher frequency AC can be directly coupled to LEDS 9626 and 9624 or coupled via wireless transmitter 9612 and wireless receiver 9614. Additionally point of load converter 9620 can also be used to further power condition the power delivered to the LEDs 9626 and 9624. Typically 120 VAC 60 Hz is used in the U.S. while 220 VAC 50 Hz is used in Europe. In both cases, directly driving anti-paralleled LEDs off the input power AC is undesirable because of flickering issues due to the low frequency of the AC input. LEDs have very high frequency response and can be driven efficiently at frequencies well into the MHz region. Also the passive elements capacitors and inductors required in most power conversion circuits become less bulky at higher frequencies. It is known in the art that high frequency (1 KHz to several MHz) power conversion can be done efficiently using wideband gap device such as GaN and SiC. In addition, wireless power transfer via magnetic induction benefits from higher frequencies. Finally, it is desirable that devices such as lighting be electrically isolated from the AC mains for consumer safety reasons. As an example 120 VAC 60 Hz is connected from AC main 9605 via leads 9604 and 9602 to AC to AC matrix converter 9606. Approximately 120 VAC 150 KHz is coupled from AC to AC matrix converter 9606 to wireless transmitter loop antenna 9612. A matched wireless receiver antenna 9614 is used to provide simple attachment and electrical isolation from the AC main 9605. Approximately 120 VAC 150 KHz is coupled from the wireless receiver antenna 9614 to point of load converter 9620 via lead 9616 and 9618. Point of load converter 9620 may be a AC to DC or AC to AC power converter. As wireless receiver antenna 9614 and point of load converter 9620 are integrated into the self cooling light source as previously disclosed, a minimal number of components are preferred. Matrix converters are therefore preferred because of the reduced amount of magnetic material required. Load leads 9622 and 9624 deliver the conditioned power to the LED loads 9626 and 9630. It should be noted that LED loads 9626 and 9630 can be in antiparallel, series, parallel, or combinations of both depending on the output or use of point of load converter 9620. It should also be noted that wireless transmitter 9612 and wireless receiver 9614 can also function as EMI filter or added inductance in the circuit. In particular, since the efficiency of the wireless power transfer is resonant and efficient only within a narrow frequency range other frequencies generated in the AC to AC matrix converter 9606 can be filtered out. FIG. 96B shows a basic matrix converter circuit. Either AC input 9650 or DC input 9652 may be used to power the circuit being connected to the circuit via switch 9660 and 9662 respectively. A matrix of switches 9654 determines the direction of current flow in load 9656. Switches 9654 may consist of multi switches as well. A wide range of circuit configurations have been proposed in the art. In general, multi-level matrix converters can be used to efficiently perform AC to AC and DC to AC, AC to DC, and DC to DC conversion over a wide frequency range within a very small volume. This type power conditioning or conversion is preferred for the self cooling light sources disclosed in this invention. The incorporation of at least one wireless receiver 9614 and optionally a point of load converter 9620 along with at least one LED or LED package to form an electrically isolated self cooling light source is a preferred embodiment of this invention. Even more preferably the light emission 9628 and the heat generated by wireless receiver 9614, optionally point of load converter 9620 and LED loads 9626 and optionally LED load 9630 is emitted and dissipated off substantially the same surface as previously illustrated. The resulting light source, fixture, luminaire, or lighting system would allow the consumer to easily remove, move, or otherwise change the lighting as required without direct exposure to the AC main 9605. Given the wide operational range of this approach multiple input sources 9605 could be accommodated both AC and DC in nature.

Figure 97:
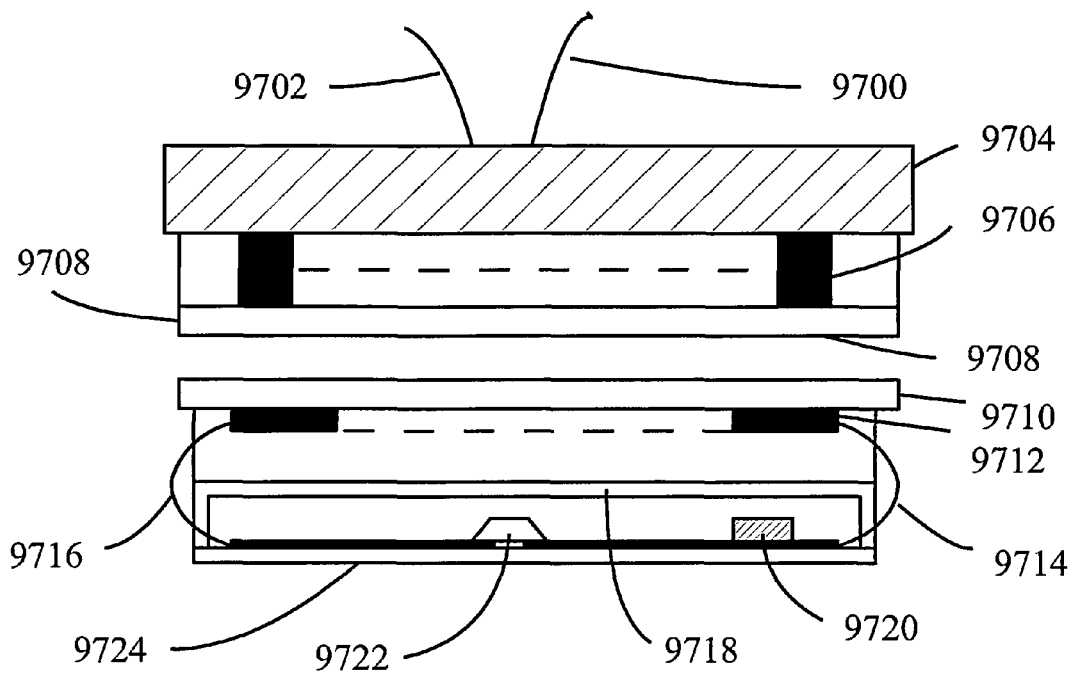
FIG. 97 depicts a side view of a wireless transfer self cooling light

FIG. 97 depicts a wireless transfer self cooling light source which uses the wireless transmitter coil 9706 and wireless receiver coil 9712 to electrically isolate the light source from the AC mains 9700 and 9702. Dielectric layers 9706 and 9710 may include polymers, ceramics, insulated metals, and glass. The large surface area of the sources typically required for self cooling lighting allow wireless transmitter coil 9706 and wireless receiver coil 9712 to have large loop area which facilitates efficient transfer of power via inductive coupling. The dielectric layers 9706 and 9710 can also be used to define a very narrow gap between wireless transmitter coil 9706 and wireless receiver coil 9712 which also increases efficiency. Magnetic, clips, and other restraining means maybe used to further align and bring the two dielectric layers 9706 and 9710 together. AC to AC conversion element 9704 may be used to increase the AC main frequency upward to increase the efficiency of power transfer. In this case the wireless receiver coil is integrated into the self cooling light source as shown in the figure it is attached to the reflector 9718 however other mountings are anticipated. Leads 9714 and 9716 take the output of the wireless receiver coil 9712 and connect to the point of load converter 9720 if used and the LEDs 9722 both of which can be integrated onto the light transmitting thermally conductive element 9724 as previously disclosed.

Figure 98:
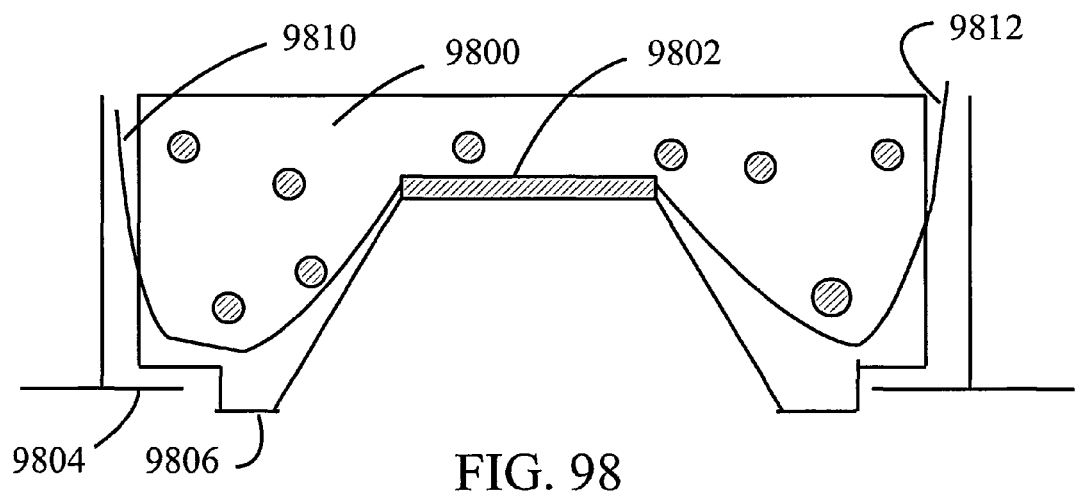
FIG. 98 depicts a side view of a ceiling tile with a recessed self cooling source.

FIG. 98 depicts a ceiling tile 9800 with a recessed self cooling source 9802 supported by a T grid 9804. The outer scrim surface 9806 of ceiling tile 9800 may exhibit specular or diffuse reflectivity to the light emitting by recessed self cooling source 9802. Most preferably recessed self cooling source 9802 is less than 6 mm thick such that the acoustical, fire and thermal barrier of the ceiling tile 9800 can be maintained. Power lead 9810 and 9812 may be incorporated into ceiling tile 9800 underneath the outer scrim surface 9806 during fabrication of the ceiling tile 9800.

Figure 99:
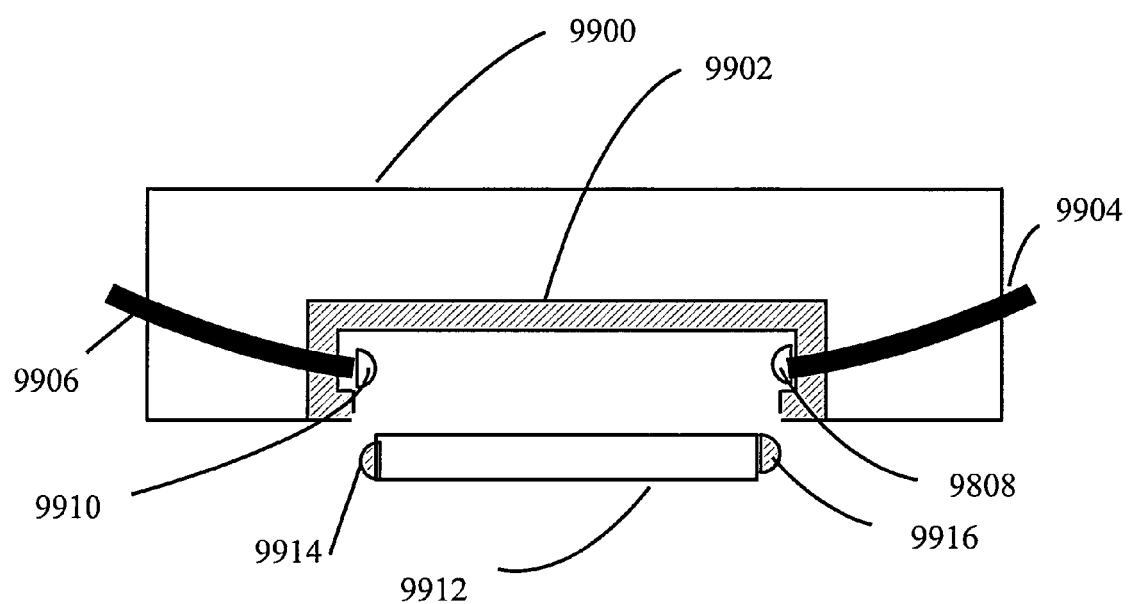
FIG. 99 depicts a side view of mounting elements for attaching or otherwise integrating self cooling light source into ceiling tiles.

FIG. 99 depicts mounting elements for attaching or otherwise integrating self cooling light source 9912 into ceiling tile 9900. A mounting element 9902 is fabricated into ceiling tile 9900 and acts as both a physical and electrical mount for the self cooling light source 9912. The mounting element 9902 because it does not need to dissipate heat for the self cooling light source 9912 can be made out of plastic or other low cost light weight materials. This is in contrast to conventional solid state lighting sources which use the mounting and fixture housing to spread heat and dissipate the heat. Magnetic, Velcro, adhesives, screws, clips, and other mechanical means may be used to mount self cooling light source 9912 into mounting element 9902. In addition, electrical contact may be integrated into mounting element 9902 via contacts 9910 and 9908 which may include but not limited to spring loaded contacts, springs, clips, pins, and other electromechanical means to make electrical contact to light source contacts 9914 and 9916 respectively. Power is provided via power leads 9906 and 9904. It should be noted the electrical contacts 9910 and 9908 may also serve as physical mounting elements as well because of the lightweight nature of the self cooling light source 9912.

Figure 100:
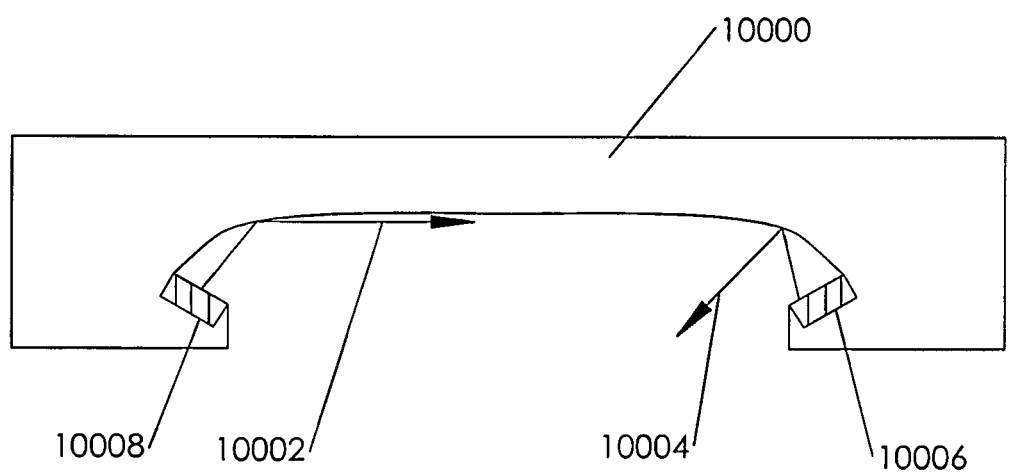
FIG. 100 depicts a side view of a self cooling light source integrated into ceiling tile

FIG. 100 depicts self cooling light sources 10008 and 10006 integrated into ceiling tile 10000. The self cooling light sources 10008 and 10006 are recess mounted into the ceiling tile 10000 such that indirect lighting is emitted from the assembly. Light rays 10002 and 10004 are emitted from self cooling light sources 10008 and 10006 respectively. The reflectivity and surface profile of the ceiling tile 10000 and orientation of self cooling light sources 10008 and 10006 determines the output distribution from the assembly.

Figure 101:
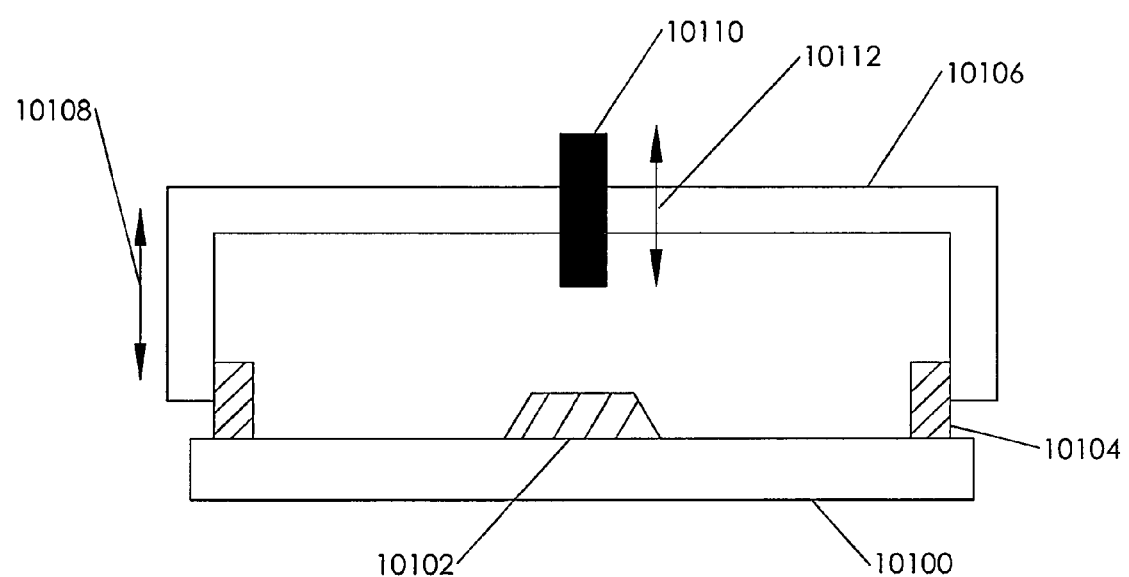
FIG. 101 depicts a side view of various elements adjusting color temperature within recycling light sources.

FIG. 101 depicts various elements which permits adjusting color temperature within the light system or light source. In one embodiment the reflector 10106 may be adjusted to change its relative distance from the LED package 10102 as shown by movement arrows 10108. Guide 10104 maintains the closed nature of the light recycling cavity formed by reflector 10106 and light transmitting thermally conductive element 10100. By adjusting the separation distance the color temperature of the light emitted through light transmitting thermally conductive element 10100 can be changed to accommodate the variability in LED packages or phosphors 10102. Alternately, wavelength conversion element 10110 may be inserted or otherwise incorporated into reflector 10106 as shown and in close proximity to the LED package 10102. The wavelength conversion element 10110 may be moved after assembly of the light source to alter how much of the wavelength conversion element is exposed inside the light recycling cavity as shown by movement 10112 which results in a change in the color temperature of the source. The wavelength conversion element 10110 may be reflective or diffusive in nature and the emission from LED packages 10102 may undergo wavelength conversion or simply be a reflective element which increases the amount of emission from LED packages 10102 which returns back to the LED packages 10102 before exiting the light recycling cavity.

Figure 102:
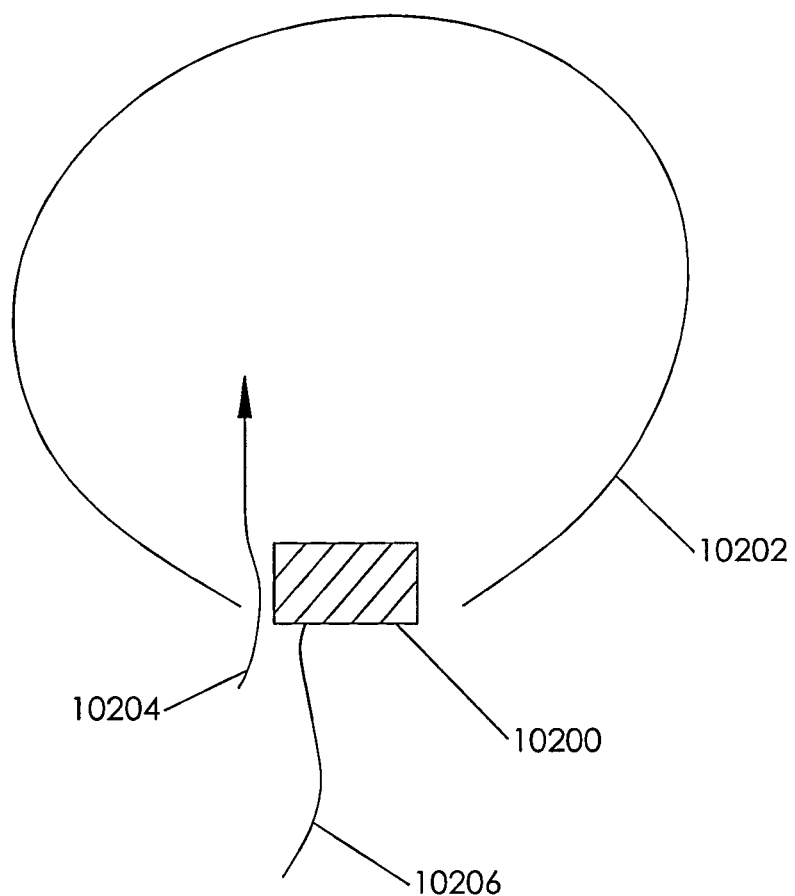
FIG. 102 depicts a side view of a deployable lighter than air light source wherein the heat generated by the light source heats the air within the surrounding envelope contains the air.

FIG. 102 depicts deployable lighter than air light source wherein the heat generated by the self cooling light source 10200 heats the air within the surrounding envelope 10204 contains the air. The heat generated by the self cooling light source 10200 can be used to induce convection air flow 10204 such that hot air is moved into surrounding envelope 10202 in a manner very much similar to a hot air balloon. The lightweight nature of the self cooling light source enables this invention to work. A power lead 10206 not only can provide power to the deployable devices but also serve as a tether for the device. Alternately, the surrounding envelope 10202 may contain solar cells or other means of energy harvesting or storage. Additional energy storage within the self cooling light source 10200 is also disclosed along with guidance and positional control elements. In a manner similar to a blimp this invention can be moved and controlled remotely. The use of this approach for emergency signaling, beacons, lighting, and other temporary lighting needs is also disclosed.

Figure 103:
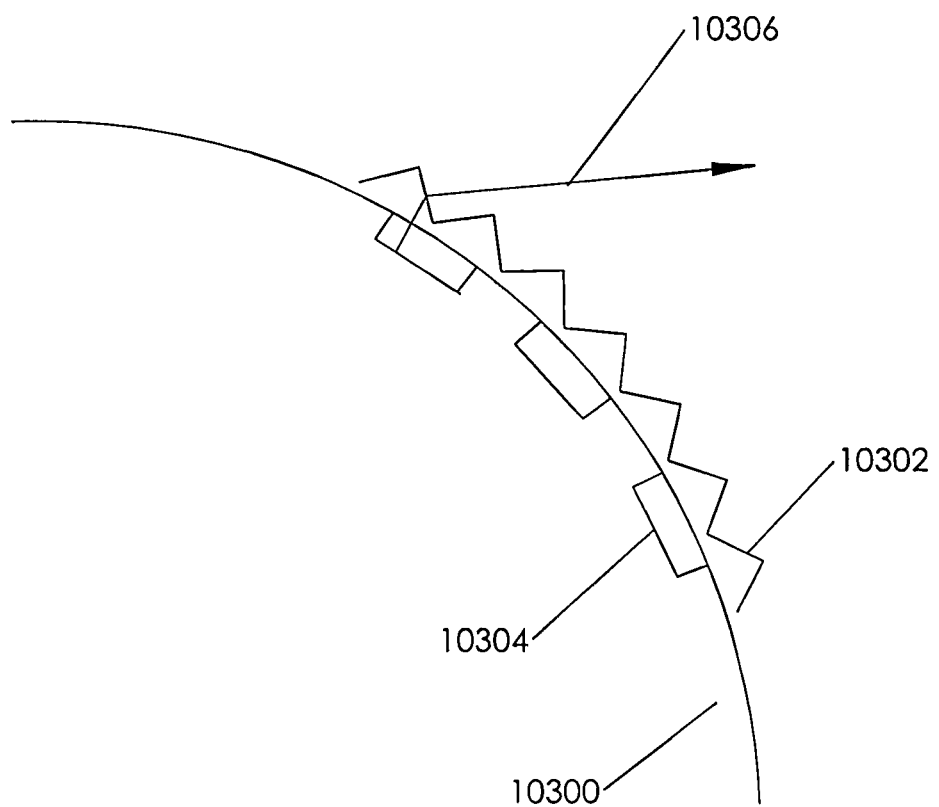
FIG. 103 depicts a side view of an automotive tail light based on self cooling light

FIG. 103 depicts automotive tail light 10300 based on self cooling light 10304. The lightweight nature of the self cooling light source 10304 and its ability to dissipate the heat generated within it allows for novel conformal lighting in automotive applications. Also a preferred embodiment of this invention is substantially all inorganic in nature which provides for a more robust design for the stringent requirements of automotive, marine, and aircraft applications. Once the heat from the localized LED packages within the light recycling cavity by the light transmitting thermally conductive element (not shown) has be spread out of the light emitting surface area of the self cooling light 10304 it is then possible to use a variety of the overlays 10302 which may or may not have high thermal conductivity. As an example, a 1 mm thick polycarbonate overlay 10302 covering a ½ inch by 24 inch self cooling light source 10304 outputting 500 lumens increases the junction temperature of the LEDs within the self cooling light source 10304 by approximately 10 to 20 C which is still well within a reasonable operating temperature for the light source and LEDs. The overlay 10302 can be used to add directivity to output rays 10306. Brake lights may use red self cooling light sources 10304 and overlay 10302 may be red colored to enhance contrast. In this case, the perforated metal self cooling light source as previously disclosed may be used to aesthetically or functionally modify the external contrast of the light source. As previously stated the perforated metal approach can have even a black outside surface if desired.

Figure 104:
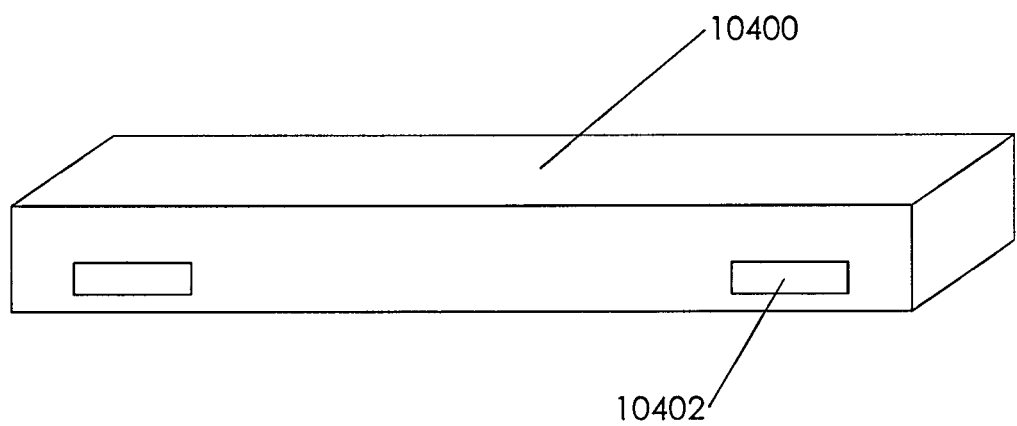
FIG. 104 depicts a perspective view of automotive off road lights based on self cooling light sources

FIG. 104 depicts automotive off road lights based on self cooling light sources 10402 mounted on an automotive surface 10400 such as a bumper, fender, or other surface attached to a motor vehicle. The thin, lightweight, and robust nature of the self cooling light sources 10402 disclosed enable easier mounting and durability compared to conventional solid state light sources.

Figure 105:
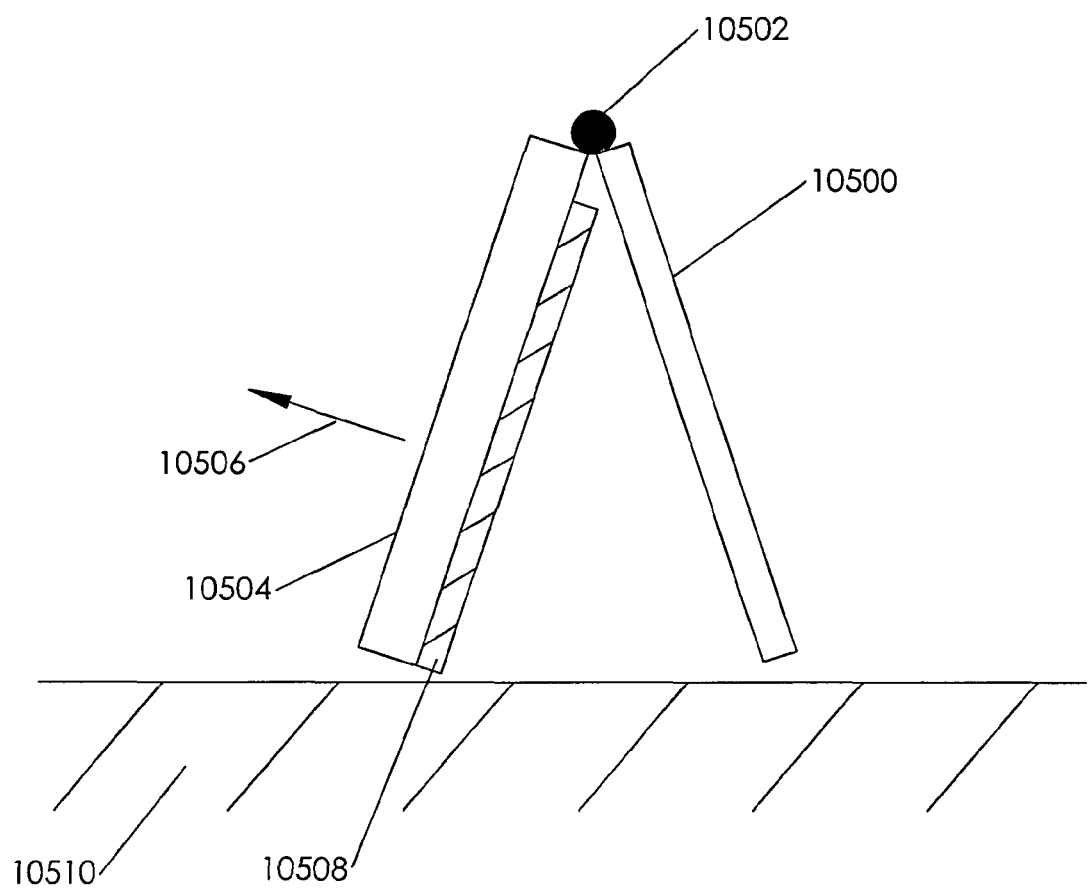
FIG. 105 depicts a side view of removable self cooling light panels in automobiles, trucks, and emergency vehicles to allow for emergency, accident, and recreational usage with snaps out and has a hinged bracket like a sandwich board with integrated battery

FIG. 105 depicts removable self cooling light panels 10504 in automobiles, trucks, and emergency vehicles to allow for emergency, accident, and recreational usage. Snaps out and has a hinge 10502 and bracket 10500 like a sandwich board with integrated battery 10508. As an example the removable light source can be integrated into the rear ceiling light of a SUV or pickup truck such that it is normally used to provide internal lighting or bed lighting to the vehicle. The removable light source however can be snapped out of its mounting and used as a standalone light source for tire repair or other emergency usage. The removable light source can be set up on the ground 10510 or a picnic table or hung from a tree for camping and other recreational activities.

While the invention has been described in conjunction with specific embodiments and examples, it is evident to those skilled in the art that many alternatives, modifications and variations will be evident in light of the foregoing descriptions. Accordingly, the invention is intended to embrace all such alternatives, modifications and variations that fall within the spirit and scope of the appended claims.

The invention claimed is:

1. A lighting system comprising
at least one mostly reflective light transmitting thermally conductive element with a light emitting surface,
wherein the majority of light and heat emitted from said lighting system is transferred to the surrounding ambient from said light emitting surface of said at least one mostly reflective light transmitting thermally conductive element.

2. The lighting system of claim 1 wherein said light emitting surface has an emissivity greater than 0.7 and said at least one mostly reflective light transmitting thermally conductive element has a thermal conductivity of at least 10 Watts/Meter-° Kelvin.

3. The lighting system of claim 1 wherein said at least one mostly reflective light transmitting thermally conductive element is more reflective than light transmitting.

4. The lighting system of claim 1 wherein said light emitting surface of at least one mostly reflective light transmitting thermally conductive element is substantially the only exterior surface of said lighting system to be exposed to ambient.

5. The lighting system of claim 1 further comprising
an electrical interconnect on the inside surface of said at least one mostly reflective light transmitting thermally conductive element and at least one solid state emitter mounted to the inside surface of said at least one mostly reflective light transmitting thermally conductive element
wherein the width of said interconnect and size of the solid state emitting element is selected such that the interconnect or solid state emitter is not visibly noticeable to an observer or does not cast a visibly noticeable shadow or create a noticeable dark spot either in an on or off state of the light source of the lighting system.

6. The lighting system of claim 5 wherein the ratio of the linewidth of the interconnect and the thickness of the mostly reflective light transmitting thermally conductive element is less than ¹⁄₁₀ and the ratio of the maximum feature dimension of the solid state emitter element to the thickness of the mostly reflective light transmitting thermally conductive element is less than 1/1.

7. The lighting system of claim 1 wherein said light emitting surface has an emissivity greater than 0.3.

8. The lighting system of claim 1 wherein said lighting system emits greater than 20 lumens per gram.

9. The lighting system of claim 1 further comprising
at least one power conversion element that is thermally connected to said at least one mostly reflective light transmitting thermally conductive element
wherein said at least one power conversion element transfers the heat generated by said at least one power conversion element to the surrounding ambient from said at least one mostly reflective light transmitting thermally conductive element to which it is thermally connected.

10. The lighting system of claim 1 further comprising
at least one separate thermally isolated power conversion element wherein said thermally isolated power conversion element provides, through an interconnect means, power to said lighting system.

* * * * *